US010948822B2

(12) United States Patent
Hatakeyama et al.

(10) Patent No.: US 10,948,822 B2
(45) Date of Patent: Mar. 16, 2021

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Koji Hasegawa, Joetsu (JP); Masahiro Fukushima, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 281 days.

(21) Appl. No.: 16/005,988

(22) Filed: Jun. 12, 2018

(65) Prior Publication Data

US 2018/0373148 A1 Dec. 27, 2018

(30) Foreign Application Priority Data

Jun. 21, 2017 (JP) ............................ JP2017-121532

(51) Int. Cl.

| | |
|---|---|
| ***G03F 7/039*** | (2006.01) |
| ***G03F 7/038*** | (2006.01) |
| ***G03F 7/16*** | (2006.01) |
| ***G03F 7/38*** | (2006.01) |
| ***G03F 7/32*** | (2006.01) |
| ***G03F 7/20*** | (2006.01) |
| ***C08F 220/16*** | (2006.01) |
| ***C08F 220/30*** | (2006.01) |
| ***C08F 212/14*** | (2006.01) |
| ***C08F 220/24*** | (2006.01) |
| ***C08F 220/22*** | (2006.01) |
| ***C08F 12/20*** | (2006.01) |
| ***C08F 12/22*** | (2006.01) |
| ***C08F 212/32*** | (2006.01) |
| ***C09D 125/18*** | (2006.01) |
| ***G03F 7/004*** | (2006.01) |
| *C08F 12/24* | (2006.01) |
| *C08F 220/28* | (2006.01) |
| *C08F 220/38* | (2006.01) |

(52) U.S. Cl.

CPC .............. *G03F 7/038* (2013.01); *C08F 12/20* (2013.01); *C08F 12/22* (2013.01); *C08F 212/14* (2013.01); *C08F 212/32* (2013.01); *C08F 220/16* (2013.01); *C08F 220/22* (2013.01); *C08F 220/24* (2013.01); *C08F 220/30* (2013.01); *C09D 125/18* (2013.01); *G03F 7/0045* (2013.01); *G03F 7/039* (2013.01); *G03F 7/0392* (2013.01); *G03F 7/162* (2013.01); *G03F 7/168* (2013.01); *G03F 7/2004* (2013.01); *G03F 7/2006* (2013.01); *G03F 7/322* (2013.01); *G03F 7/38* (2013.01); *C08F 12/24* (2013.01); *C08F 220/283* (2020.02); *C08F 220/301* (2020.02); *C08F 220/302* (2020.02); *C08F 220/382* (2020.02); *C08F 2800/10* (2013.01)

(58) Field of Classification Search

CPC ........ G03F 7/038; G03F 7/0382; G03F 7/039; G03F 7/0392; G03F 7/2004; G03F 7/2006; G03F 7/0045; C08F 212/16; C08F 212/21; C08F 220/22; C08F 12/16; C08F 12/21; C09D 125/18

USPC ...................................................... 430/270.1

See application file for complete search history.

(56) References Cited

U.S. PATENT DOCUMENTS

| | | | | |
|---|---|---|---|---|
| 5,858,620 A | | 1/1999 | Ishibashi et al. | |
| 6,369,279 B1 | | 4/2002 | Nakashima et al. | |
| 2015/0125794 A1* | | 5/2015 | Hatakeyama ............. | G03F 7/30 430/285.1 |
| 2016/0152755 A1* | | 6/2016 | Fujiwara ............... | G03F 7/0045 430/281.1 |

FOREIGN PATENT DOCUMENTS

| | | | |
|---|---|---|---|
| JP | 10-73927 A | | 3/1998 |
| JP | 3900240 B2 | | 4/2007 |
| JP | 2009-157338 A | * | 7/2009 |

OTHER PUBLICATIONS

Computer-generated translation of JP 2009-157338 (Jul. 2009). (Year: 2009).*

Yamamoto et al., "Polymer-Structure Dependence of Acid Generation in Chemically Amplified Extreme Ultraviolet Resists", Japanese Journal of Applied Physics, 2007, vol. 46, No. 7, pp. L142-L144 (3 pages).

* cited by examiner

*Primary Examiner* — John A McPherson

(74) *Attorney, Agent, or Firm* — Westerman, Hattori, Daniels & Adrian, LLP

(57) ABSTRACT

A resist composition comprising a polymer comprising recurring units having an optionally substituted brominated phenol has advantages including high sensitivity, high resolution and reduced acid diffusion and forms a pattern of good profile with improved CDU.

19 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2017-121532 filed in Japan on Jun. 21, 2017, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. The logic devices used in smart phones drive forward the miniaturization technology. Logic devices of 10-nm node are manufactured in a large scale using a multi-patterning lithography process based on ArF lithography.

In the application of lithography to next 7-nm or 5-nm node devices, the increased expense and overlay accuracy of multi-patterning lithography become tangible. The advent of EUV lithography capable of reducing the number of exposures is expected.

Since the wavelength (13.5 nm) of extreme ultraviolet (EUV) is shorter than 1/10 of the wavelength (193 nm) of ArF excimer laser, the EUV lithography achieves a high light contrast, from which a high resolution is expectable. Because of the short wavelength and high energy density of EUV, an acid generator is sensitive to a small dose of photons. It is believed that the number of photons available with EUV exposure is 1/14 of that of ArF exposure. In the EUV lithography, the phenomenon that the edge roughness (LWR) of line patterns or the critical dimension uniformity (CDU) of hole patterns is degraded by a variation of photon number is considered a problem.

For the purpose of suppressing such photon variation, the use of low sensitivity resist material is effective. On the other hand, for the purpose of preventing any drop of throughput even when the laser power is low, it is desired to develop a high sensitivity resist material. A reduction of photon variation and an increase of sensitivity are contradictory requirements.

Non-Patent Document 1 reports that an acid generator in polyhydroxystyrene exerts a high acid generation efficiency when processed by the EB or EUV lithography. The energy transfer model contemplated therein is that upon exposure, a phenol group generates a phenoxy radical, which is ionized to emit electrons, to which the acid generator is sensitive. It is a brominated styrene that has the next high acid generation efficiency in the report. The model advocated therein is that a bromine anion generated upon exposure forms a charge transfer complex with a radical cation of a polymer, after which an acid generates.

In the prior art, halogenated hydroxystyrene base resins are known (Patent Documents 1 and 2). By halogen substitution, the acidity of phenol groups is improved whereby alkali dissolution rate or transparency is improved.

CITATION LIST

Patent Document 1: JP-A H10-073927
Patent Document 2: JP 3900240
Non-Patent Document 1: Jpn. J. Appl. Phys., Vol. 46, No. 7 (2007)

DISCLOSURE OF INVENTION

An object of the invention is to provide a resist composition which has advantages including reduced acid diffusion, a high resolution surpassing prior art resist compositions, a reduced edge roughness (LER, LWR), and high sensitivity, and forms a pattern of good profile; and a pattern forming process using the same.

Attempting to obtain the currently desired resist composition having a high sensitivity, high resolution and reduced edge roughness, the inventors have found that the above object is achieved by using a polymer comprising recurring units containing brominated phenol which may or may not be substituted with an acid labile group as a base resin to formulate a resist composition, especially chemically amplified resist composition.

The inventors have also found that for the purpose of increasing a dissolution contrast while maintaining a high sensitivity and suppressed acid diffusion, it is effective to use a polymer comprising recurring units having a brominated phenol group which may or may not be substituted with an acid labile group and optionally recurring units having a group capable of polarity switch under the action of acid as a base resin to formulate a resist composition, especially chemically amplified resist composition. The resist composition exhibits a high sensitivity, a very high contrast of alkaline dissolution rate before and after exposure, an acid diffusion-suppressing effect, and a high resolution, and forms a pattern of good profile with a reduced edge roughness. By virtue of these advantages, the composition is suited as a pattern-forming material for the fabrication of VLSIs and photomasks.

Among halogen atoms including fluorine, chlorine, bromine, iodine and astatine atoms, the atom that is most absorptive to EUV of wavelength 13.5 nm is iodine, but the halo-substituted compound that exhibits the highest acid generation efficiency upon exposure is a bromine-substituted one. This is probably because bromine atoms are susceptible to ionization and likely to release electrons. Aiming to significantly increase the ionization efficiency of bromine, the inventive resist composition uses a polymer having a bromine-substituted phenol group as a base resin. In addition to ionization of bromine atoms upon exposure, radicals generated from phenol are ionized on bromine atoms, whereby the generation efficiency of secondary electrons is increased, implying that the decomposition efficiency of acid generator can be enhanced. The resulting resist composition exhibits a very high sensitivity, high acid diffusion-suppressing effect, high resolution, good dimensional uniformity, reduced edge roughness, and process adaptability, and forms a pattern of good profile after exposure. By virtue of these advantages, the resist composition is fully useful in commercial application and quite effective as a VLSI-forming resist material or mask pattern-forming material.

In one aspect, the invention provides a resist composition comprising a base resin containing a polymer comprising recurring units having the formula (a).

(a)

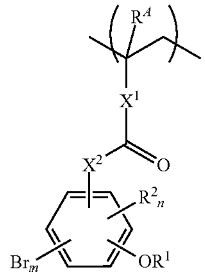

Herein $R^A$ is hydrogen or methyl, $R^1$ is hydrogen or an acid labile group, $R^2$ is a $C_1$-$C_6$ straight, branched or cyclic alkyl group or halogen other than bromine, $X^1$ is a single bond, phenylene group, or a $C_1$-$C_{12}$ straight, branched or cyclic alkylene group which may contain an ester moiety or lactone ring, $X^2$ is —O—, —O—$CH_2$— or —NH—, m is an integer of 1 to 4, preferably 2 to 4, and n is an integer of 0 to 3.

The polymer may further comprise recurring units having a group capable of polarity switch under the action of acid. The polarity switch under the action of acid takes place by elimination reaction.

Preferably the recurring units having a group capable of polarity switch under the action of acid have the formula (b1) or (b2).

(b1)

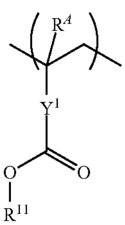

(b2)

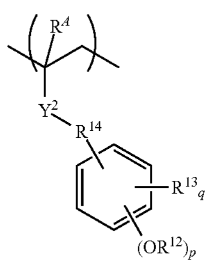

Herein $R^A$ is each independently hydrogen or methyl, $R^{11}$ and $R^{12}$ are each independently an acid labile group, $R^{13}$ is fluorine, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, $R^{14}$ is a single bond or a $C_1$-$C_6$ straight or branched alkylene group in which at least one carbon atom may be substituted by an ether or ester moiety, p is 1 or 2, q is an integer of 0 to 4, $Y^1$ is a single bond, phenylene group, naphthylene group, or a $C_1$-$C_{12}$ linking group which may contain an ester moiety, ether moiety or lactone ring, and $Y^2$ is a single bond, —C(═O)—O— or —C(═O)—NH—.

The polymer may further comprise recurring units having an adhesive group selected from among hydroxyl, carboxyl, lactone ring, carbonate, thiocarbonate, carbonyl, cyclic acetal, ether, ester, sulfonic acid ester, cyano, amide, and —O—C(═O)-G- wherein G is —S— or —NH—.

The polymer may further comprise recurring units of at least one type selected from the formulae (d1) to (d3).

(d1)

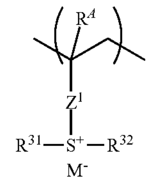

(d2)

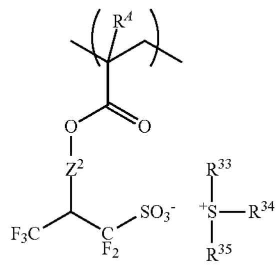

(d3)

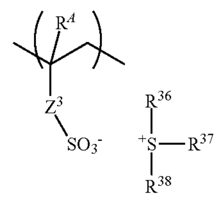

Herein $R^A$ is each independently hydrogen or methyl; $Z^1$ is a single bond, phenylene group, —O—$Z^{12}$—, or —C(═O)—$Z^{11}$—, $Z^{12}$—, $Z^{11}$ is —O— or —NH—, $Z^{12}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety; $R^{31}$ to $R^{38}$ are each independently a $C_1$-$C_{12}$ straight, branched or cyclic alkyl group which may contain a carbonyl, ester or ether moiety, or a $C_6$-$C_{12}$ aryl group or $C_7$-$C_{20}$ aralkyl group, in which at least one hydrogen may be substituted by a $C_1$-$C_{10}$ straight, branched or cyclic alkyl moiety, halogen, trifluoromethyl, cyano, nitro, hydroxyl, mercapto, $C_1$-$C_{10}$ straight, branched or cyclic alkoxy moiety, $C_2$-$C_{10}$ straight, branched or cyclic alkoxycarbonyl moiety, or $C_2$-$C_{10}$ straight, branched or cyclic acyloxy moiety; $Z^2$ is a single bond, a $C_1$-$C_{12}$ straight, branched or cyclic alkylene group or $C_2$-$C_{12}$ straight, branched or cyclic alkenylene group which may contain an ether moiety, ester moiety or lactone ring, or $C_6$-$C_{10}$ arylene group; $Z^3$ is a single bond, methylene, ethylene, phenylene, fluorinated phenylene, —O—$Z^{32}$—, or —C(═O)—$Z^{31}$-$Z^{32}$—, $Z^{31}$ is —O— or —NH—, $Z^{32}$ is a straight, branched or cyclic $C_1$-$C_{12}$ alkylene or $C_2$-$C_{12}$ alkenylene group which may contain a carbonyl, ester or ether moiety, or phenylene group, in which at least one hydrogen atom may be substituted by fluorine or hydroxyl; and $M^-$ is a non-nucleophilic counter ion.

The resist composition may further comprise an organic solvent, acid generator, basic compound, and/or surfactant.

In another aspect, the invention provides a process for forming a pattern comprising the steps of applying the resist composition defined above onto a substrate, baking to form a resist film, exposing the resist film to high-energy radiation, and developing the exposed film in a developer.

Typically, the high-energy radiation is i-line, KrF excimer laser, ArF excimer laser, EB or EUV of wavelength 3 to 15 nm.

Advantageous Effects of Invention

The resist composition of the invention exhibits a high sensitivity, high acid diffusion-suppressing effect, and high resolution, and forms a pattern of good profile, dimensional uniformity, and reduced edge roughness after exposure. The resist composition is thus suited as fine pattern-forming material for the fabrication of VLSIs and the fabrication of photomasks by EB writing, and pattern forming material by i-line, KrF excimer laser, ArF excimer laser, EB or EUV lithography.

The resist composition, especially chemically amplified resist composition is used not only in the lithography for semiconductor circuit formation, but also in the formation of mask circuit patterns, micro-machines, and thin-film magnetic head circuits.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "brominated" compound means a bromine-containing compound. In chemical formulae, Me stands for methyl, and Ac for acetyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition Base Resin The resist composition of the invention is defined as comprising a polymer comprising recurring units having the formula (a) as a base resin. For simplicity's sake, the units are referred to as recurring units (a) and the polymer is referred to as polymer A.

(a)

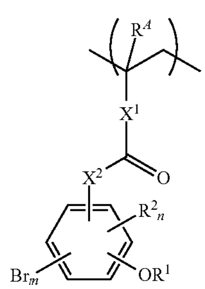

Herein $R^A$ is hydrogen or methyl. $R^1$ is hydrogen or an acid labile group. $R^2$ is a $C_1$-$C_6$ straight, branched or cyclic alkyl group or a halogen atom other than bromine. $X^1$ is a single bond, phenylene group, or a $C_1$-$C_{12}$ straight, branched or cyclic alkylene group which may contain an ester moiety or lactone ring. $X^2$ is —O—, —O—$CH_2$— or —NH—, m is an integer of 1 to 4, and n is an integer of 0 to 3.

Suitable monomers Ma from which recurring units (a) are derived are those having the formula (Ma).

(Ma)

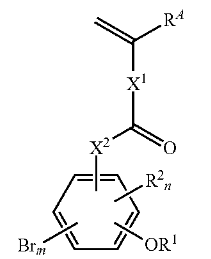

Herein $R^A$, $R^1$, $R^2$, $X^1$, $X^2$, m and n are as defined above.

Monomer Ma may be synthesized, for example, by reacting a compound having the formula (Ma1) with a compound having the formula (Ma2).

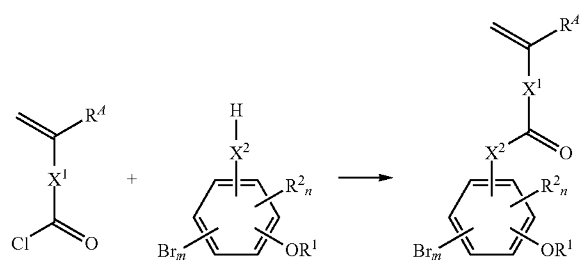

(Ma1) (Ma2) (Ma)

Herein $R^A$, $R^1$, $R^2$, $X^1$, $X^2$, m and n are as defined above.

Examples of the monomer Ma are shown below, but not limited thereto. $R^A$ and $R^1$ are as defined above.

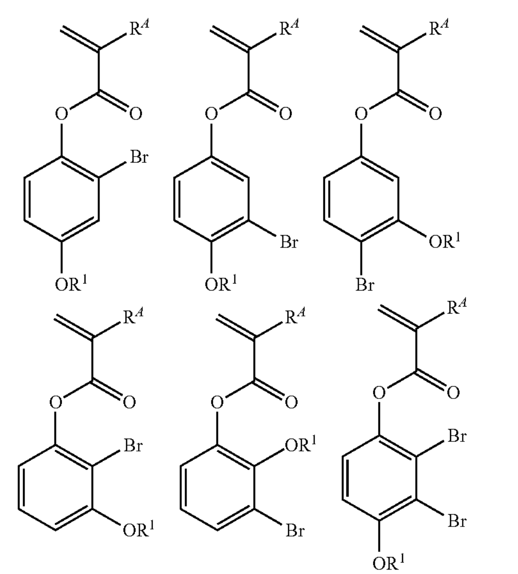

-continued
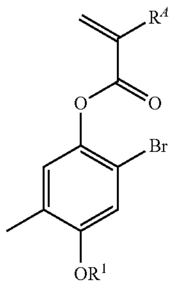
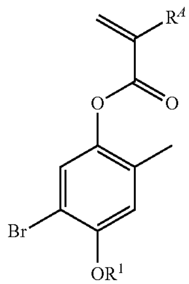
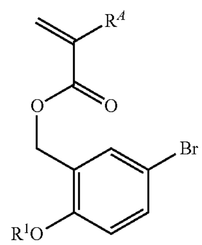
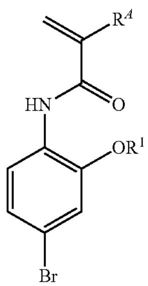
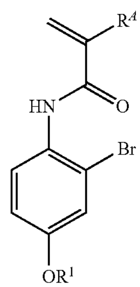
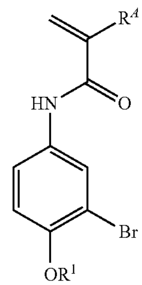
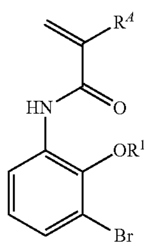
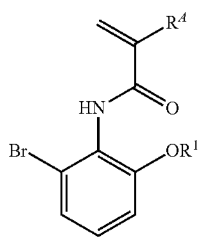
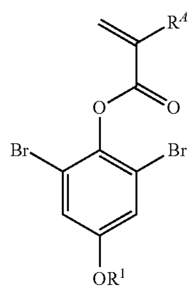
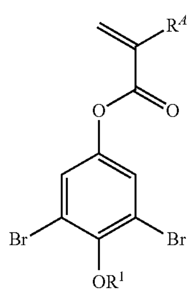
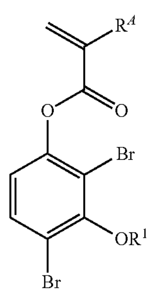
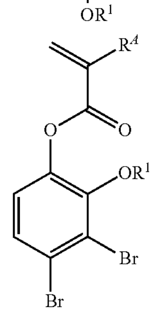
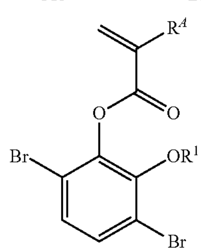
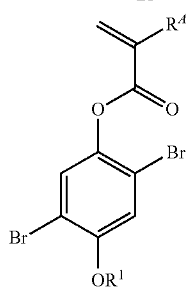
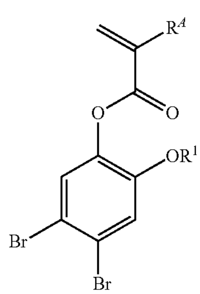
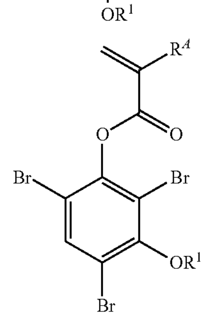
-continued
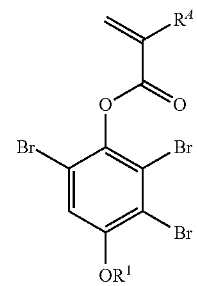
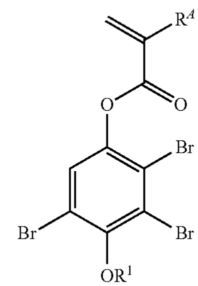
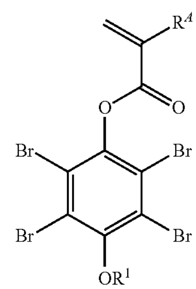
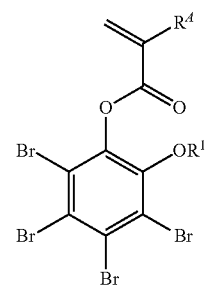
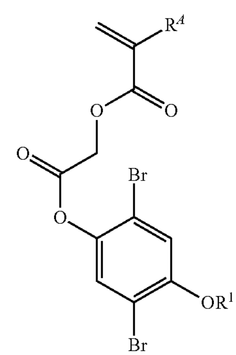
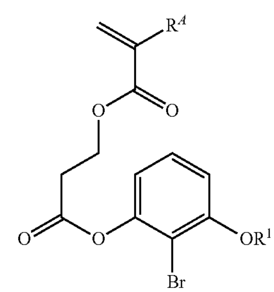
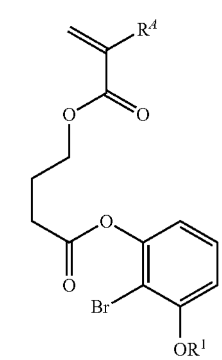
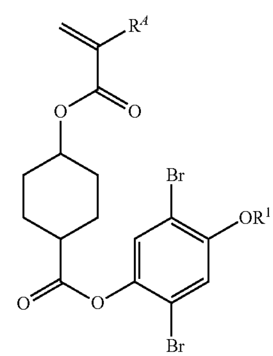
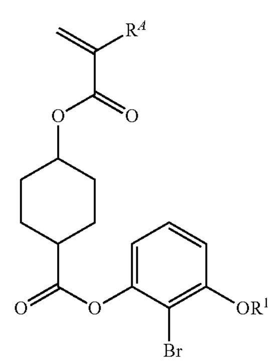
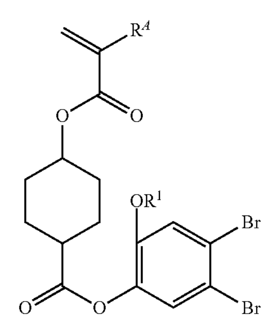

-continued
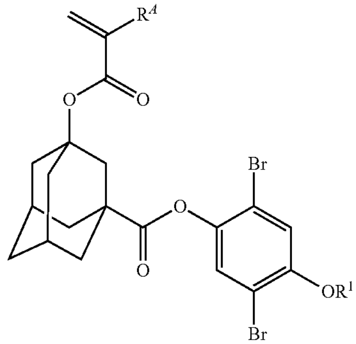
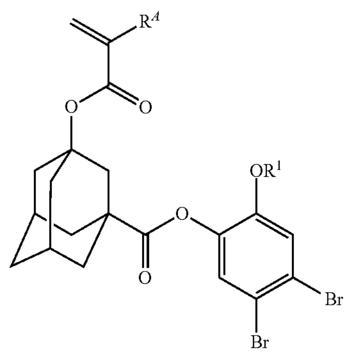
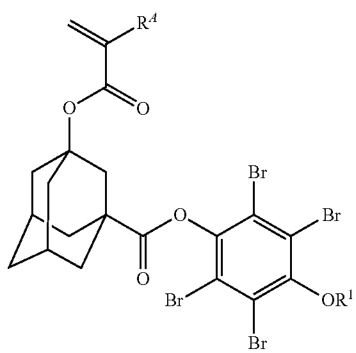
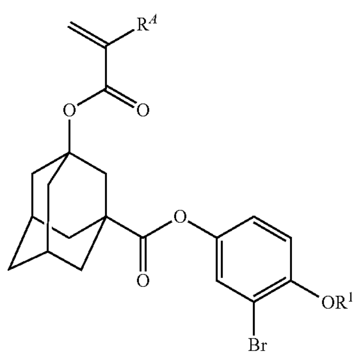
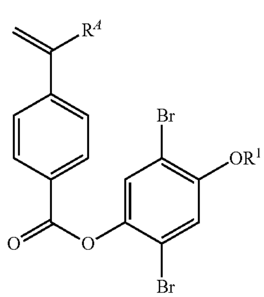
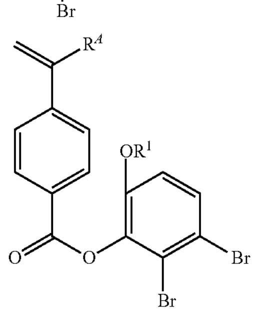
-continued
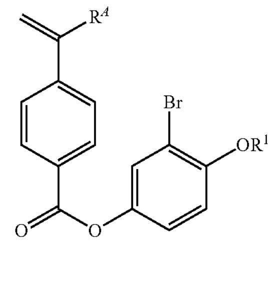
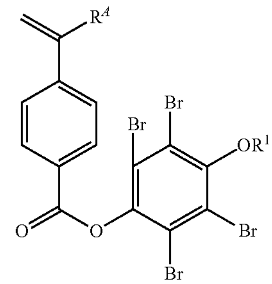
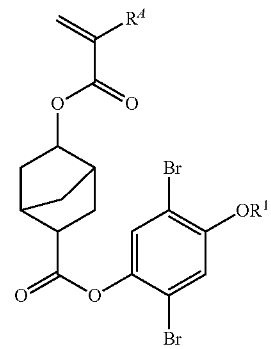
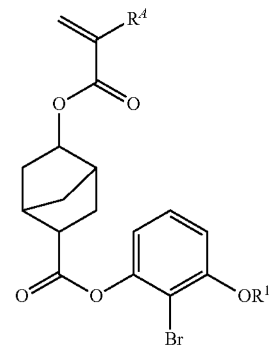
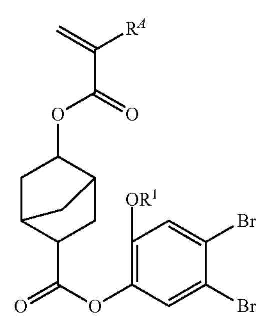
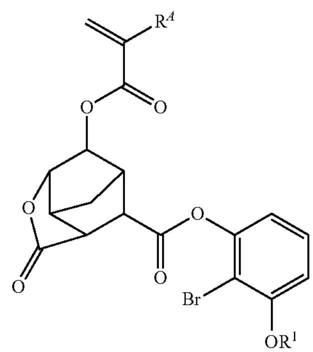
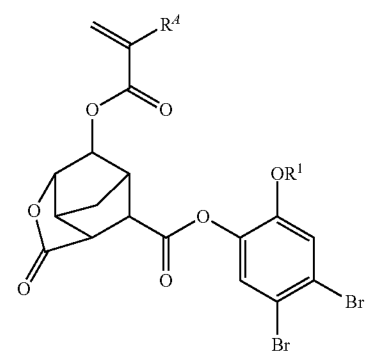
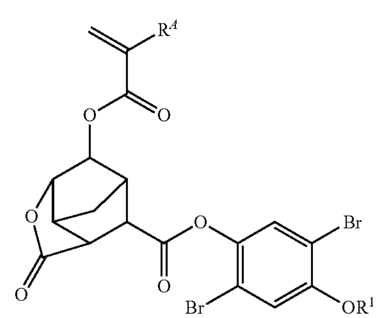

-continued

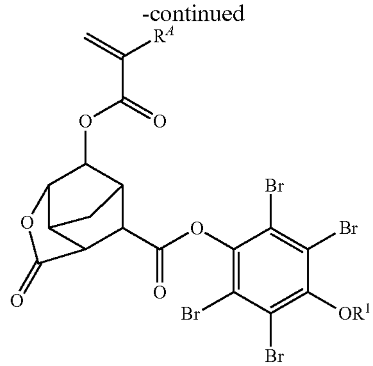

The recurring unit (a) is characterized by inclusion of a substituted or unsubstituted brominated phenol. In the case of unsubstituted brominated phenol, sensitivity is improved by the release of secondary electrons from bromine and phenol upon EB or EUV exposure. In the case of acid labile group-substituted brominated phenol, the acidity of phenol is enhanced by not only the release of secondary electrons from bromine upon exposure, but also the electron-withdrawing effect of bromine, whereby the alkaline dissolution rate during development is increased, achieving a high dissolution contrast. This leads to a high sensitivity and enables to form a pattern with satisfactory dimensional uniformity (CDU) and edge roughness (LWR).

Polymer A may further comprise recurring units having a group capable of polarity switch under the action of acid. These units are referred to as recurring units (b). Suitable recurring units (b) include units containing a carboxyl or phenolic hydroxyl group substituted with an acid labile group. The preferred recurring units (b) are recurring units having the formula (b1) and/or recurring units having the formula (b2). These units are referred to as recurring units (b1) and (b2), respectively. When recurring units (b1) and/or (b2) are incorporated, the resist composition may be used as a positive tone resist composition forming a positive pattern via aqueous alkaline development or a negative tone resist composition forming a negative pattern via organic solvent development.

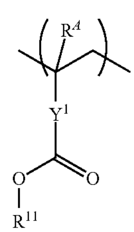

(b1)

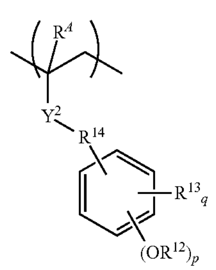

(b2)

Herein $R^A$ is each independently hydrogen or methyl. $R^{11}$ and $R^{12}$ are each independently an acid labile group. $R^{13}$ is fluorine, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group. $R^{14}$ is a single bond or a $C_1$-$C_6$ straight or branched alkylene group in which at least one carbon atom may be substituted by an ether or ester moiety, p is 1 or 2, and q is an integer of 0 to 4. $Y^1$ is a single bond, phenylene group, naphthylene group, or a $C_1$-$C_{12}$ linking group which may contain an ester moiety, ether moiety or lactone ring. $Y^2$ is a single bond, —C(═O)—O— or —C(═O)—NH—.

Suitable monomers Mb1 from which recurring units (b1) are derived are those having the formula (Mb1). Suitable monomers Mb2 from which recurring units (b2) are derived are those having the formula (Mb2).

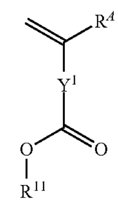

(Mb1)

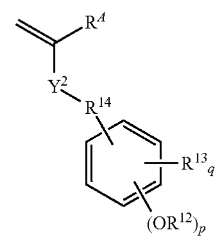

(Mb2)

Herein $R^A$, $R^{11}$ to $R^{14}$, $Y^1$, $Y^2$, p and q are as defined above.

Examples of the monomer Mb1 are shown below, but not limited thereto. $R^A$ and $R^{11}$ are as defined above.

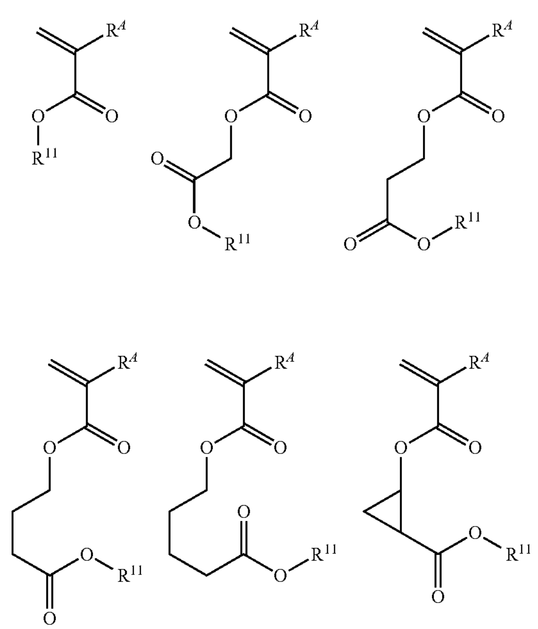

-continued
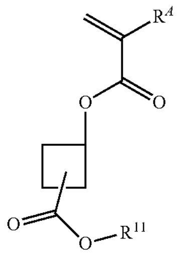
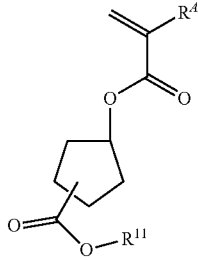
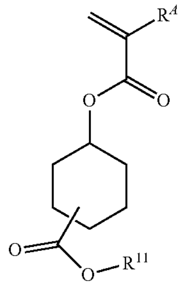
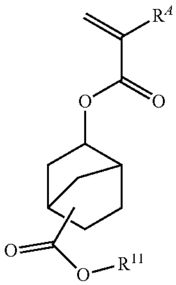
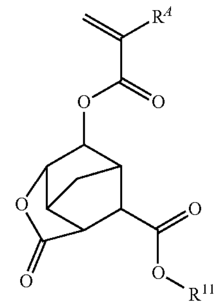
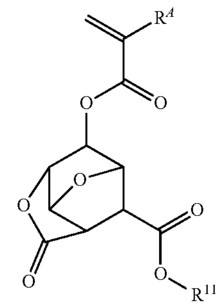
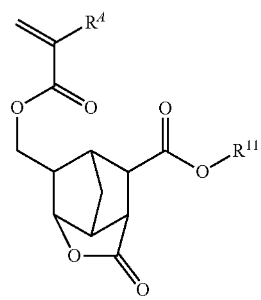
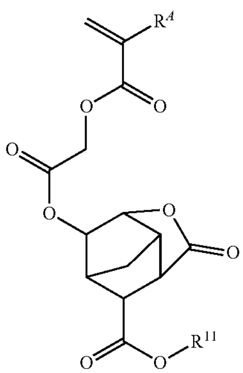
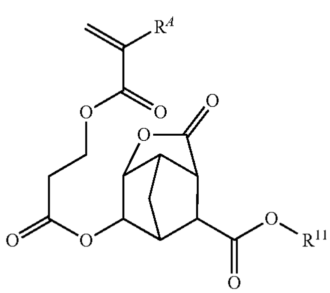
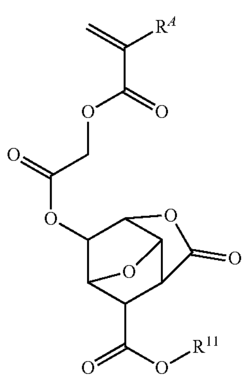
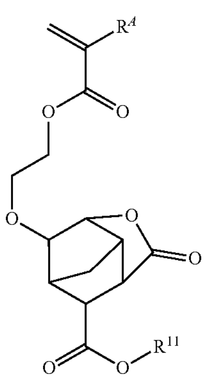
-continued
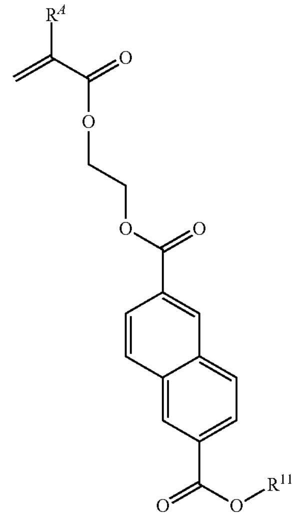
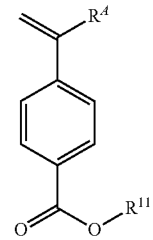
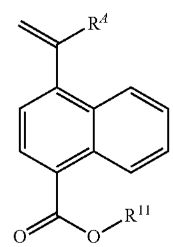
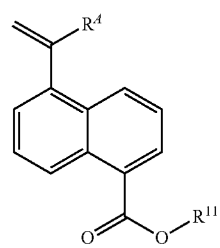
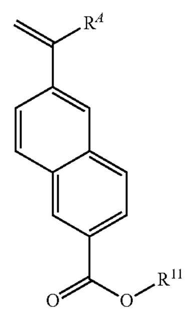
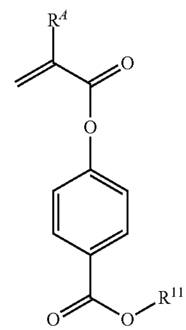
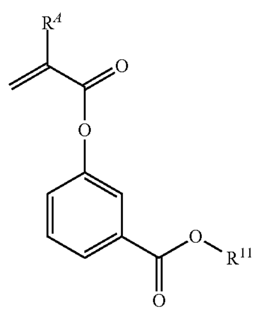
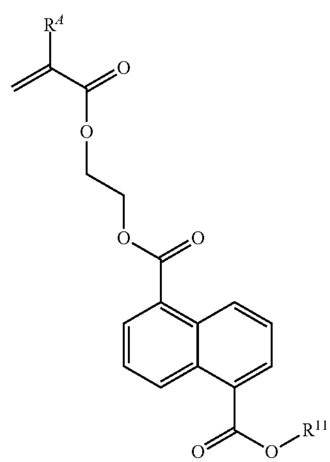

-continued
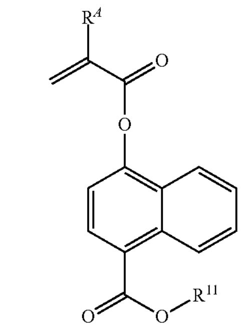
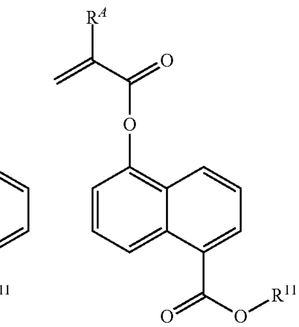
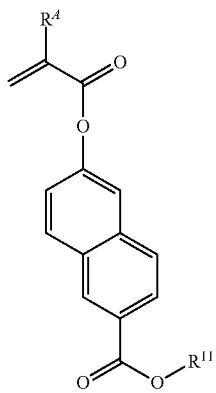
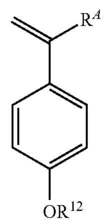
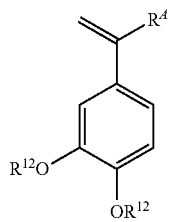
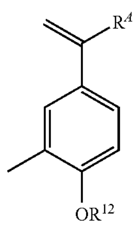
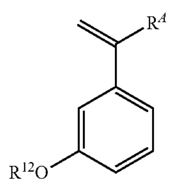
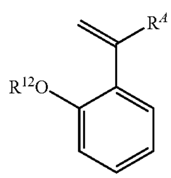
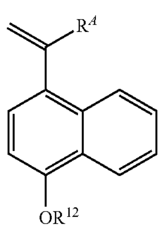
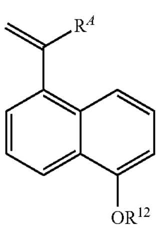
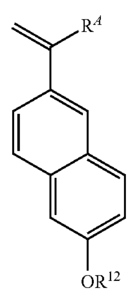
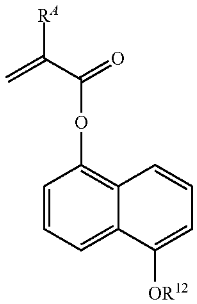
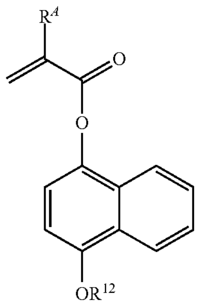
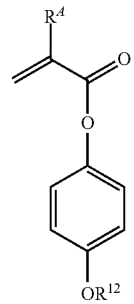
-continued
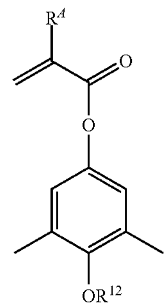
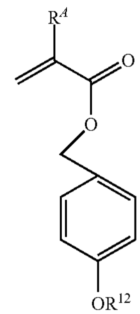
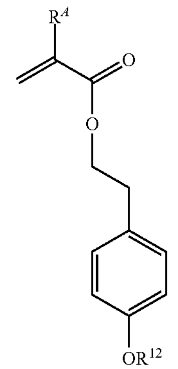
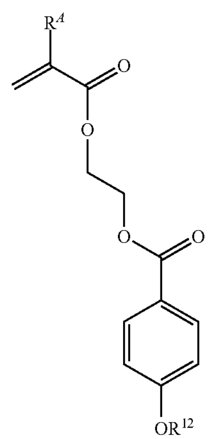
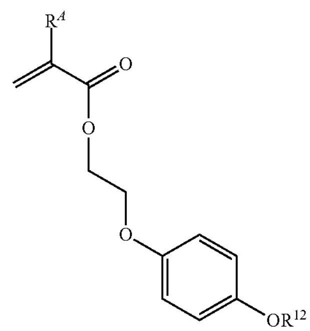
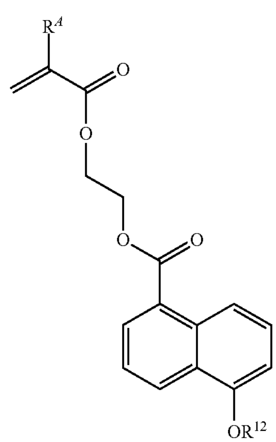
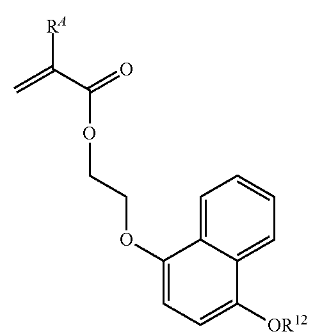
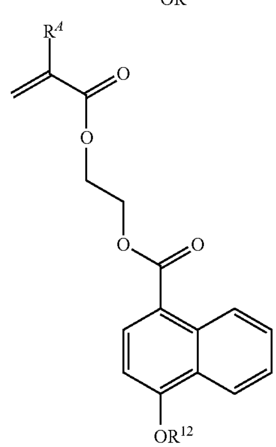
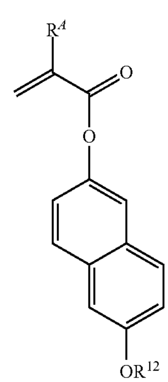

-continued

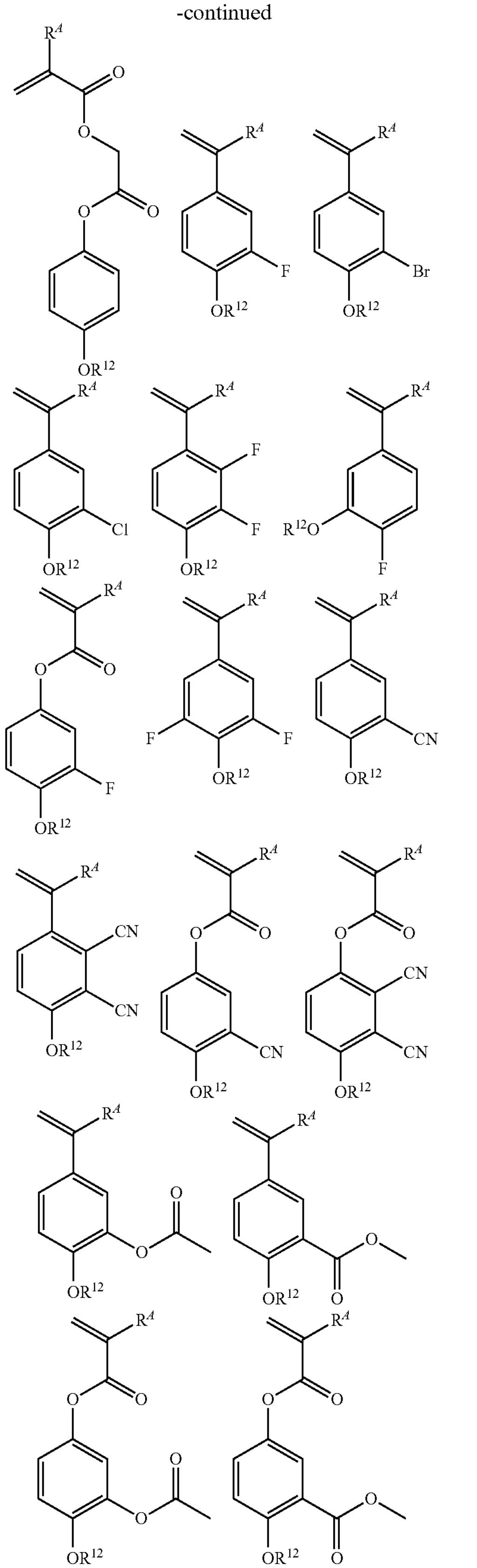

Examples of the monomer Mb2 are shown below, but not limited thereto. $R^A$ and $R^{12}$ are as defined above.

The acid labile groups represented by $R^1$ in formula (Ma), $R^{11}$ in formula (Mb1) and $R^{12}$ in formula (Mb2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

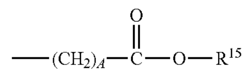

(AL-2)

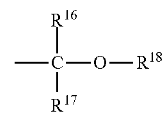

(AL-3)

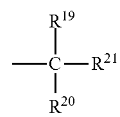

In formulae (AL-1) and (AL-2), $R^{15}$ and $R^{18}$ are each independently a monovalent hydrocarbon group of 1 to 40 carbon atoms, preferably 1 to 20 carbon atoms, typically straight, branched or cyclic alkyl, which may contain a heteroatom such as oxygen, sulfur, nitrogen or fluorine. $R^{16}$ and $R^{17}$ are each independently hydrogen or a monovalent hydrocarbon group of 1 to 20 carbon atoms, typically straight, branched or cyclic alkyl, which may contain a heteroatom such as oxygen, sulfur, nitrogen or fluorine. Any two of $R^{16}$, $R^{17}$ and $R^{18}$ may bond together to form a ring, typically alicyclic, with the carbon atom or carbon and oxygen atoms to which they are attached, the ring containing 3 to 20 carbon atoms, preferably 4 to 16 carbon atoms. A is an integer of 0 to 10, especially 1 to 5.

In formula (AL-3), $R^{19}$, $R^{20}$ and $R^{21}$ are each independently a monovalent hydrocarbon group of 1 to 20 carbon atoms, typically straight, branched or cyclic alkyl, which may contain a heteroatom such as oxygen, sulfur, nitrogen or fluorine. Any two of $R^{19}$, $R^{20}$ and $R^{21}$ may bond together to form a ring, typically alicyclic, with the carbon atom to which they are attached, the ring containing 3 to 20 carbon atoms, preferably 4 to 16 carbon atoms.

Further polymer A may contain recurring units capable of turning from hydrophilic to hydrophobic via dehydration reaction with the aid of acid, as the recurring unit (b). These units are referred to as recurring units (b3). When recurring units (b3) are incorporated, the resist composition may be used as a negative tone resist composition forming a negative pattern via aqueous alkaline development.

Examples of the monomer Mb3 from which recurring units (b3) are derived are shown below, but not limited thereto. Herein $R^A$ is hydrogen or methyl.

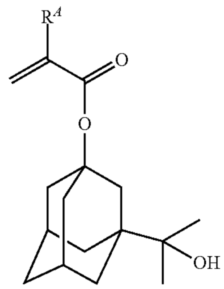
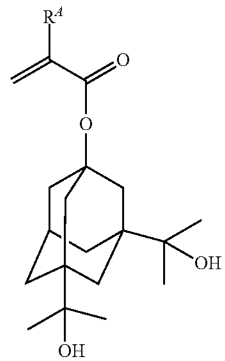
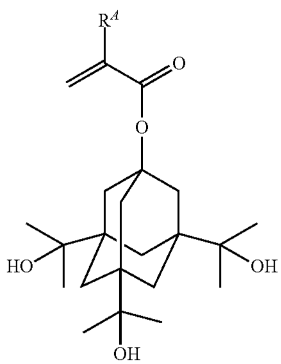
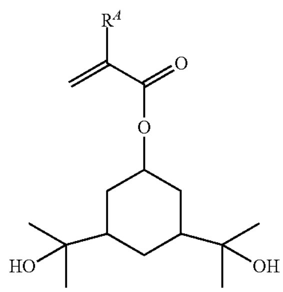
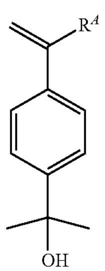
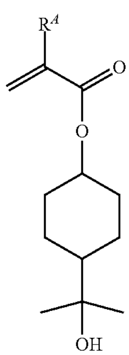
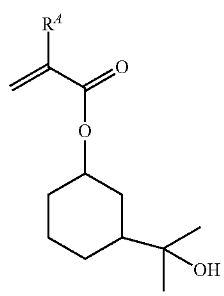
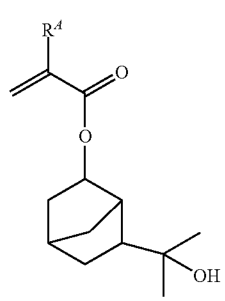
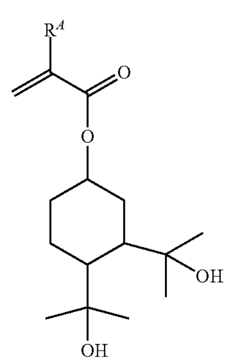

-continued

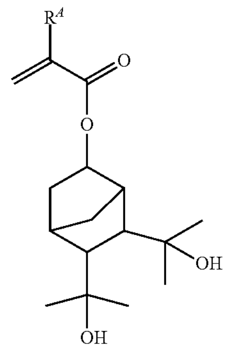
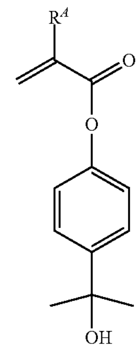
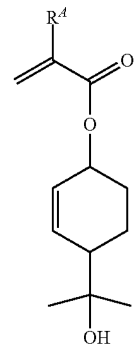
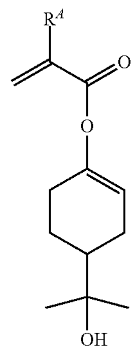
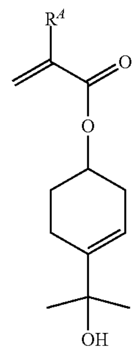
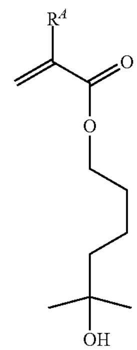

Polymer A may further comprise recurring units having an adhesive group. These units are referred to as recurring unit (c). The adhesive group is selected from among hydroxyl, carboxyl, lactone ring, carbonate, thiocarbonate, carbonyl, cyclic acetal, ether, ester, sulfonic acid ester, cyano, amide, and —O—C(═O)-G- wherein G is —S— or —NH—. Examples of suitable monomers from which recurring units (c) are derived are given below, but not limited thereto. Herein $R^A$ is as defined above.

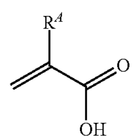
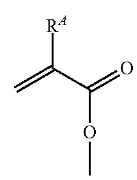
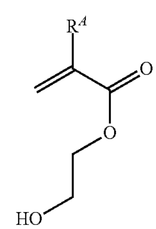
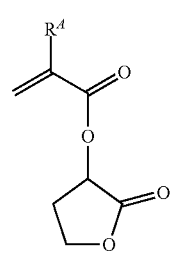
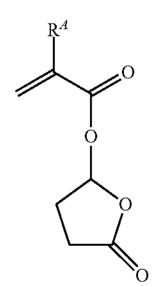
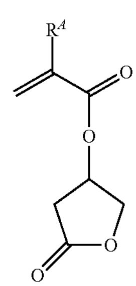

-continued
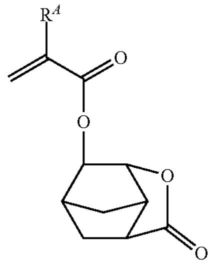
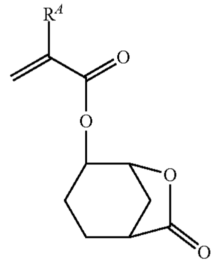
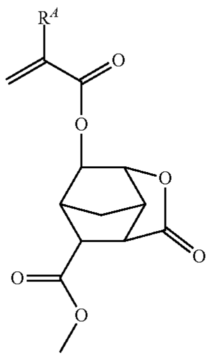
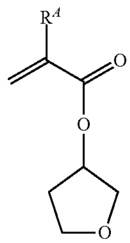
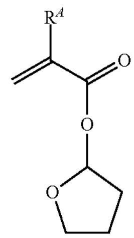
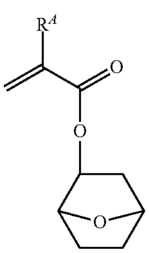
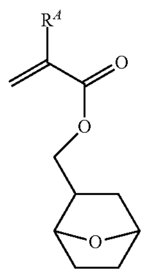
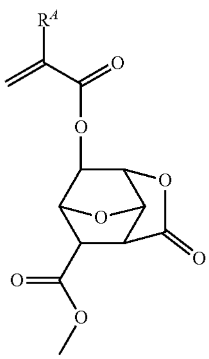
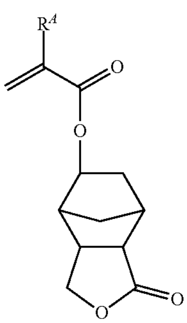
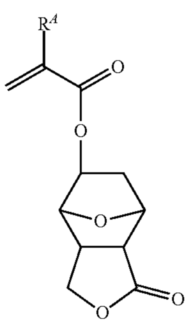
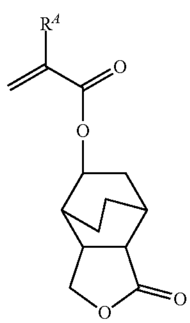
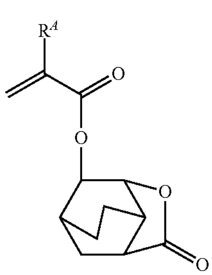
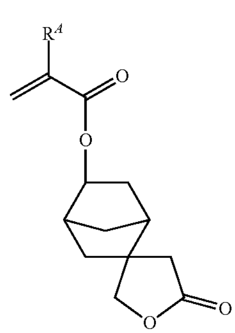
-continued
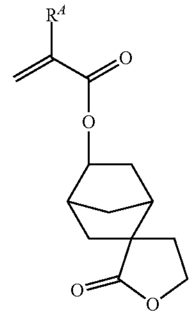
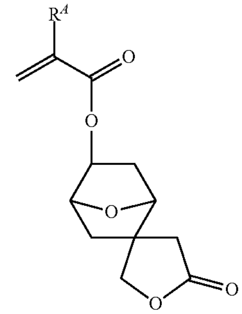
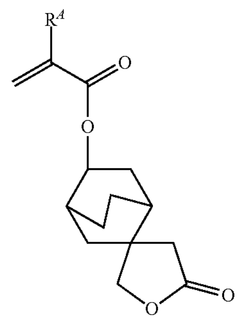
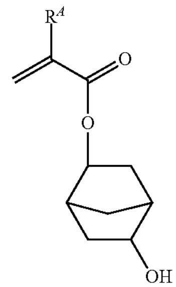
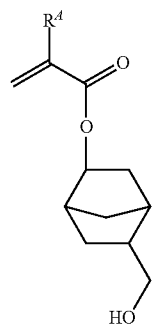
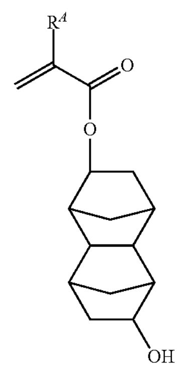
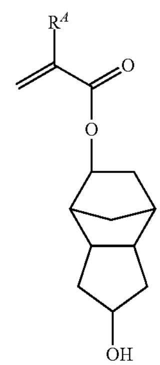
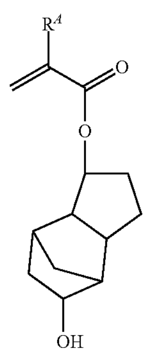
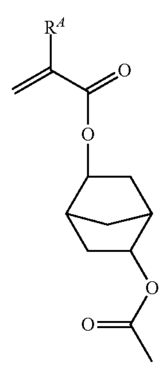
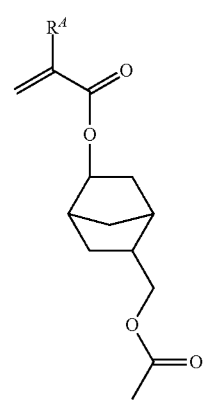

-continued
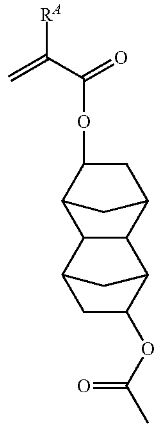
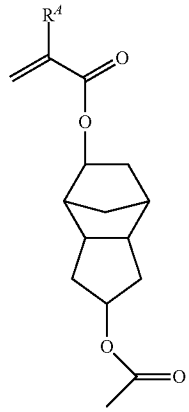
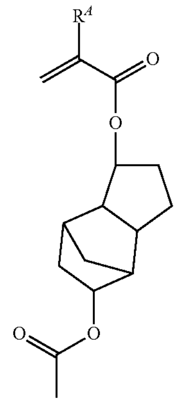
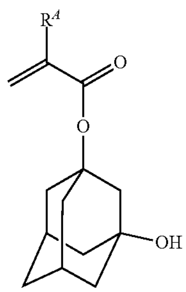
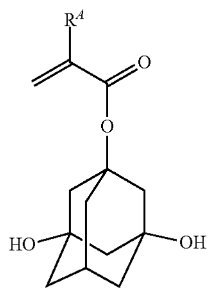
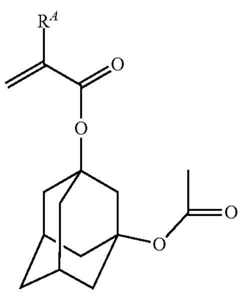
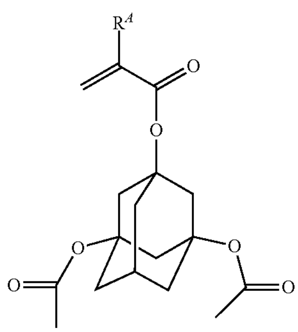
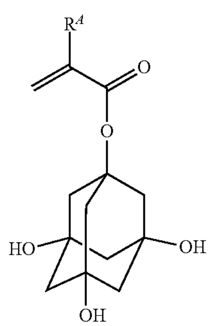
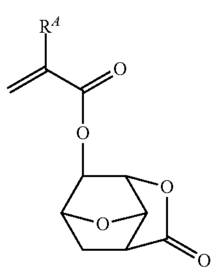
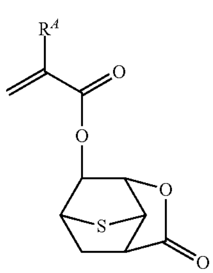
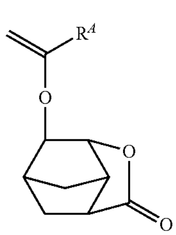
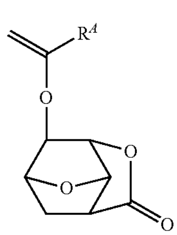
-continued
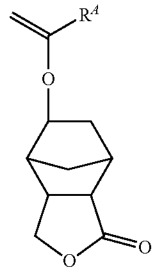
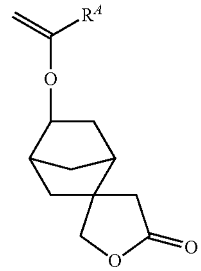
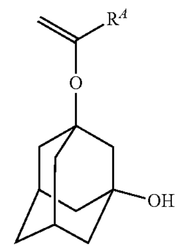
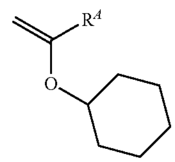
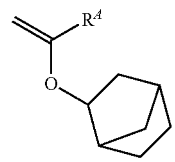
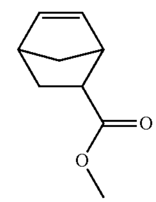
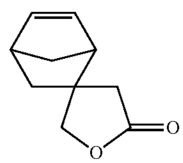
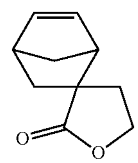
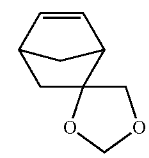
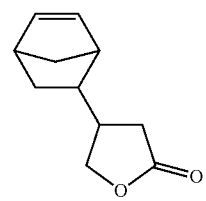
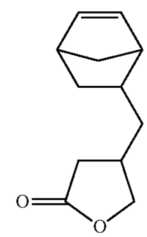
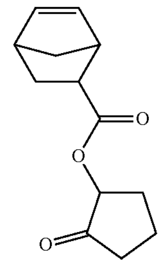
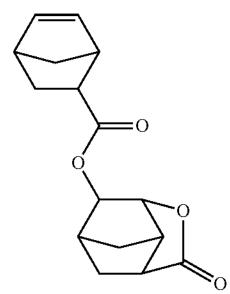
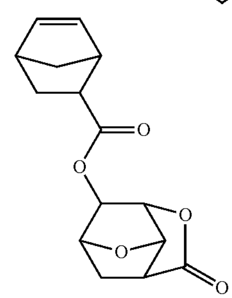
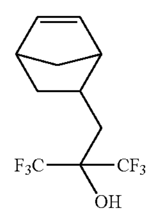
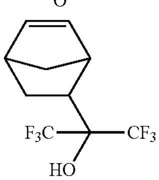
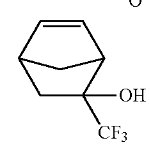
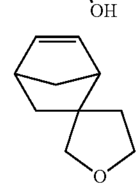
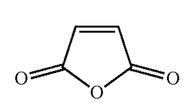
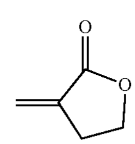
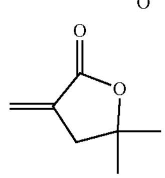
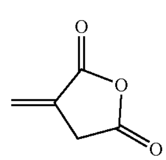
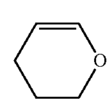
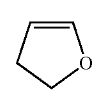

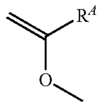
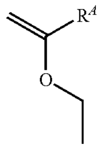
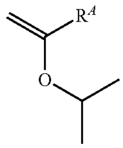
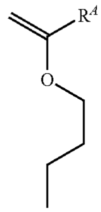
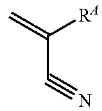
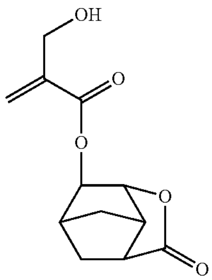
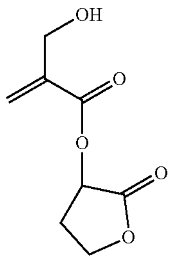
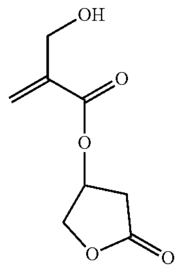
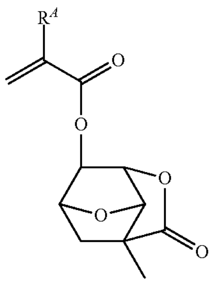
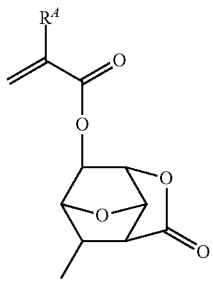
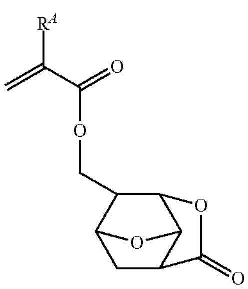
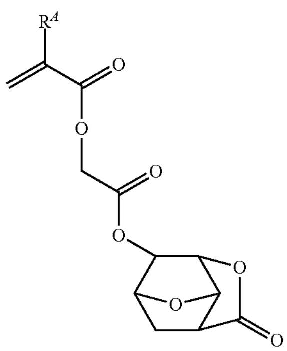
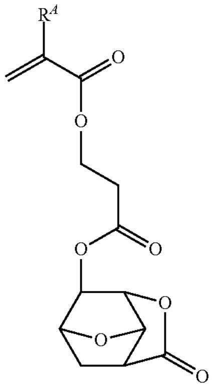
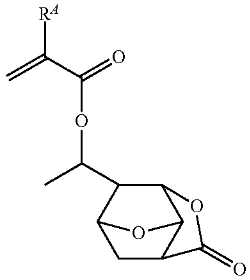
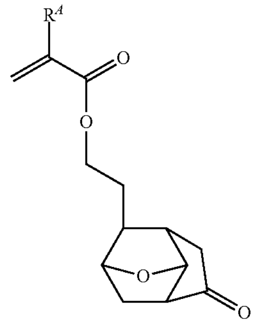
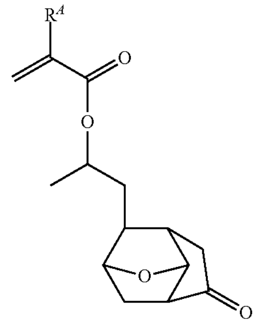
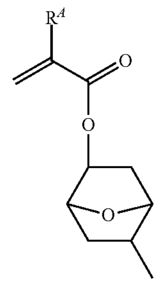
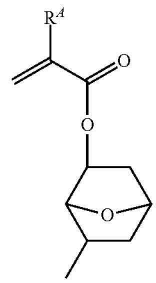
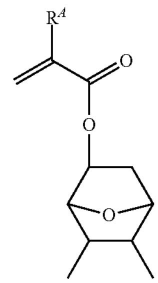
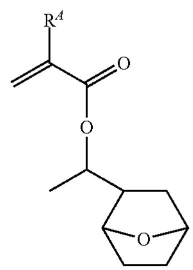
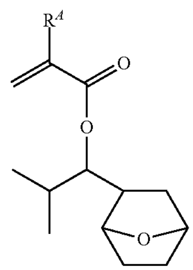
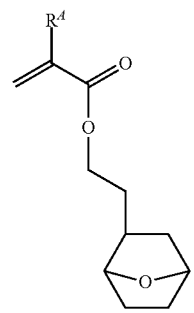
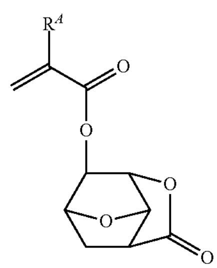
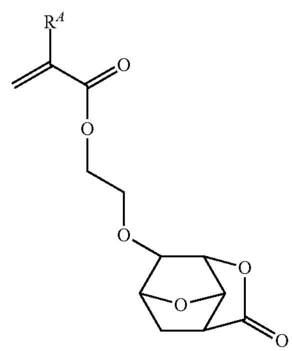
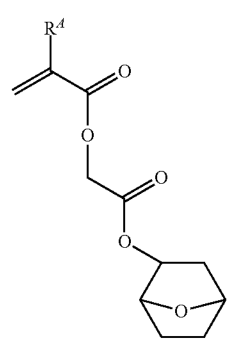
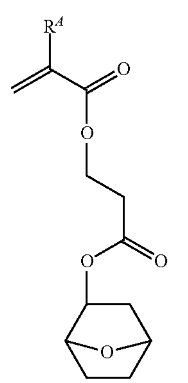

-continued
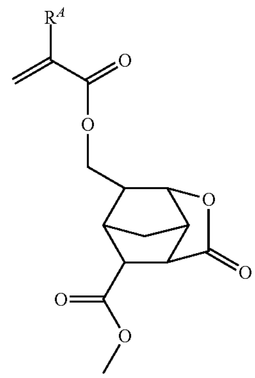
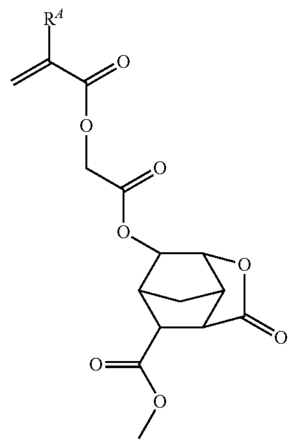
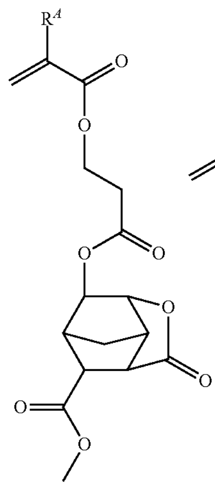
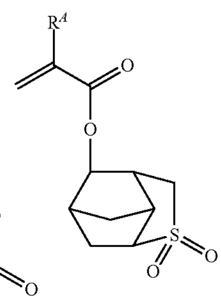
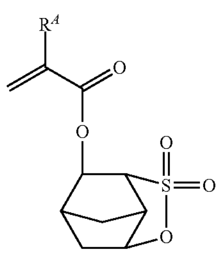
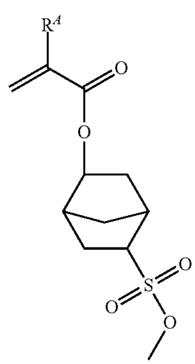
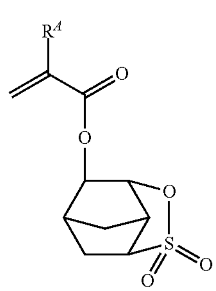
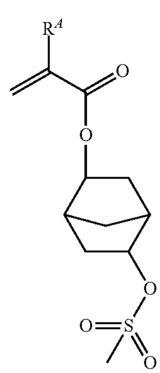
-continued
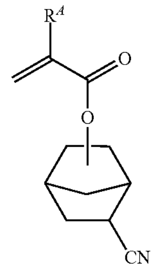
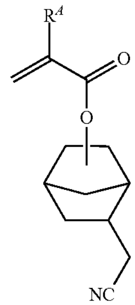
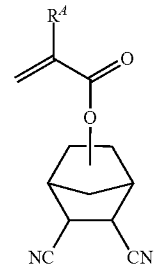
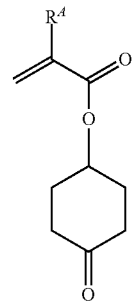
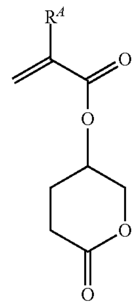
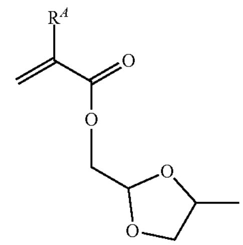
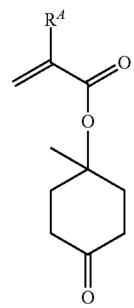
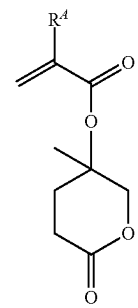
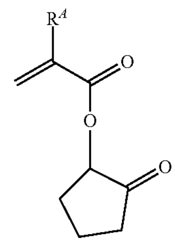
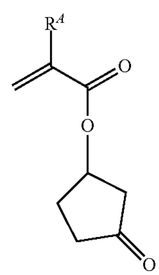
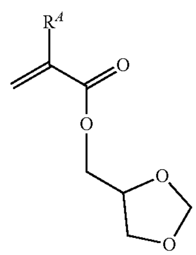
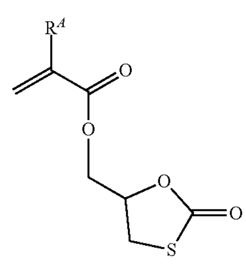
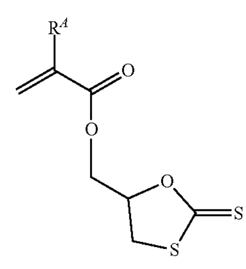
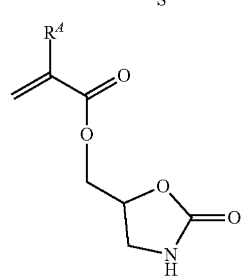
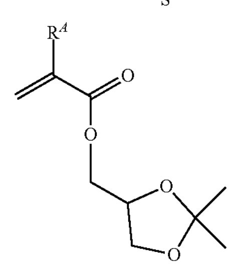

-continued
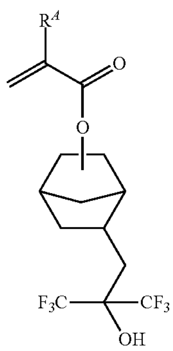 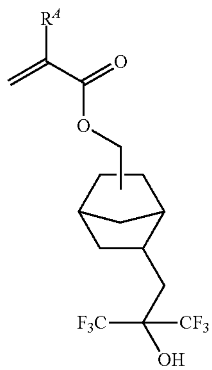
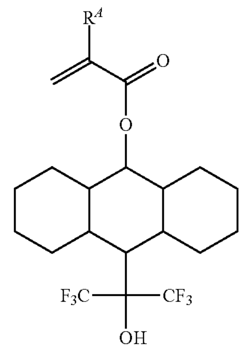 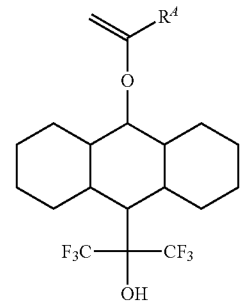
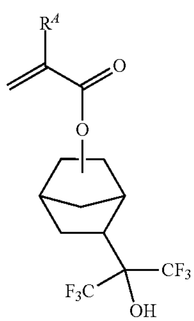 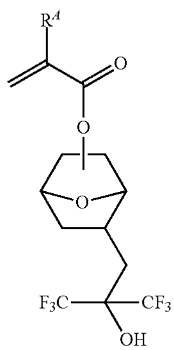 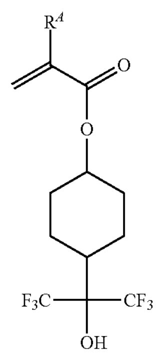
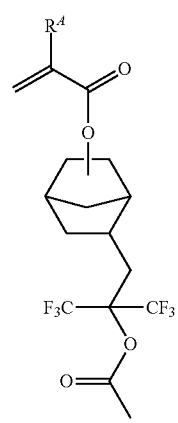 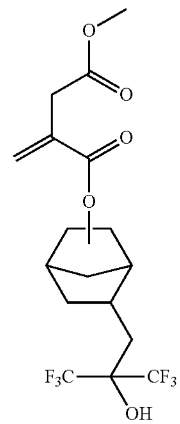 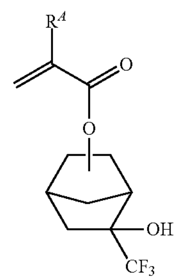
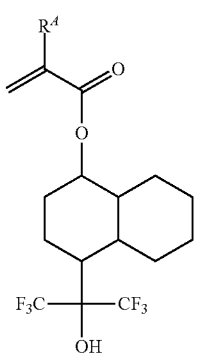 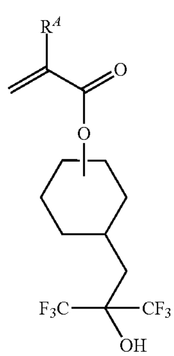 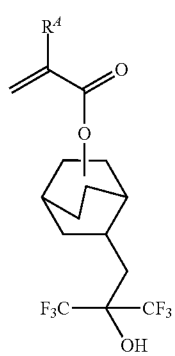
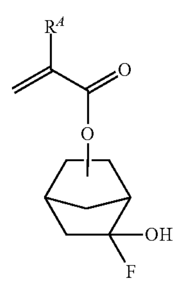 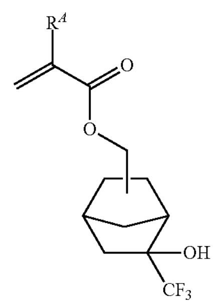
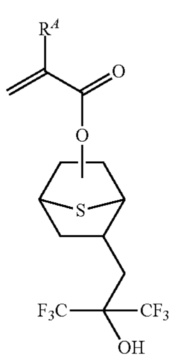 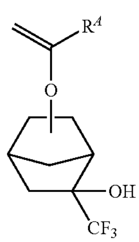 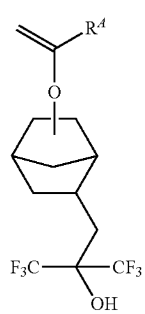
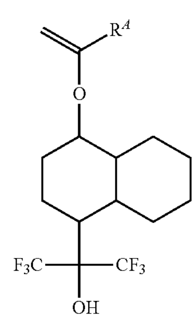 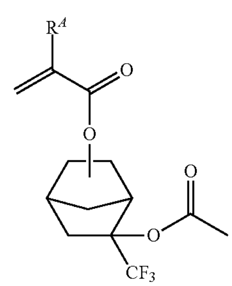

-continued
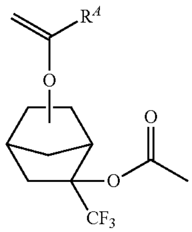
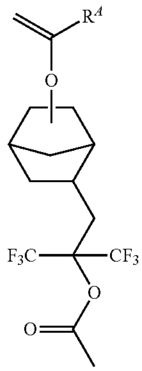
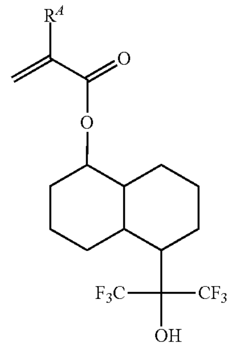
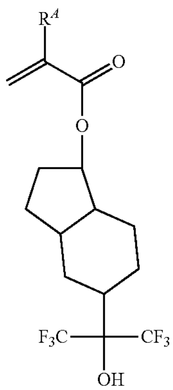
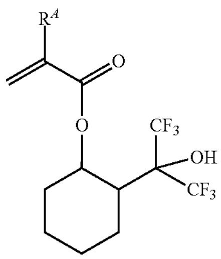
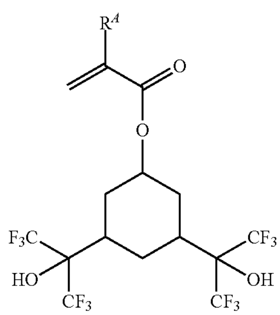
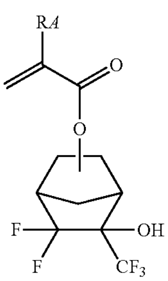
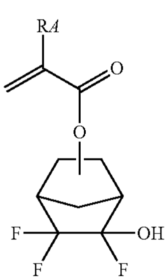
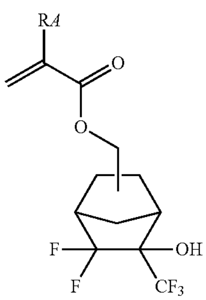
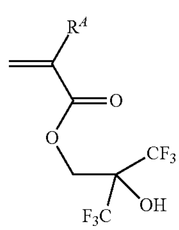
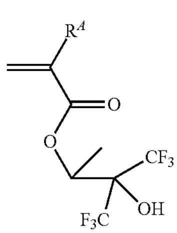
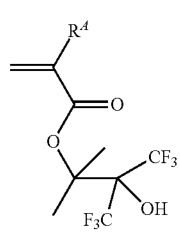
-continued
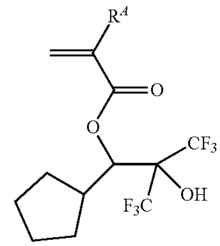
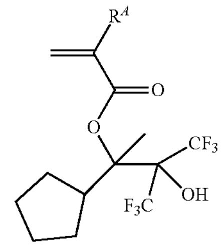
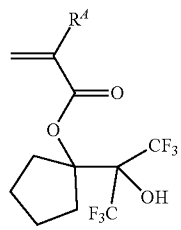
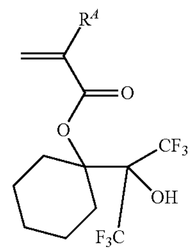
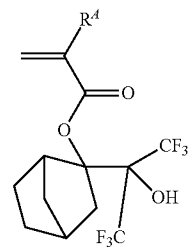
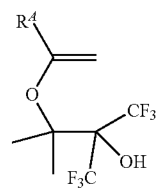
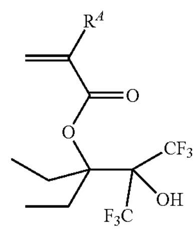
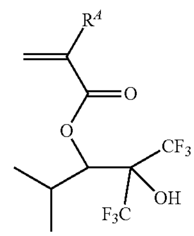
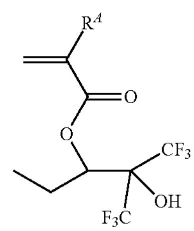
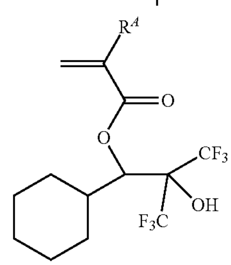
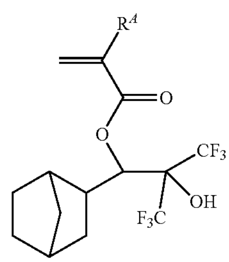
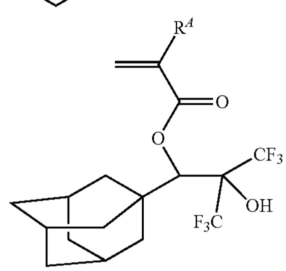
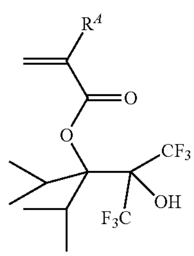
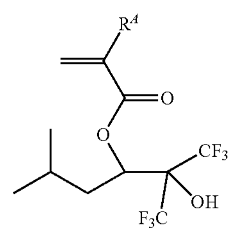
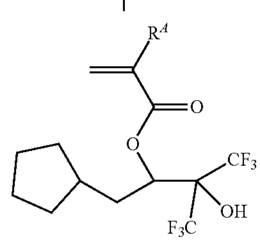
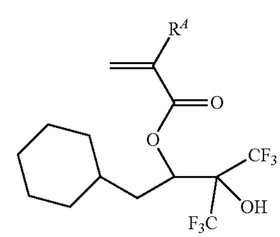

-continued
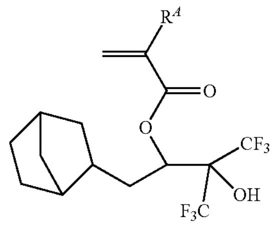
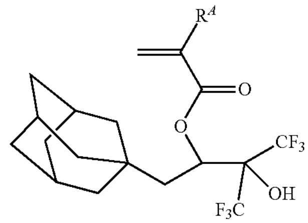
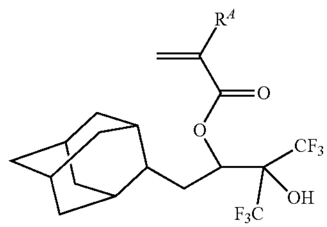
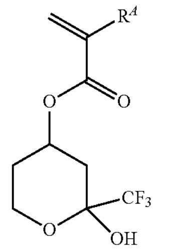
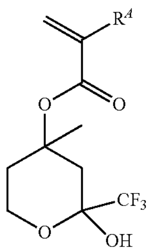
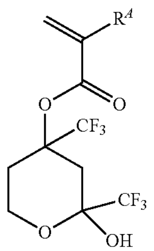
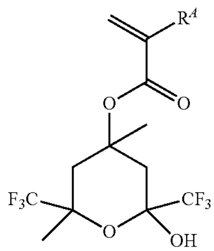
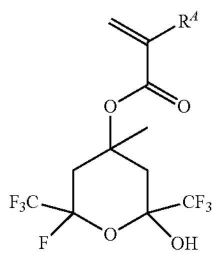
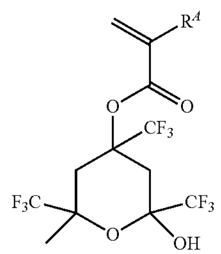
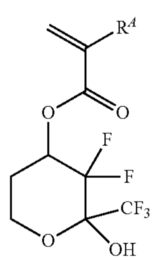
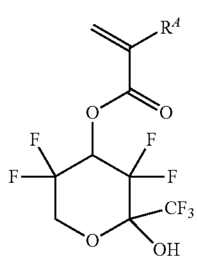
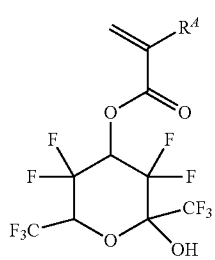
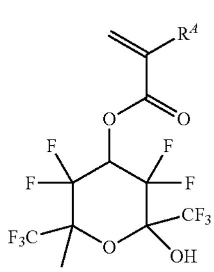
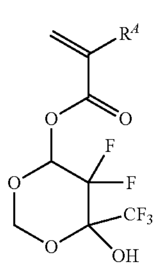
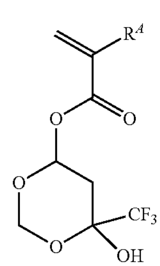
-continued
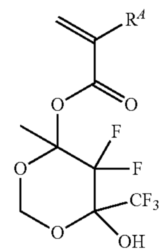
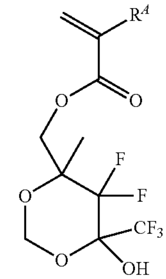
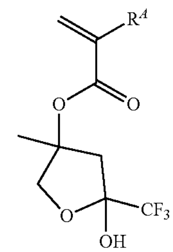
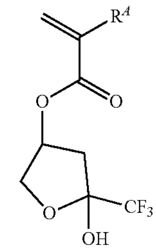
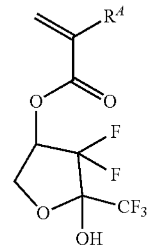
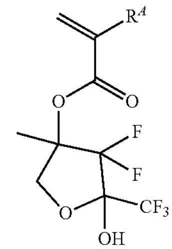
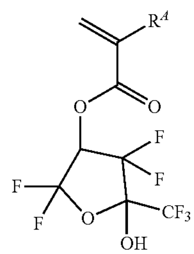
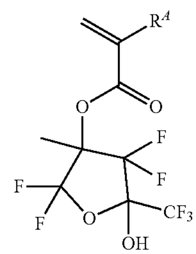
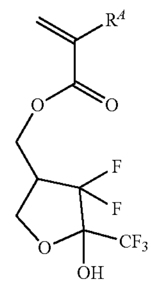
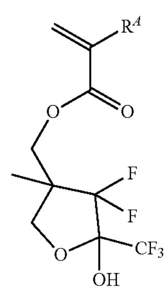
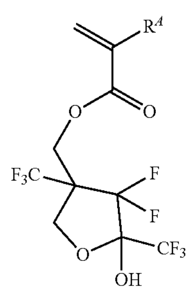
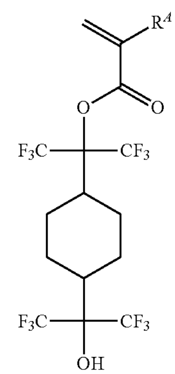
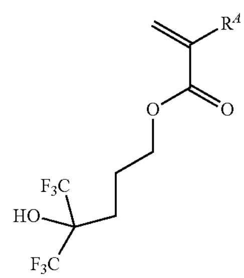
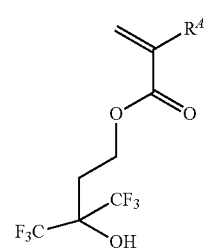
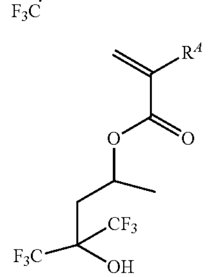
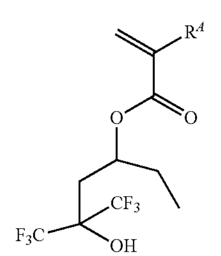

-continued
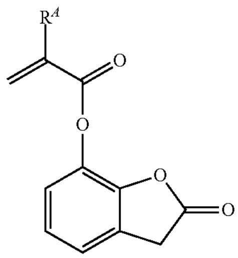
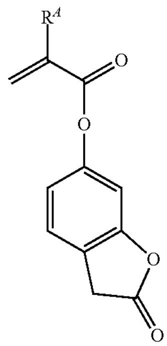
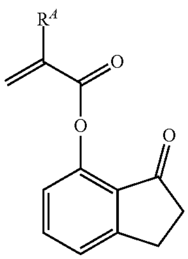
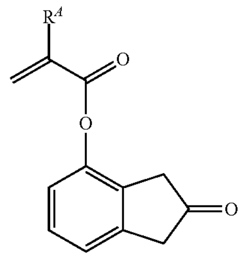
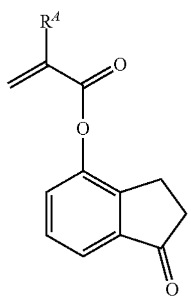
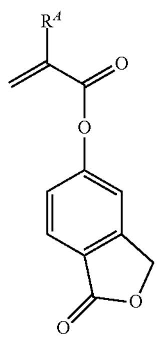
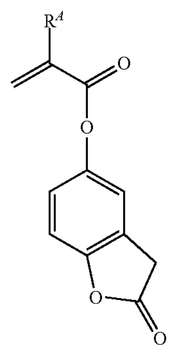
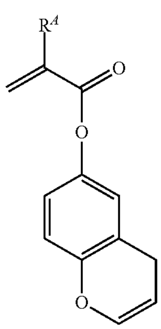
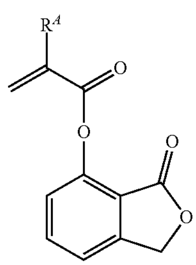
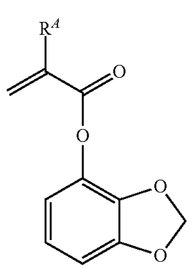
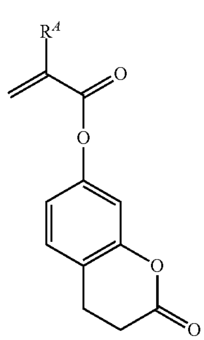
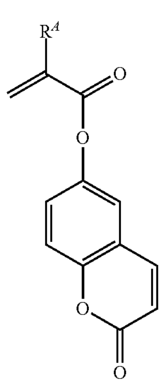
-continued
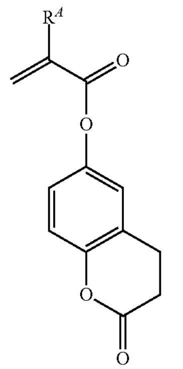
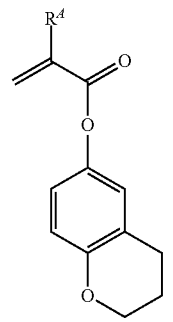
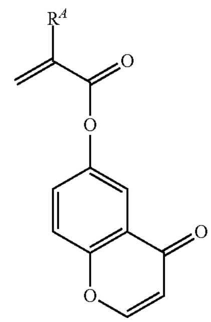
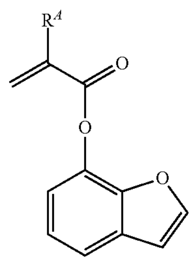
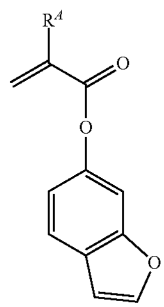
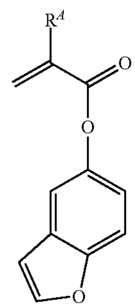
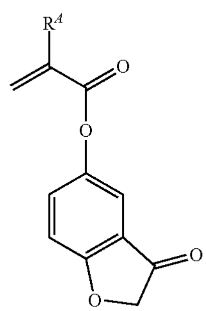
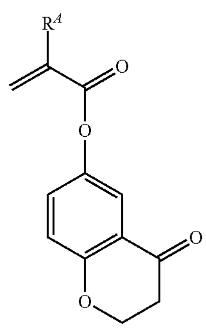
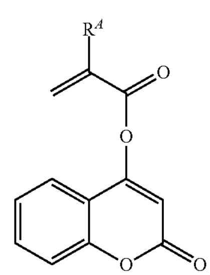
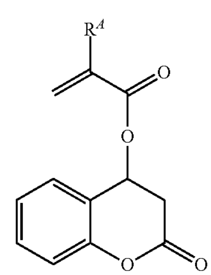
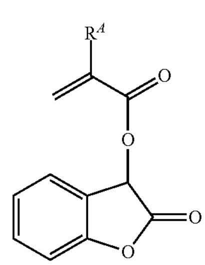
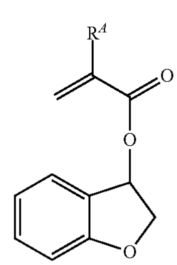
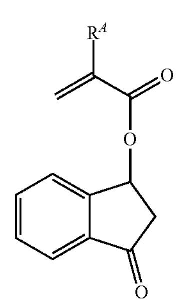

-continued
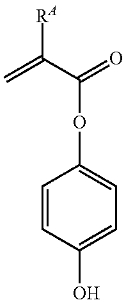
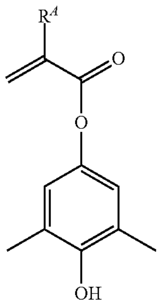
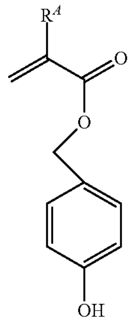
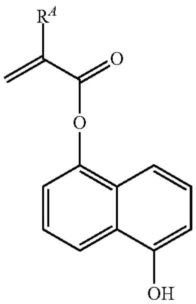
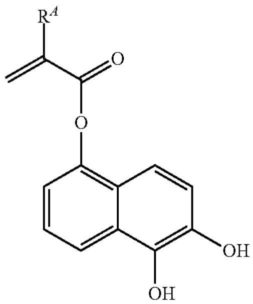
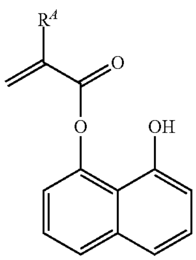
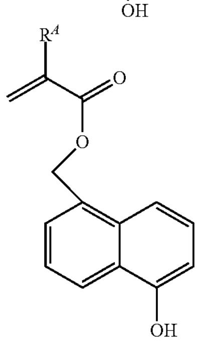
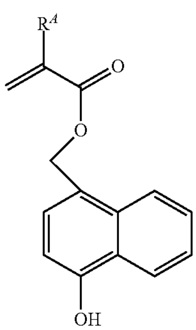
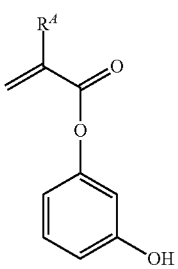
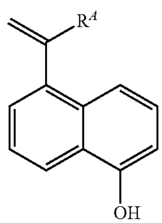
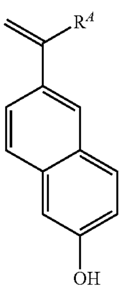
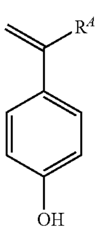
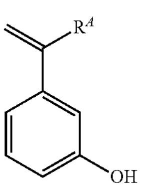
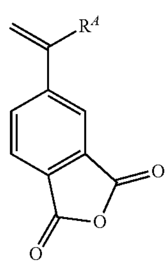
-continued
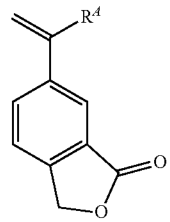
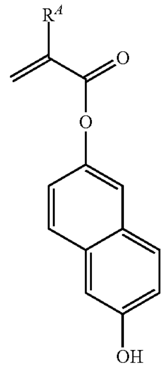
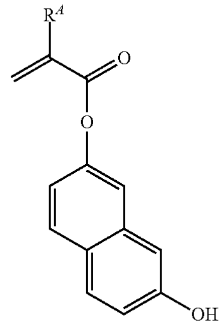
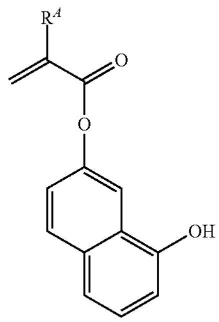
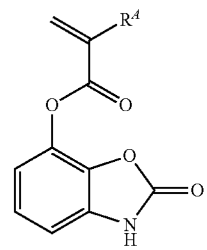
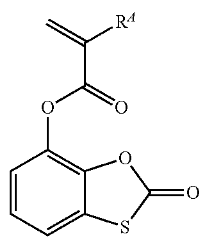
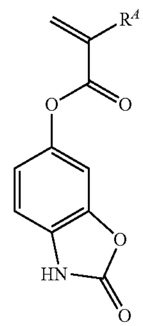
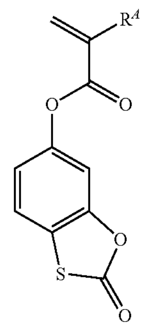
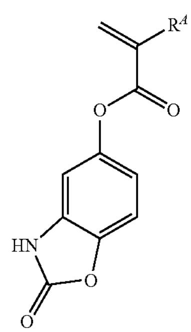
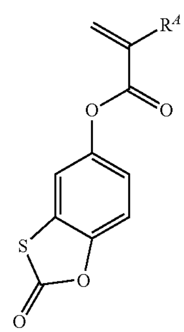
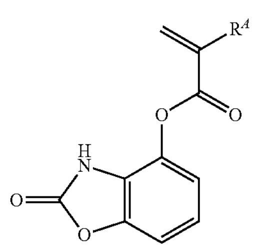
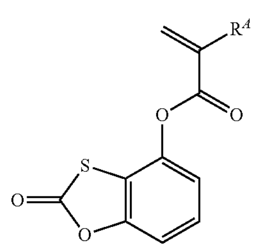

-continued

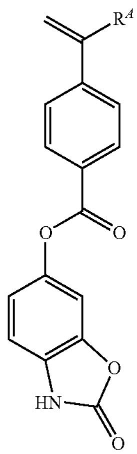
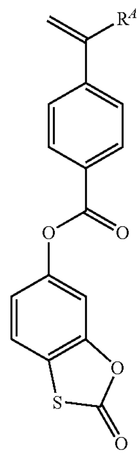
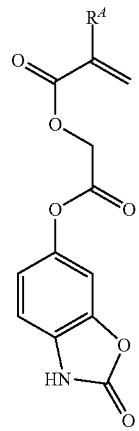
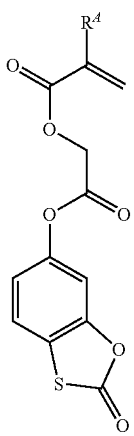
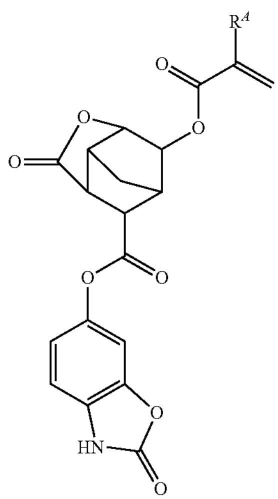
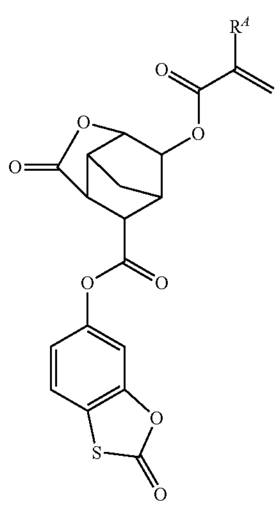
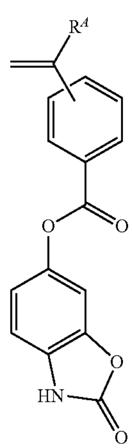
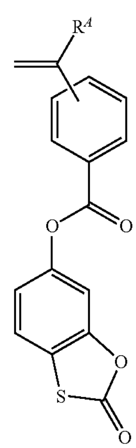

-continued

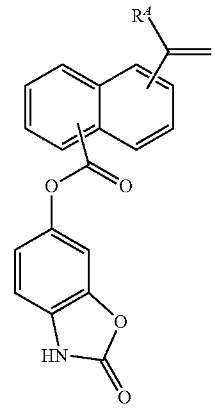
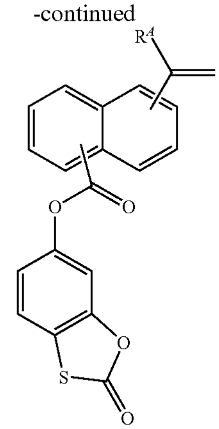
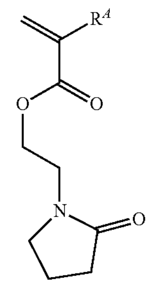
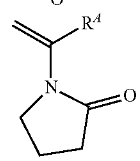
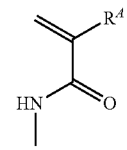
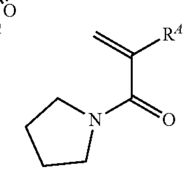

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

Polymer A may further comprise recurring units of at least one type selected from the formulae (d1) to (d3). These units are referred to as recurring units (d1) to (d3), respectively.

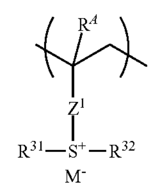

(d1)

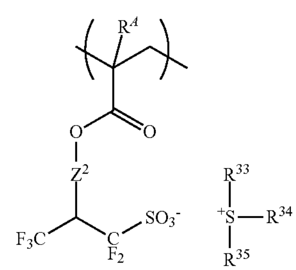

(d2)

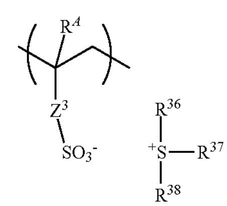

(d3)

Herein $R^A$ is each independently hydrogen or methyl. $Z^1$ is a single bond, phenylene group, —O—$Z^{12}$—, or —C(═O)—$Z^{11}$-$Z^{12}$—, wherein $Z^{11}$ is —O— or —NH—, $Z^{12}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety. $R^{31}$, $R^{32}$, $R^{33}$, $R^{34}$, $R^{35}$, $R^{36}$, $R^{37}$, and $R^{38}$ are each independently a $C_1$-$C_{12}$ straight, branched or cyclic alkyl group which may contain a carbonyl, ester or ether moiety, or a $C_6$-$C_{12}$ aryl group or $C_7$-$C_{20}$ aralkyl group, in which at least one hydrogen (one or more or even all hydrogen atoms) may be substituted by a $C_1$-$C_{10}$ straight, branched or cyclic alkyl moiety, halogen, trifluoromethyl, cyano, nitro, hydroxyl, mercapto, $C_1$-$C_{10}$ straight, branched or cyclic alkoxy moiety, $C_2$-$C_{10}$ straight, branched or cyclic alkoxycarbonyl moiety, or $C_2$-$C_{10}$ straight, branched or cyclic acyloxy moiety. $Z^2$ is a single bond, a $C_1$-$C_{12}$ straight, branched or cyclic alkylene group or $C_2$-$C_{12}$ straight, branched or cyclic alkenylene group which may contain an ether moiety, ester moiety or lactone ring, or $C_6$-$C_{10}$ arylene group. $Z^3$ is a single bond, methylene, ethylene, phenylene, fluorinated phenylene, —O—$Z^{32}$—, or —C(═O)—$Z^{31}$-$Z^{32}$—, wherein $Z^{31}$ is —O— or —NH—, $Z^{32}$ is a straight, branched or cyclic $C_1$-$C_{12}$ alkylene or $C_2$-$C_{12}$ alkenylene group which may contain a carbonyl, ester or ether moiety, or phenylene group, in which at least one hydrogen atom (one or more or even all hydrogen atoms) may be substituted by fluorine or hydroxyl. $M^-$ is a non-nucleophilic counter ion.

The attachment of an acid generator to the polymer main chain is effective in restraining acid diffusion, thereby preventing a reduction of resolution due to blur by acid diffusion. Also edge roughness (LER, LWR) is improved since the acid generator is uniformly distributed.

Examples of the monomer from which recurring unit (d1) is derived are shown below, but not limited thereto. $R^A$ and $M^-$ are as defined above.

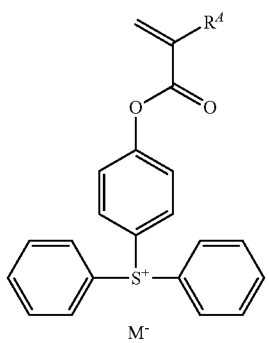

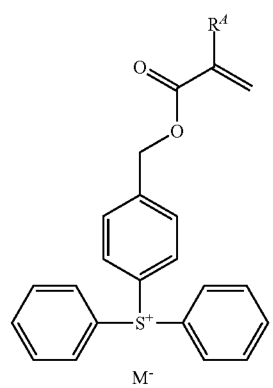

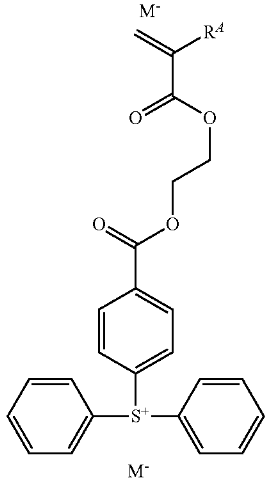

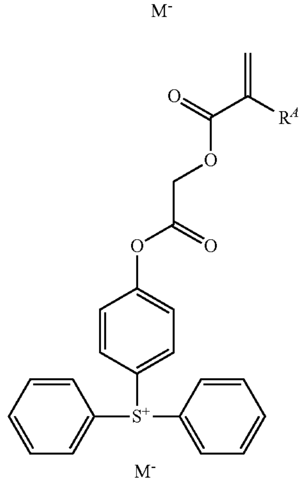

-continued

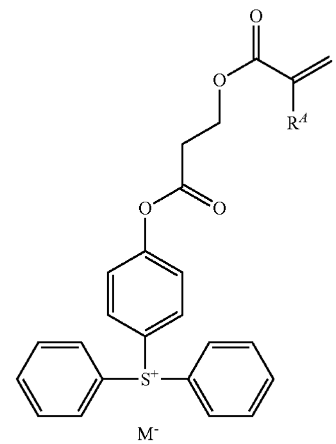

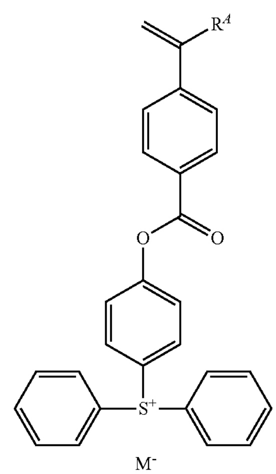

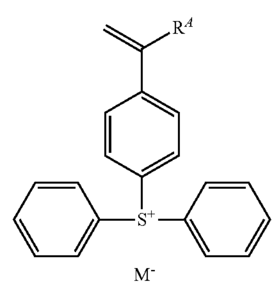

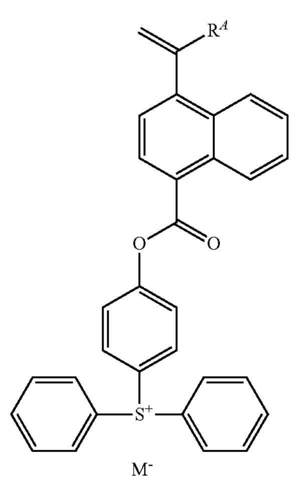

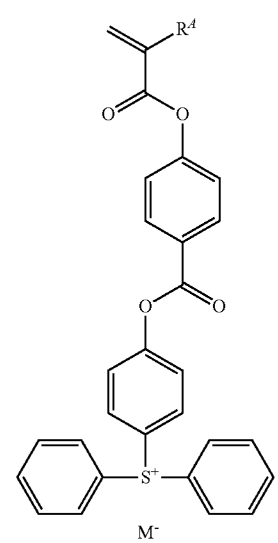

-continued

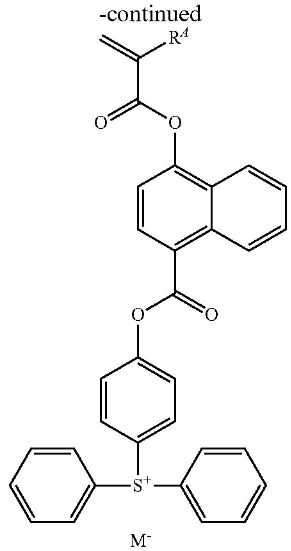

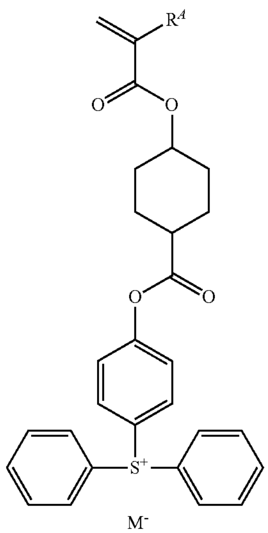

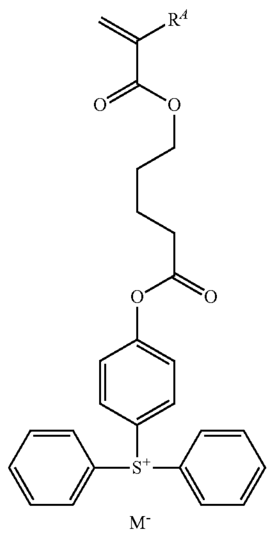

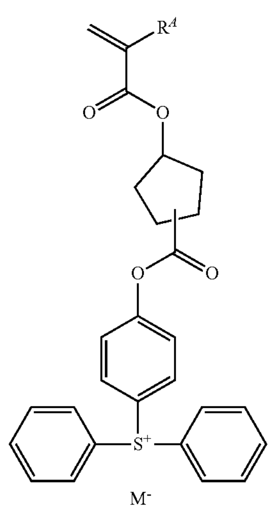

-continued

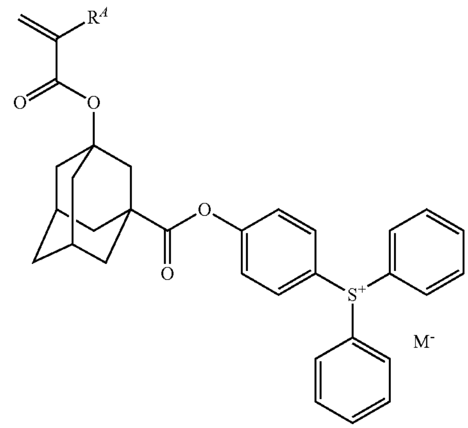

Examples of the non-nucleophilic counter ion $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl) imide; methidates such as tris(trifluoromethylsulfonyl)methide and tris(perfluoroethylsulfonyl)methide.

Further examples of the non-nucleophilic counter ion include sulfonate ions having fluorine substituted at α-position as represented by the formula (K-1) and sulfonate ions having fluorine substituted at α- and β-positions as represented by the formula (K-2).

$$R^{41}—CF_2—SO_3^- \quad (K\text{-}1)$$

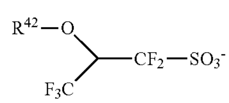

(K-2)

In formula (K-1), $R^{41}$ is hydrogen, or a $C_1$-$C_{20}$ straight, branched or cyclic alkyl group, $C_2$-$C_{20}$ straight, branched or cyclic alkenyl group, or $C_6$-$C_{20}$ aryl group, which may contain an ether, ester, carbonyl moiety, lactone ring, or fluorine atom. In formula (K-2), $R^{42}$ is hydrogen, or a $C_1$-$C_{30}$ straight, branched or cyclic alkyl group, $C_2$-$C_{20}$ straight, branched or cyclic acyl group, $C_2$-$C_{20}$ straight, branched or cyclic alkenyl group, $C_6$-$C_{20}$ aryl group or $C_6$-$C_{20}$ aryloxy group, which may contain an ether, ester, carbonyl moiety or lactone ring.

Examples of the monomer from which recurring unit (d2) is derived are shown below, but not limited thereto. $R^A$ is as defined above.

-continued
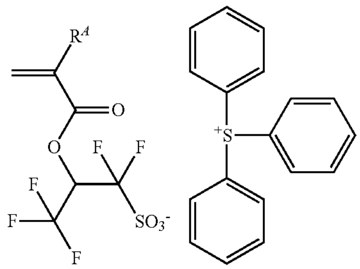
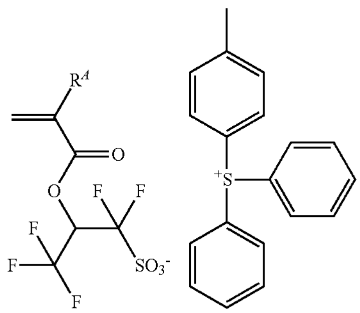
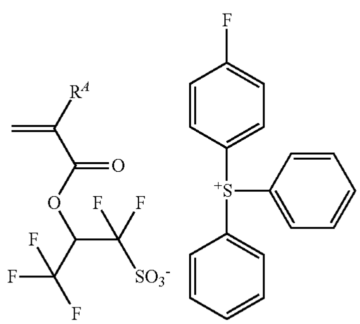
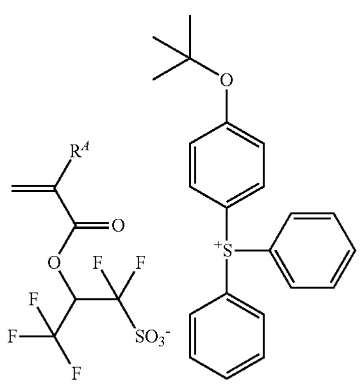
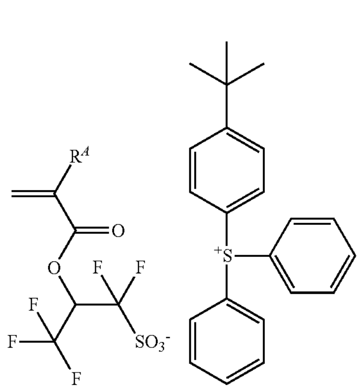
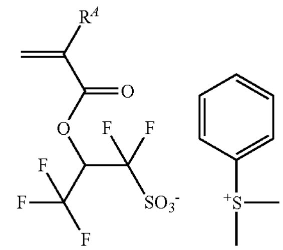
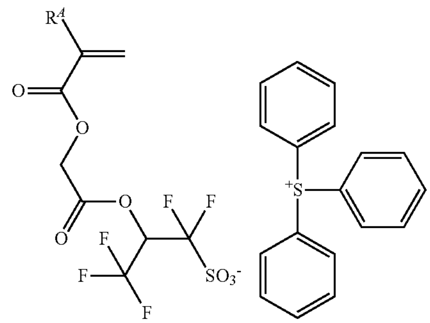
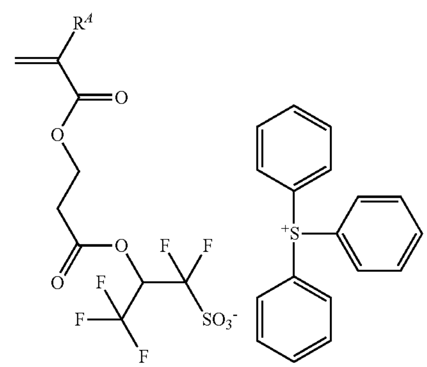
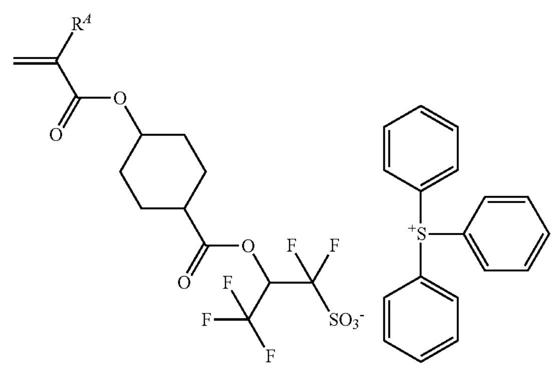
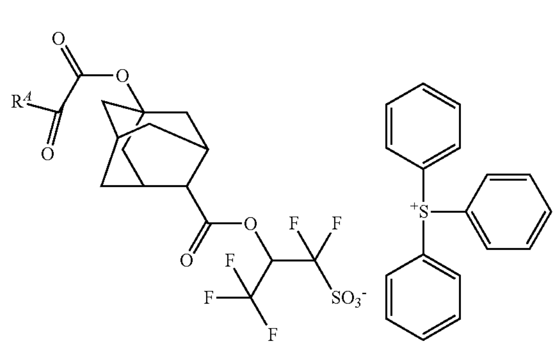

-continued
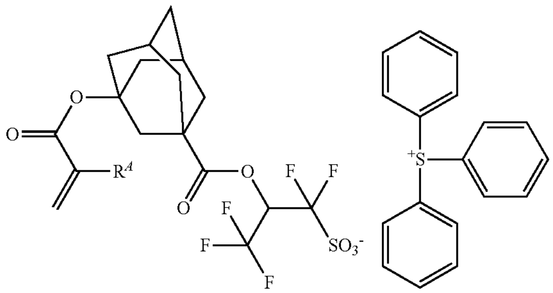
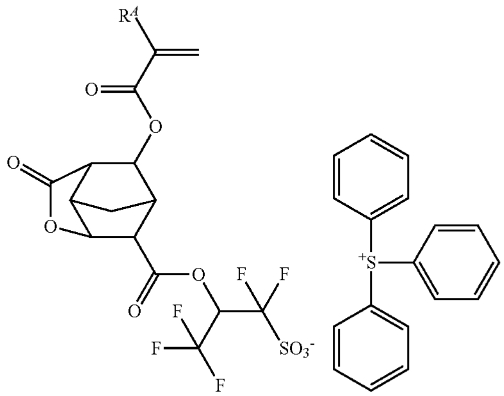
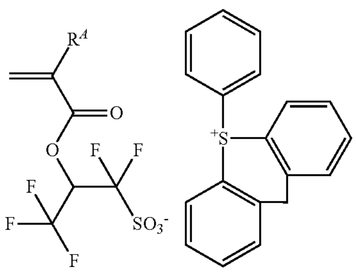
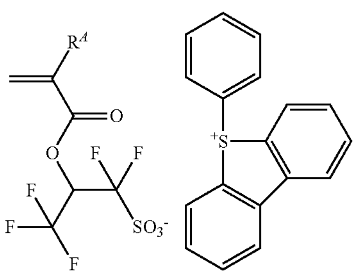
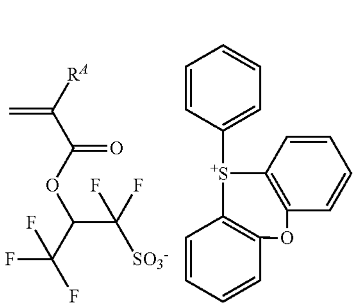
-continued
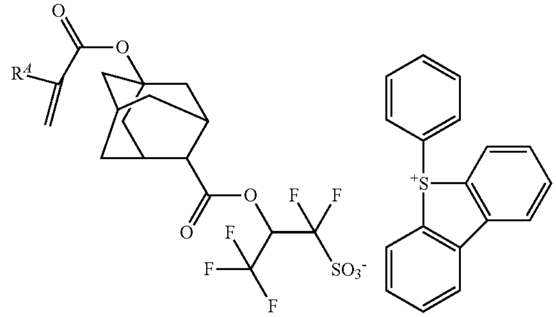
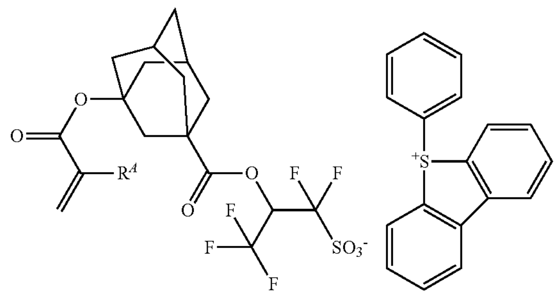
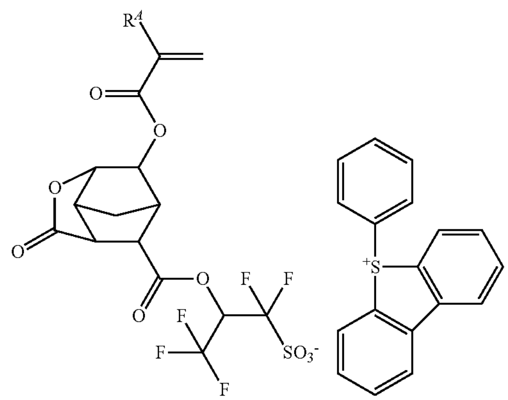
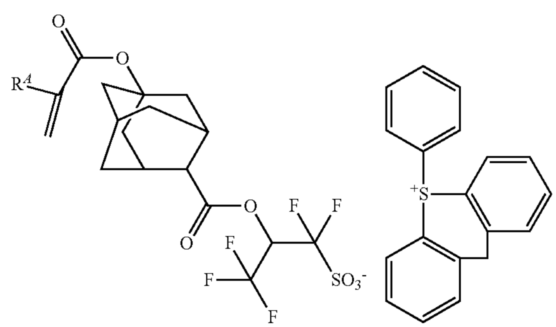
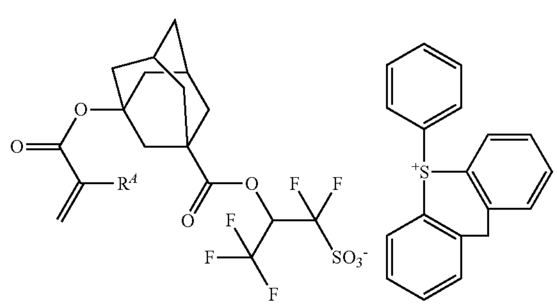

-continued
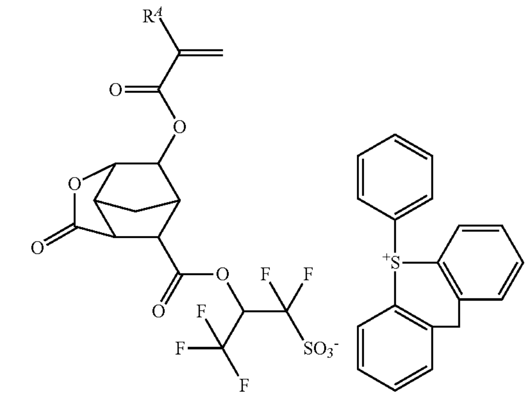
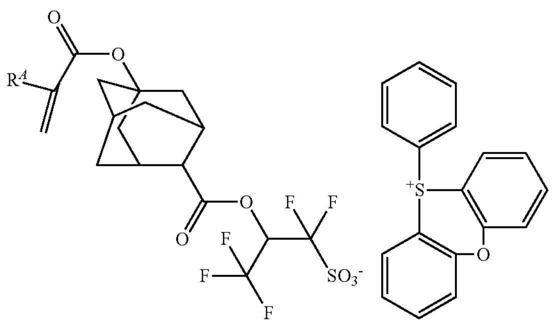
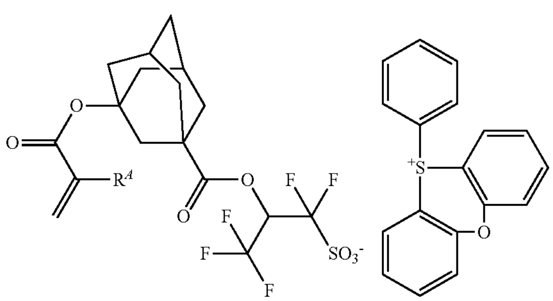
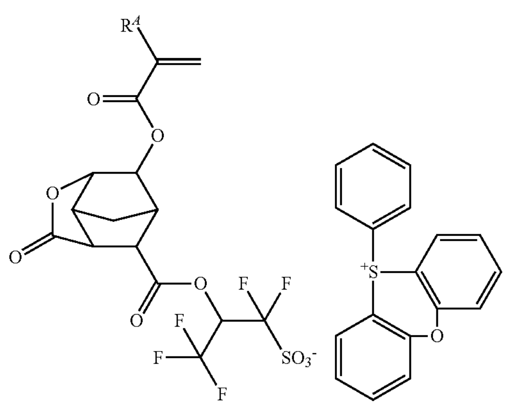
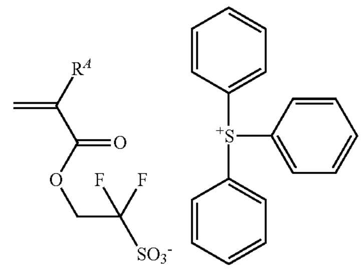
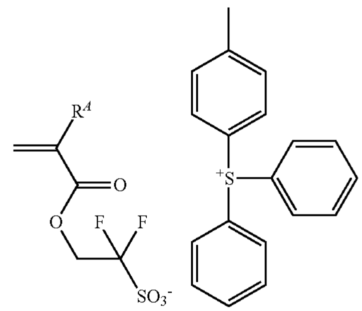
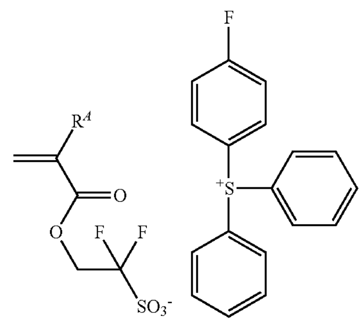
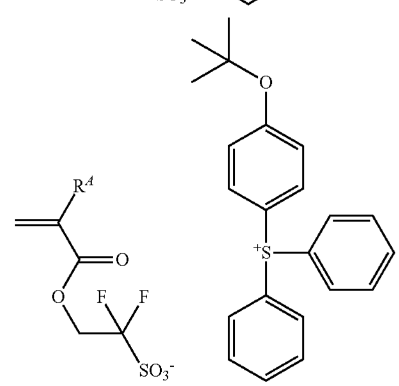
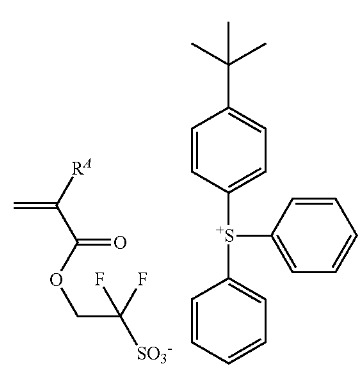
Examples of the monomer from which recurring unit (d3) is derived are shown below, but not limited thereto. $R^A$ is as defined above.

-continued
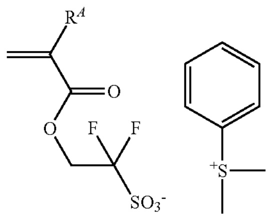
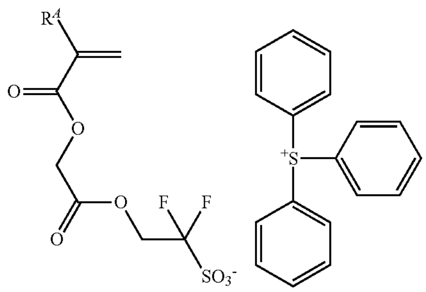
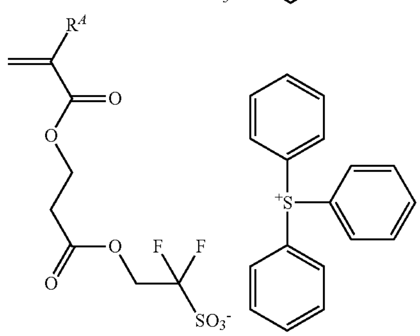
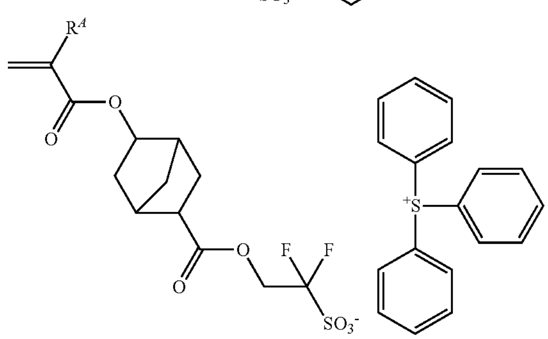
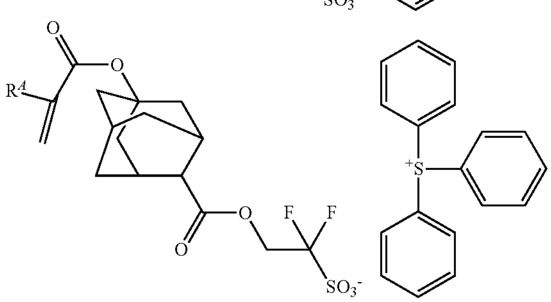
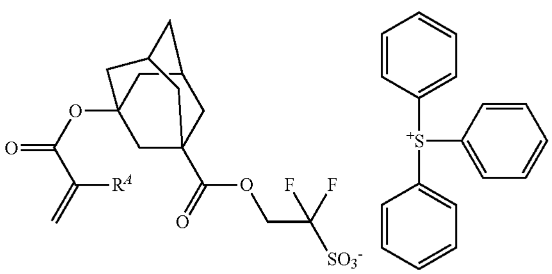
-continued
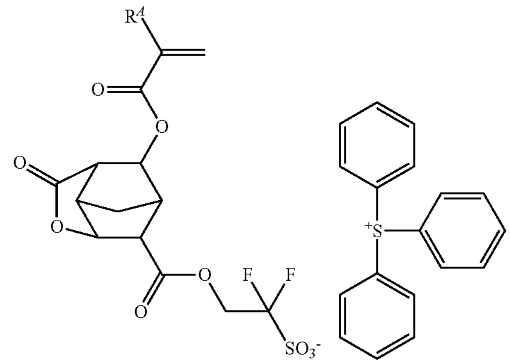
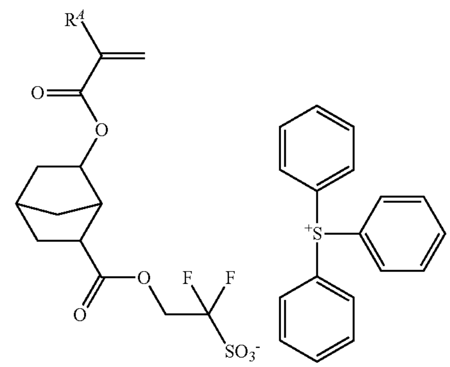
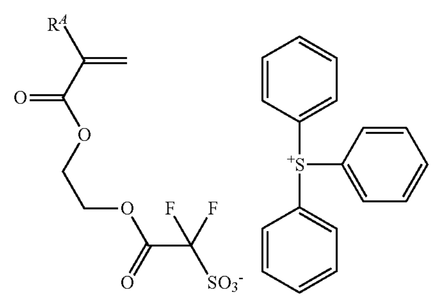
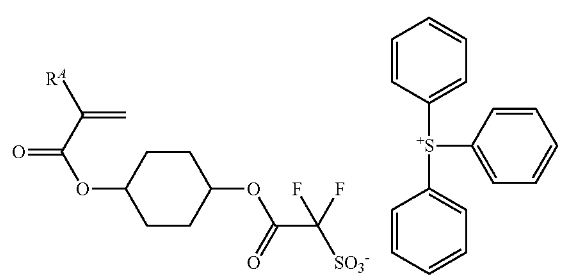
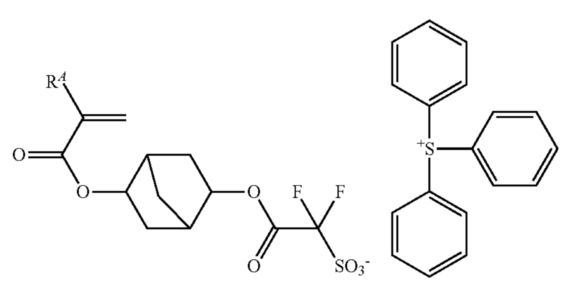

-continued
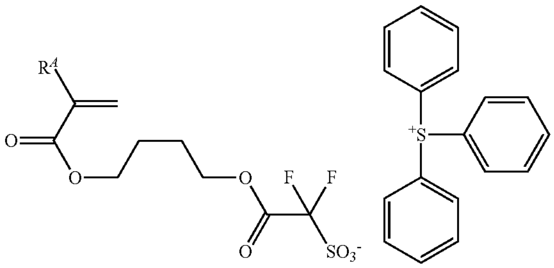
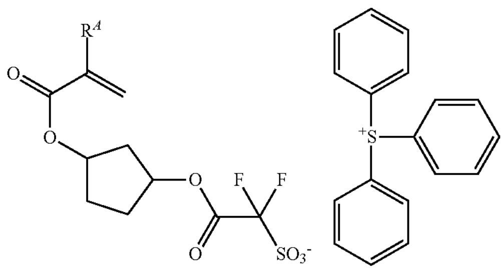
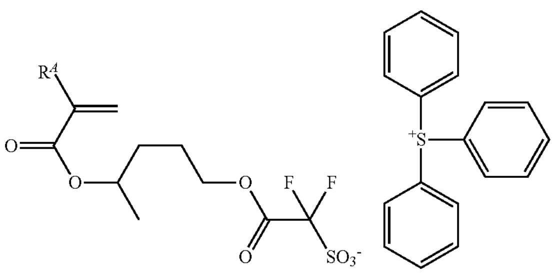
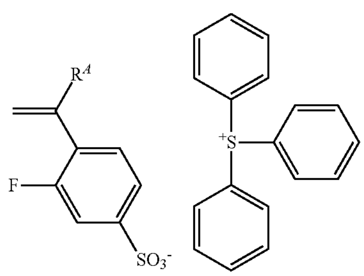
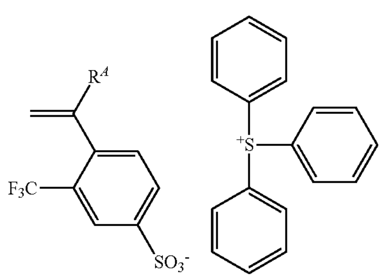
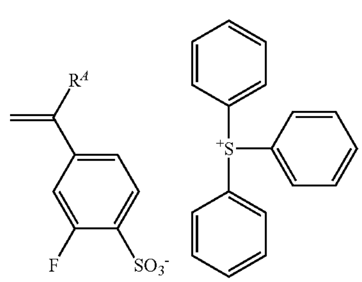
-continued
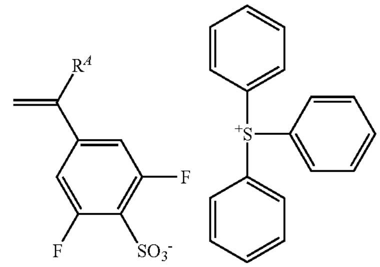
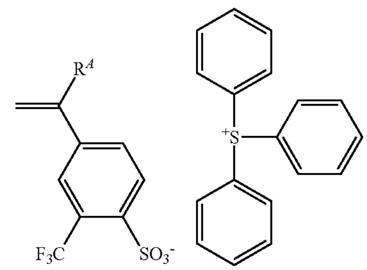
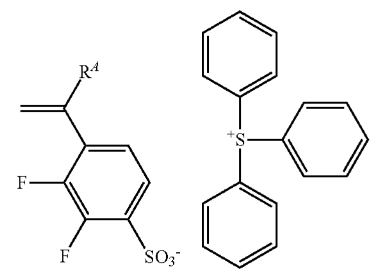
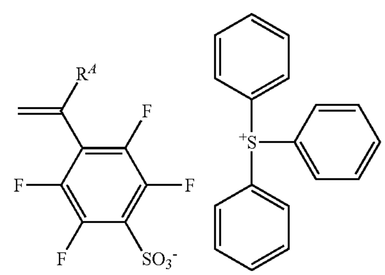
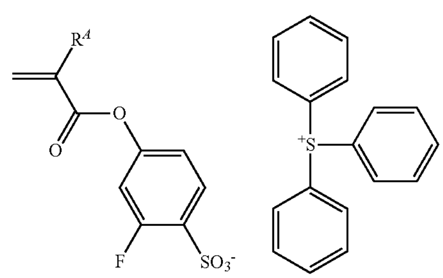
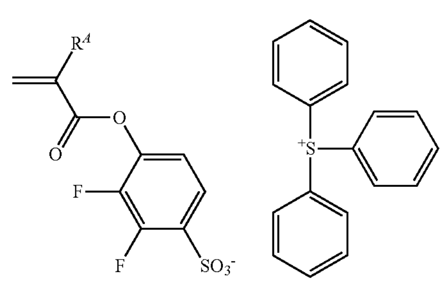

-continued

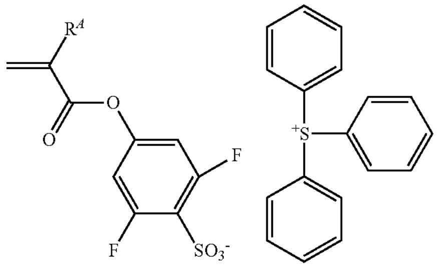

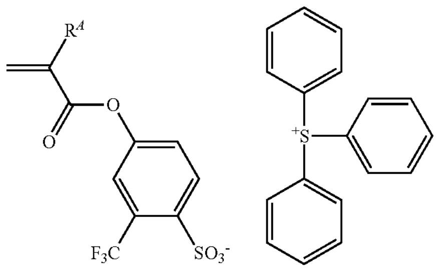

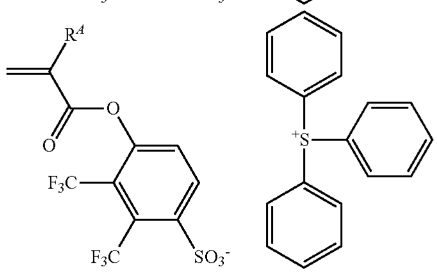

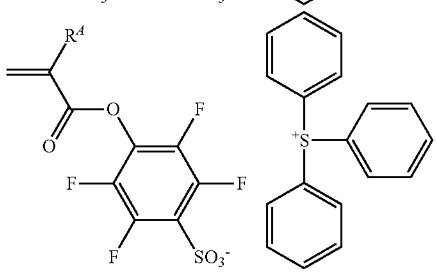

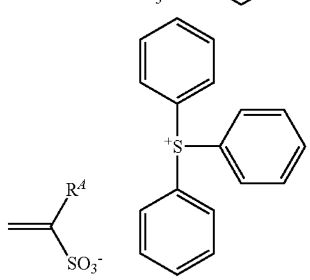

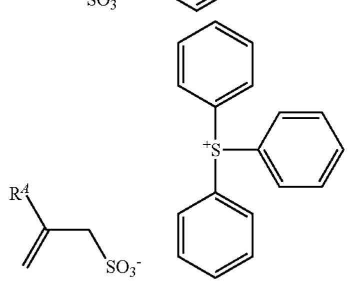

Where a polymer containing recurring units of at least one type selected from recurring units (d1) to (d3) is used, the addition of a photoacid generator to be described later may be omitted.

Polymer A may further comprise recurring units of at least one type selected from the formulae (e1) to (e5). These units are referred to as recurring units (e1) to (e5), respectively.

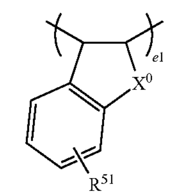

(e1)

(e2)

(e3)

(e4)

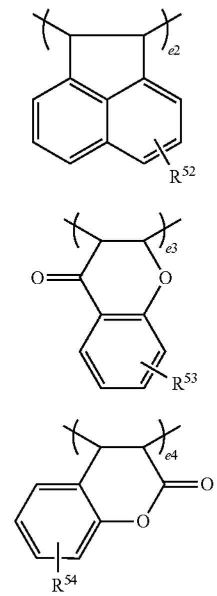

(e5)

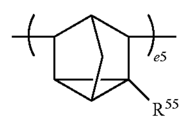

Herein $R^{51}$ to $R^{55}$ are each independently hydrogen, a $C_1$-$C_{30}$ alkyl group, $C_1$-$C_{30}$ alkyl group in which one or more or even all carbon-bonded hydrogen is substituted by halogen, hydroxyl, $C_1$-$C_{30}$ alkoxy group, $C_2$-$C_{30}$ acyl group, $C_2$-$C_{30}$ alkoxycarbonyl group, $C_6$-$C_{10}$ aryl group, halogen, or 1,1,1,3,3,3-hexafluoro-2-propanol. $X^0$ is a methylene, ether or sulfide group.

In polymer A, recurring units (f) which are derived from styrene, vinylnaphthalene, vinylanthracene, vinylpyrene or methyleneindane may be further incorporated.

Polymer A may be synthesized by any desired methods, for example, by dissolving one or more monomers selected from the monomers corresponding to the foregoing recurring units (a) to (f) in an organic solvent, adding a radical polymerization initiator thereto, and heating for polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is preferably 2 to 100 hours, more preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the relevant units to hydroxystyrene or hydroxyvinylnaphthalene units. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

In Polymer A, recurring units (a) and (b) are present in a fraction of $0<a<1.0$, $0<b<1.0$, and $0.1\leq a+b\leq 1.0$. When recurring units (b) are units (b1) and/or (b2), their fraction is $0<a<1.0$, $0\leq b1<1.0$, $0\leq b2<1.0$, $0<b1+b2<1.0$, and $0.1\leq a+b1+b2\leq 1.0$. When recurring units (b) are units (b3), their fraction is $0<a<1.0$, $0<b3<1.0$, and $0.1\leq a+b3\leq 1.0$.

A fraction of recurring units (c) is $0\leq c\leq 0.9$. Where recurring units (c) are incorporated, the preferred fraction is $0<c\leq 0.9$ and $0.2\leq a+b+c\leq 1.0$. When recurring units (b) are units (b1) and/or (b2), the preferred fraction is $0.02\leq a\leq 0.8$, $0\leq b1\leq 0.8$, $0\leq b2\leq 0.8$, $0.1\leq b1+b2\leq 0.8$, and $0.1\leq c\leq 0.88$; more preferably $0.05\leq a\leq 0.75$, $0\leq b1\leq 0.7$, $0\leq b2\leq 0.7$, $0.1\leq b1+b2\leq 0.75$, and $0.15\leq c\leq 0.85$; even more preferably $0.07\leq a\leq 0.7$, $0\leq b1\leq 0.65$, $0\leq b2\leq 0.65$, $0.1\leq b1+b2\leq 0.7$, and $0.2\leq c\leq 0.83$. In this case, the preferred range is $0.2\leq a+b1+b2+c\leq 1.0$, more preferably $0.3\leq a+b1+b2+c\leq 1.0$, and even more preferably $0.4\leq a+b1+b2+c\leq 1.0$. When recurring units (b) are units (b3), the preferred fraction is $0.02\leq a\leq 0.8$, $0.1\leq b3\leq 0.8$, and $0.1\leq c\leq 0.88$; more preferably $0.05\leq a\leq 0.75$, $0.1\leq b3\leq 0.75$, and $0.15\leq c\leq 0.85$; even more preferably $0.07\leq a\leq 0.7$, $0.1\leq b3\leq 0.7$, and $0.2\leq c\leq 0.83$. In this case, the preferred range is $0.2\leq a+b3+c\leq 1.0$, more preferably $0.3\leq a+b3+c\leq 1.0$, and even more preferably $0.4\leq a+b3+c\leq 1.0$.

A fraction of recurring units (d1) to (d3) is $0\leq d1\leq 0.5$, $0\leq d2\leq 0.5$, $0\leq d3\leq 0.5$, and $0\leq d1+d2+d3\leq 0.5$. Where recurring units (d1) to (d3) are incorporated, their fraction is $0<d1+d2+d3\leq 0.5$. In this case, the preferred range is $0\leq d1\leq 0.4$, $0\leq d2\leq 0.4$, $0\leq d3\leq 0.4$, and $0<d1+d2+d3\leq 0.4$; more preferably $0\leq d1\leq 0.3$, $0\leq d2\leq 0.3$, $0\leq d3\leq 0.3$, and $0<d1+d2+d3\leq 0.3$; even more preferably $0\leq d1\leq 0.2$, $0\leq d2\leq 0.2$, $0\leq d3\leq 0.2$, and $0<d1+d2+d3\leq 0.25$. The total fraction is $0.2\leq a+b1+b2+c+d1+d2+d3\leq 1.0$, preferably $0.4\leq a+b1+b2+c+d1+d2+d3\leq 1.0$.

A fraction of recurring units (e1) to (e5) is $0\leq e1\leq 0.5$, $0\leq e2\leq 0.5$, $0\leq e3\leq 0.5$, $0\leq e4\leq 0.5$, $0\leq e5\leq 0.5$, and $0\leq e1+e2+e3+e4+e5\leq 0.5$. Where recurring units (e1) to (e5) are incorporated, their fraction is $0<e1+e2+e3+e4+e5\leq 0.5$. In this case, the preferred range is $0\leq e1\leq 0.4$, $0\leq e2\leq 0.4$, $0\leq e3\leq 0.4$, $0\leq e4\leq 0.4$, $0\leq e5\leq 0.4$, and $0<e1+e2+e3+e4+e5\leq 0.4$; more preferably $0\leq e1\leq 0.3$, $0\leq e2\leq 0.3$, $0\leq e3\leq 0.3$, $0\leq e4\leq 0.3$, $0\leq e5\leq 0.3$, and $0<e1+e2+e3+e4+e5\leq 0.3$.

A fraction of recurring units (f) is $0\leq f\leq 0.5$, preferably $0\leq f\leq 0.4$, and more preferably $0\leq f\leq 0.3$.

Notably, the total is preferably $a+b+c+d1+d2+d3+e1+e2+e3+e4+e5+f=1$.

Polymer A should preferably have a weight average molecular weight (Mw) in the range of 1,000 to 500,000, and more preferably 2,000 to 30,000, as measured by GPC versus polystyrene standards using tetrahydrofuran (THF) solvent. With a Mw of at least 1,000, the resist composition is heat resistant. A polymer with a Mw of up to 500,000 has alkaline solubility and avoids the risk of a footing phenomenon occurring after pattern formation.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, polymer A should preferably have a narrow dispersity (Mw/Mn) of 1.0 to 2.0, especially 1.0 to 1.5, in order to provide a resist composition suitable for micropatterning to a small feature size.

It is understood that the base resin used herein may be polymer A alone, a blend of two or more polymers A which differ in compositional ratio, Mw or Mw/Mn, or a blend of polymer A with another polymer free of recurring units (a).

Acid Generator

To the resist composition, an acid generator is optionally added so that the composition may function as a chemically amplified resist composition. The acid generator is typically a compound (PAG) capable of generating an acid upon exposure to actinic ray or radiation.

Any desired PAG may be used herein as long as it is a compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, sulfonium salts having the formula (1-1) and iodonium salts having the formula (1-2) are also preferred.

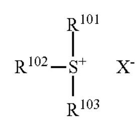

(1-1)

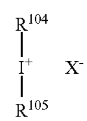

(1-2)

In formulae (1-1) and (1-2), $R^{101}$, $R^{102}$, $R^{103}$, $R^{104}$ and $R^{105}$ are each independently a $C_1$-$C_{20}$ straight, branched or cyclic monovalent hydrocarbon group which may contain a heteroatom. Any two of $R^{101}$, $R^{102}$ and $R^{103}$ may bond together to form a ring with the sulfur atom to which they are attached.

Examples of the cation moiety in the sulfonium salt having formula (1-1) are given below, but not limited thereto.

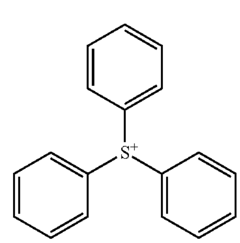

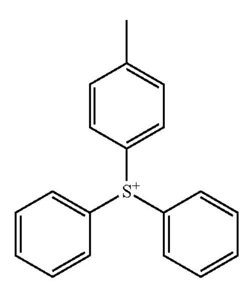

-continued
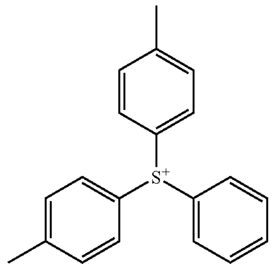
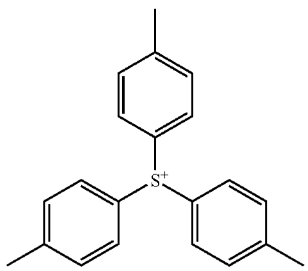
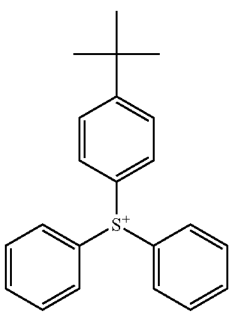
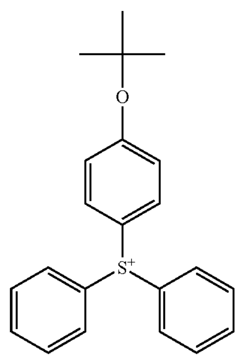
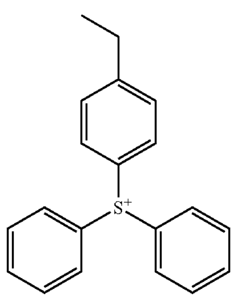
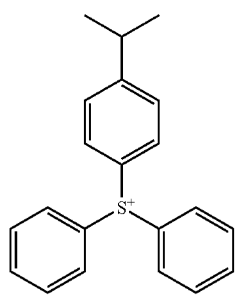
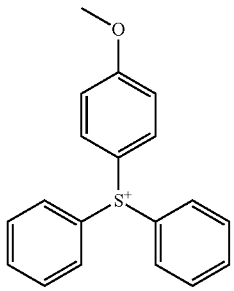
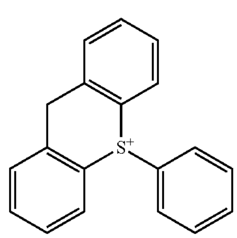
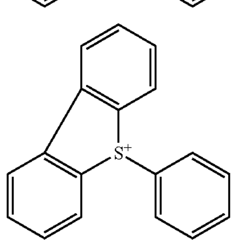
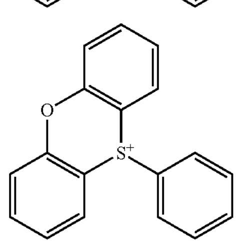
-continued
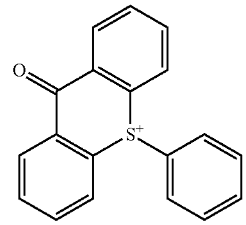
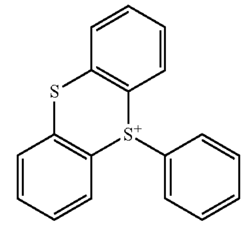
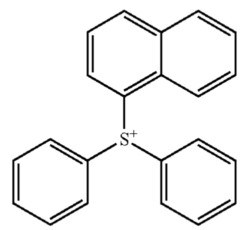
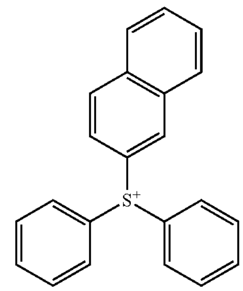
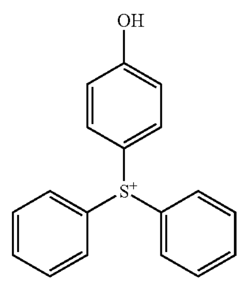
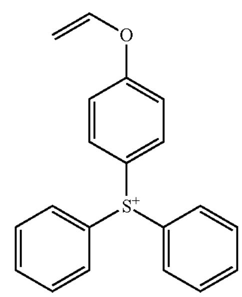
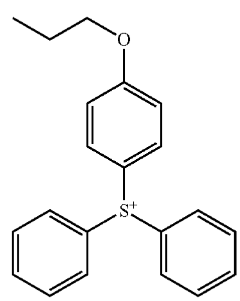
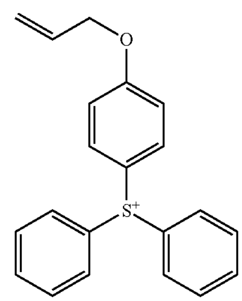
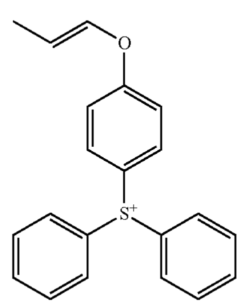
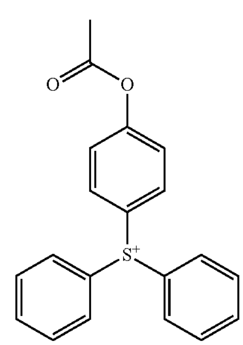

-continued
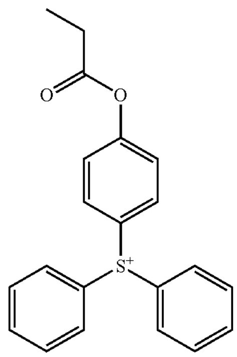
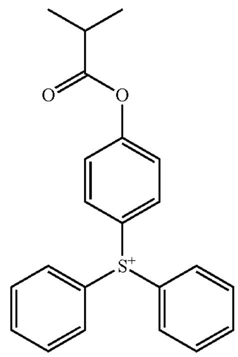
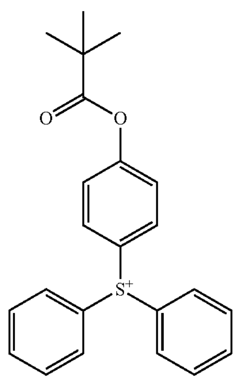
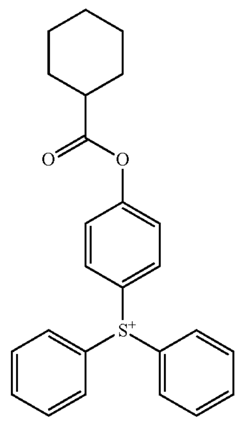
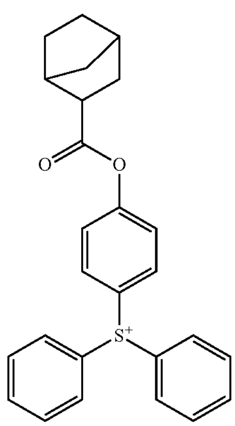
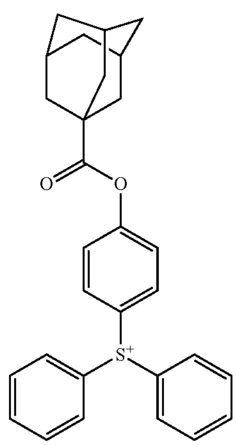
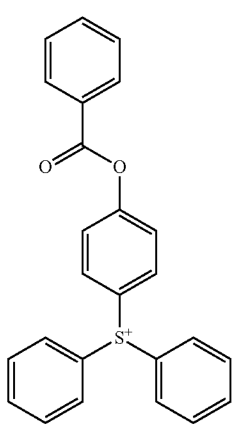
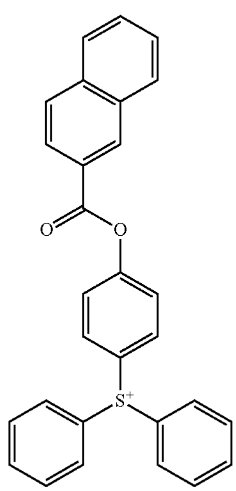
-continued
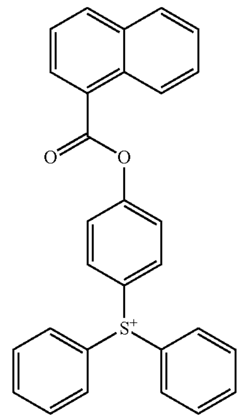
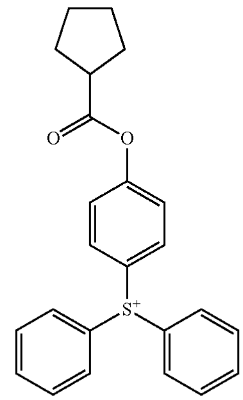
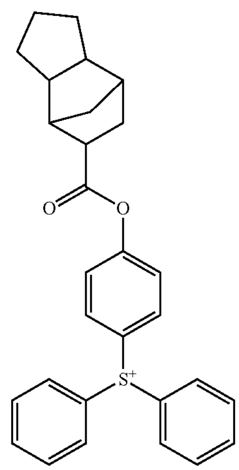
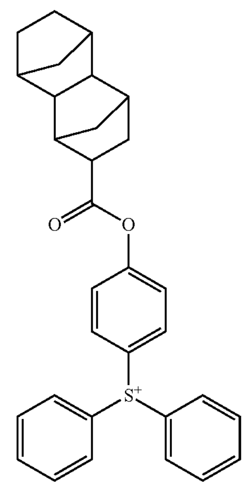
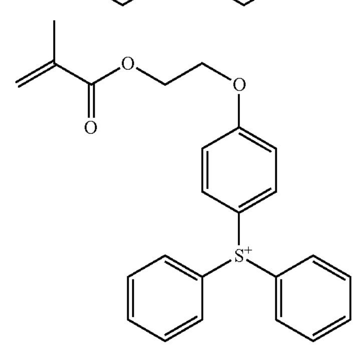
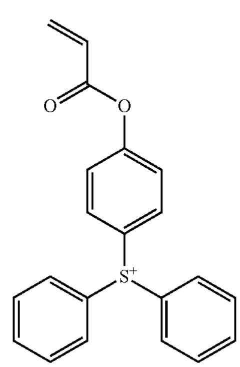
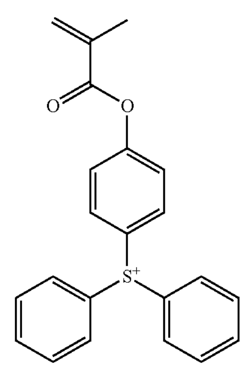

-continued
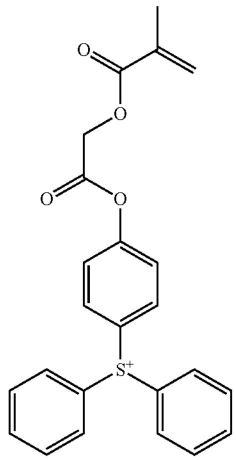
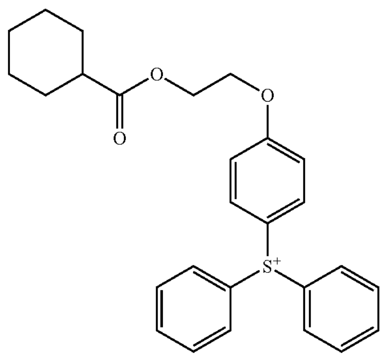
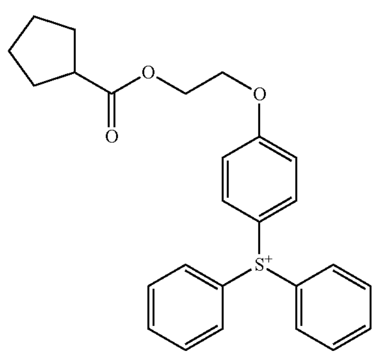
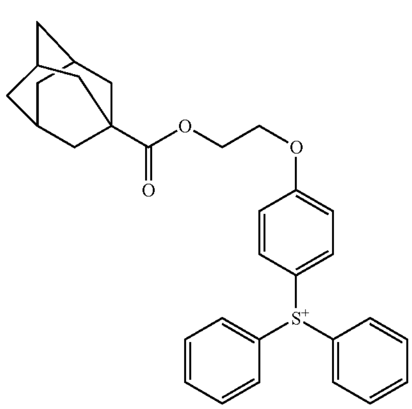
-continued
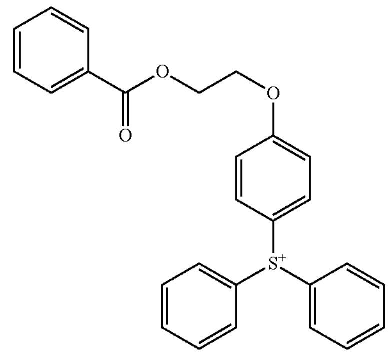
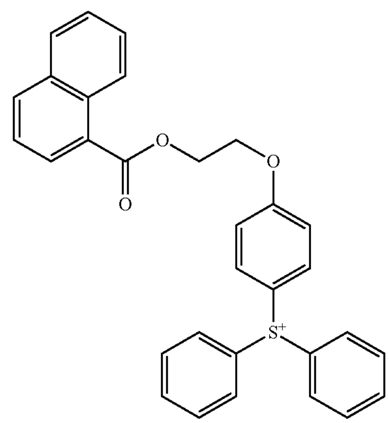
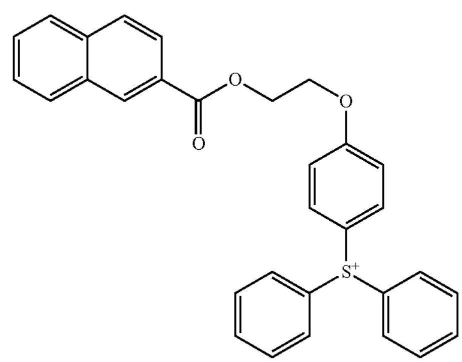
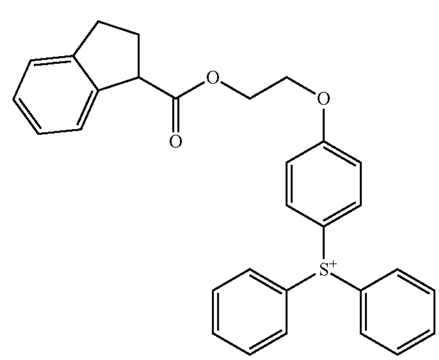

-continued
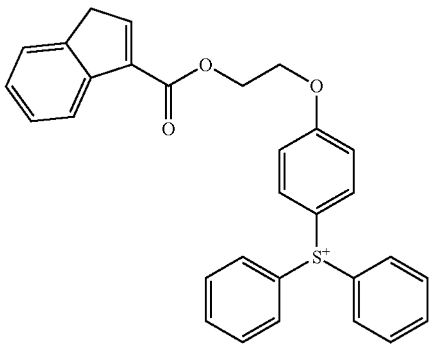
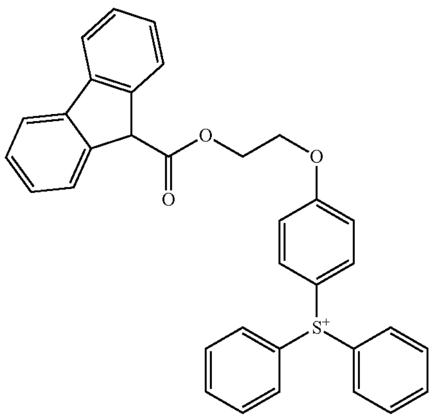
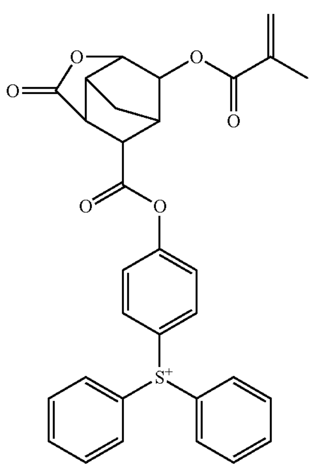
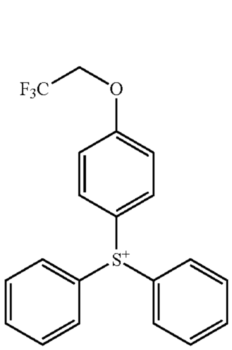
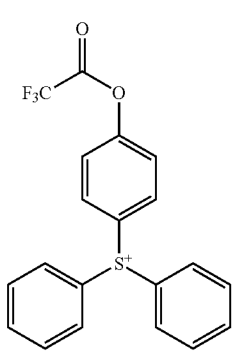
-continued
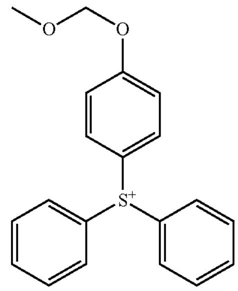
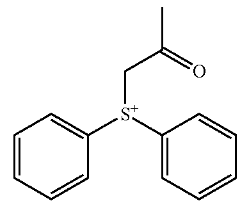
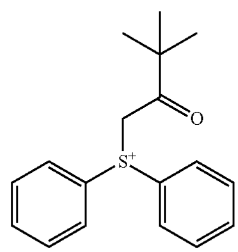
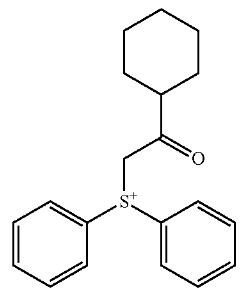
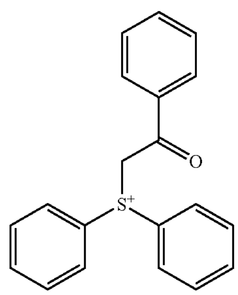
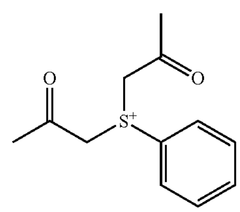
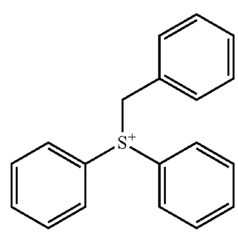
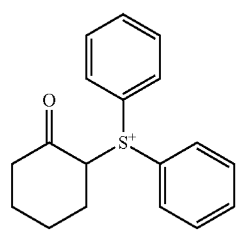
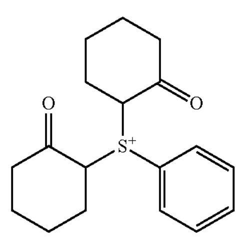
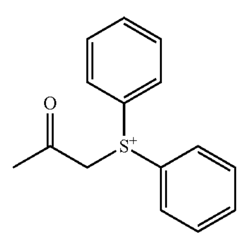
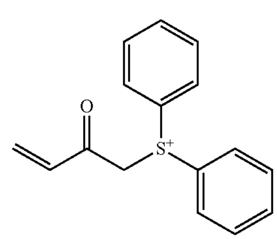

-continued
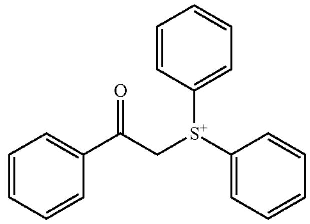
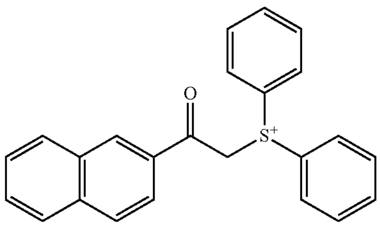
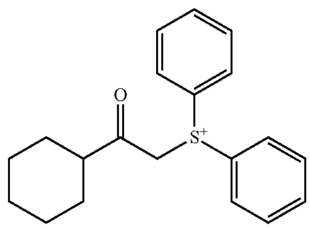
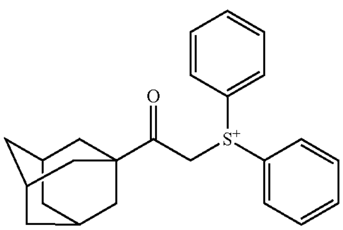
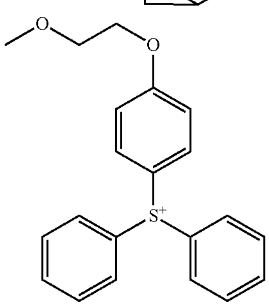
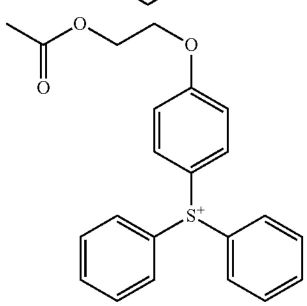
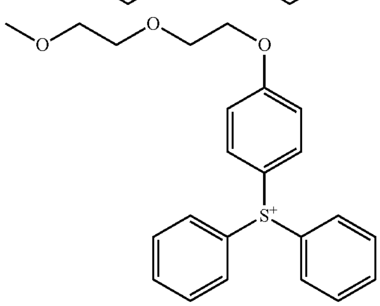
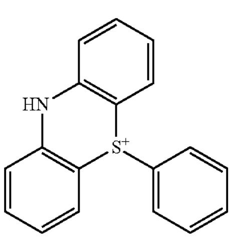
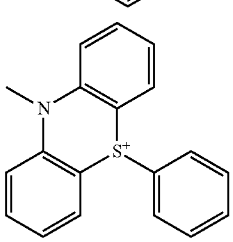
-continued
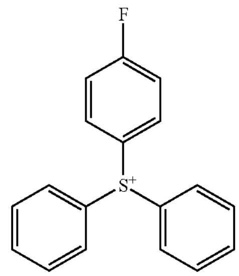
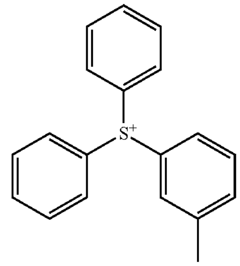
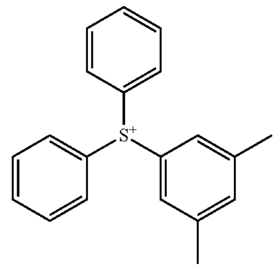
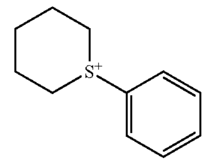
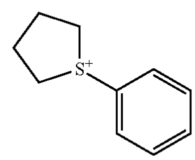
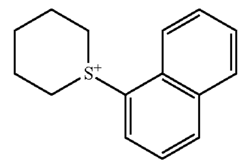
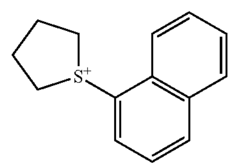
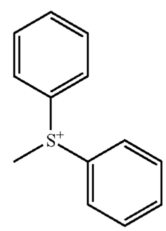
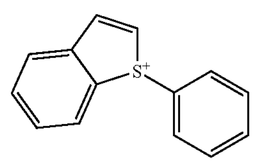
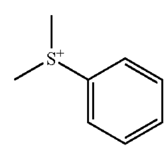
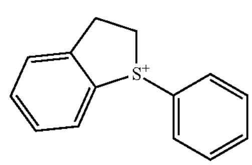
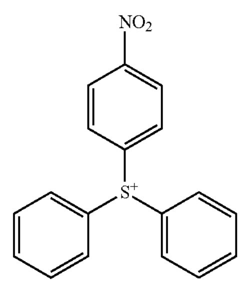
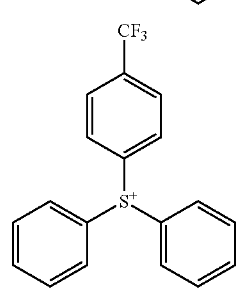
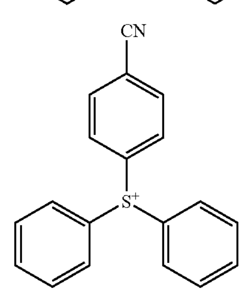

-continued
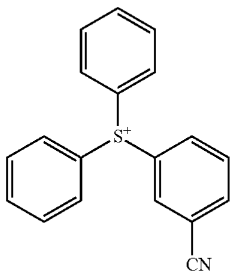
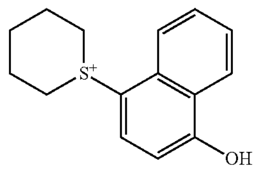
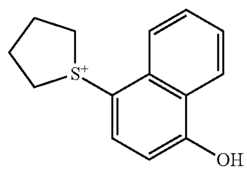
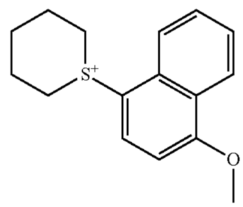
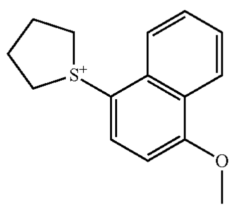
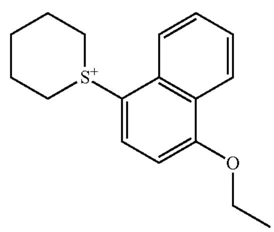
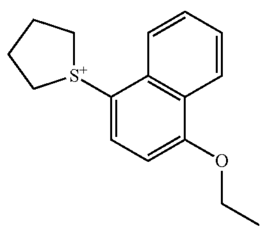
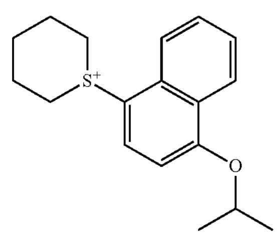
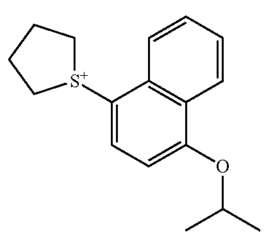
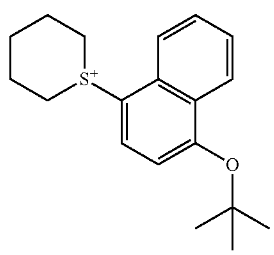
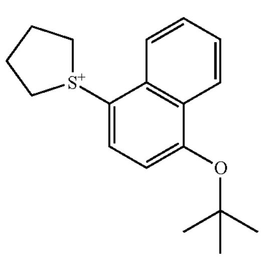
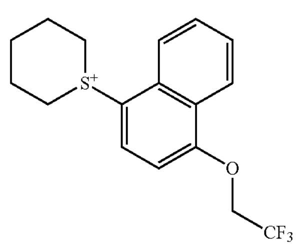
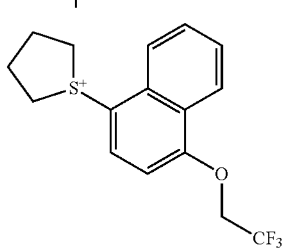
-continued
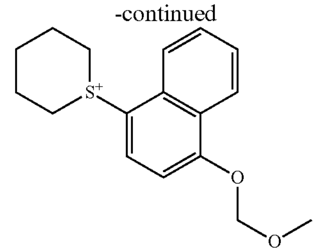
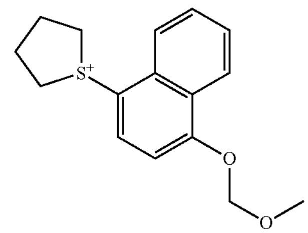
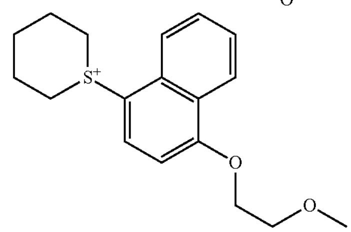
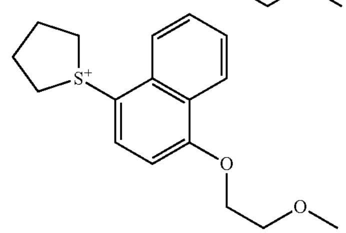
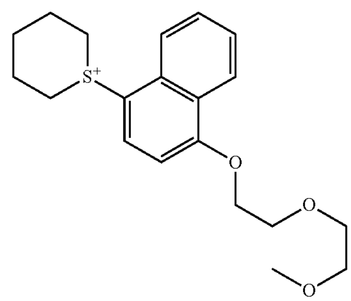
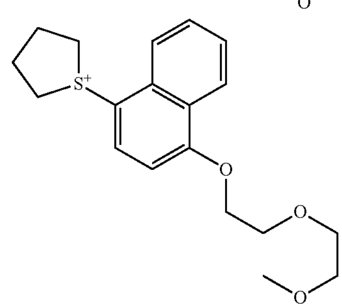
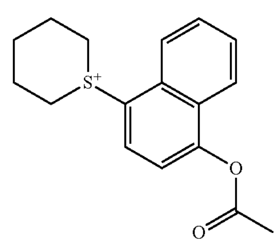
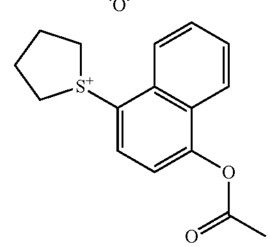

-continued
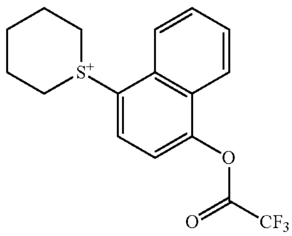
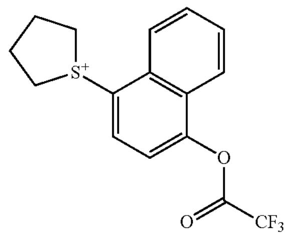
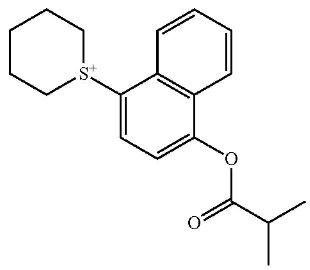
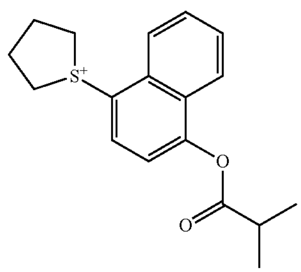
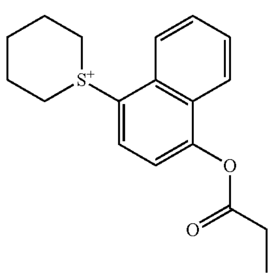
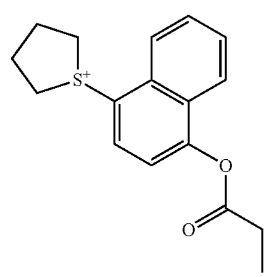
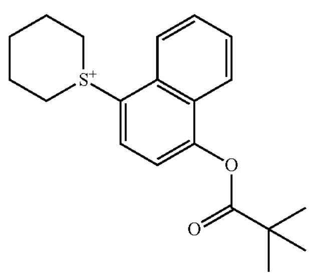
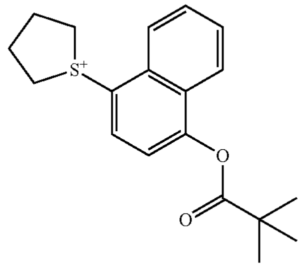
-continued
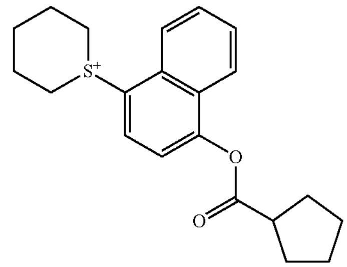
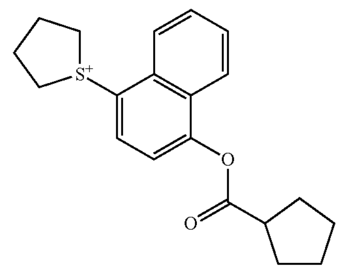
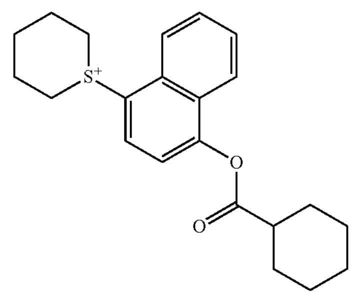
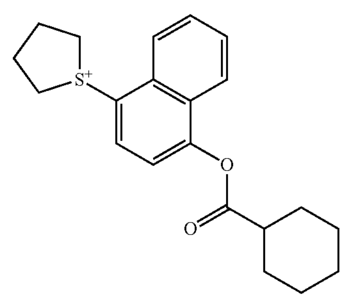
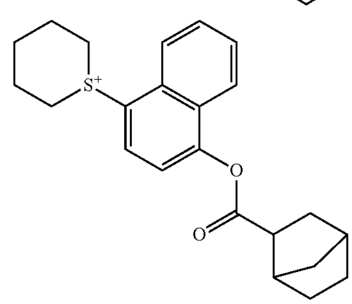
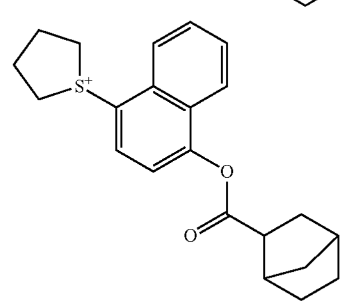

-continued
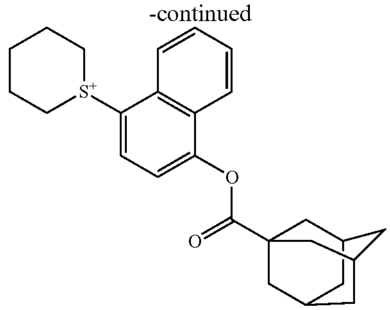
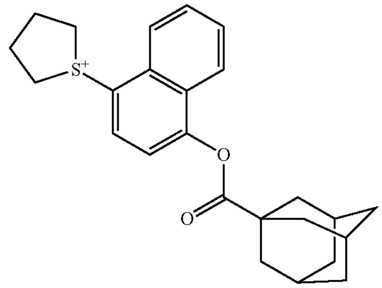
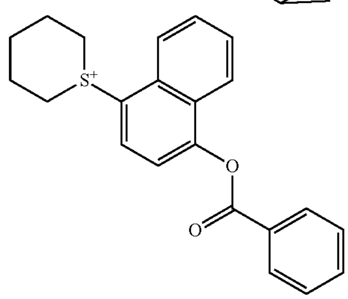
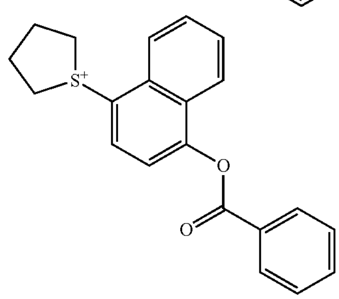
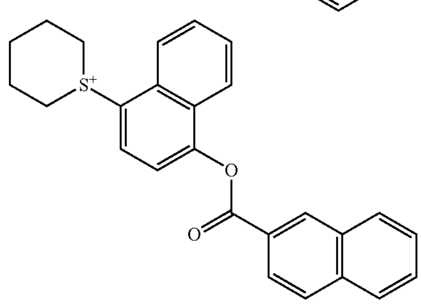
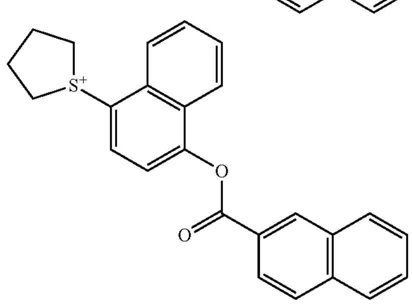
-continued
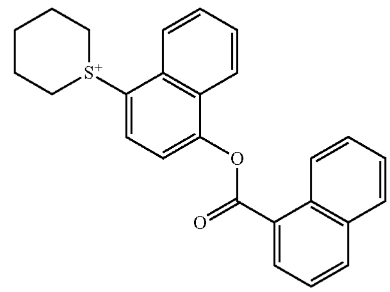
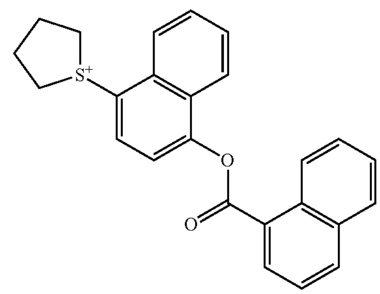
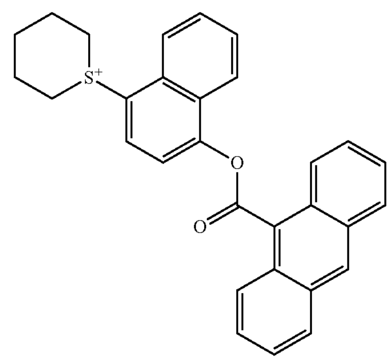
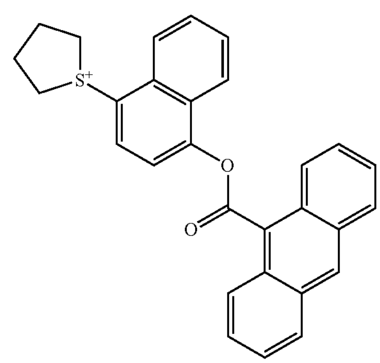
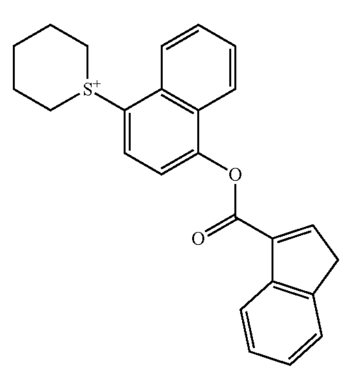

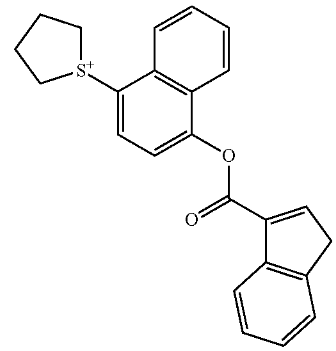
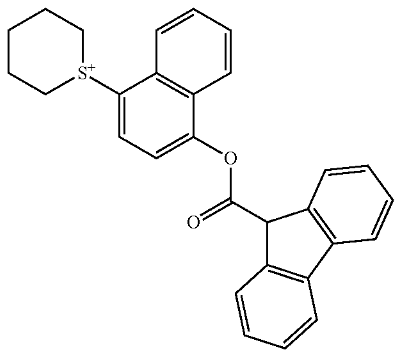
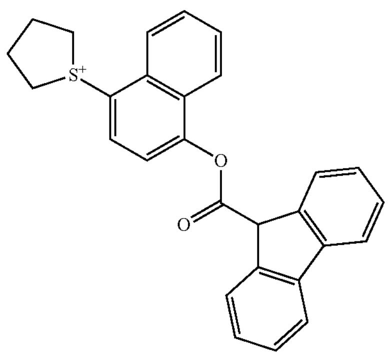
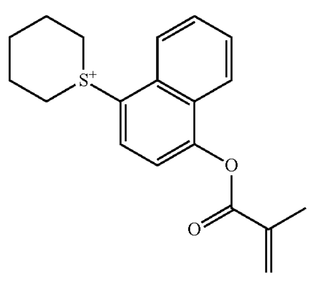
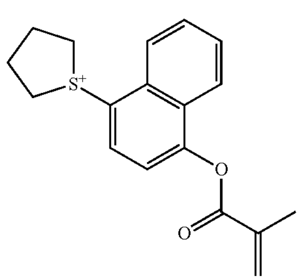
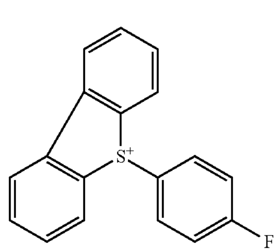
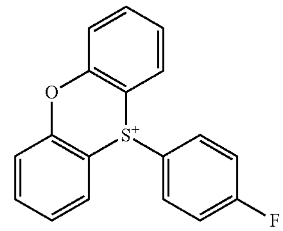
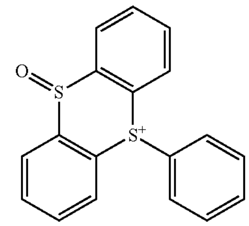
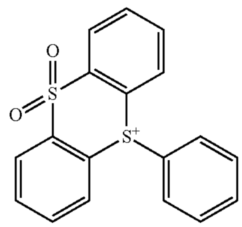
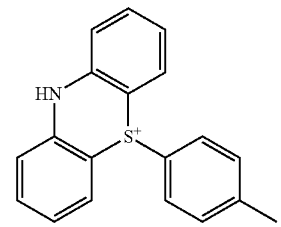
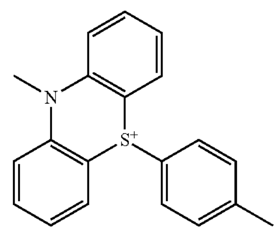
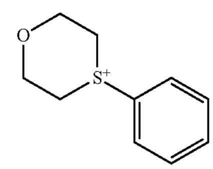
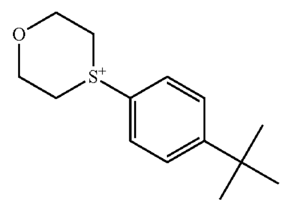
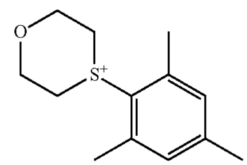
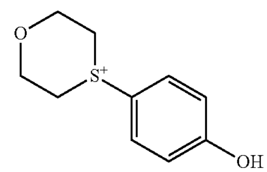
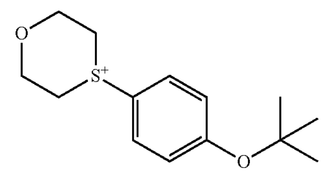
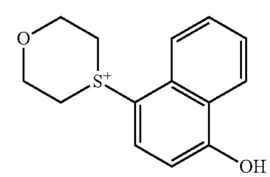
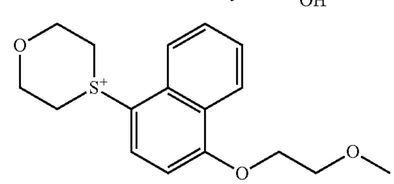
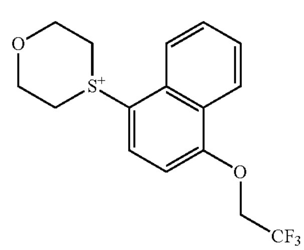
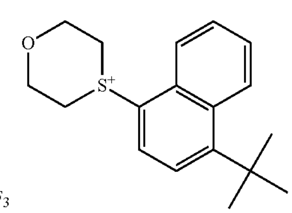

-continued
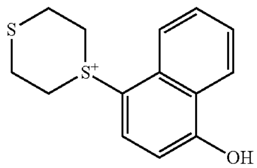
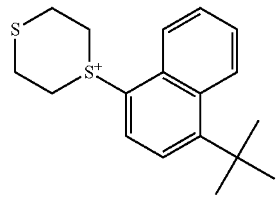
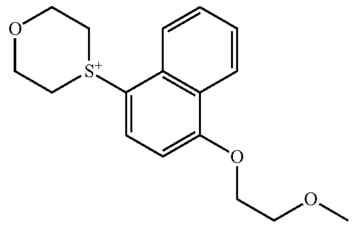
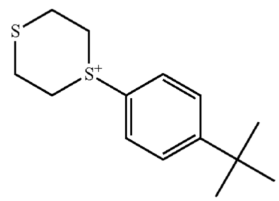
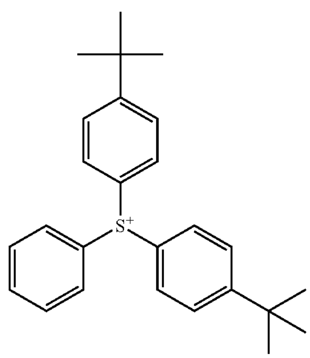
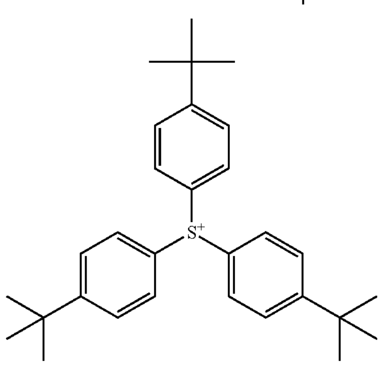
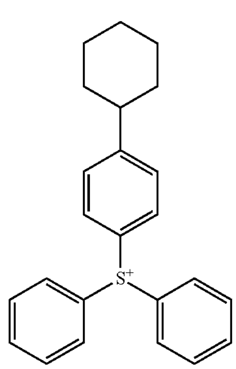
-continued
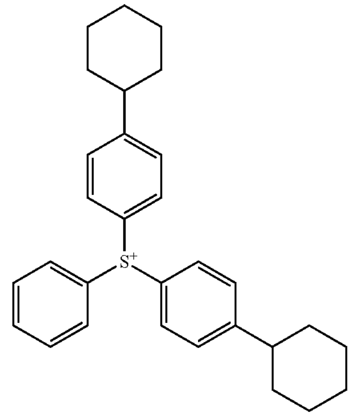
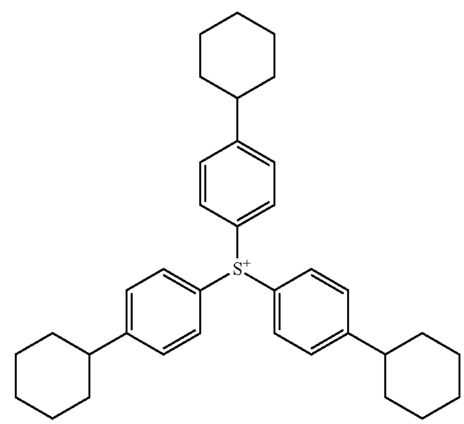
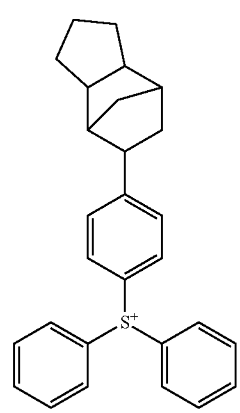

-continued
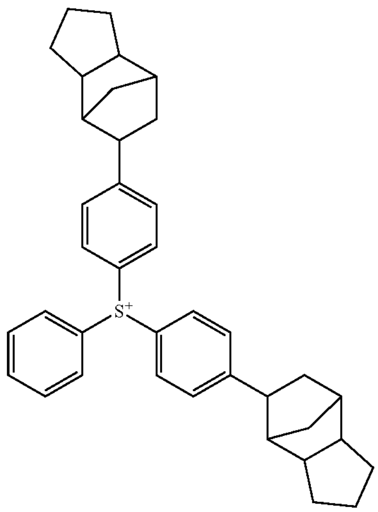
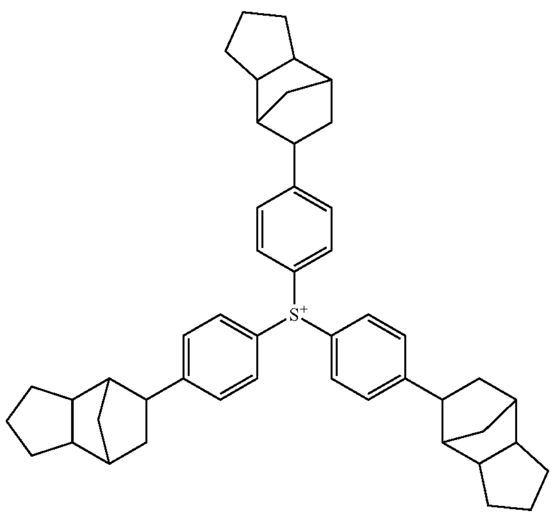
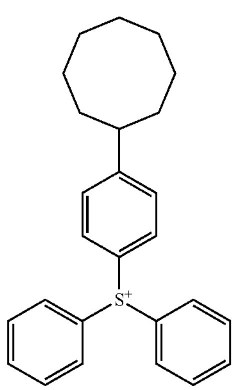
-continued
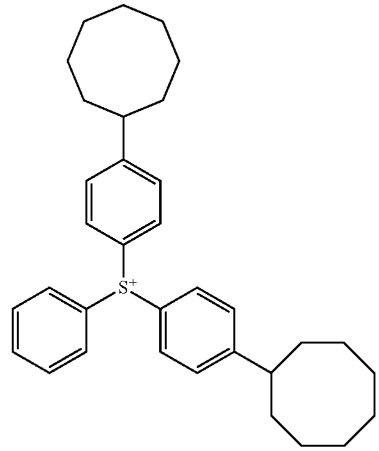
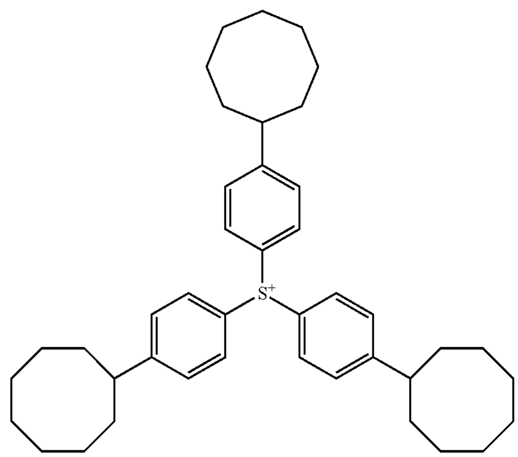
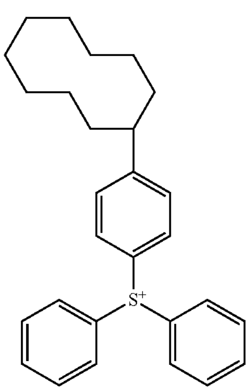

-continued
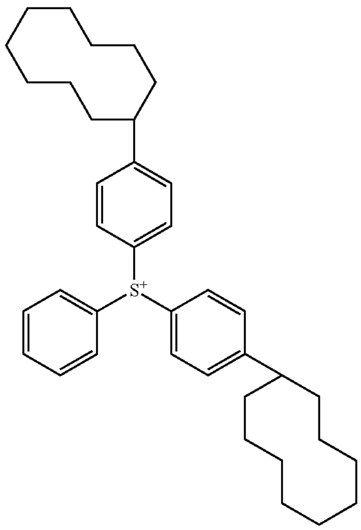
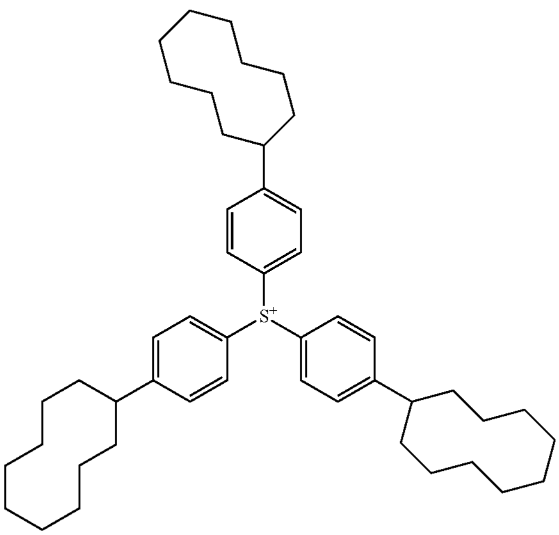
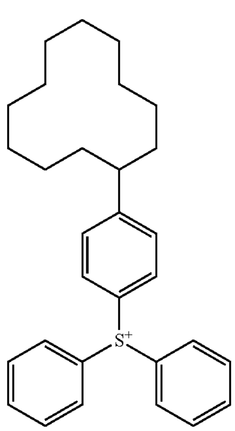
-continued
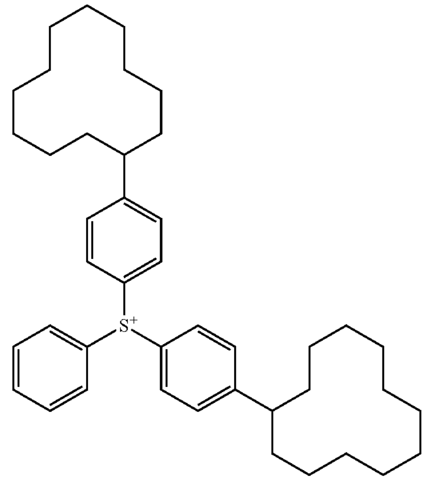
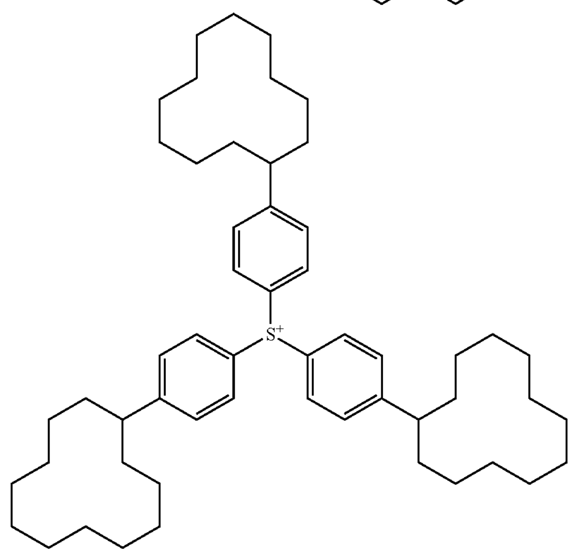
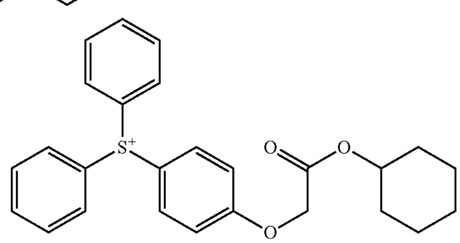
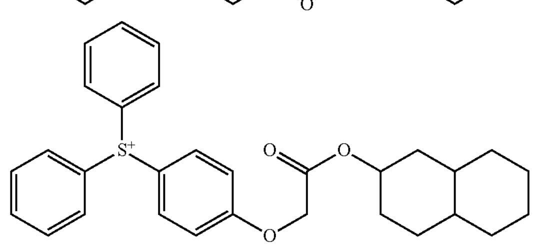
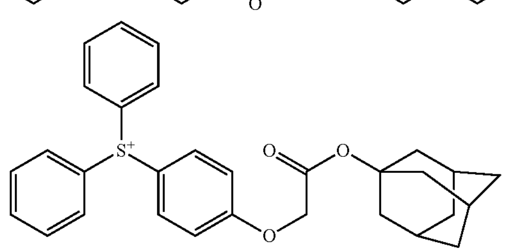

-continued
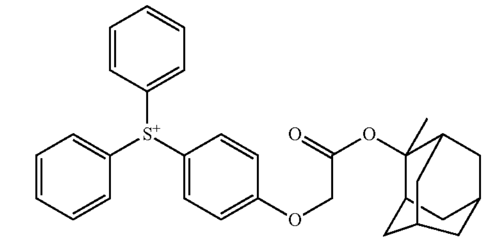
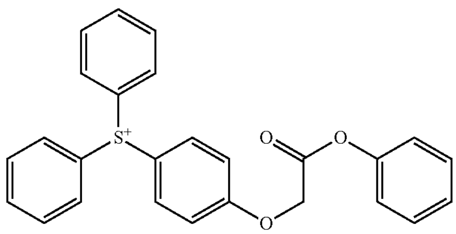
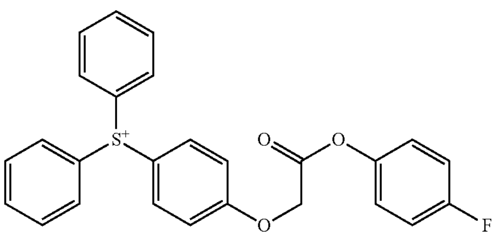
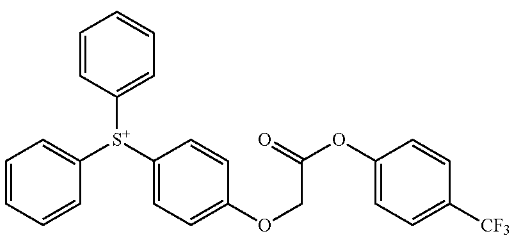
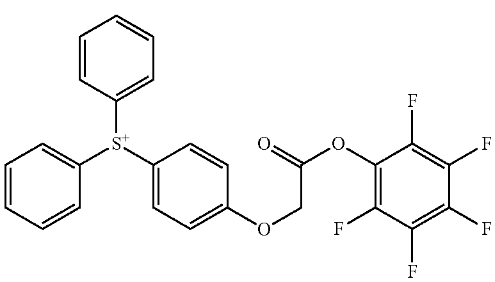
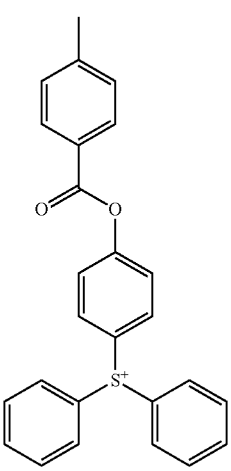
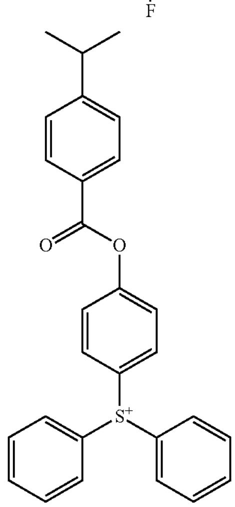
-continued
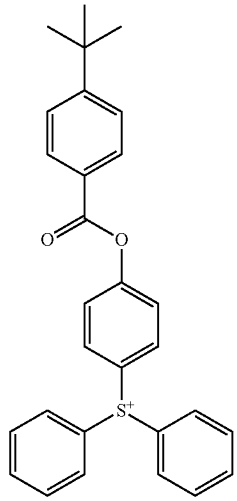
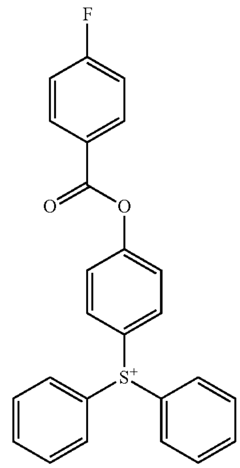
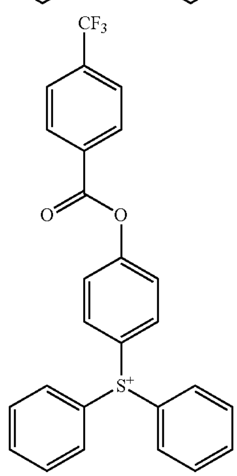
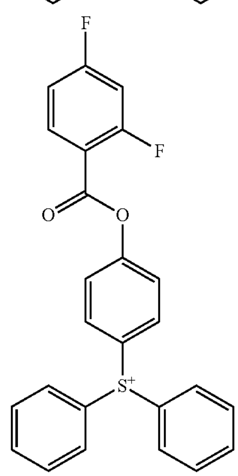
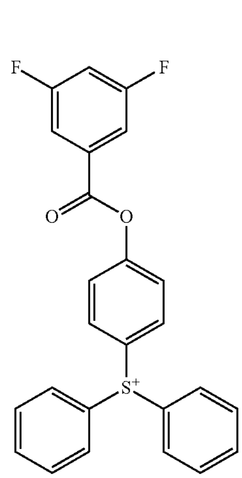
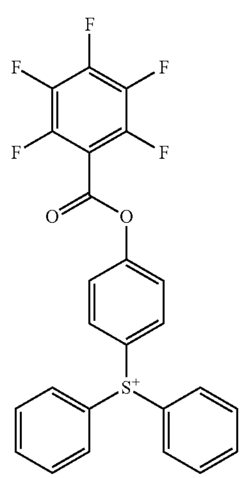
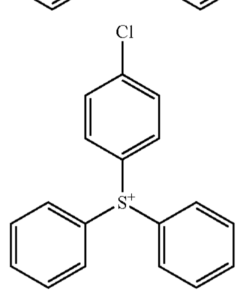
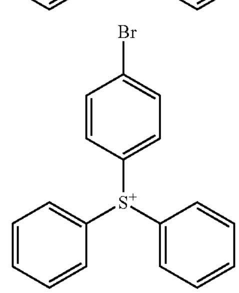

-continued
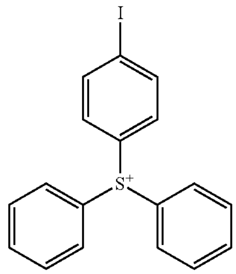
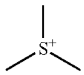
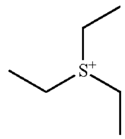
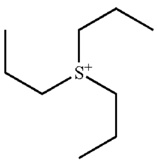
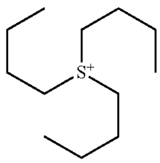
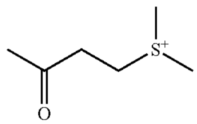
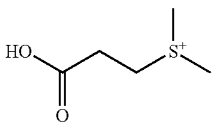
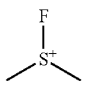
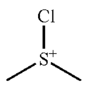
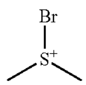
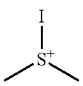
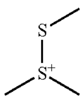
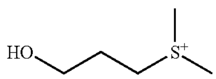
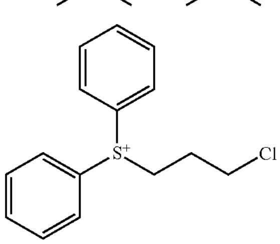
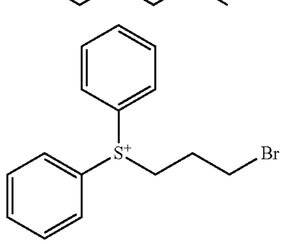
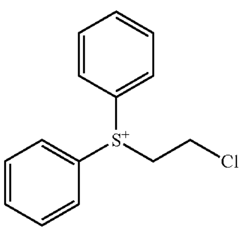
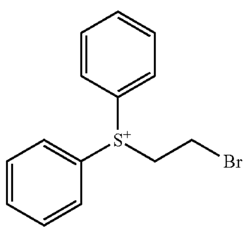
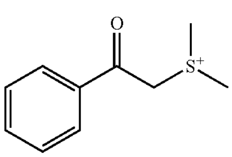
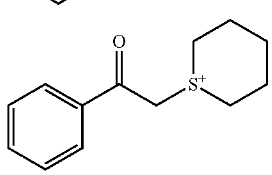
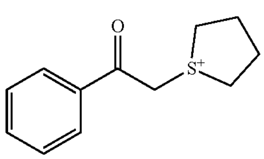
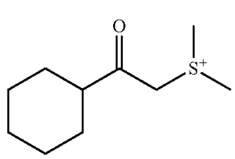
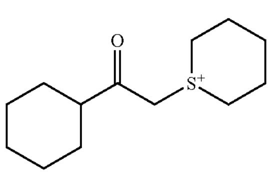
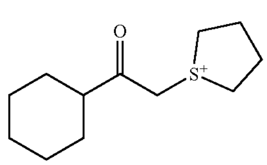
-continued
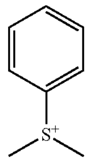
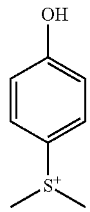
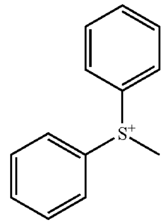
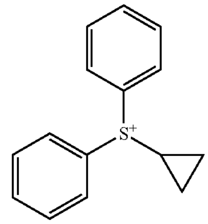
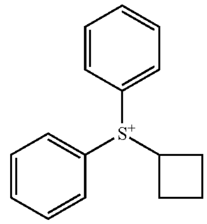
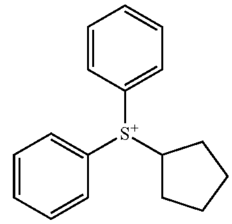
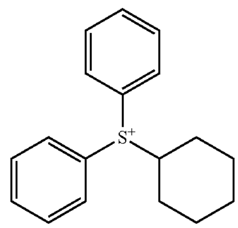
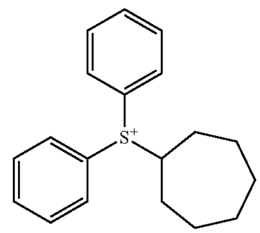
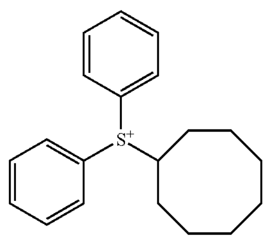
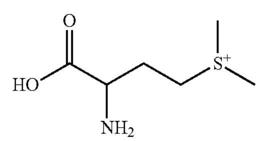
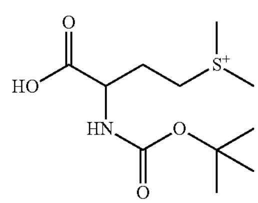
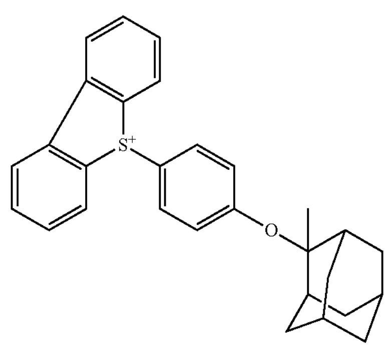

-continued
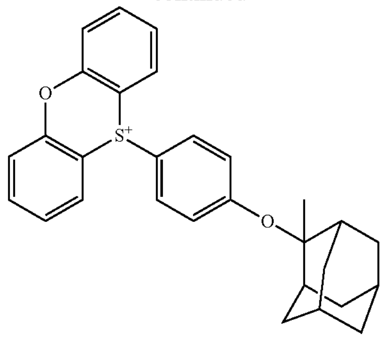
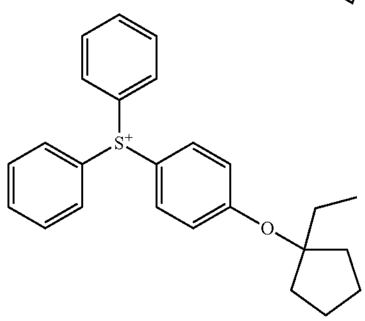
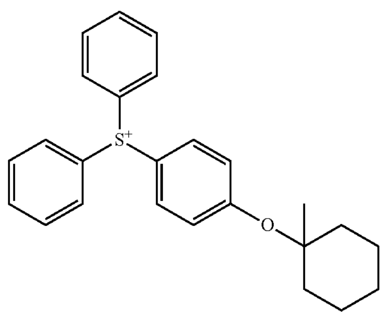
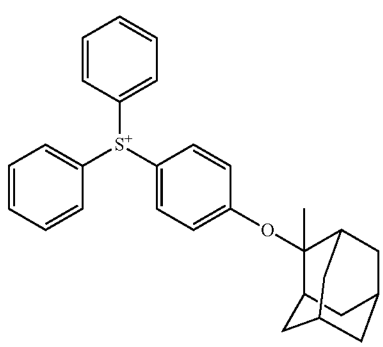
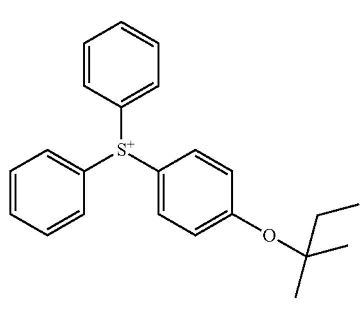
-continued
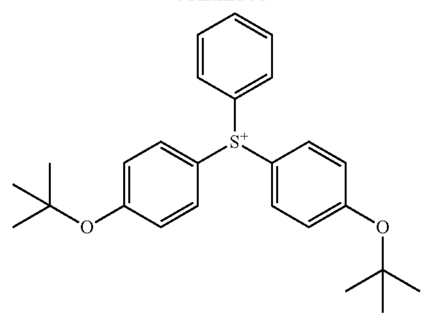
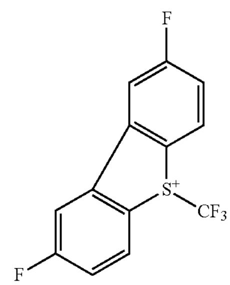
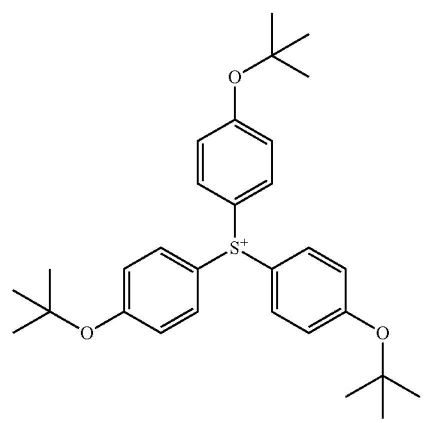
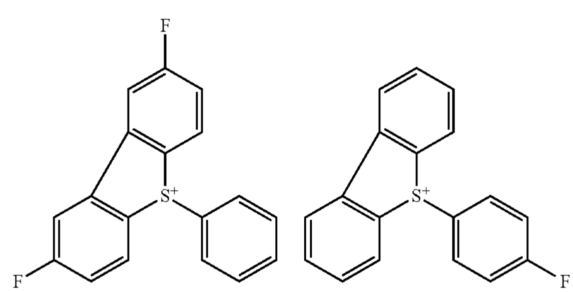
Examples of the cation moiety in the iodonium salt having formula (1-2) are given below, but not limited thereto.

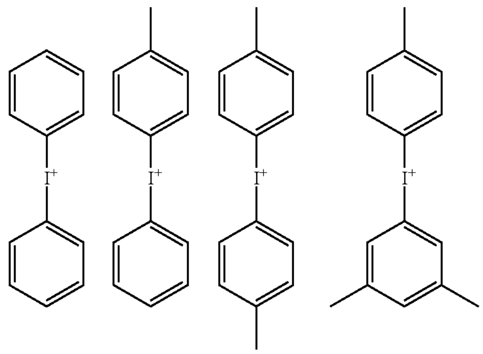
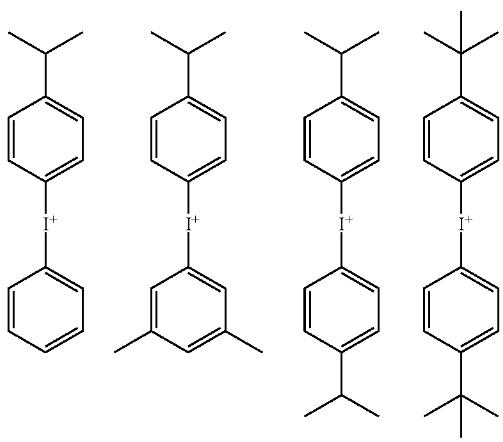
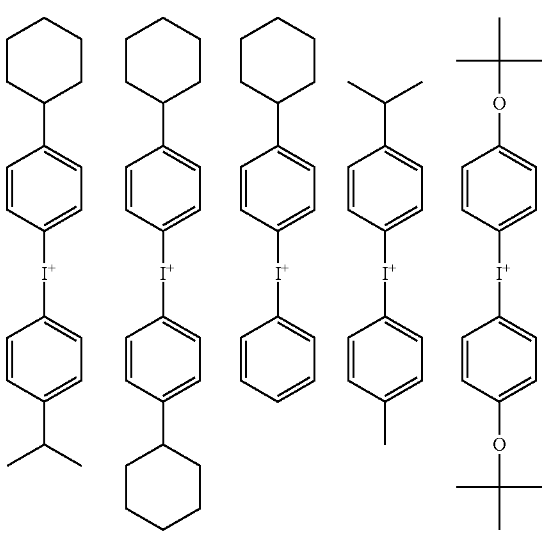
-continued
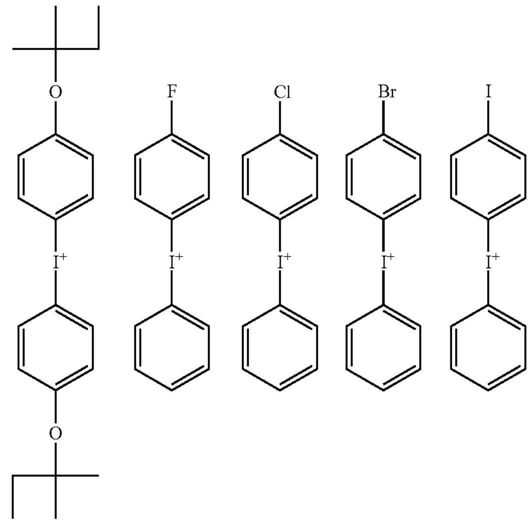
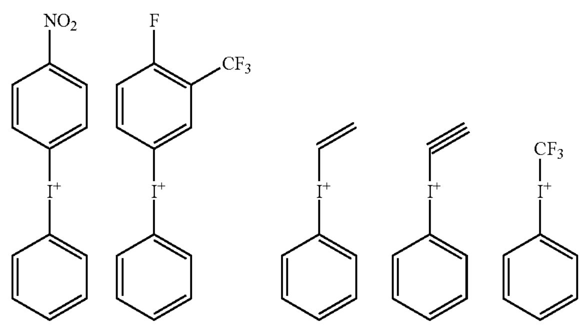
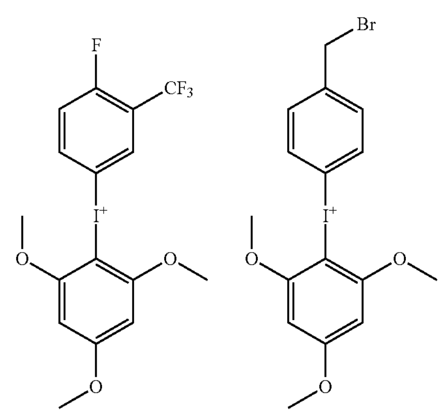
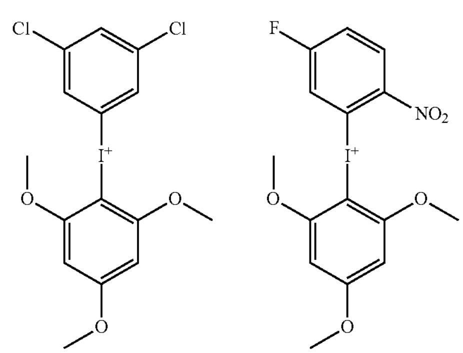

-continued

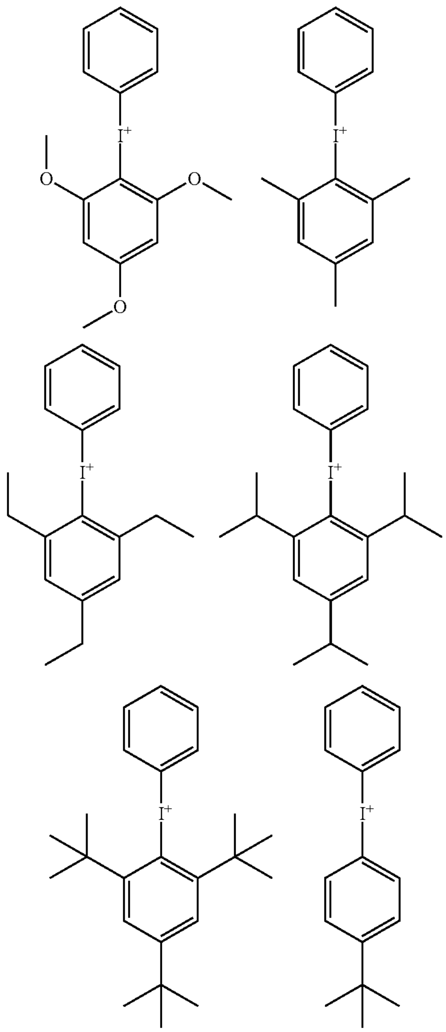

In formulae (1-1) and (1-2), $X^-$ is an anion of the following formula (1A), (1B), (1C) or (1D).

(1A)

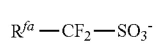

(1B)

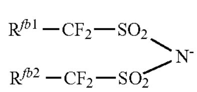

(1C)

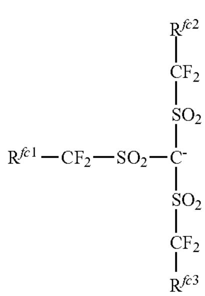

-continued (1D)

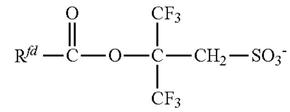

In formula (1A), $R^{fa}$ is fluorine or a $C_1$-$C_{40}$ straight, branched or cyclic monovalent hydrocarbon group which may contain a heteroatom.

Of the anions of formula (1A), an anion having the formula (1A') is preferred.

(1A')

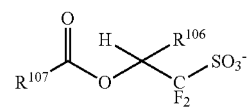

In formula (1A'), $R^{106}$ is hydrogen or trifluoromethyl, preferably trifluoromethyl. $R^{107}$ is a $C_1$-$C_{38}$ straight, branched or cyclic monovalent hydrocarbon group which may contain a heteroatom. As the heteroatom, oxygen, nitrogen, sulfur and halogen atoms are preferred, with oxygen being most preferred. Of the monovalent hydrocarbon groups represented by $R^{107}$, those groups of 6 to 30 carbon atoms are preferred from the aspect of achieving a high resolution in forming patterns of fine feature size. Suitable monovalent hydrocarbon groups include, but are not limited to, methyl, ethyl, propyl, isopropyl, butyl, isobutyl, s-butyl, t-butyl, pentyl, neopentyl, cyclopentyl, hexyl, cyclohexyl, 3-cyclohexenyl, heptyl, 2-ethylhexyl, nonyl, undecyl, tridecyl, pentadecyl, heptadecyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl. In these groups, one or more hydrogen atoms may be substituted by a moiety containing a heteroatom such as oxygen, sulfur, nitrogen or halogen, or one or more carbon atoms may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety.

With respect to the synthesis of the sulfonium salt having an anion of formula (1A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion of formula (1A) are shown below, but not limited thereto.

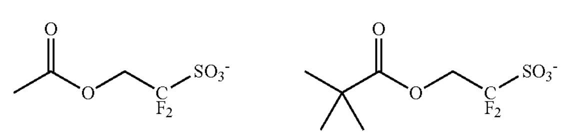

-continued
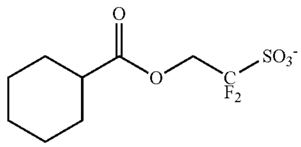
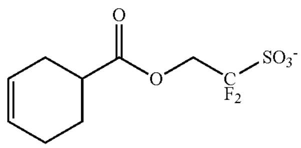
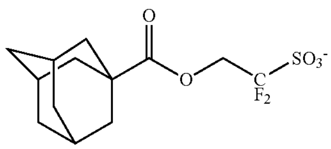
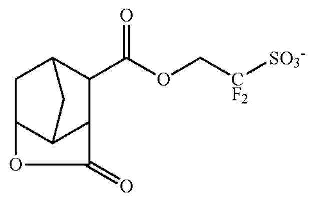
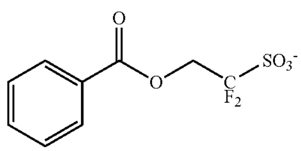
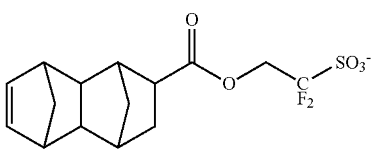
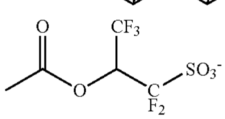
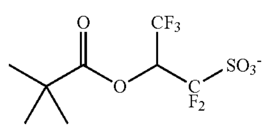
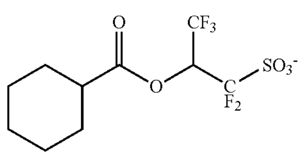
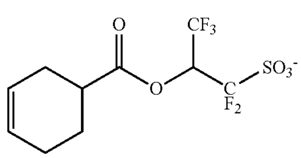
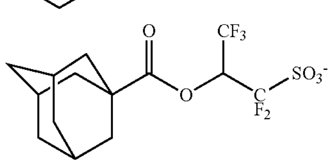
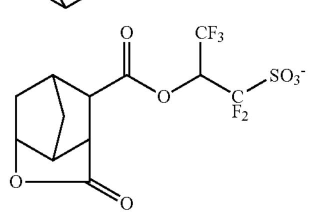
-continued
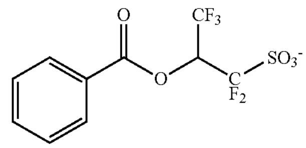
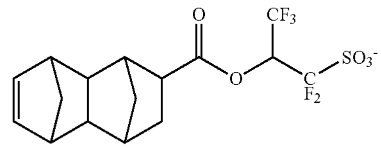
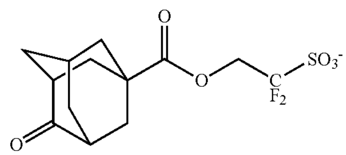
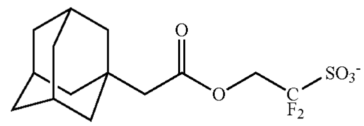
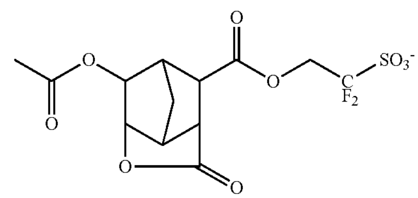
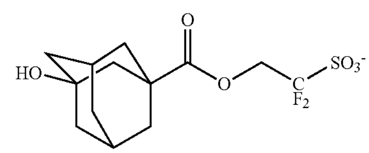
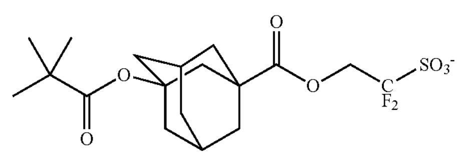
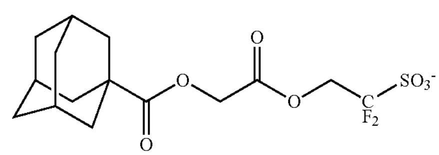
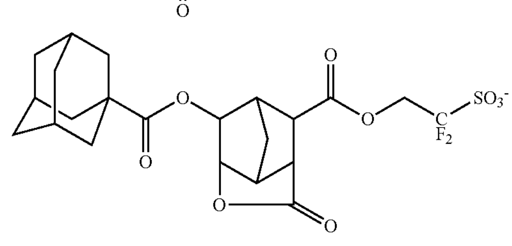
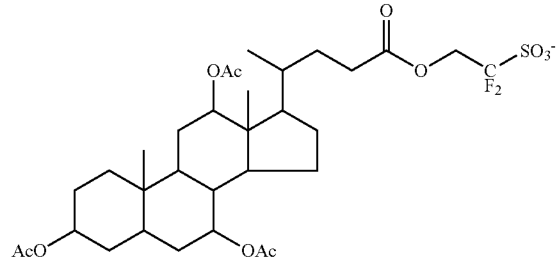

-continued

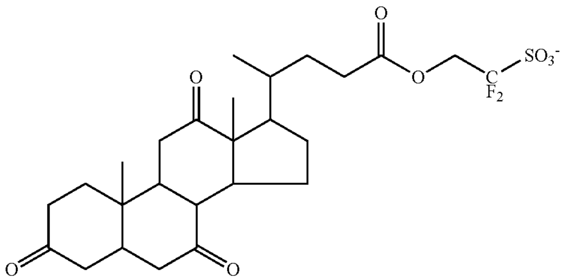

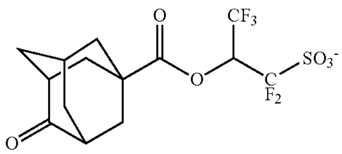

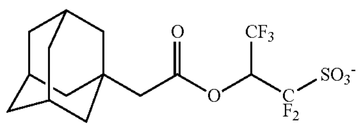

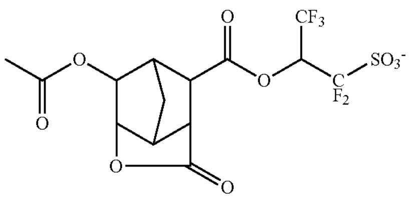

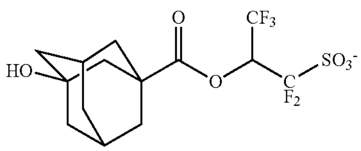

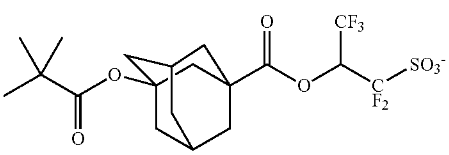

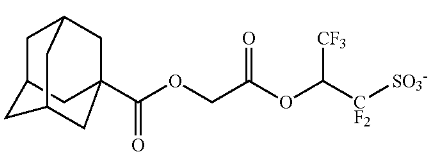

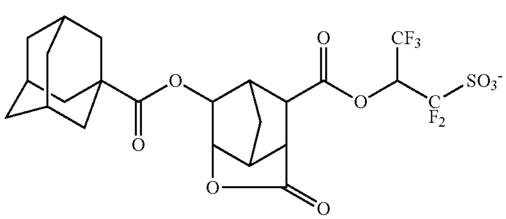

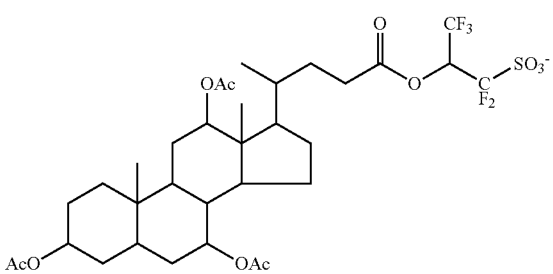

-continued

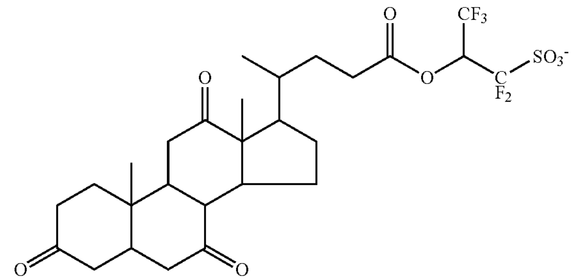

In formula (1B), $R^{fb1}$ and $R^{fb2}$ are each independently fluorine or a $C_1$-$C_{40}$ straight, branched or cyclic monovalent hydrocarbon group which may contain a heteroatom. Illustrative examples of the monovalent hydrocarbon group are as exemplified for $R^{107}$. Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: $—CF_2—SO_2—N^-—SO_2—CF_2—$ to which they are attached. The preferred structure that $R^{fb1}$ and $R^{fb2}$ bond together to form is a fluorinated ethylene or fluorinated propylene group.

In formula (1C), $R^{fc1}$, $R^{fc2}$ and $R^{fc3}$ are each independently fluorine or a $C_1$-$C_{40}$ straight, branched or cyclic monovalent hydrocarbon group which may contain a heteroatom. Illustrative examples of the monovalent hydrocarbon group are as exemplified for $R^{107}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: $—CF_2—SO_2—C^-—SO_2—CF_2—$ to which they are attached. The preferred structure that $R^{fc1}$ and $R^{fc2}$ bond together to form is a fluorinated ethylene or fluorinated propylene group.

In formula (1D), $R^{fd}$ is a $C_1$-$C_{40}$ straight, branched or cyclic monovalent hydrocarbon group which may contain a heteroatom. Illustrative examples of the monovalent hydrocarbon group are as exemplified for $R^{107}$.

With respect to the synthesis of the sulfonium salt having an anion of formula (1D), reference may be made to JP-A 2010-215608 and JP-A 2014-133723.

Examples of the anion of formula (1D) are shown below, but not limited thereto.

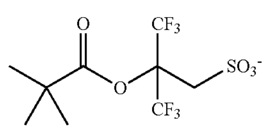

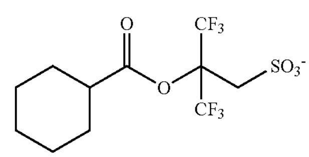

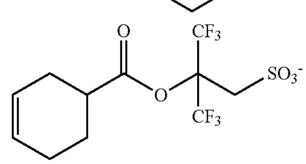

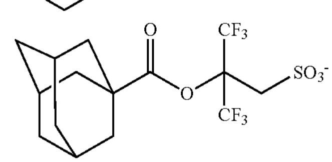

-continued

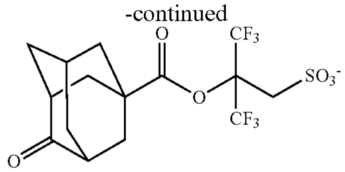

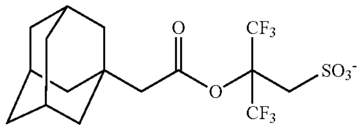

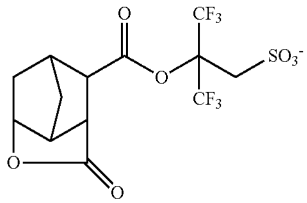

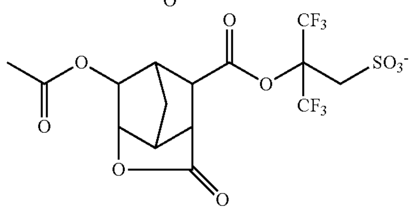

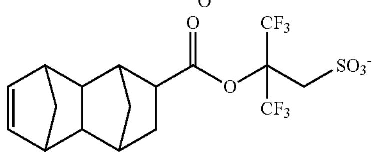

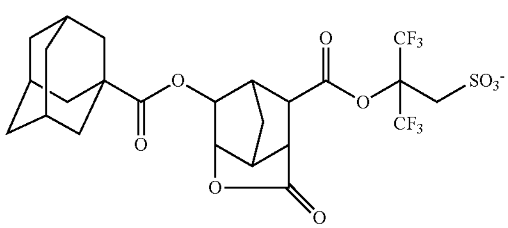

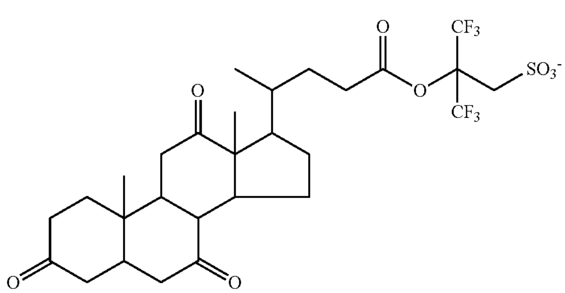

Notably, the compound having the anion of formula (1D) does not have fluorine at the α-position relative to the sulfo group, but two trifluoromethyl groups at the β-position. For this reason, it has a sufficient acidity to sever the acid labile groups in the resist polymer. Thus the compound is an effective PAG.

Another preferred PAG is a compound having the formula (2).

(2)

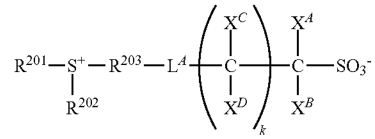

In formula (2), $R^{201}$ and $R^{202}$ are each independently a $C_1$-$C_{30}$ straight, branched or cyclic monovalent hydrocarbon group which may contain a heteroatom. $R^{203}$ is a $C_1$-$C_{30}$ straight, branched or cyclic divalent hydrocarbon group which may contain a heteroatom. Any two of $R^{201}$, $R^{202}$ and $R^{203}$ may bond together to form a ring with the sulfur atom to which they are attached. $L^A$ is a single bond, ether bond or a $C_1$-$C_{20}$ straight, branched or cyclic divalent hydrocarbon group which may contain a heteroatom. $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Examples of the monovalent hydrocarbon group include methyl, ethyl, propyl, isopropyl, n-butyl, s-butyl, t-butyl, n-pentyl, t-pentyl, n-hexyl, n-octyl, n-nonyl, n-decyl, cyclopentyl, cyclohexyl, 2-ethylhexyl, cyclopentylmethyl, cyclopentylethyl, cyclopentylbutyl, cyclohexylmethyl, cyclohexylethyl, cyclohexylbutyl, norbornyl, oxanorbomyl, tricyclo[5.2.1.$0^{2,6}$]decanyl, adamantyl, phenyl, naphthyl and anthracenyl. In these groups, one or more hydrogen atoms may be substituted by a heteroatom such as oxygen, sulfur, nitrogen or halogen, or one or more carbon atoms may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety.

Suitable divalent hydrocarbon groups include straight alkane-diyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; saturated cyclic divalent hydrocarbon groups such as cyclopentanediyl, cyclohexanediyl, norbornanediyl and adamantanediyl; and unsaturated cyclic divalent hydrocarbon groups such as phenylene and naphthylene. In these groups, one or more hydrogen atoms may be substituted by an alkyl moiety such as methyl, ethyl, propyl, n-butyl or t-butyl; one or more hydrogen atoms may be substituted by a moiety containing a heteroatom such as oxygen, sulfur, nitrogen or halogen; or one or more carbon atoms may be substituted by a moiety containing a heteroatom such as oxygen, sulfur or nitrogen, so that the group may contain a hydroxyl, cyano, carbonyl, ether, ester, sulfonic acid ester, carbonate, lactone ring, sultone ring, carboxylic anhydride or haloalkyl moiety. Of the heteroatoms, oxygen is preferred.

Of the PAGs having formula (2), those having formula (2') are preferred.

(2')

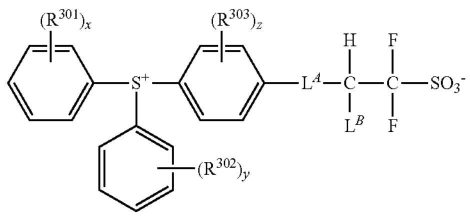

In formula (2'), $L^A$ is as defined above. $L^B$ is hydrogen or trifluoromethyl, preferably trifluoromethyl. $R^{301}$, $R^{302}$ and $R^{303}$ are each independently hydrogen or a $C_1$-$C_{20}$ straight, branched or cyclic monovalent hydrocarbon group which may contain a heteroatom. Suitable monovalent hydrocarbon groups are as described above for $R^{107}$. The subscripts x and y are each independently an integer of 0 to 5, and z is an integer of 0 to 4.

Examples of the PAG having formula (2) are shown below, but not limited thereto. Notably, $L^B$ is as defined above.

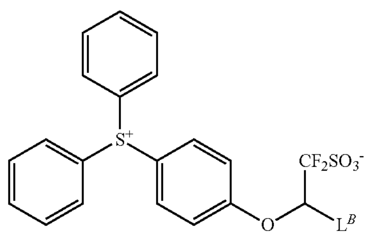

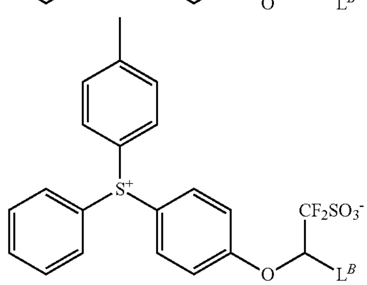

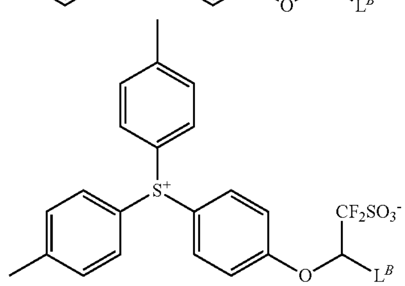

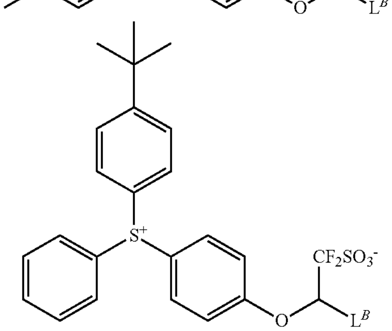

-continued

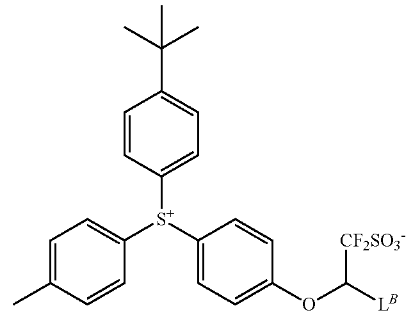

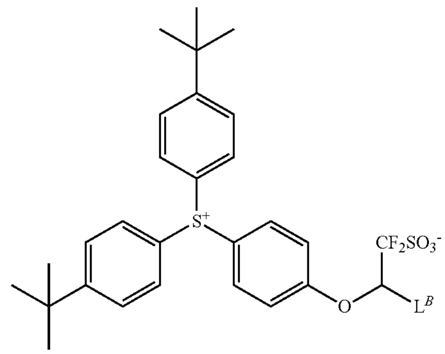

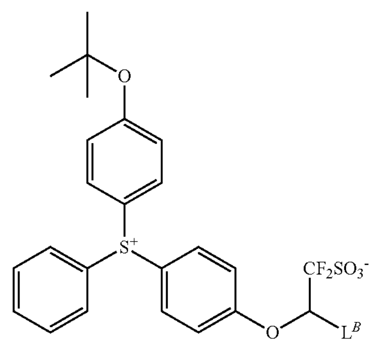

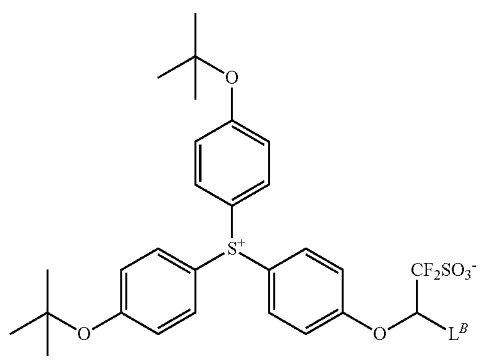

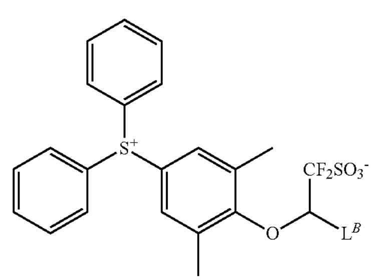

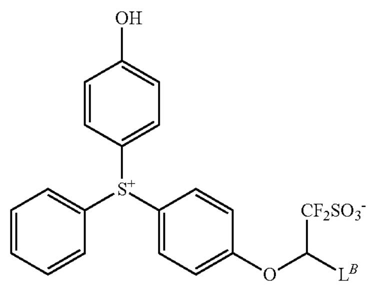
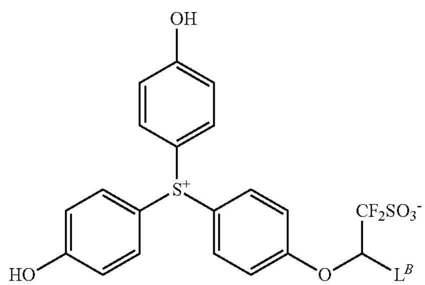
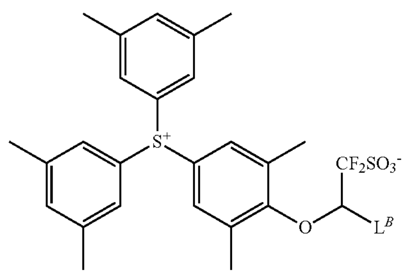
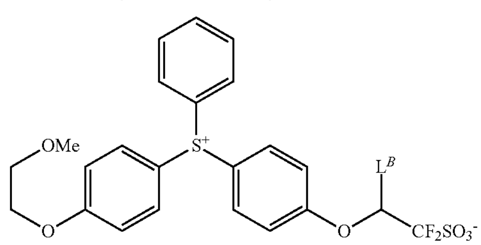
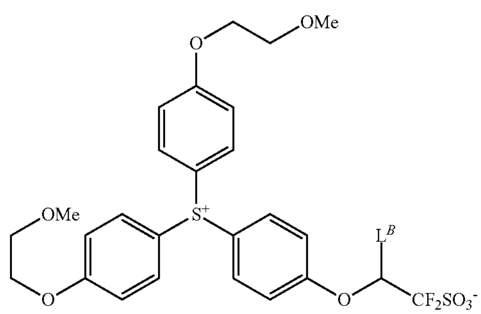
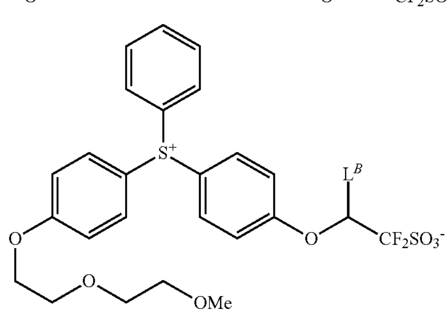
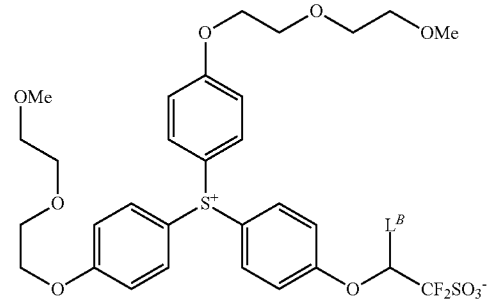
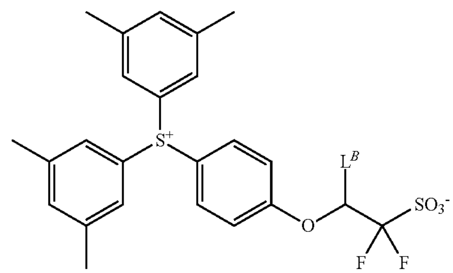
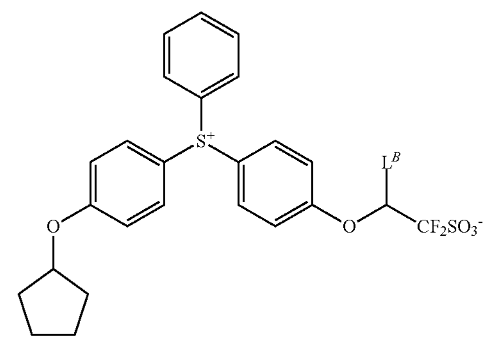
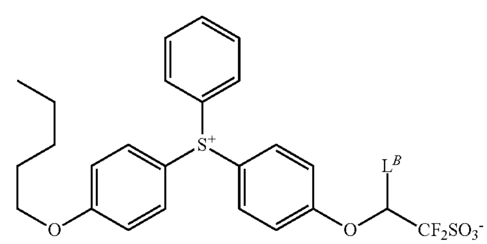
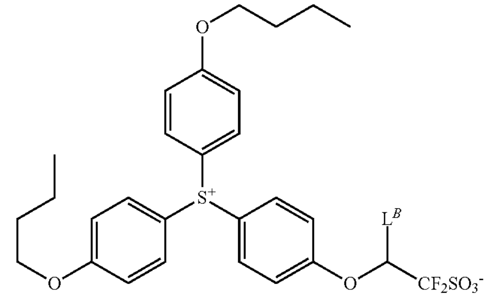
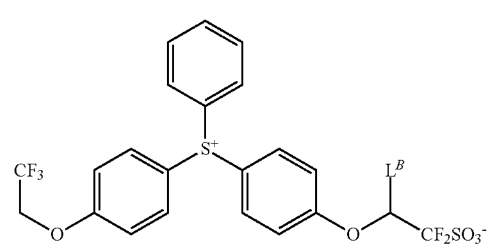

-continued
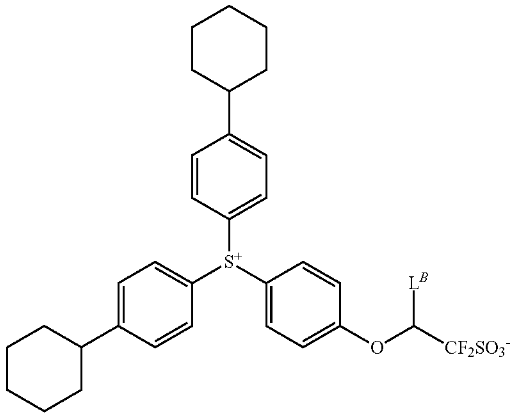
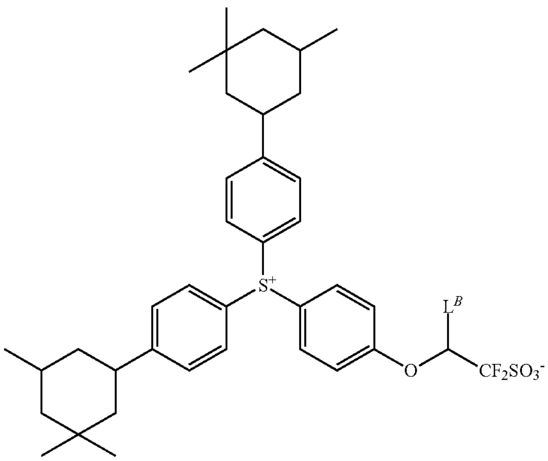
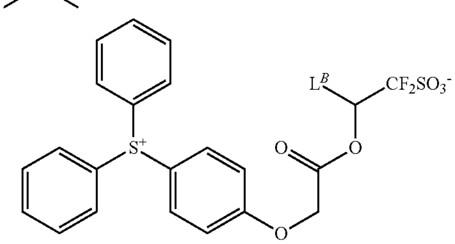
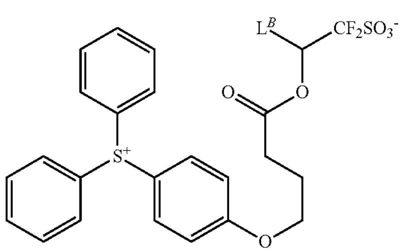
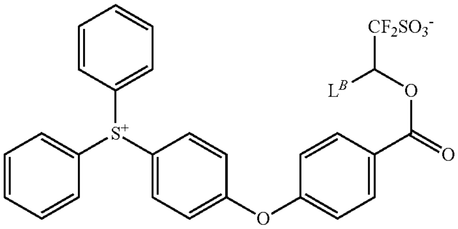
-continued
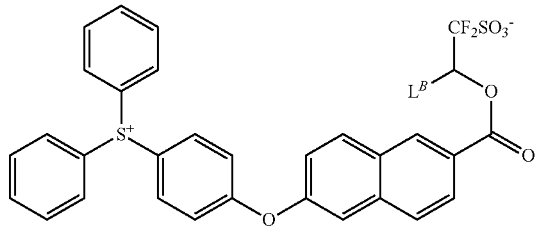
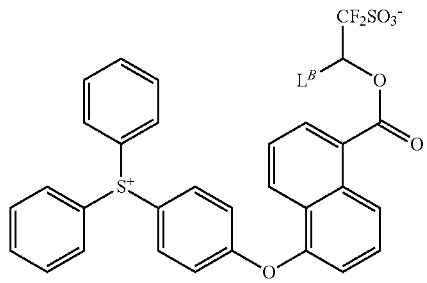
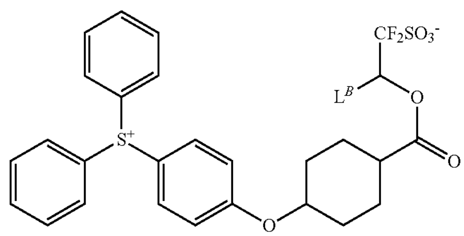
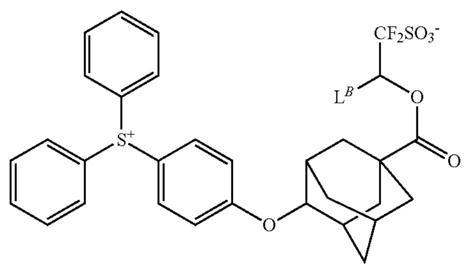
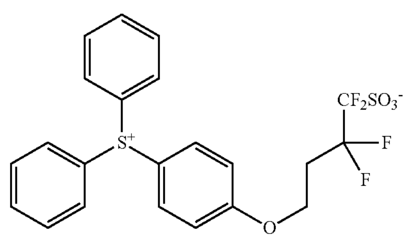
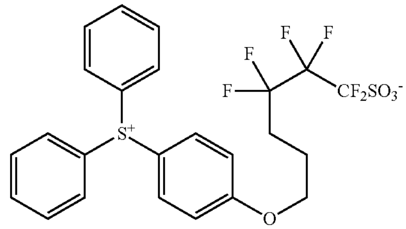
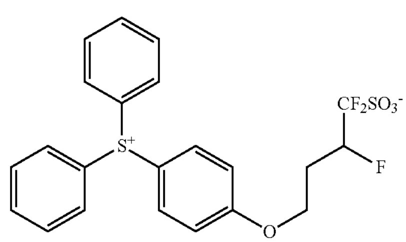

-continued

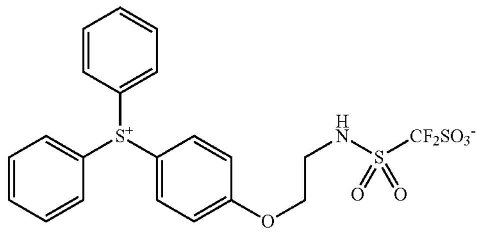

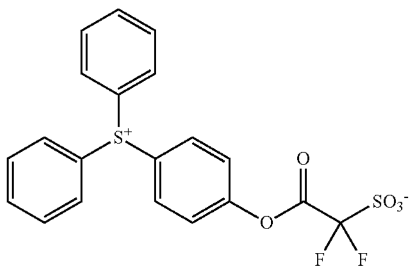

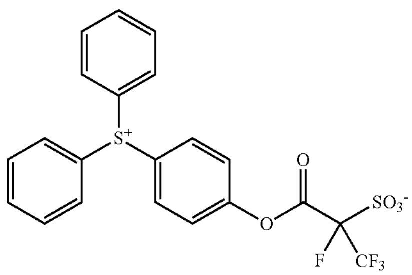

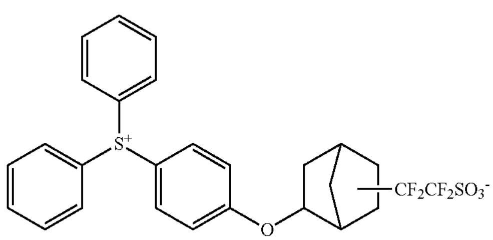

Of the foregoing PAGs, those having an anion of formula (1A') or (1D) are especially preferred because of reduced acid diffusion and high solubility in the resist solvent. Also those having an anion of formula (2') are especially preferred because of extremely reduced acid diffusion.

Other useful PAGs are sulfonium and iodonium salts of iodized benzoyloxy-containing fluorinated sulfonic acid having the formulae (3-1) and (3-2), respectively.

(3-1)

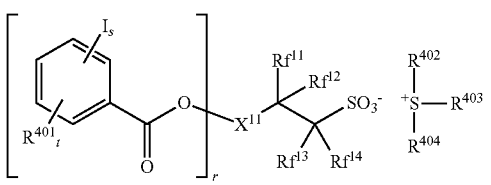

-continued (3-2)

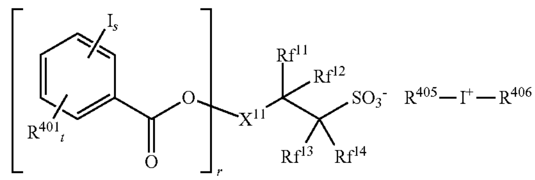

In formulae (3-1) and (3-2), $R^{401}$ is hydrogen, hydroxyl, carboxyl, nitro, cyano, fluorine, chlorine, bromine, amino group, or a straight, branched or cyclic, $C_1$-$C_{20}$ alkyl, $C_1$-$C_{20}$ alkoxy, $C_2$-$C_{20}$ alkoxycarbonyl, $C_2$-$C_{20}$ acyloxy or alkylsulfonyloxy group, which may contain fluorine, chlorine, bromine, hydroxy, amino or alkoxy moiety, or —$NR^{407}$—C(═O)—$R^{408}$ or —$NR^{407}$—C(═O)—O—$R^{408}$, wherein $R^{407}$ is hydrogen, or a straight, branched or cyclic $C_1$-$C_6$ alkyl group which may contain halogen, hydroxy, alkoxy, acyl or acyloxy moiety, $R^{408}$ is a straight, branched or cyclic, $C_1$-$C_{16}$ alkyl or $C_2$-$C_{16}$ alkenyl group, or $C_6$-$C_{12}$ aryl group, which may contain halogen, hydroxy, alkoxy, acyl or acyloxy moiety. $X^{11}$ is a single bond or a $C_1$-$C_{20}$ divalent linking group when r=1, or a $C_1$-$C_{20}$ tri- or tetravalent linking group when r=2 or 3, the linking group optionally containing an oxygen, sulfur or nitrogen atom. $Rf^{11}$ to $Rf^{14}$ are each independently hydrogen, fluorine or trifluoromethyl, at least one of $Rf^{11}$ to $Rf^{14}$ being fluorine or trifluoromethyl, or $Rf^{11}$ and $Rf^{12}$ taken together, may form a carbonyl group. $R^{402}$, $R^{403}$, $R^{404}$, $R^{405}$ and $R^{406}$ are each independently a $C_1$-$C_{12}$ straight, branched or cyclic alkyl group, $C_2$-$C_{12}$ straight, branched or cyclic alkenyl group, $C_2$-$C_{12}$ straight, branched or cyclic alkynyl group, $C_6$-$C_{20}$ aryl group, $C_7$-$C_{12}$ aralkyl group or $C_7$-$C_{12}$ aryloxyalkyl group, in which at least one hydrogen (one or more or even all hydrogen atoms) may be substituted by a hydroxyl, carboxyl, halogen, cyano, oxo, amide, nitro, sultone, sulfone or sulfonium salt-containing moiety, or in which at least one carbon atom may be substituted by an ether, ester, carbonyl, carbonate or sulfonic acid ester moiety, or $R^{402}$ and $R^{403}$ may bond together to form a ring with the sulfur atom to which they are attached, r is an integer of 1 to 3, s is an integer of 1 to 5, and t is an integer of 0 to 3.

Further useful PAGs are sulfonium and iodonium salts of iodized benzene-containing fluorinated sulfonic acid having the formulae (3-3) and (3-4), respectively.

(3-3)

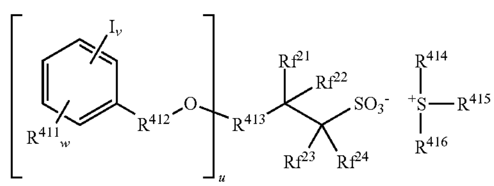

(3-4)

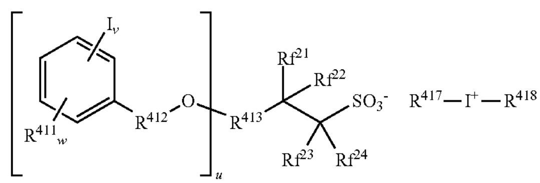

In formulae (3-3) and (3-4), $R^{411}$ is each independently a hydroxyl, $C_1$-$C_{20}$ straight, branched or cyclic alkyl or alkoxy group, $C_2$-$C_{20}$ straight, branched or cyclic acyl or acyloxy group, fluorine, chlorine, bromine, amino, or alkoxycarbonyl-substituted amino group. $R^{412}$ is each independently a single bond or alkylene group. $R^{413}$ is a single bond or $C_1$-$C_{20}$ divalent linking group when u=1, or a $C_1$-$C_{20}$ tri- or tetravalent linking group when u=2 or 3, the linking group optionally containing an oxygen, sulfur or nitrogen atom. $Rf^{21}$ to $Rf^{24}$ are each independently hydrogen, fluorine or trifluoromethyl, at least one of $Rf^{21}$ to $Rf^{24}$ being fluorine or trifluoromethyl, or $Rf^{21}$ and $Rf^{22}$, taken together, may form a carbonyl group. $R^{414}$, $R^{415}$, $R^{416}$, $R^{417}$ and $R^{418}$ are each independently a $C_1$-$C_{12}$ straight, branched or cyclic alkyl group, $C_2$-$C_{12}$ straight, branched or cyclic alkenyl group, $C_6$-$C_{20}$ aryl group, $C_7$-$C_{12}$ aralkyl group or $C_7$-$C_{12}$ aryloxyalkyl group, in which at least one hydrogen (one or more or even all hydrogen atoms) may be substituted by a hydroxyl, carboxyl, halogen, cyano, oxo, amide, nitro, sultone, sulfone, or sulfonium salt-containing moiety, or in which at least one carbon atom may be substituted by an ether, ester, carbonyl, carbonate or sulfonic acid ester moiety, or $R^{414}$ and $R^{415}$ may bond together to form a ring with the sulfur atom to which they are attached, u is an integer of 1 to 3, v is an integer of 1 to 5, and w is an integer of 0 to 3.

Suitable examples of the cation moiety in the sulfonium salt having formulae (3-1) and (3-3) are as exemplified above as the cation moiety in the sulfonium salt having formula (1-1). Suitable examples of the cation moiety in the iodonium salt having formulae (3-2) and (3-4) are as exemplified above as the cation moiety in the iodonium salt having formula (1-2).

Examples of the anion moiety in the onium salts having formulae (3-1) to (3-4) are given below, but not limited thereto.

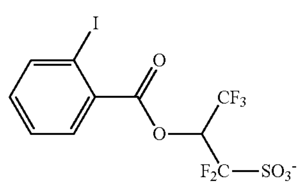

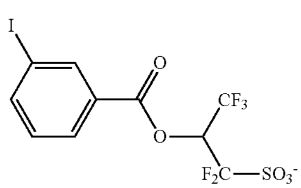

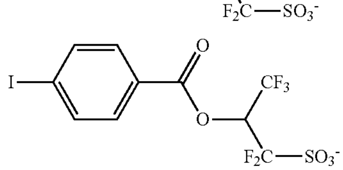

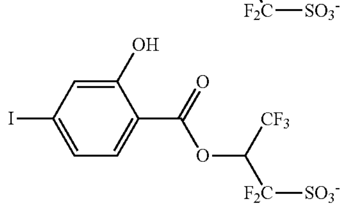

-continued

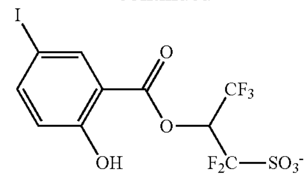

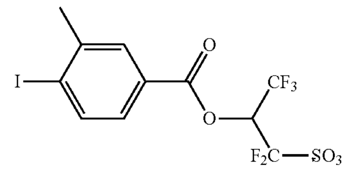

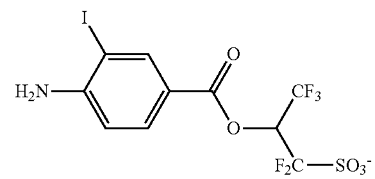

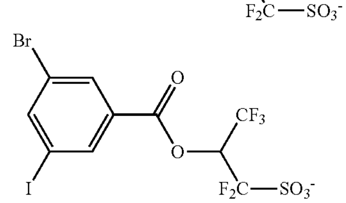

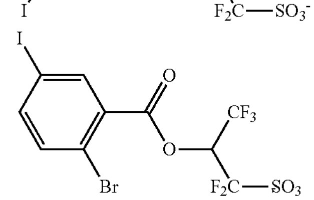

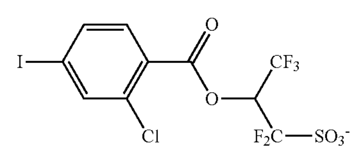

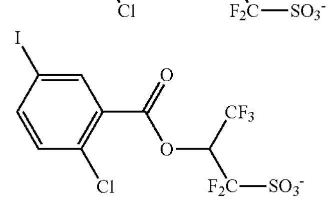

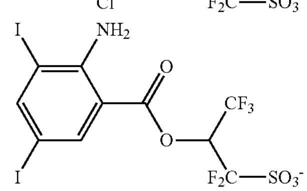

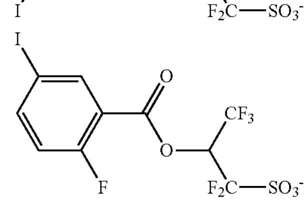

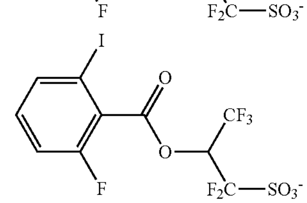

-continued
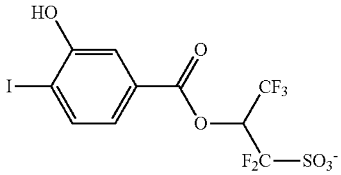
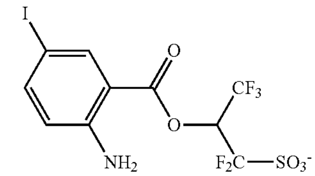
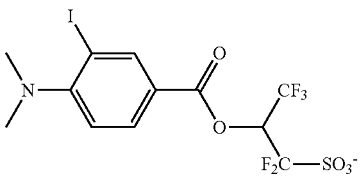
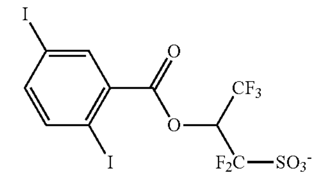
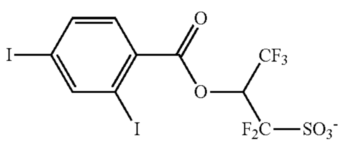
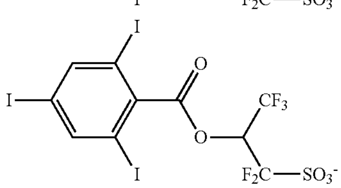
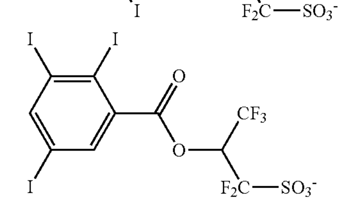
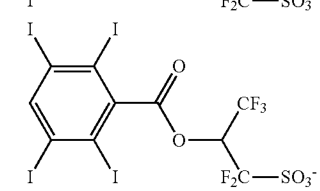
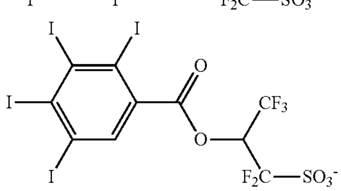
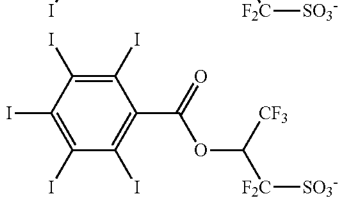
-continued
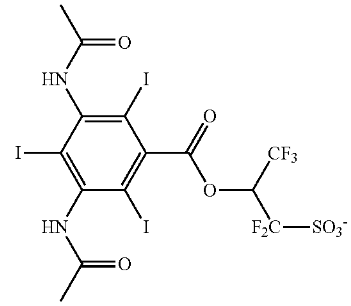
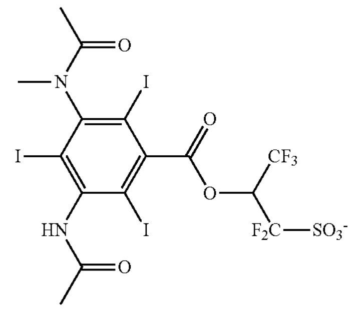
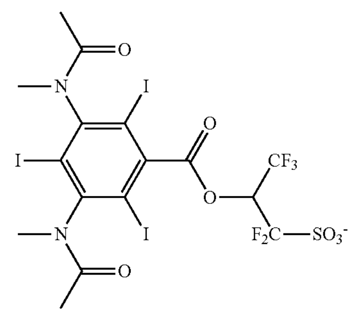
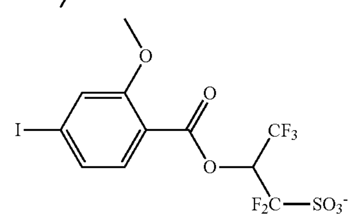
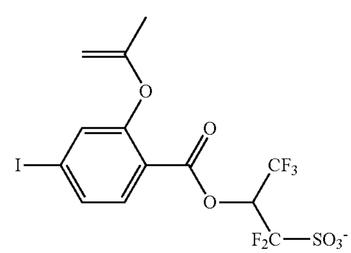
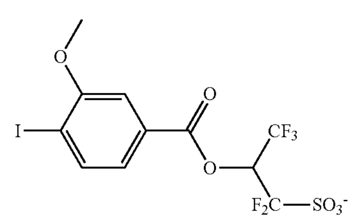

-continued
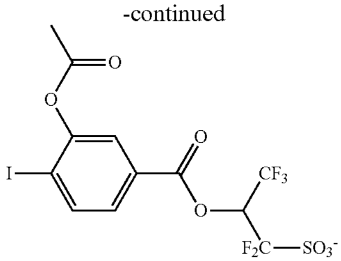
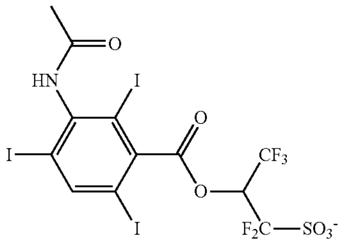
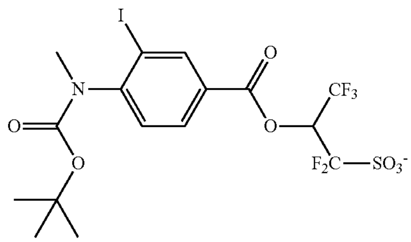
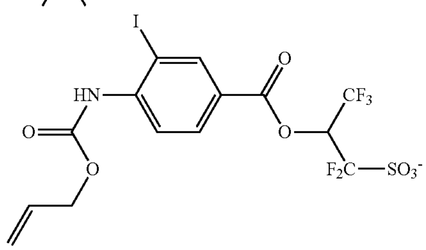
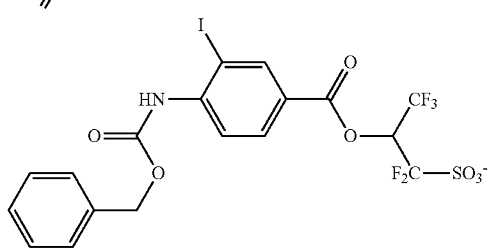
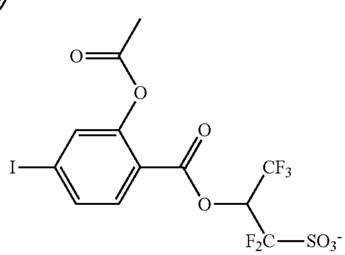
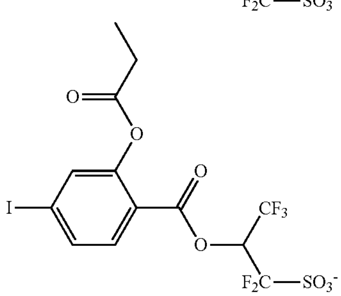
-continued
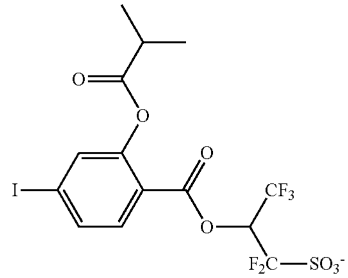
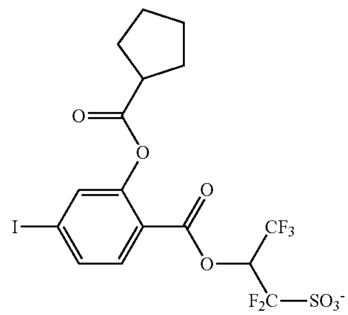
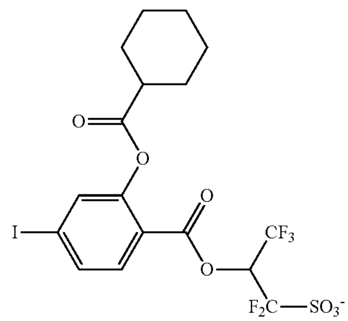
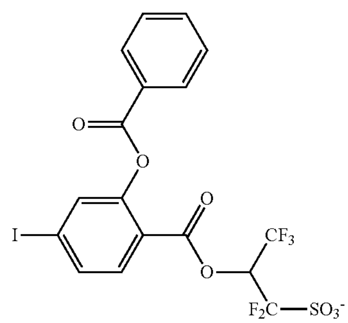
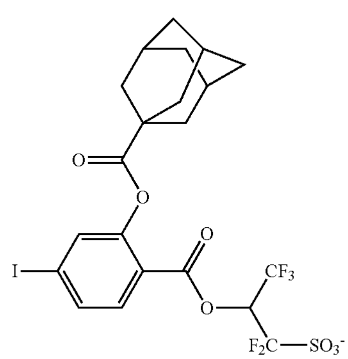

-continued
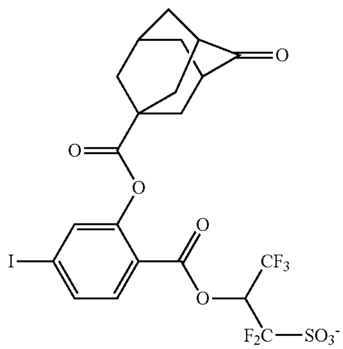
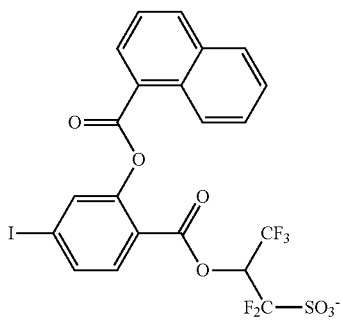
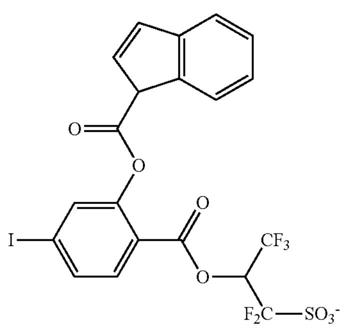
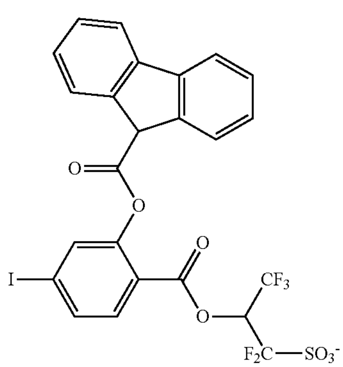
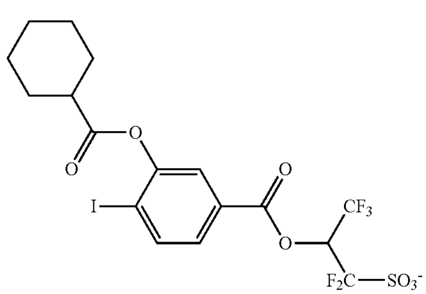
-continued
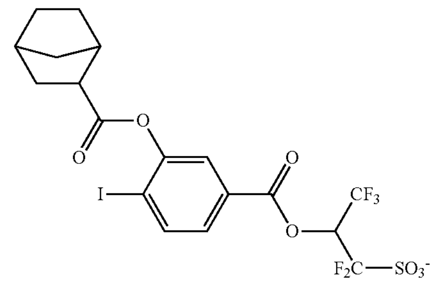
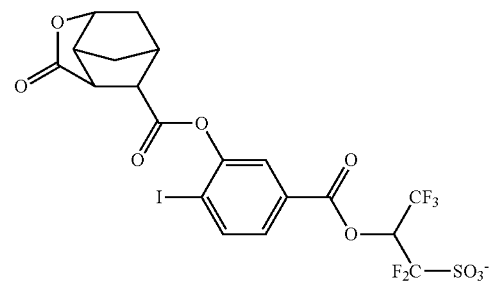
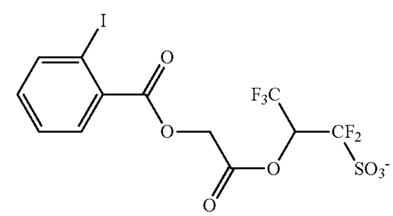
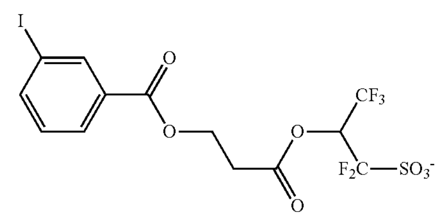
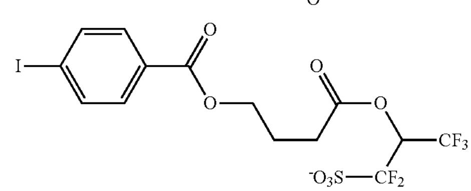
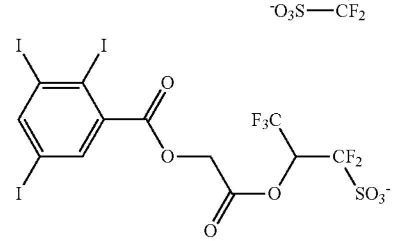
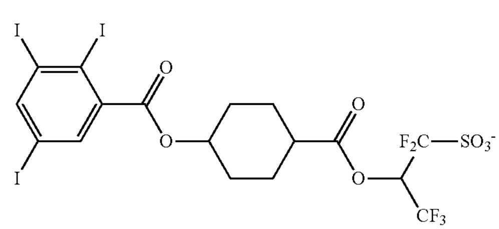

-continued
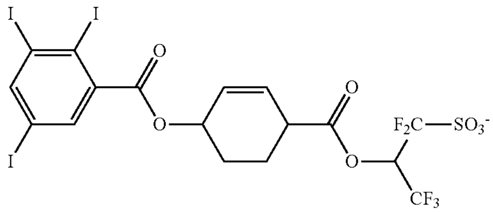
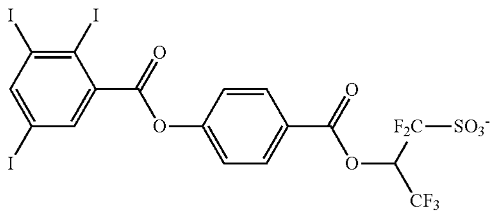
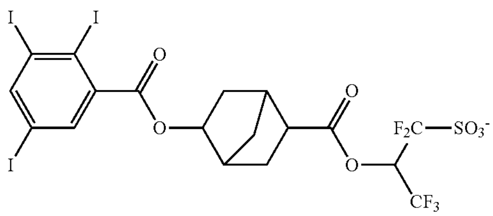
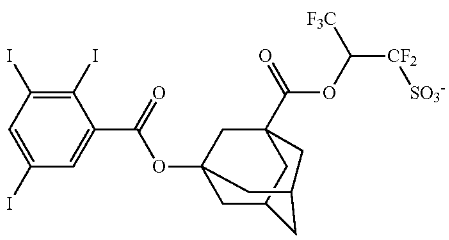
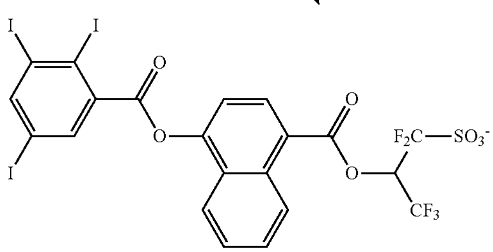
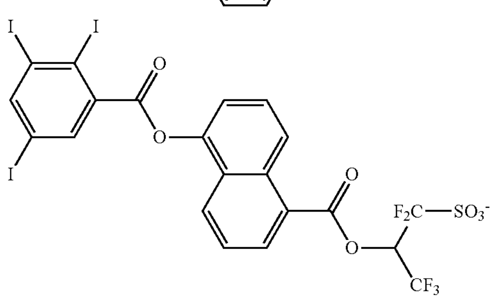
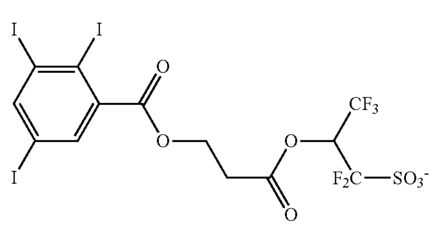
-continued
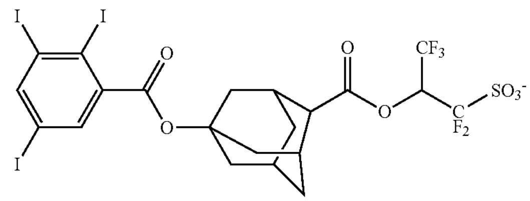
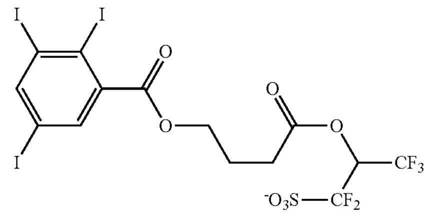
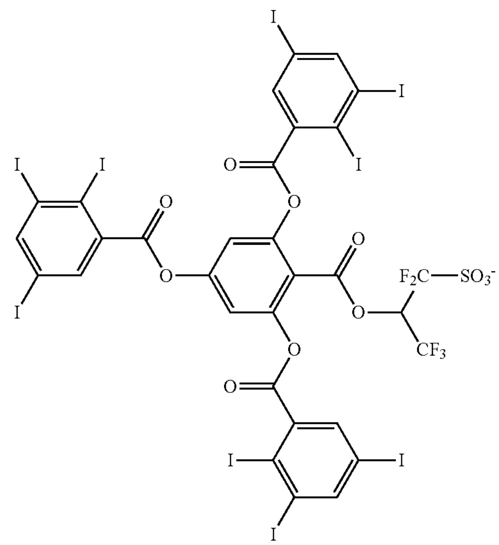
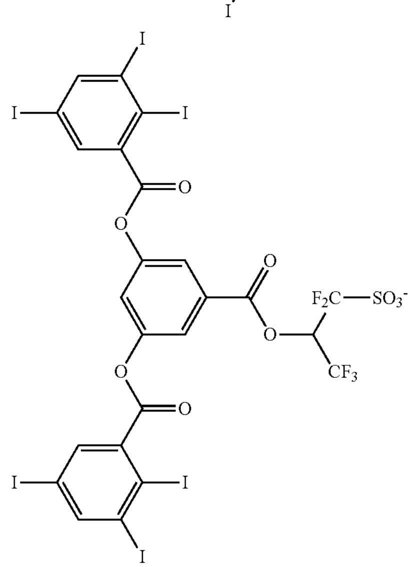
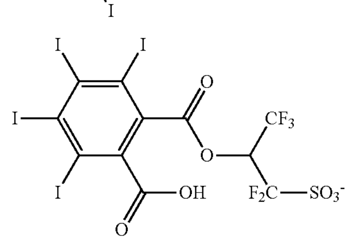

-continued
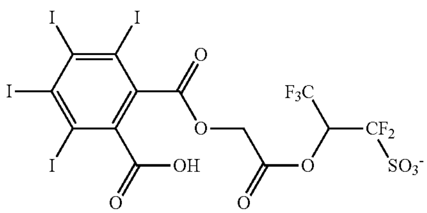
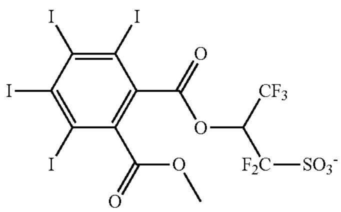
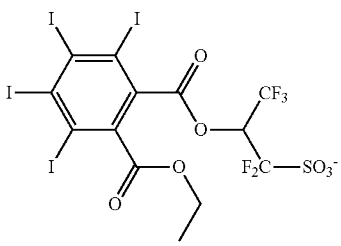
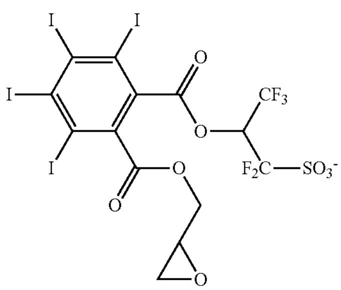
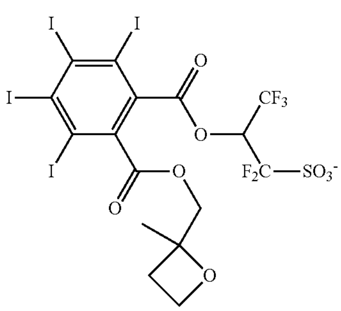
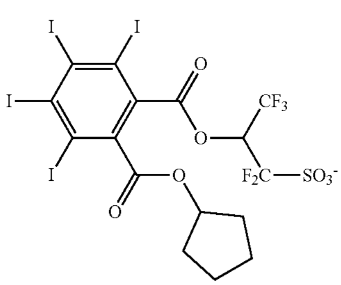
-continued
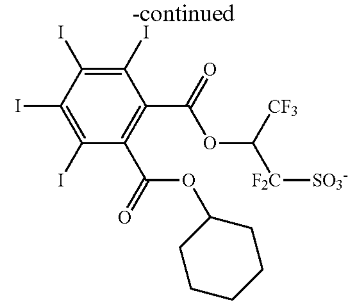
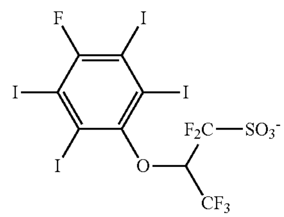
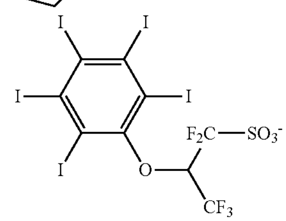
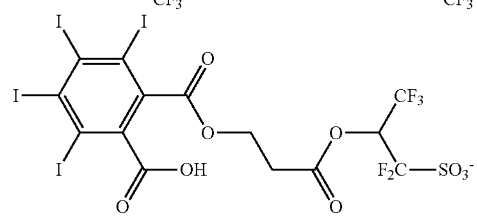
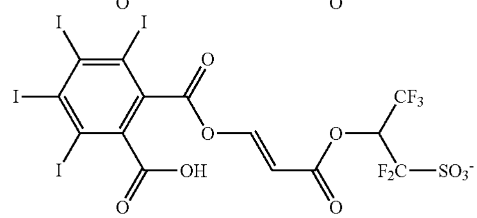
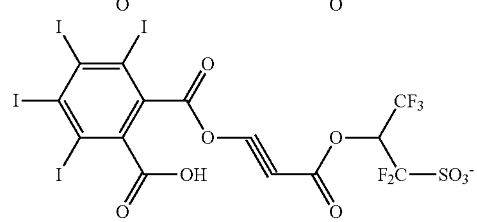
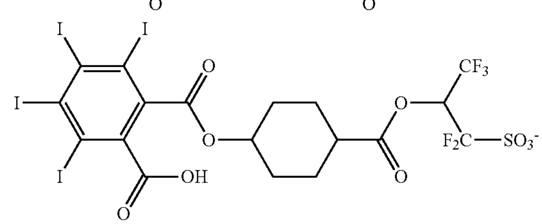
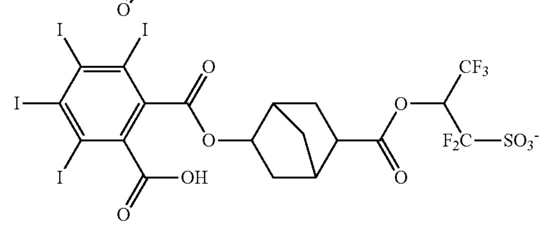
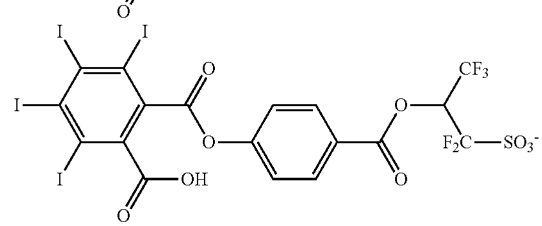

-continued
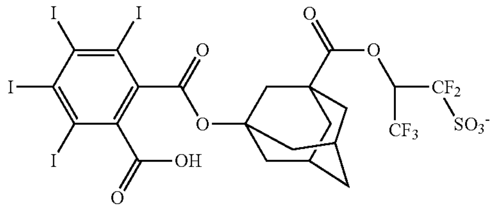
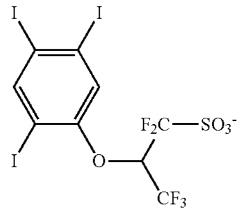
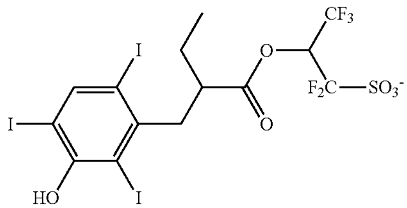
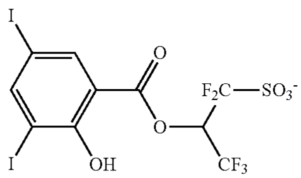
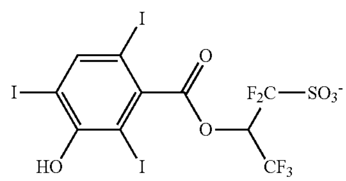
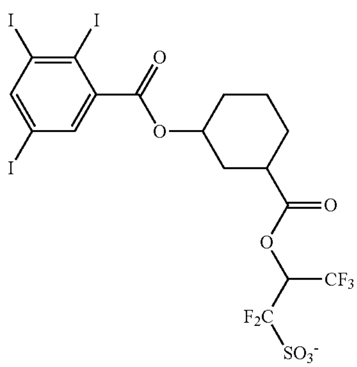
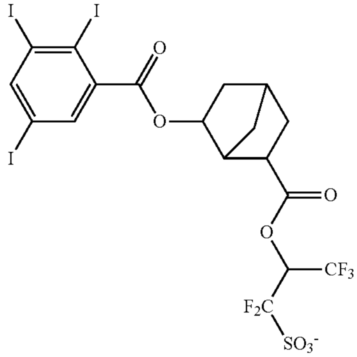
-continued
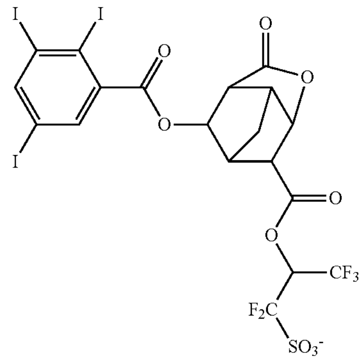
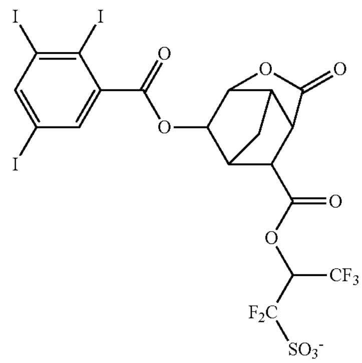
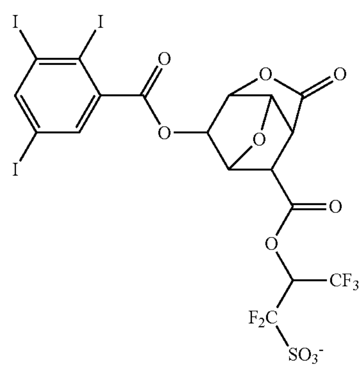
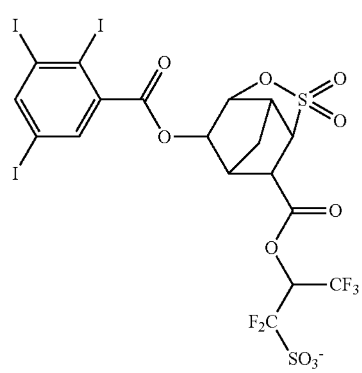

-continued
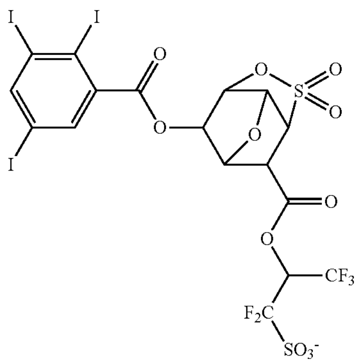
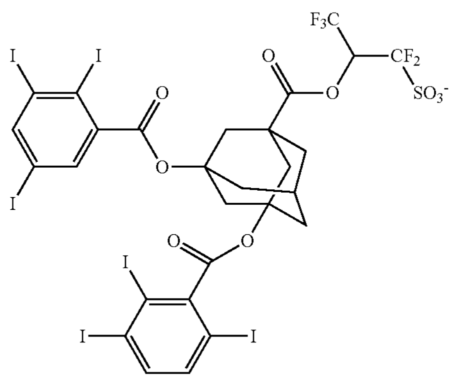
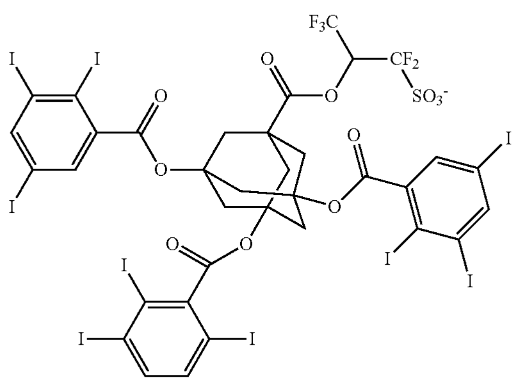
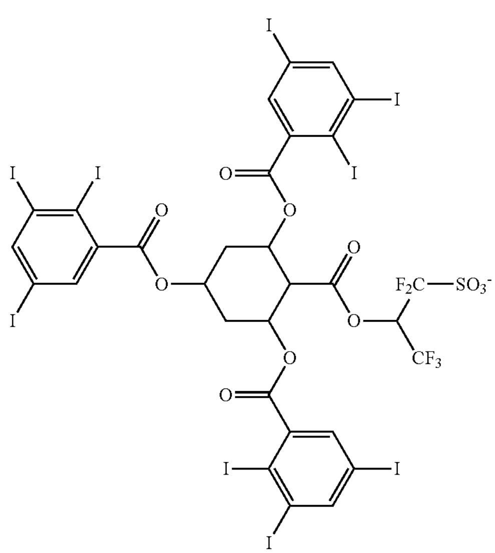
-continued
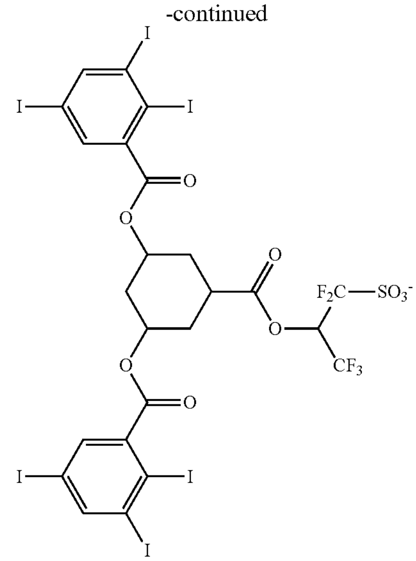
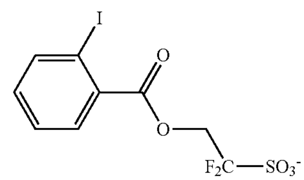
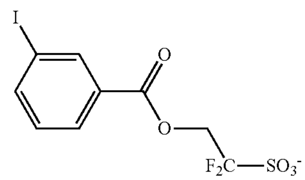
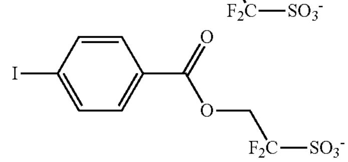
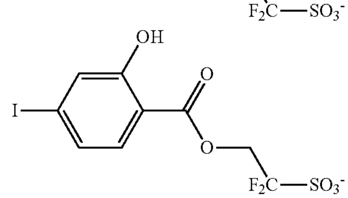
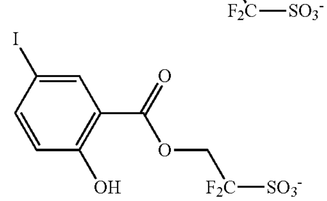
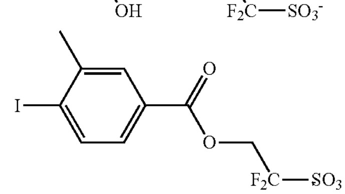
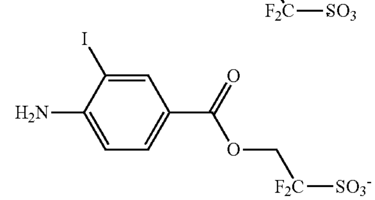

-continued
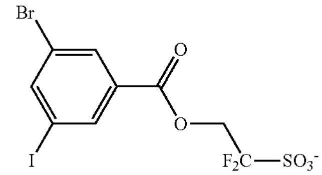
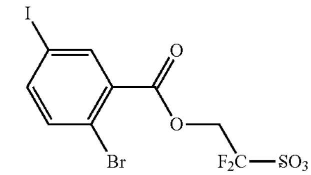
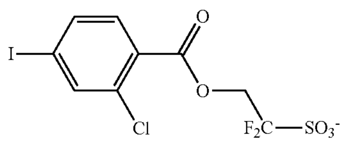
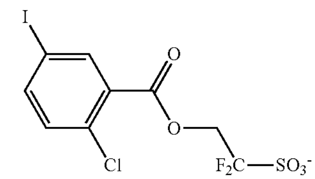
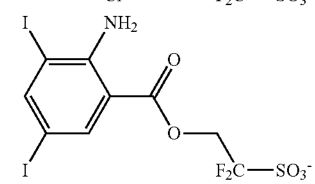
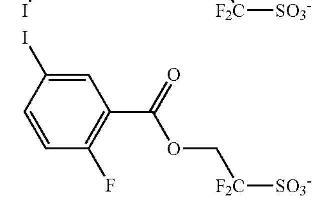
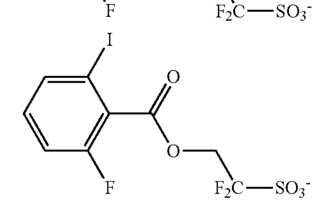
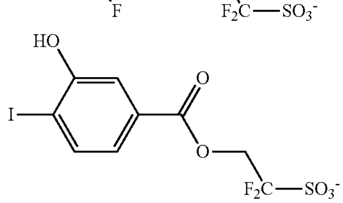
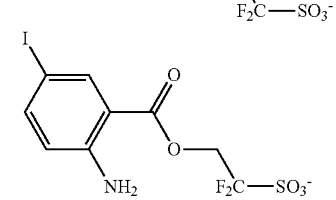
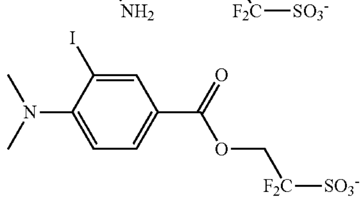
-continued
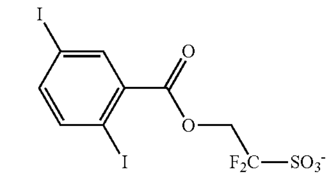
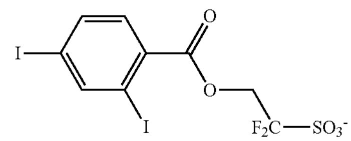
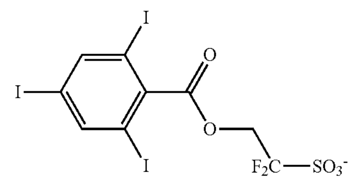
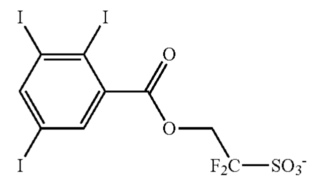
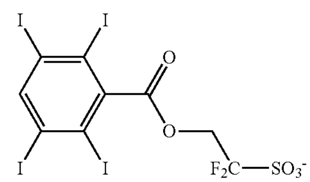
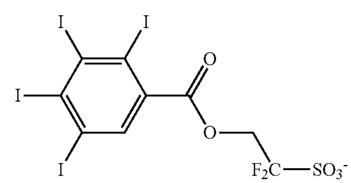
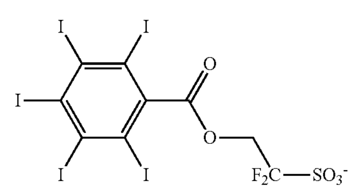
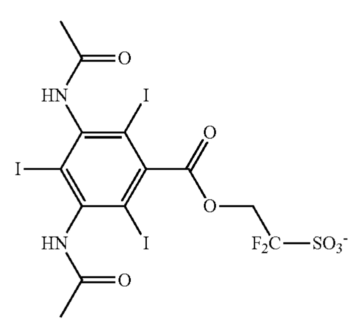

-continued
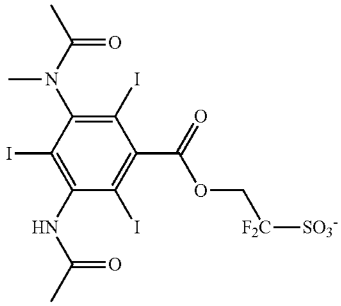
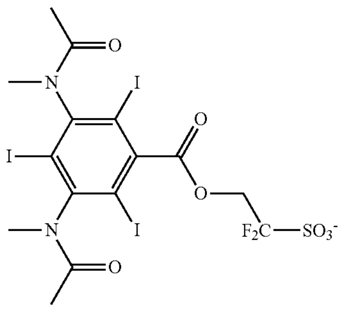
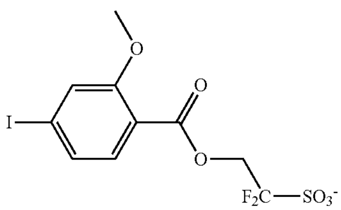
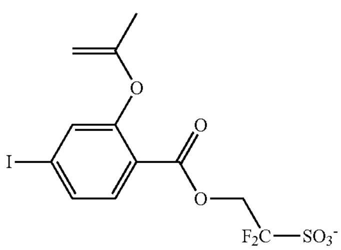
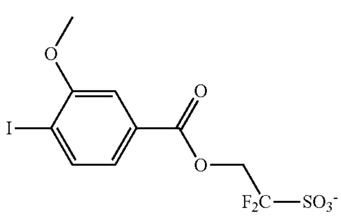
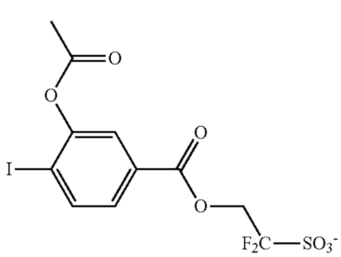
-continued
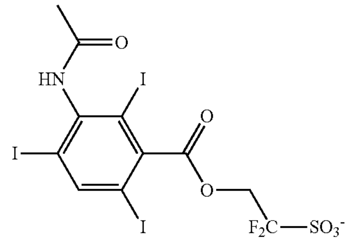
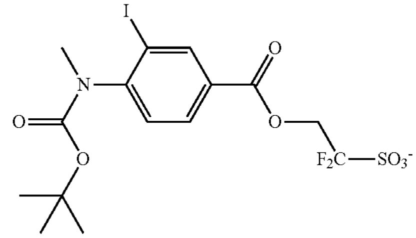
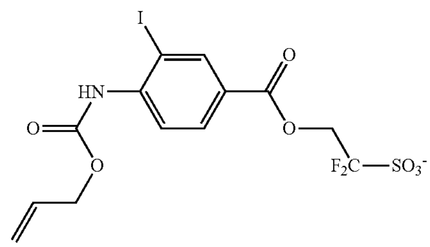
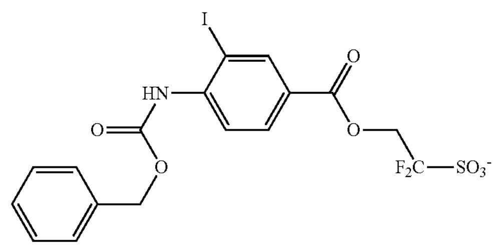
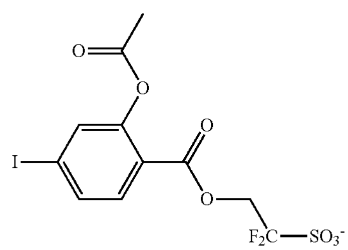
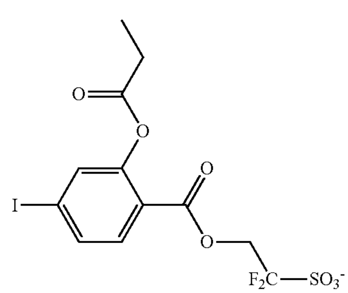

-continued
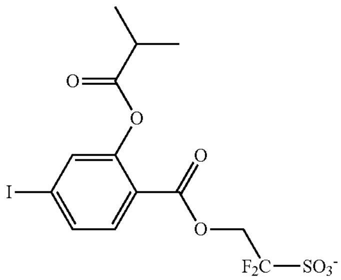
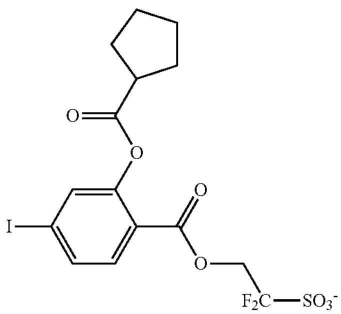
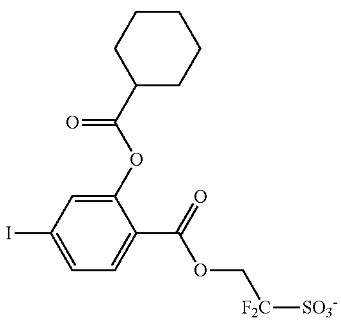
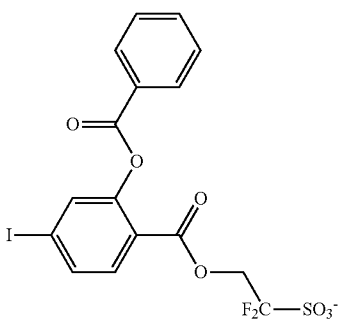
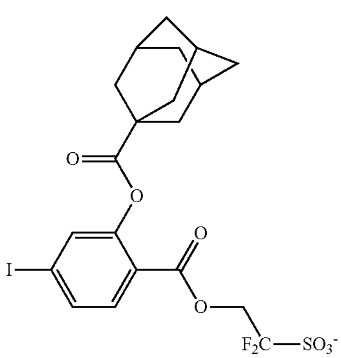
-continued
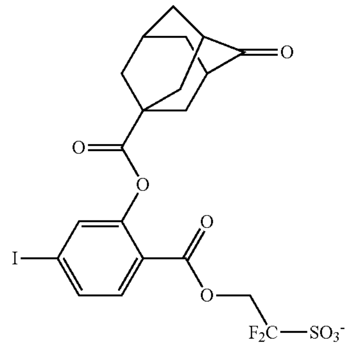
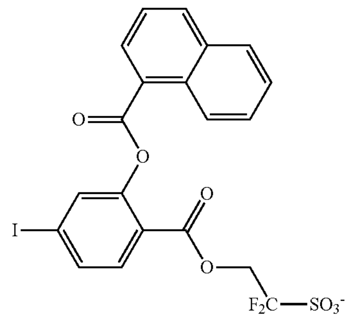
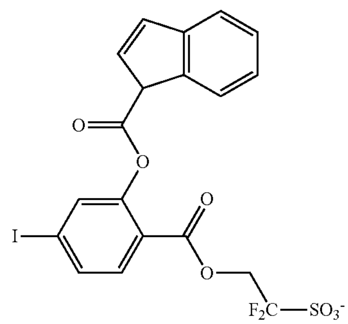
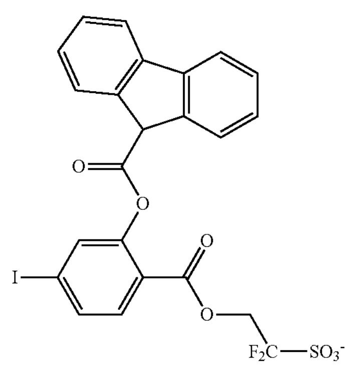
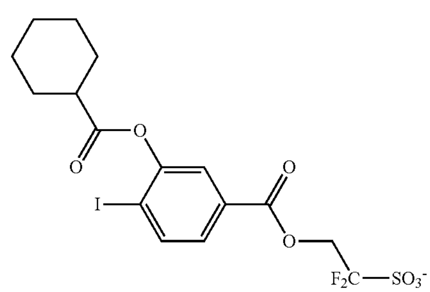

-continued
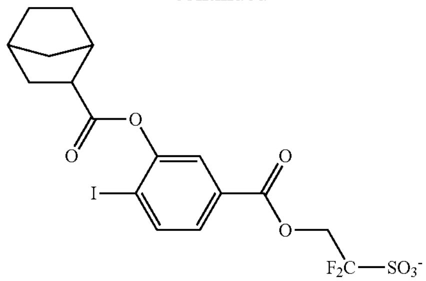
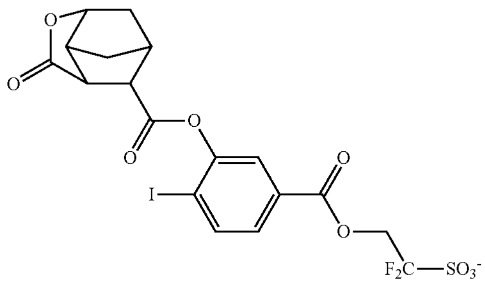
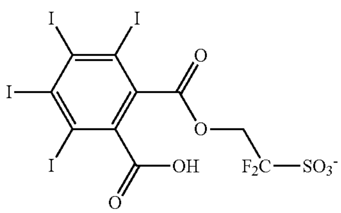
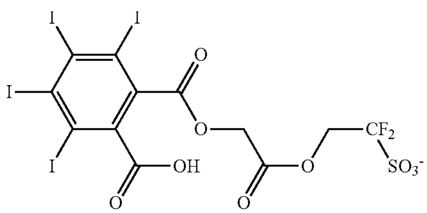
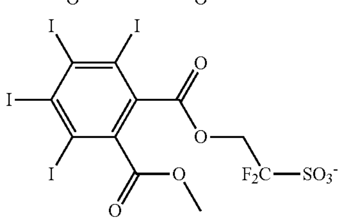
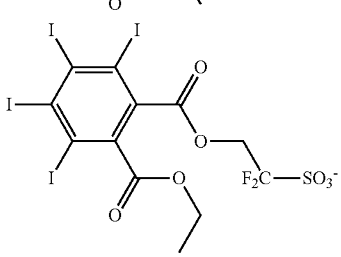
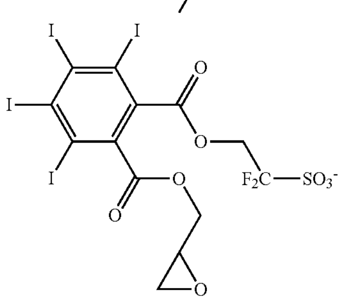
-continued
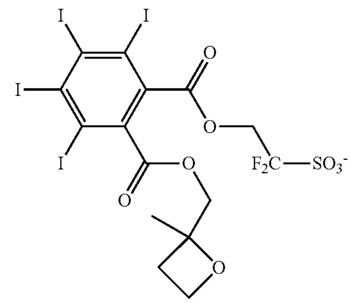
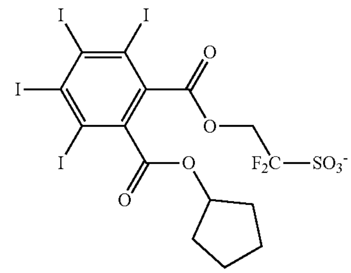
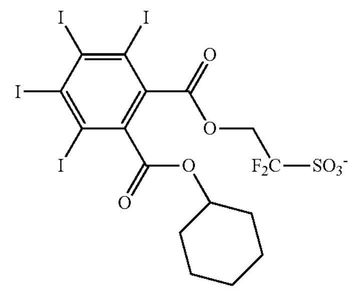
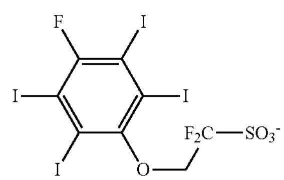
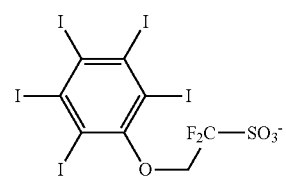
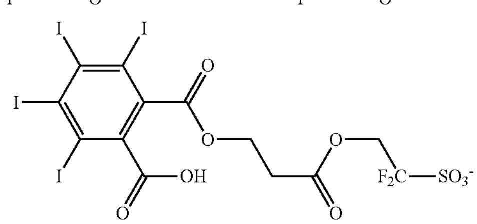
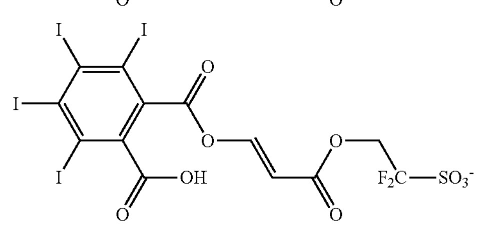
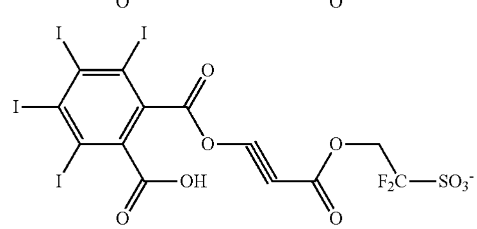

-continued
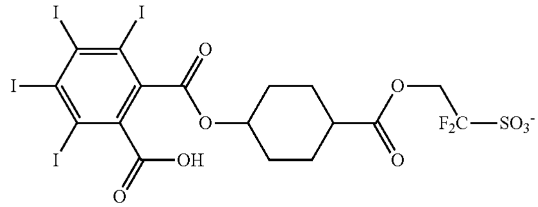
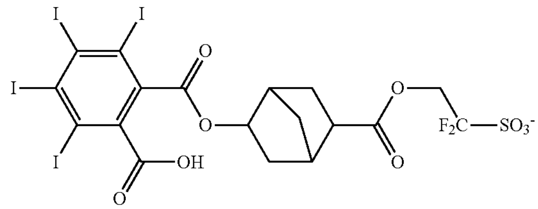
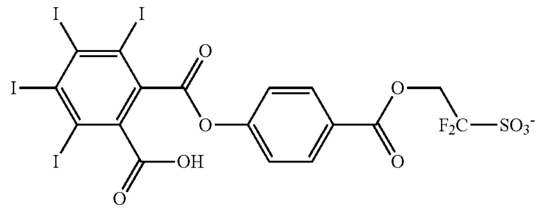
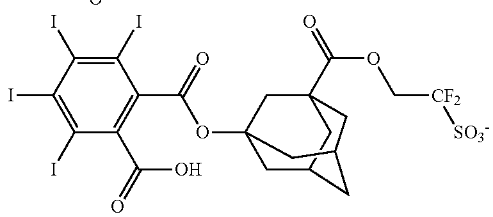
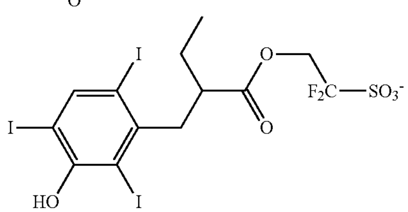
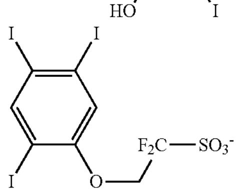
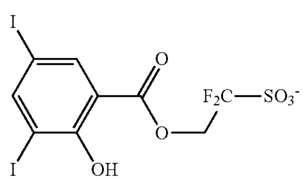
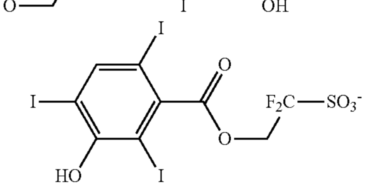
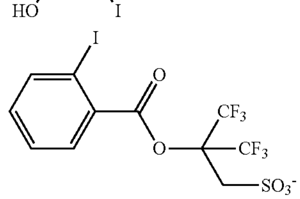
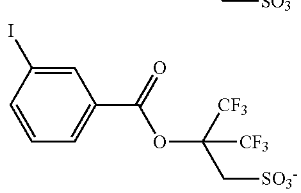
-continued
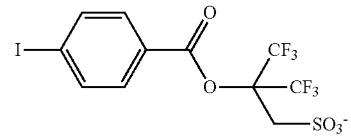
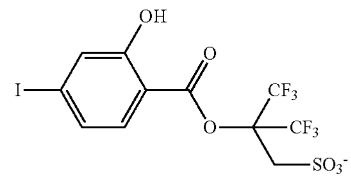
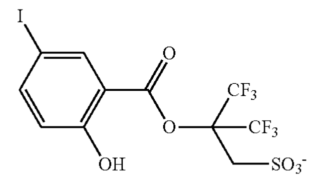
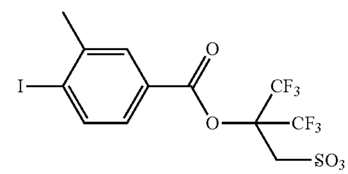
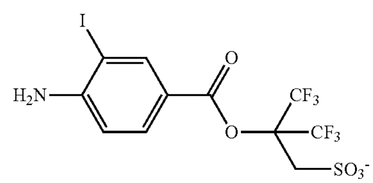
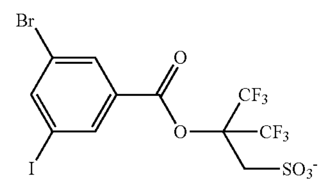
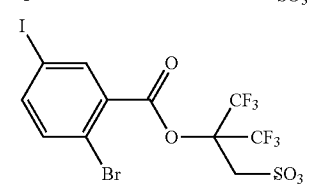
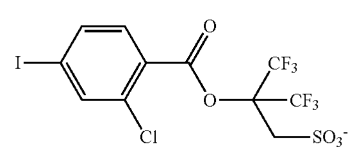
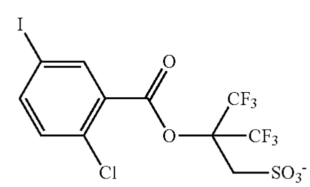
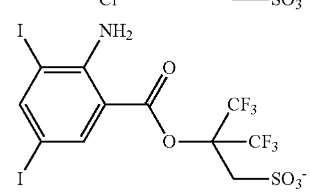

-continued
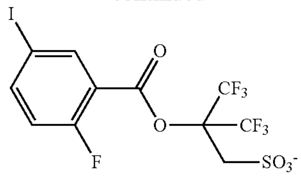
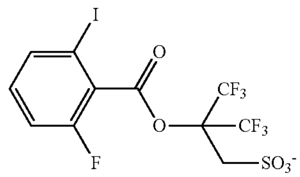
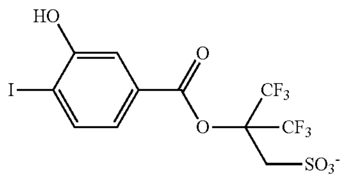
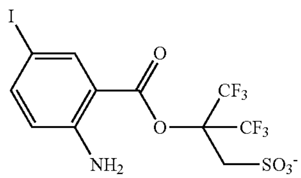
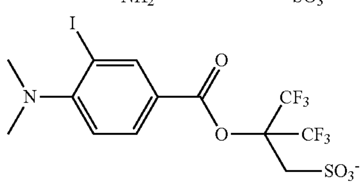
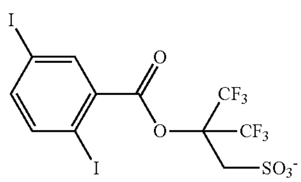
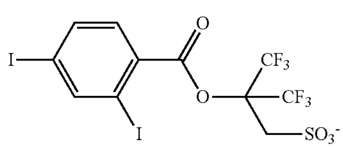
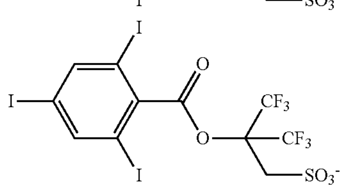
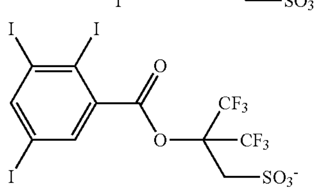
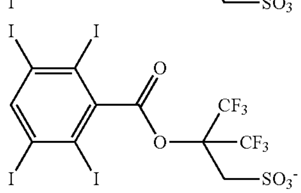
-continued
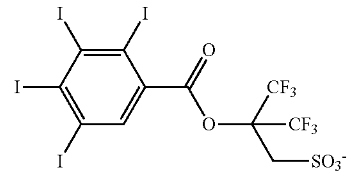
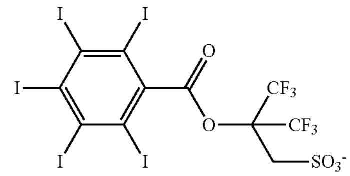
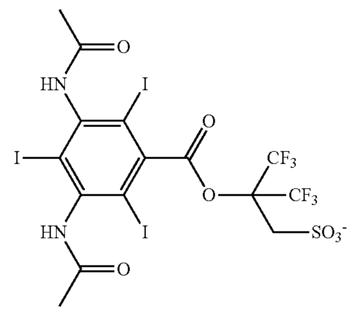
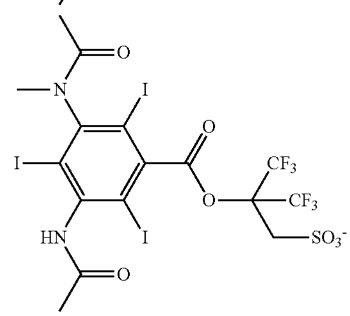
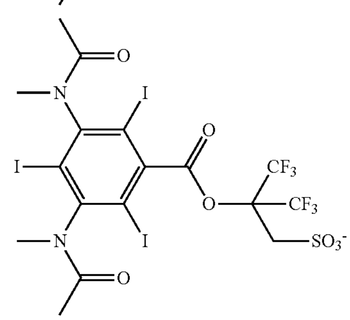
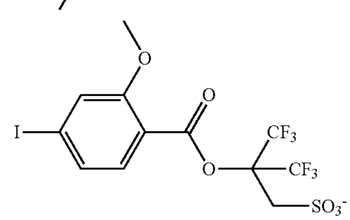
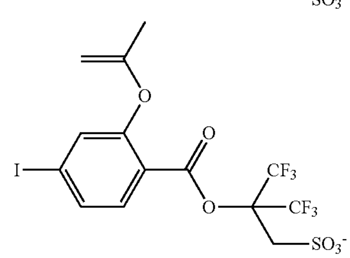

-continued
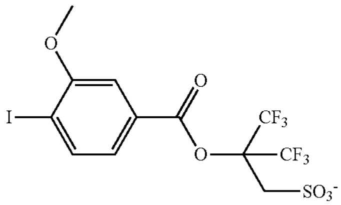
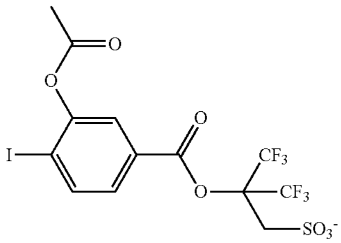
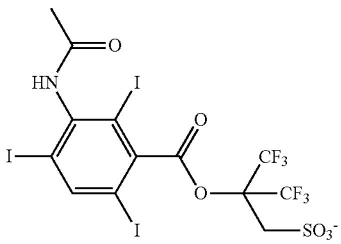
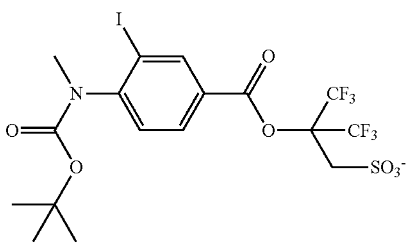
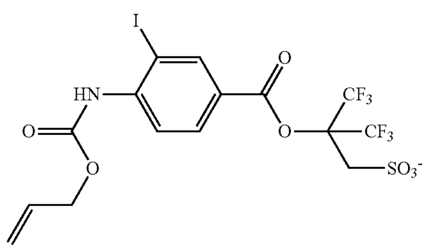
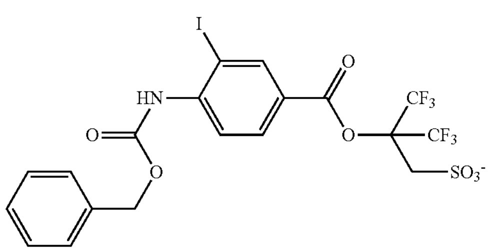
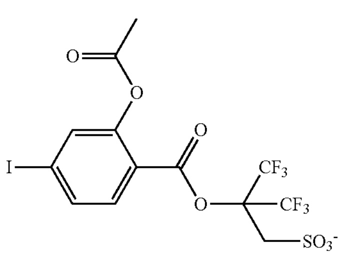
-continued
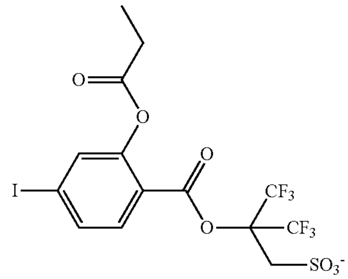
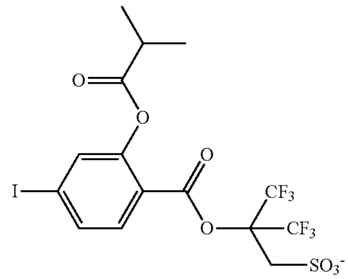
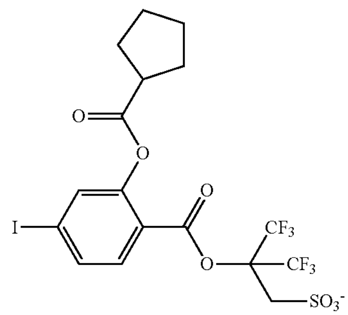
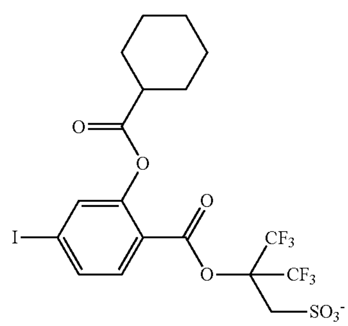
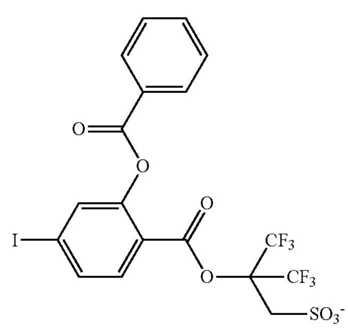

-continued
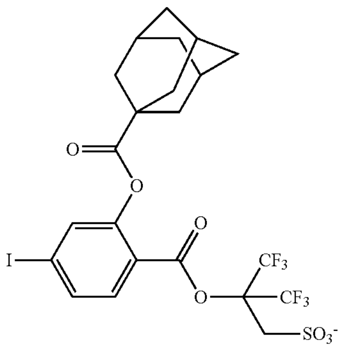
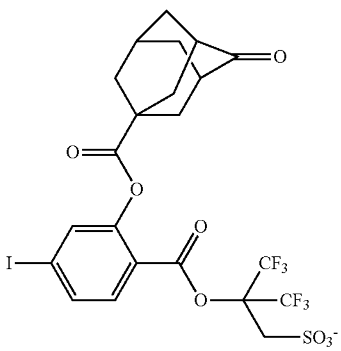
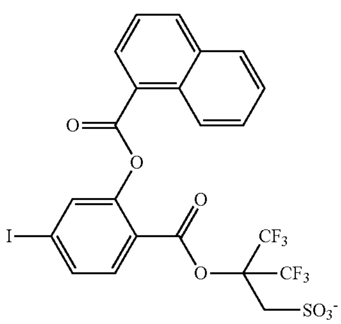
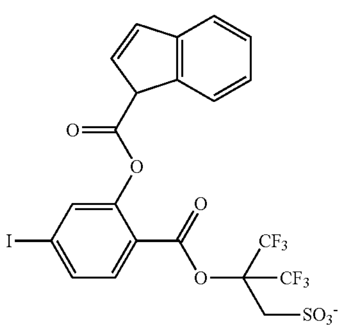
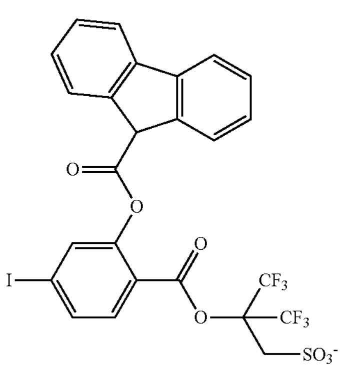
-continued
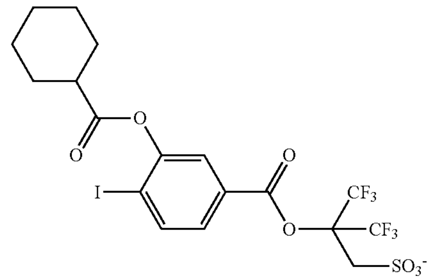
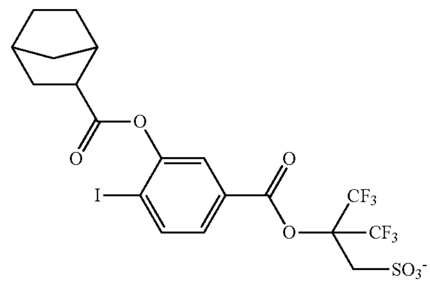
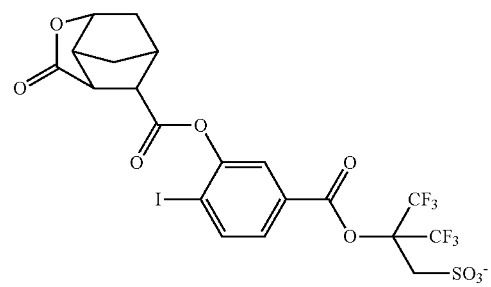
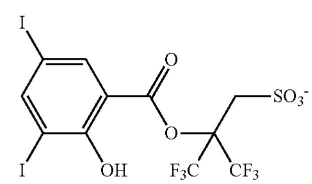
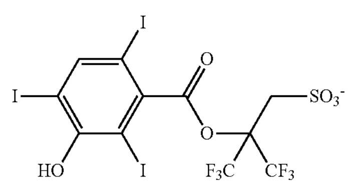
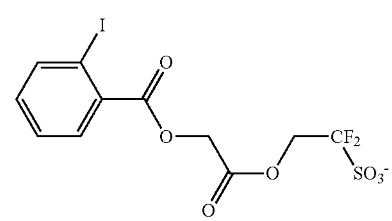
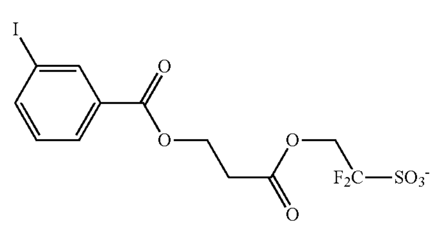

-continued
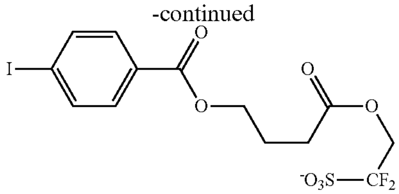
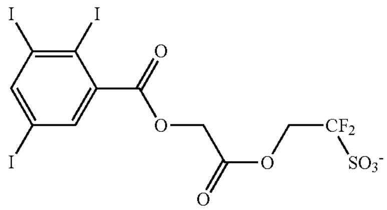
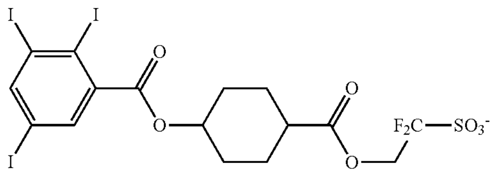
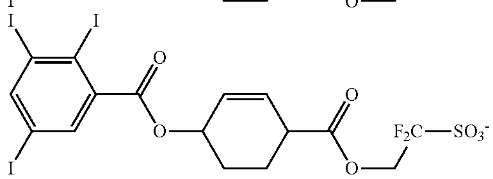
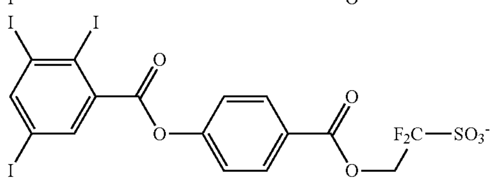
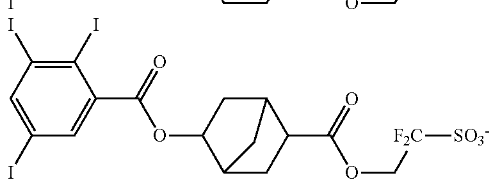
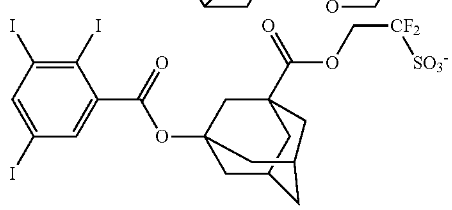
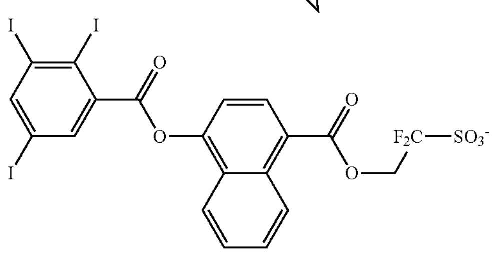
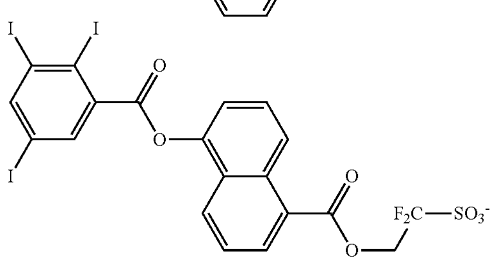
-continued
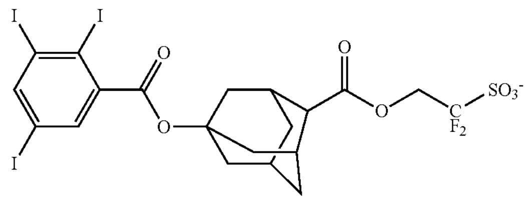
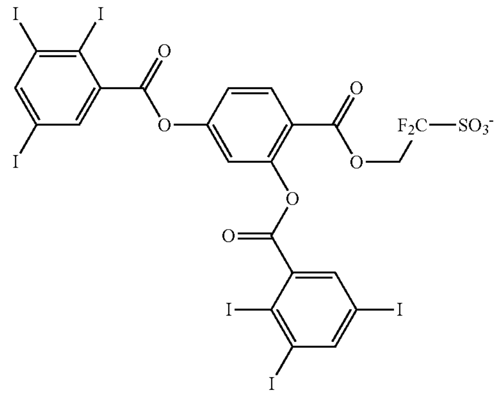
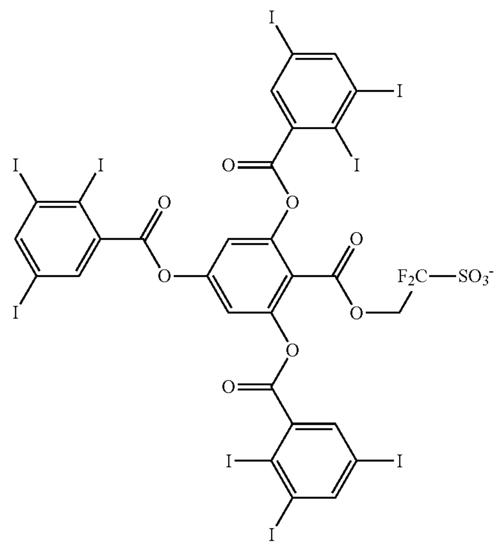
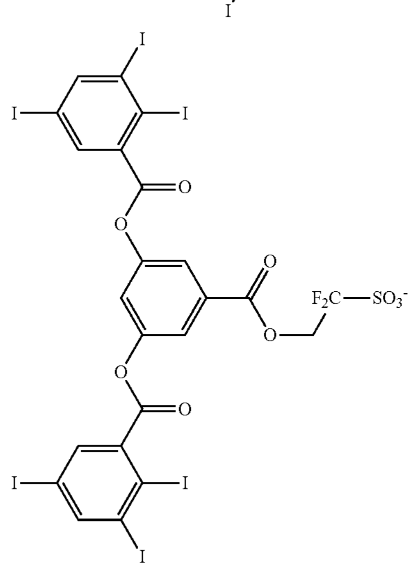

-continued
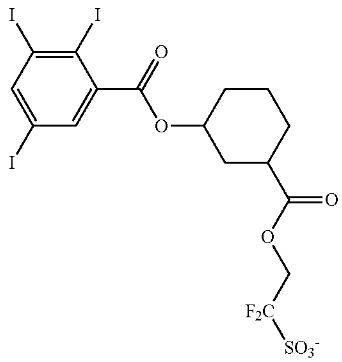
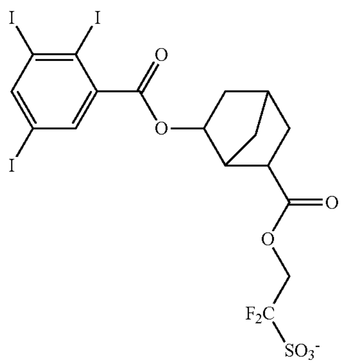
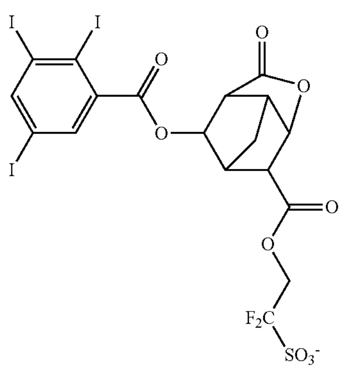
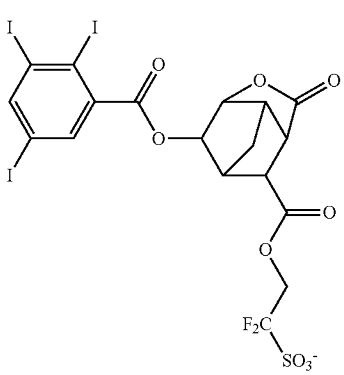
-continued
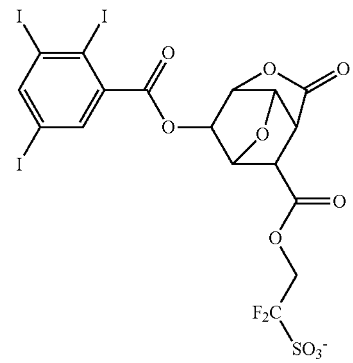
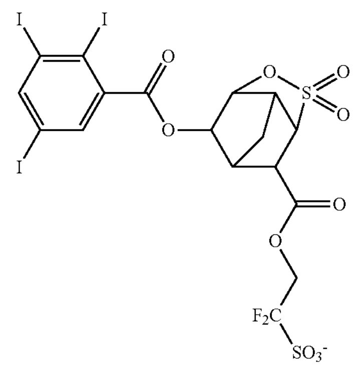
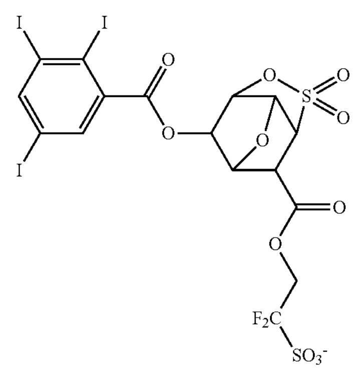
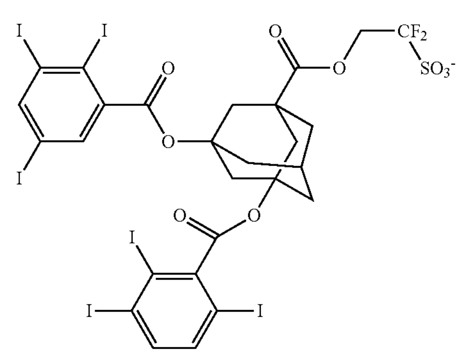

-continued
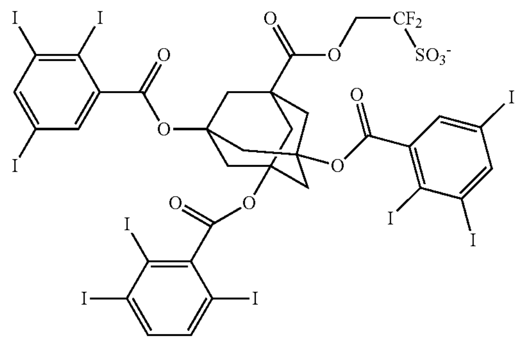
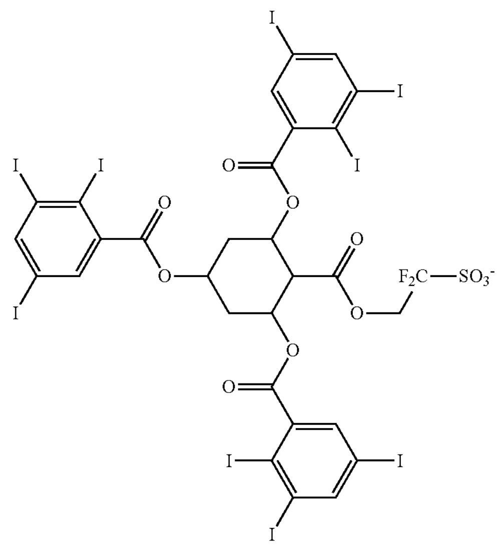
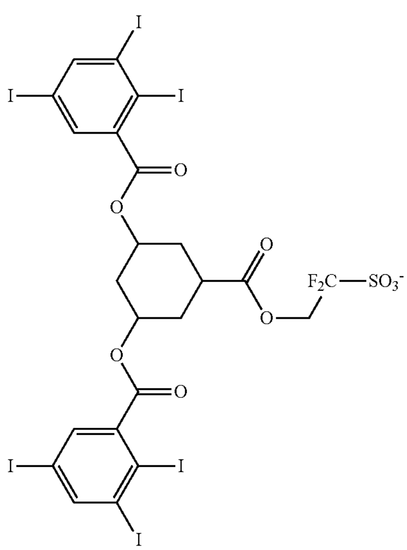
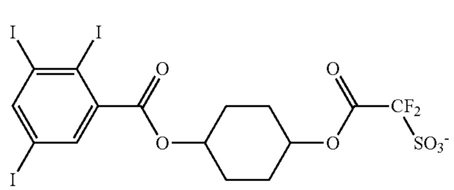
-continued
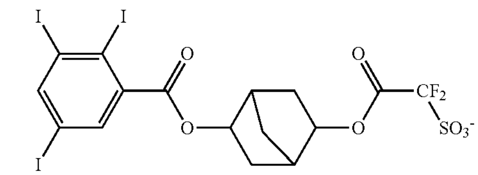
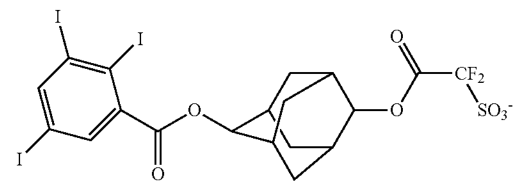
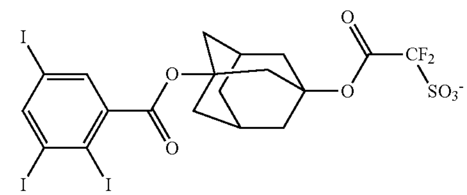
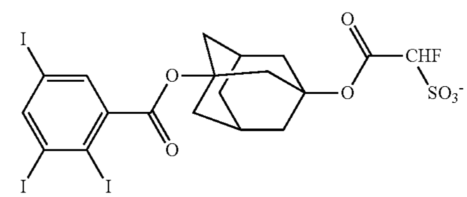
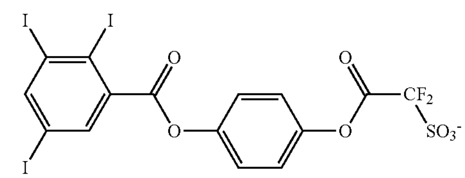
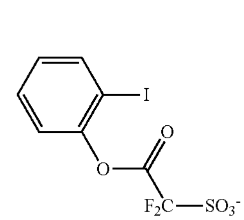
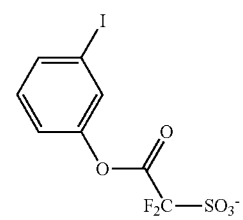
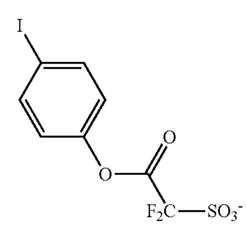
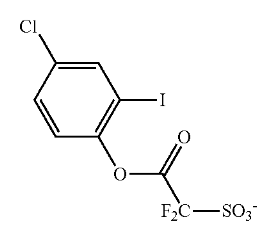
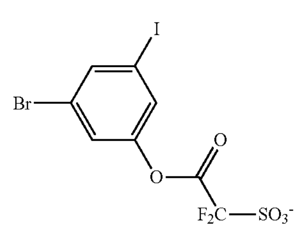
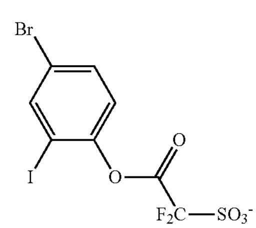

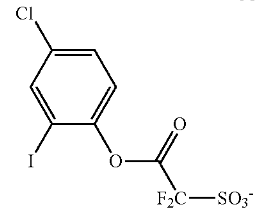
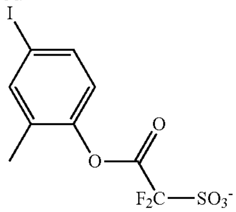
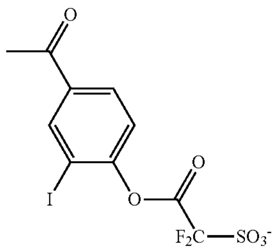
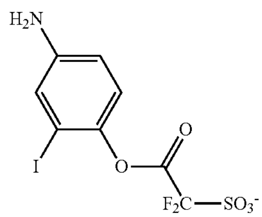
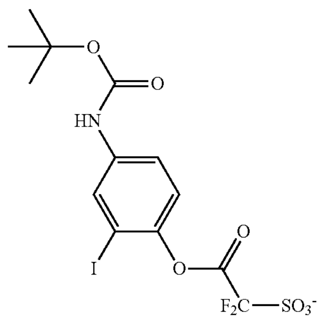
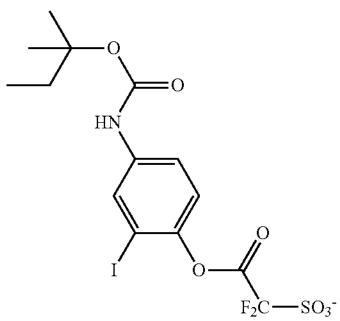
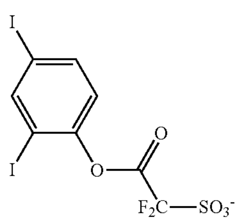
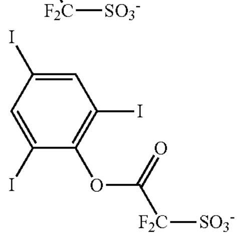
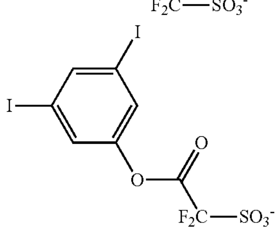
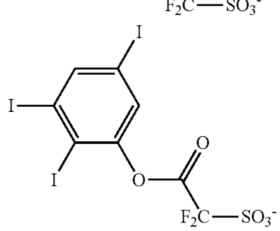
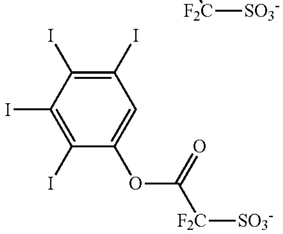
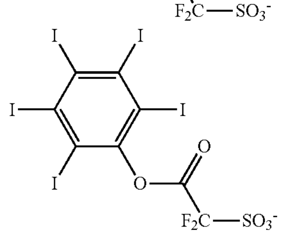
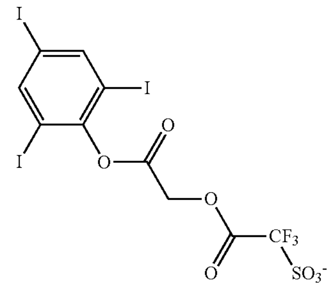
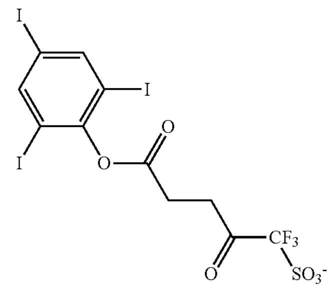
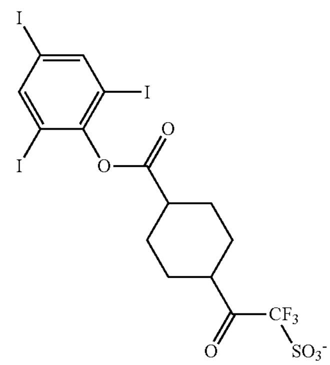
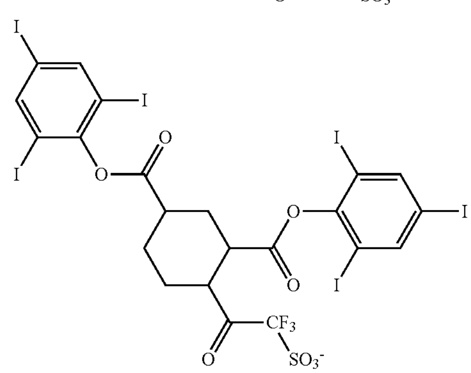
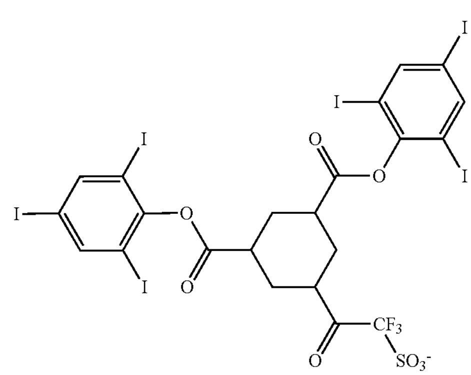

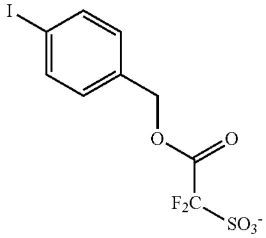
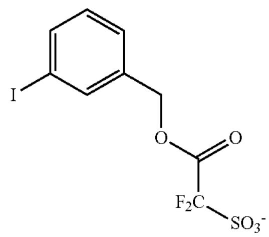
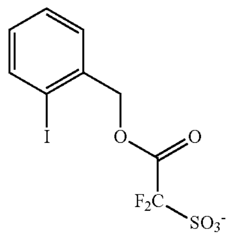
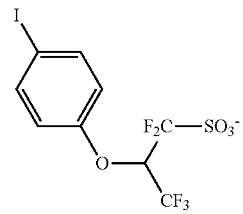
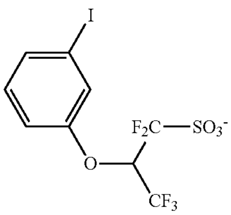
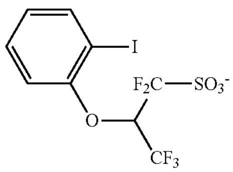
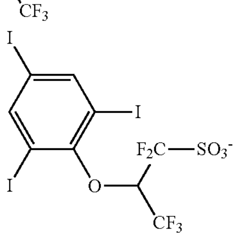
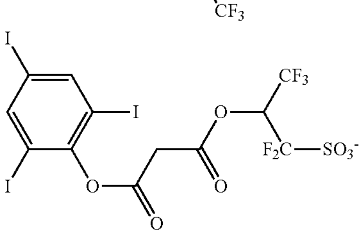
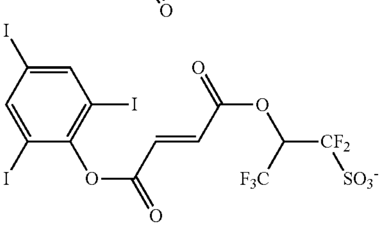
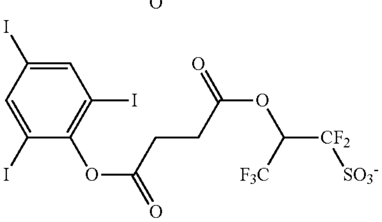
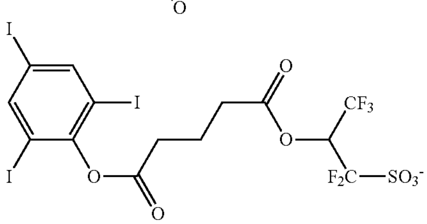
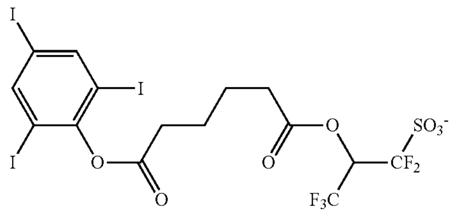
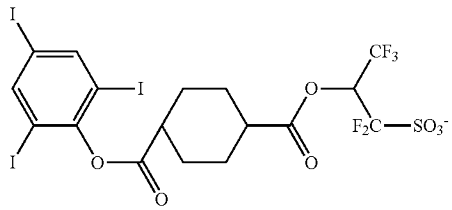
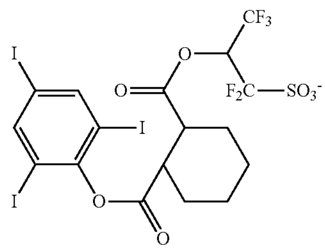
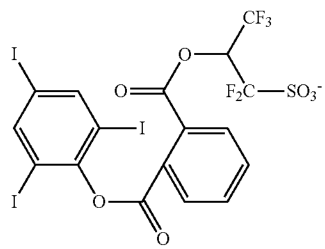
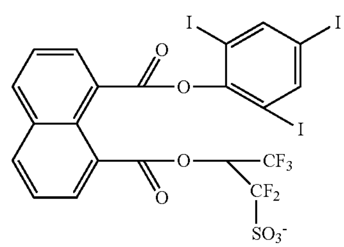
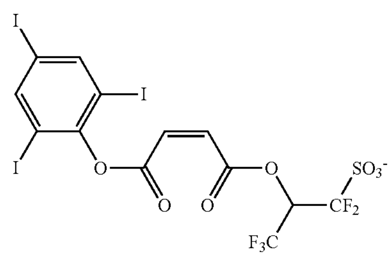
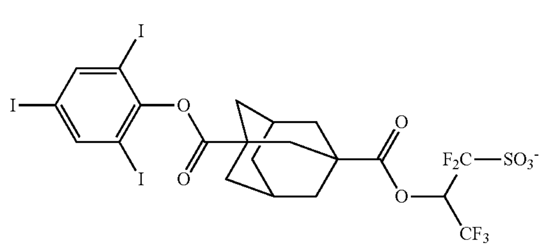

-continued
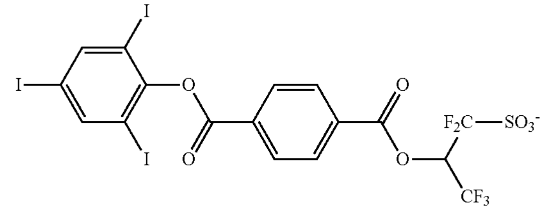
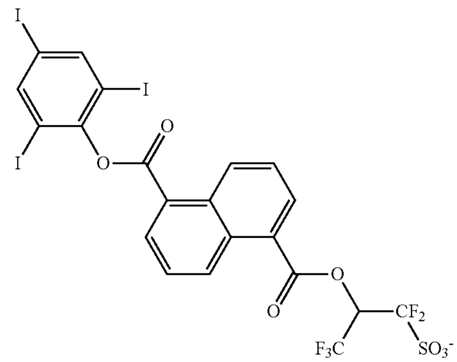
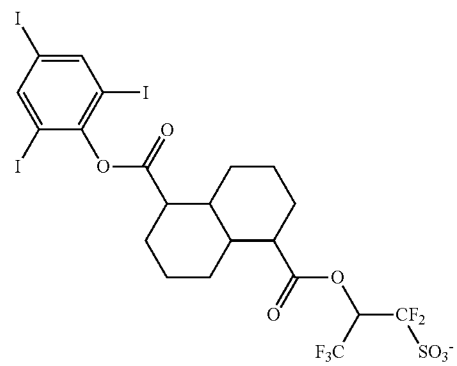
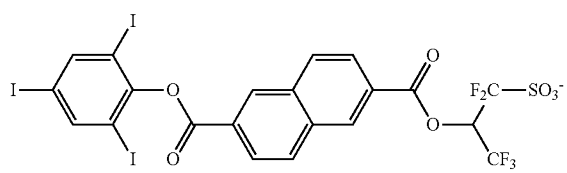
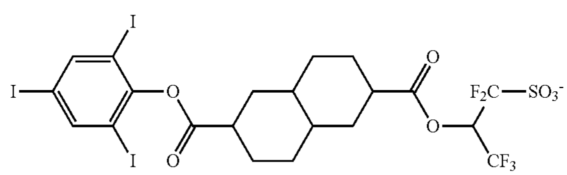
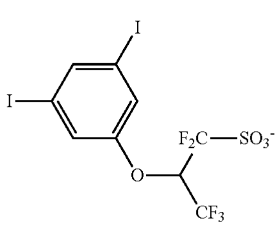
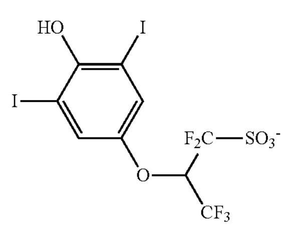
-continued
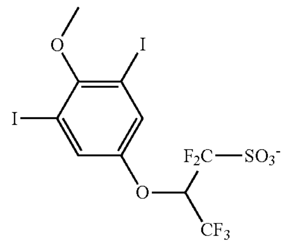
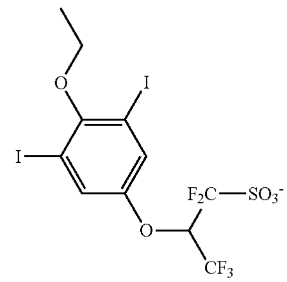
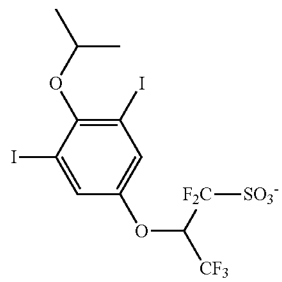
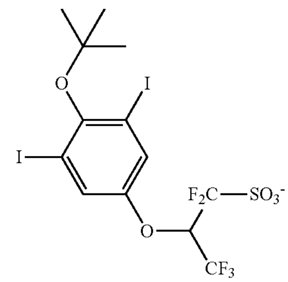
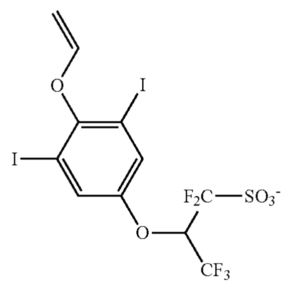
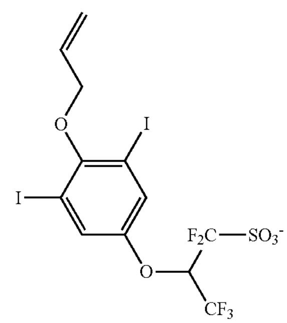
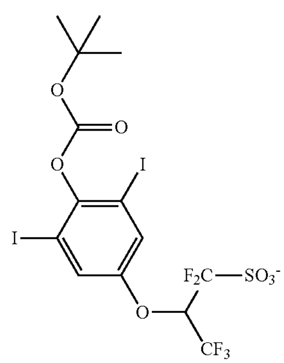
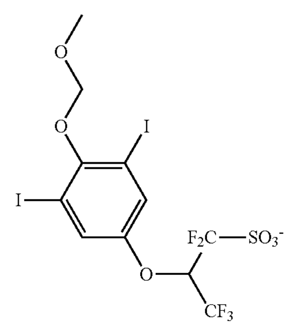
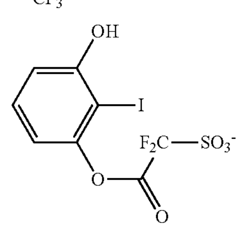
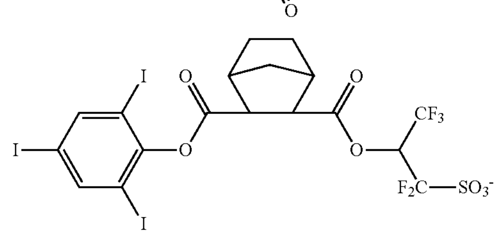

-continued
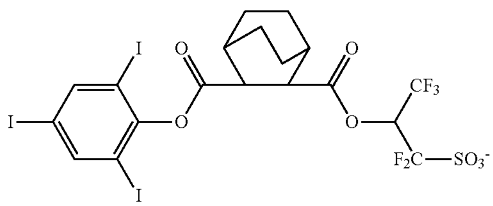
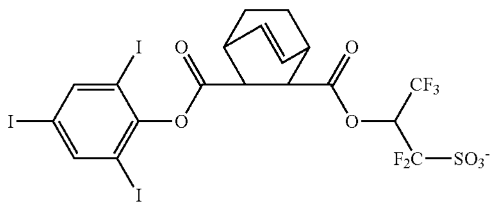
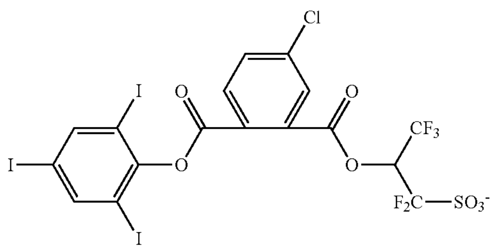
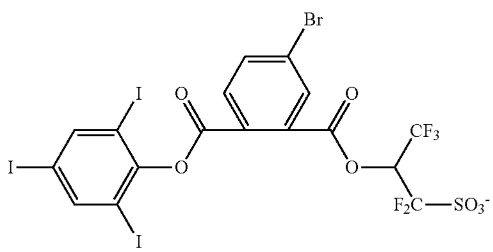
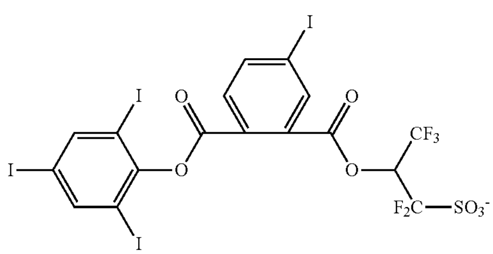
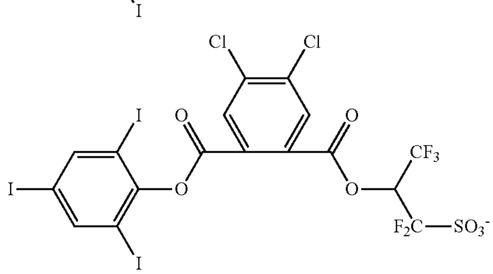
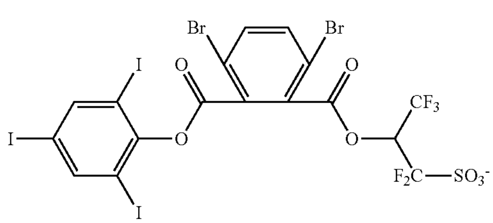
-continued
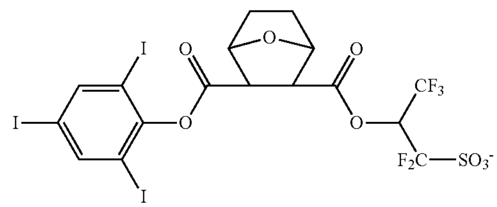
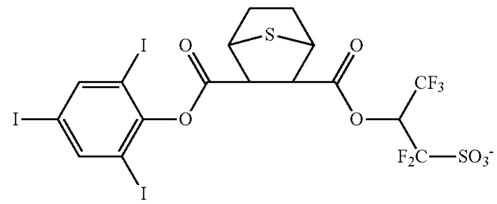
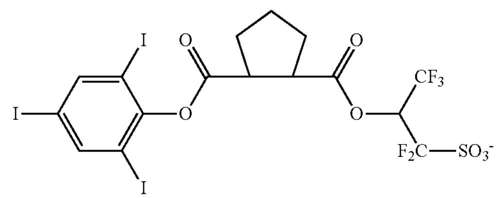
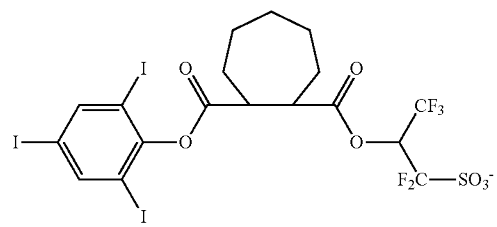
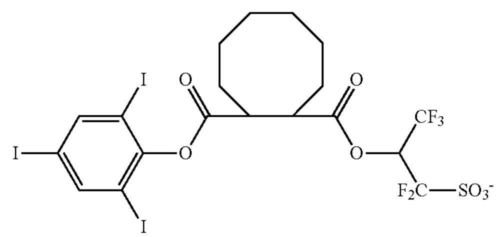
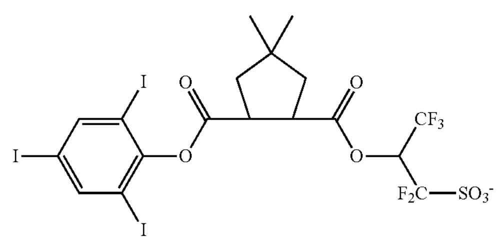
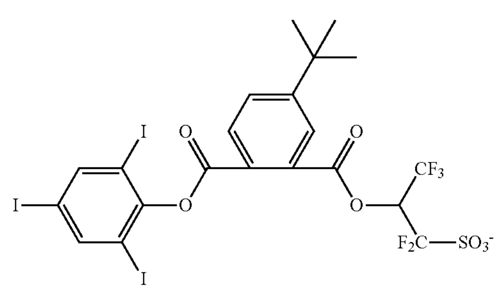

-continued
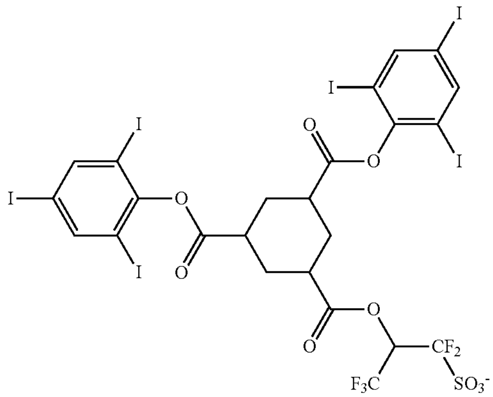
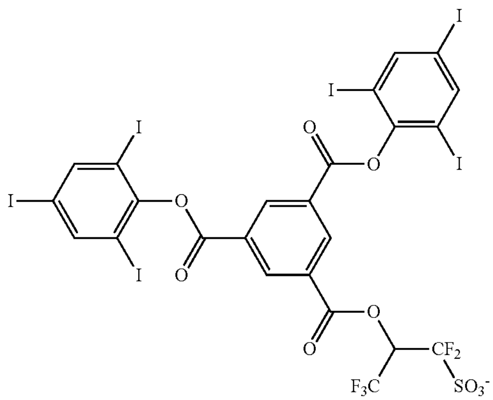
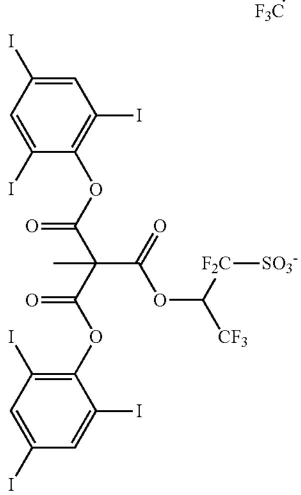
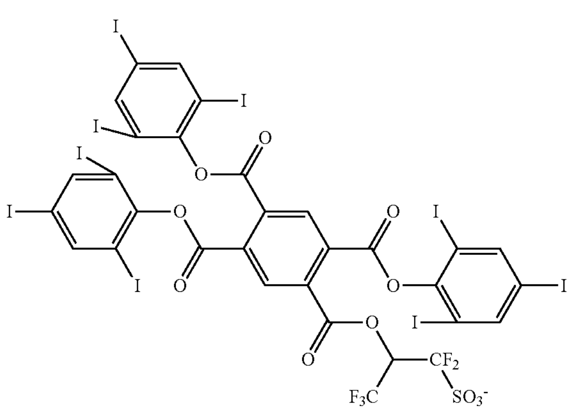
-continued
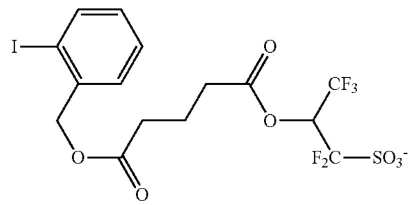
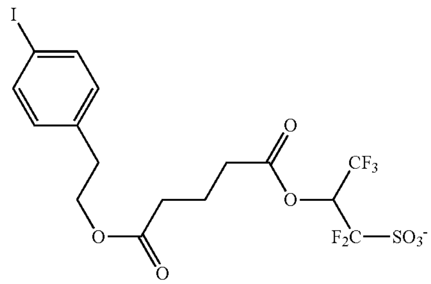
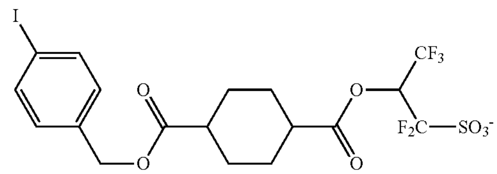
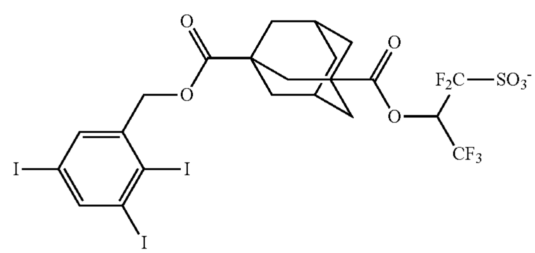
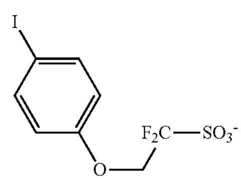
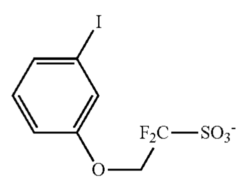
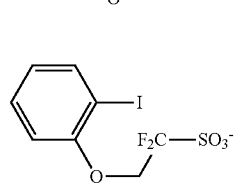
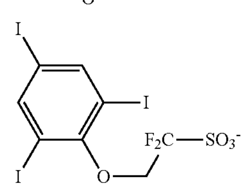
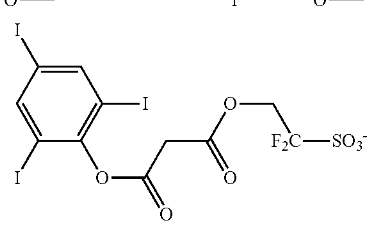
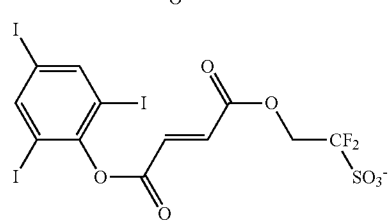

-continued
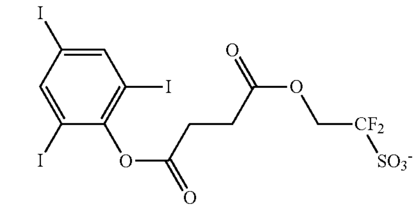
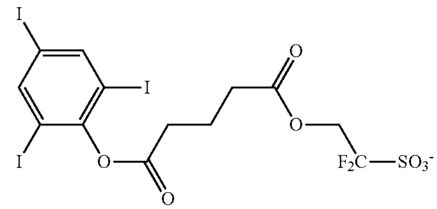
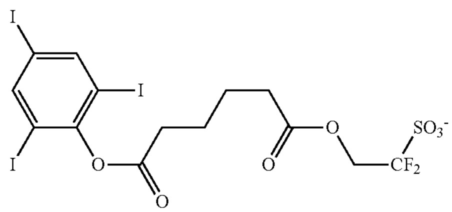
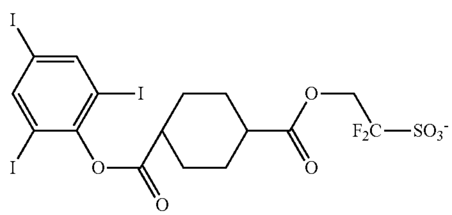
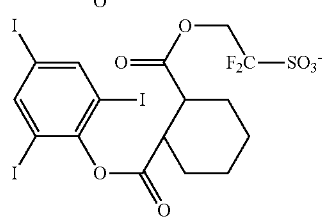
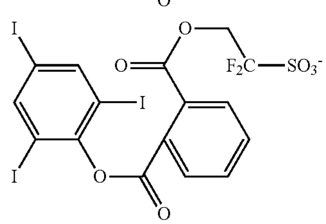
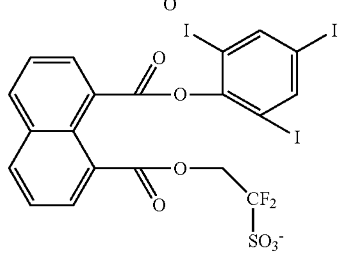
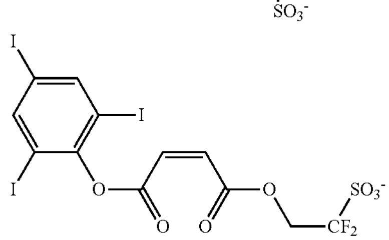
-continued
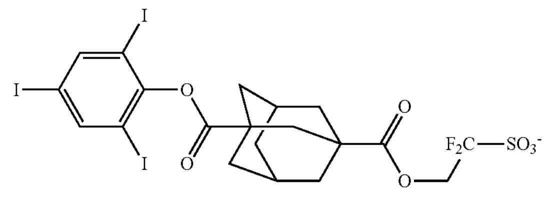
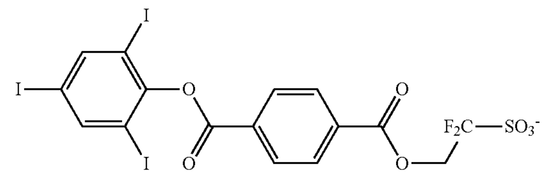
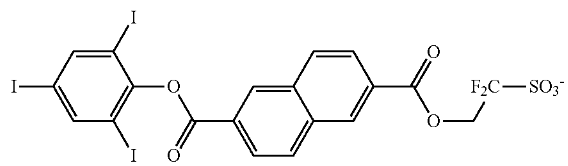
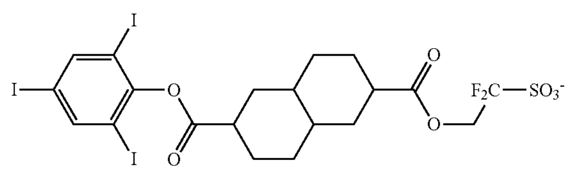
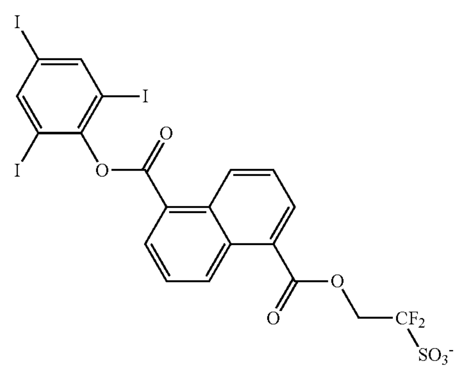
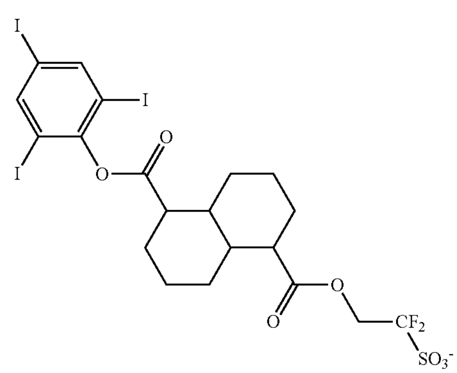

-continued
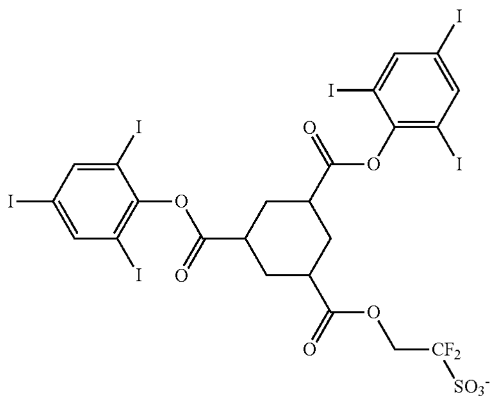
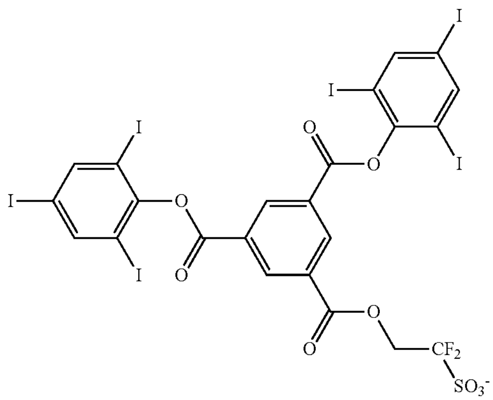
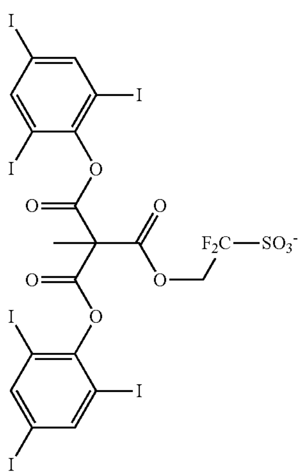
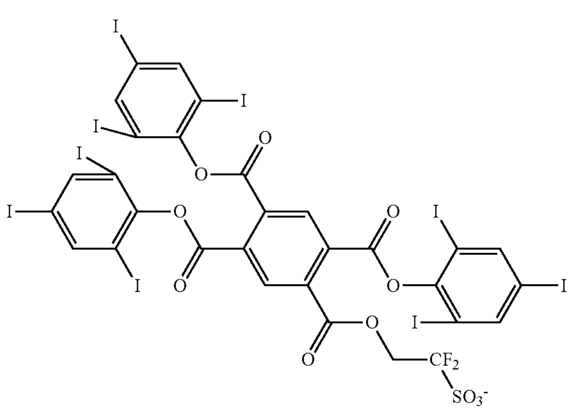
-continued
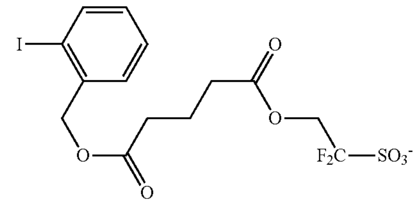
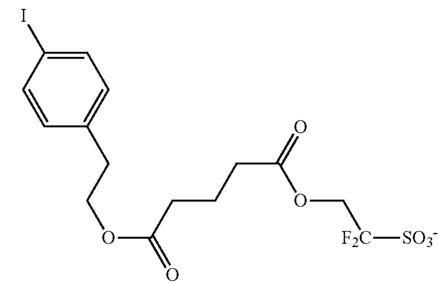
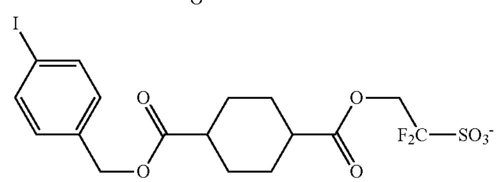
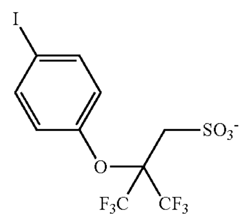
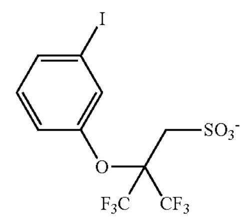
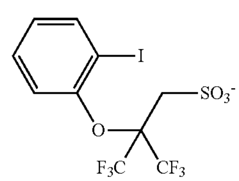
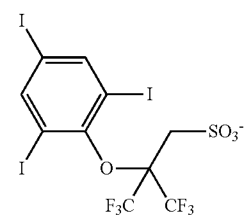
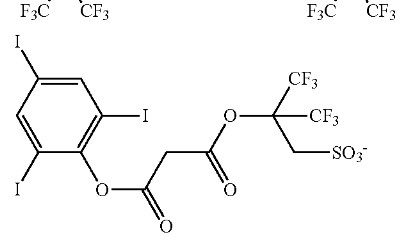
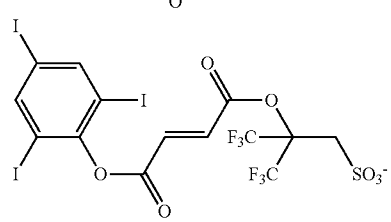
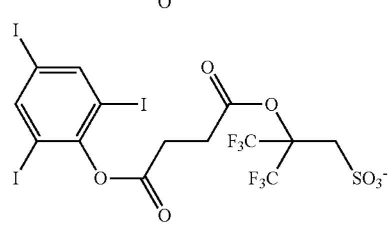

-continued
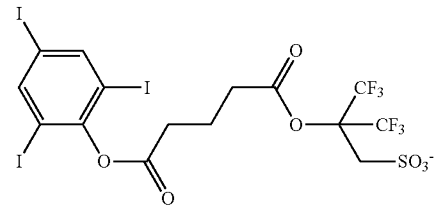
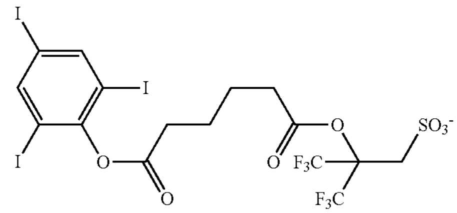
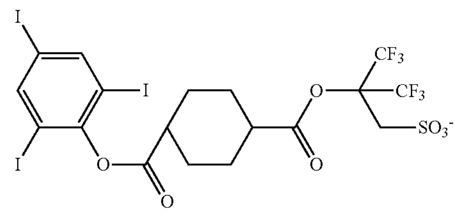
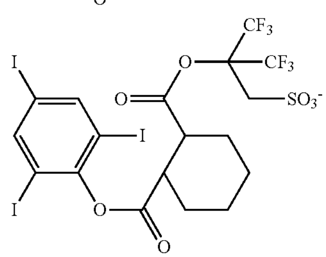
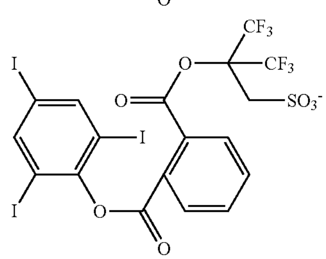
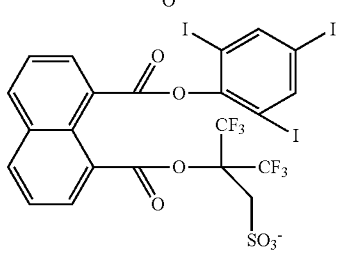
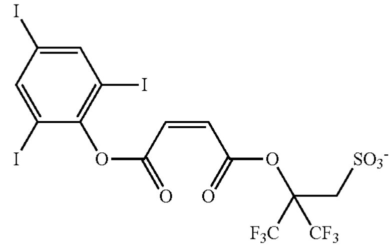
-continued
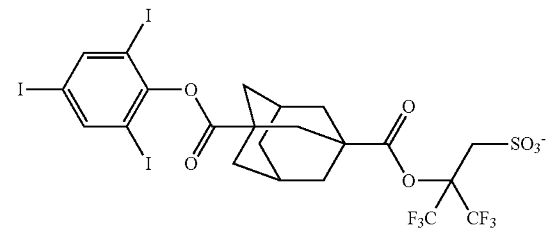
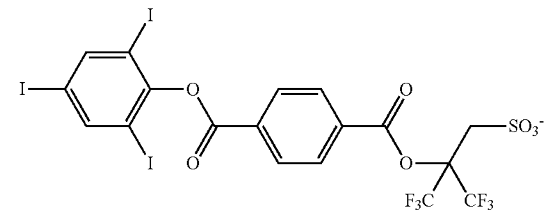
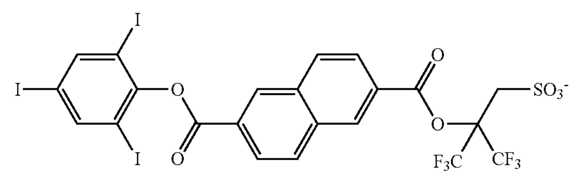
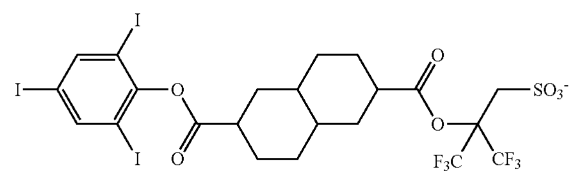
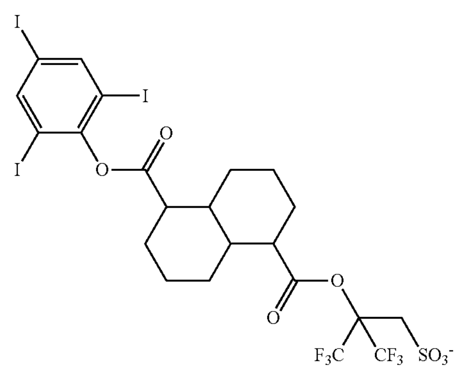
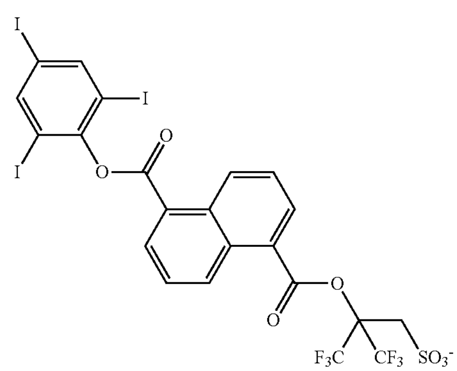

-continued

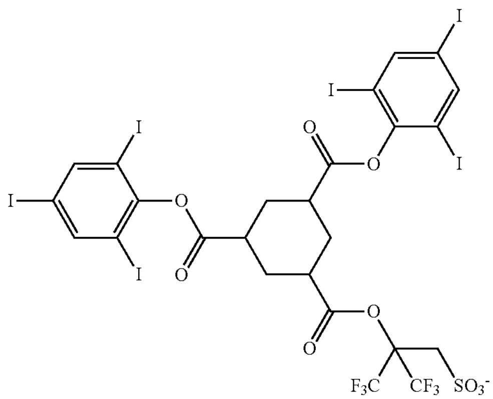

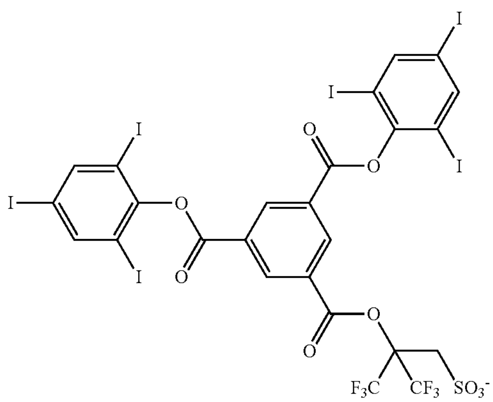

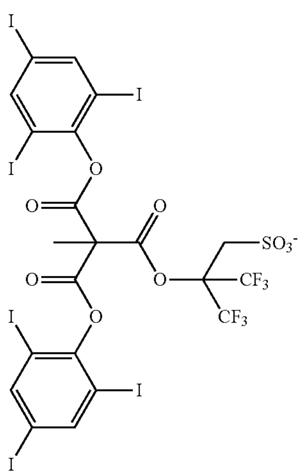

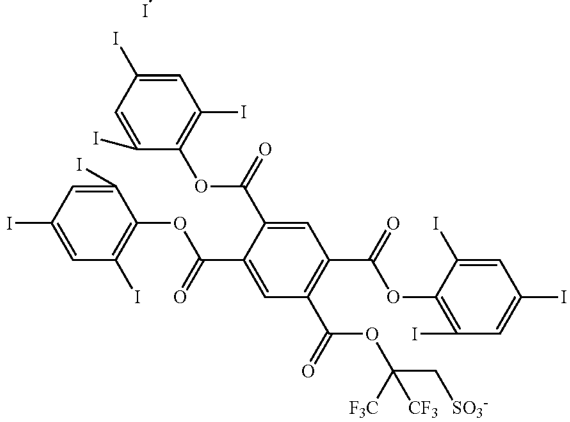

-continued

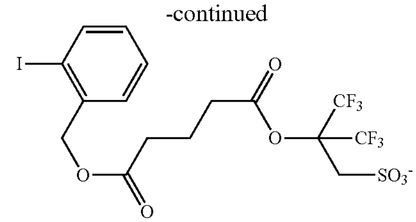

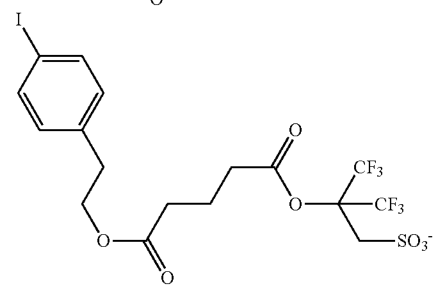

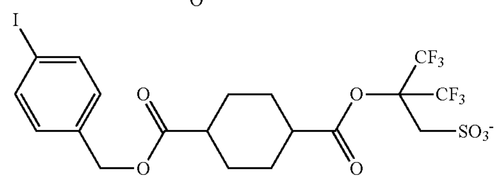

The acid generator is preferably added in an amount of 0.1 to 50 parts, and more preferably 1 to 40 parts by weight per 100 parts by weight of the base polymer (or base resin). Where the base polymer contains any of recurring units (d1) to (d3), i.e., acid generator, the addition of a separate acid generator is not necessarily needed.

Organic Solvent

In the resist composition, an organic solvent may be blended. Examples of the organic solvent used herein are described in JP-A 2008-111103, paragraphs [0144]-[0145] (U.S. Pat. No. 7,537,880). Exemplary solvents include ketones such as cyclohexanone and methyl n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 50 to 10,000 parts, and more preferably 100 to 5,000 parts by weight per 100 parts by weight of the base polymer.

Other Components

The resist composition may further contain other components such as a quencher, dissolution inhibitor, surfactant, and acetylene alcohol.

The addition of the quencher to the resist composition is effective, for example, for reducing the rate of acid diffusion in the resist film, thus contributing to a further improvement in resolution. Typically basic compounds are used as the quencher. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146]-[0164] (U.S. Pat. No. 7,537,880). An appropriate amount of the basic compound added as the quencher is 0 to 100 parts, more preferably 0.001 to 50 parts by weight per 100 parts by weight of the base resin.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied onto the resist film, the polymeric quencher is also effective for preventing a film thickness loss of resist pattern or rounding of pattern top. When the polymeric quencher is added, its amount is arbitrary as long as the benefits of the invention are not impaired.

Also an onium salt of sulfonic acid which is not fluorinated at α-position as represented by the formula (4) or carboxylic acid as represented by the formula (5) is useful as the quencher.

$$R^{501}-C(R^{502})(R^{503})-SO_3^- \ M^+ \quad (4)$$

$$R^{504}-CO_2^- \ M^+ \quad (5)$$

Herein $R^{501}$, $R^{502}$ and $R^{503}$ are each independently hydrogen, halogen exclusive of fluorine, or a $C_1$-$C_{40}$ straight, branched or cyclic monovalent hydrocarbon group which may contain a heteroatom, any two of $R^{501}$, $R^{502}$ and $R^{503}$ may bond together to form a ring with the carbon atom to which they are attached. $R^{504}$ is a $C_1$-$C_{40}$ straight, branched or cyclic monovalent hydrocarbon group which may contain a heteroatom. $M^+$ is an onium cation.

The onium salt of sulfonic acid which is not fluorinated at α-position is described in U.S. Pat. No. 8,795,942 (JP-A 2008-158339). The PAGs capable of generating sulfonic acid which is not fluorinated at α-position are exemplified in JP-A 2010-155824, paragraphs [0019]-[0036] and JP-A 2010-215608, paragraphs [0047]-[0082]. The onium salts of carboxylic acid are described in JP 3991462.

The anion in formula (4) or (5) is a conjugated base of weak acid. As used herein, the weak acid indicates an acidity insufficient to deprotect an acid labile group from an acid labile group-containing unit in the base resin. The onium salt having formula (4) or (5) functions as a quencher when used in combination with an onium salt type PAG having a conjugated base of a strong acid, typically a sulfonic acid which is fluorinated at α-position as the counter anion.

In a system using a mixture of an onium salt capable of generating a strong acid (e.g., α-position fluorinated sulfonic acid) and an onium salt capable of generating a weak acid (e.g., α-position non-fluorinated sulfonic acid or carboxylic acid), if the strong acid generated from the PAG upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion.

In particular, since sulfonium salts and iodonium salts of an α-position non-fluorinated sulfonic acid and a carboxylic acid are photo-decomposable, those portions receiving a high light intensity are reduced in quenching capability and increased in the concentration of an α-position fluorinated sulfonic acid, imide acid or methide acid. This enables to form a pattern having an improved contrast in exposed area, further improved depth of focus (DOF) and satisfactory dimensional control.

If a PAG capable of generating a strong acid is an onium salt, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

In case the acid labile group is an acetal group which is very sensitive to acid, the acid for eliminating the protective group need not necessarily be an α-fluorinated sulfonic acid, imide acid or methide acid. Sometimes, deprotection reaction may take place even with α-position non-fluorinated sulfonic acid. In this case, since an onium salt of sulfonic acid cannot be used as the quencher, an onium salt of carboxylic acid is preferably used alone as the quencher.

Of the onium salts of α-position non-fluorinated sulfonic acid and carboxylic acid, sulfonium salts of sulfonic acid having the following formula (4') and sulfonium salts of carboxylic acid having the following formula (5') are preferred.

(4')

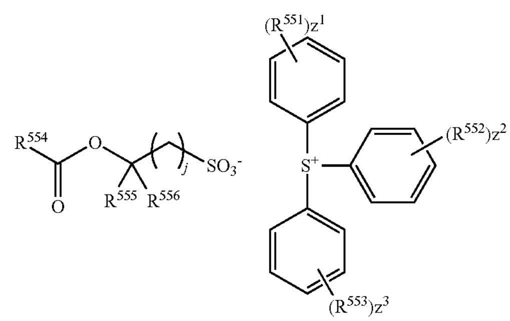

(5')

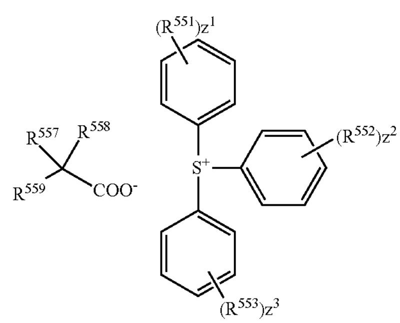

Herein $R^{551}$, $R^{552}$ and $R^{553}$ are each independently a $C_1$-$C_{20}$ straight, branched or cyclic monovalent hydrocarbon group which may contain a heteroatom, any two or more of $R^{551}$, $R^{552}$ and $R^{553}$ may bond together to form a ring with the atom to which they are attached and intervening atoms. $R^{554}$ is a $C_1$-$C_{40}$ straight, branched or cyclic monovalent hydrocarbon group which may contain a heteroatom. $R^{555}$ and $R^{556}$ are each independently hydrogen or trifluoromethyl. $R^{557}$ and $R^{558}$ are each independently hydrogen, fluorine or trifluoromethyl. $R^{559}$ is hydrogen, hydroxyl, a $C_1$-$C_{35}$ straight, branched or cyclic monovalent hydrocarbon group which may contain a heteroatom, or optionally substituted $C_6$-$C_{30}$ aryl group. The subscript j is an integer of 1 to 3, $z^1$, $z^2$ and $z^3$ are each independently an integer of 0 to 5.

The onium salt may be used as quencher alone or in admixture of two or more. An appropriate amount of the quencher is 0 to 50 parts, preferably 0.001 to 50 parts, more preferably 0.01 to 20 parts by weight, per 100 parts by weight of the base resin. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. The inclusion of quencher is also effective for improving adhesion to the substrate.

Inclusion of a surfactant may improve or control the coating characteristics of the resist composition. Exemplary surfactants are described in JP-A 2008-111103, paragraphs [0165]-[0166]. The surfactant may be added in an amount of 0 to 10 parts, preferably 0.0001 to 5 parts by weight per 100 parts by weight of the base resin.

The addition of the dissolution regulator to the resist composition is effective for exaggerating a difference in dissolution rate between exposed and unexposed regions, thus contributing to a further improvement in resolution. Exemplary dissolution regulators are described in US 2008090172 (JP-A 2008-122932, paragraphs [0155] 40178D. An appropriate amount of the dissolution regulator added is 0 to 50 parts, more preferably 0 to 40 parts by weight per 100 parts by weight of the base resin.

Exemplary acetylene alcohols are described in JP-A 2008-122932, paragraphs [0179]401821 An appropriate amount of the acetylene alcohol added is 0 to 2%, more preferably 0.02 to 1% by weight of the resist composition.

Also a polymeric additive may be added for improving the water repellency on surface of a resist film as spin coated. The water repellency improver may be used in the topcoatless immersion lithography. The preferred water repellency improvers include polymers having a fluorinated alkyl group and polymers of specific structure with a 1,1,1,3,3,3-hexafluoro-2-propanol residue. Their examples are described in JP-A 2007-297590 and JP-A 2008-111103. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellency improver and is effective for preventing evaporation of acid during PEB and any hole pattern opening failure after development. An appropriate amount of the water repellency improver is 0.1 to 20 parts, preferably 0.5 to 10 parts by weight per 100 parts by weight of the base resin.

As alluded to previously, polymer A is advantageously used as a base resin in a resist composition. Specifically, polymer A is used as a base resin and combined with any desired components including an acid generator, organic solvent, dissolution regulator, basic compound, and surfactant to formulate a resist composition. This resist composition has a very high sensitivity in that the dissolution rate in developer of polymer A in exposed areas is accelerated by catalytic reaction. In addition, the resist film has a high dissolution contrast, resolution, exposure latitude, and process adaptability, and provides a good pattern profile after exposure, yet better etch resistance, and minimal proximity bias because of restrained acid diffusion. By virtue of these advantages, the composition is fully useful in commercial application and suited as a pattern-forming material for the fabrication of VLSIs. Particularly when an acid generator is included to formulate a chemically amplified resist composition capable of utilizing acid catalyzed reaction, the composition has a higher sensitivity and is further improved in the properties described above.

Process

The resist composition, typically chemically amplified resist composition comprising the base resin, acid generator, organic solvent and basic compound is used in the fabrication of various integrated circuits. Pattern formation using the resist composition may be performed by well-known lithography processes. The process generally involves coating, prebaking, exposure, post-exposure baking (PEB), and development. If necessary, any additional steps may be added.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.1 to 2.0 μm thick.

If desired, a protective film may be formed on the resist film. The protective film is preferably formed of an alkaline developer-soluble composition so that both formation of a resist pattern and stripping of the protective film may be achieved during development. The protective film has the functions of restraining outgassing from the resist film, filtering or cutting off out-of-band (OOB) light having a wavelength of 140 to 300 nm emitted by the EUV laser (other than 13.5 nm), and preventing the resist film from assuming T-top profile or from losing its thickness under environmental impacts.

The resist film is then exposed to a desired pattern of high-energy radiation such as UV, deep-UV, EB, EUV, x-ray, soft x-ray, excimer laser light, γ-ray or synchrotron radiation, directly or through a mask. The exposure dose is preferably about 1 to 200 $mJ/cm^2$, more preferably about 10 to 100 $mJ/cm^2$, or about 0.1 to 100 $\mu C/cm^2$, more preferably about 0.5 to 50 $\mu C/cm^2$. The resist film is further baked (PEB) on a hot plate at 60 to 150° C. for 10 seconds to 30 minutes, preferably at 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). When polymer A contains recurring units (b1) and/or (b2), the resist film in the exposed area is dissolved in the developer whereas the resist film in the unexposed area is not dissolved, yielding a positive pattern on the substrate. When polymer A contains recurring units (b3), a negative pattern is formed on the substrate. It is appreciated that the resist composition of the invention is best suited for micro-patterning using such high-energy radiation as EB, EUV, x-ray, soft x-ray, γ-ray and synchrotron radiation.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

In an embodiment wherein polymer A contains recurring units (b1) and/or (b2), a negative pattern may be formed via organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

EXAMPLE

Examples of the invention are given below by way of illustration and not by way of limitation. The abbreviation "pbw" is parts by weight.

1) Synthesis of Monomers

Synthesis Example 1-1

Synthesis of Monomer 1

In 50 g of THF, 18.4 g of 2-bromoresorcinol and 0.37 g of 4-(dimethylamino)pyridine were dissolved. To the solution under ice cooling, 9.24 g of methacrylic chloride was added dropwise. The solution was stirred at room temperature for 5 hours, after which water was added to quench the reaction. This was followed by standard aqueous work-up and silica gel column chromatography purification, yielding 19 g of Monomer 1.

Synthesis Example 1-2

Synthesis of Monomer 2

The procedure of Synthesis Example 1-1 was repeated except that 26 g of 2,5-dibromohydroquinone was used instead of 2-bromoresorcinol, yielding 29.9 g of Monomer 2.

Synthesis Example 1-3

Synthesis of Monomer 3

The procedure of Synthesis Example 1-1 was repeated except that 33.6 g of 2,4,6-tribromoresorcinol was used instead of 2-bromoresorcinol, yielding 35.5 g of Monomer 3.

Synthesis Example 1-4

Synthesis of Monomer 4

The procedure of Synthesis Example 1-1 was repeated except that 41.5 g of tetrabromohydroquinone was used instead of 2-bromoresorcinol, yielding 47.3 g of Monomer 4.

Synthesis Example 1-5

Synthesis of Monomer 5

The procedure of Synthesis Example 1-1 was repeated except that 46.8 g of 4-tert-butoxytetrabromocatechol was used instead of 2-bromoresorcinol, yielding 39.2 g of Monomer 5.

Monomers 1 to 5 have the following structure.
Monomer 1
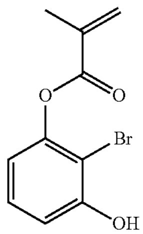
Monomer 2
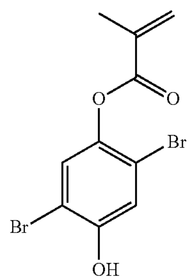
Monomer 3
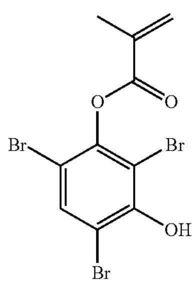
Monomer 4
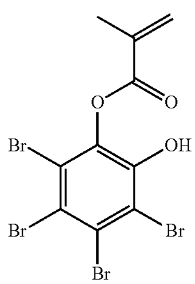
Monomer 5
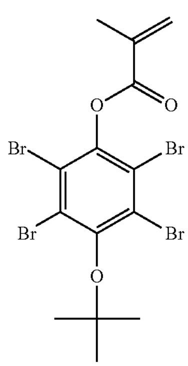
2) Synthesis of Polymers
Monomers 6, 7 and 8 and PAG Monomers 1 and 2 used in Synthesis Examples are identified below.
Monomer 6
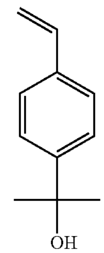
Monomer 7
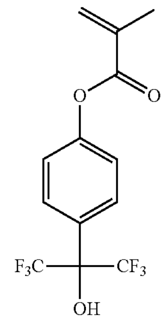
Monomer 8
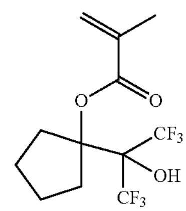
PAG Monomer 1
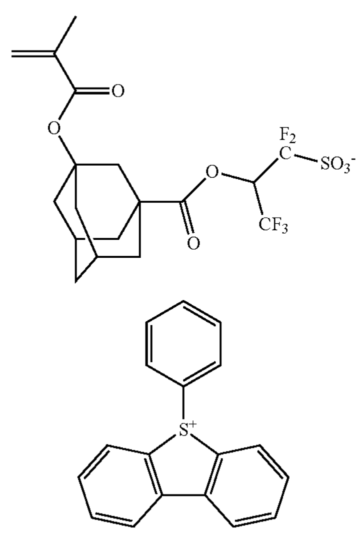

-continued

PAG Monomer 2

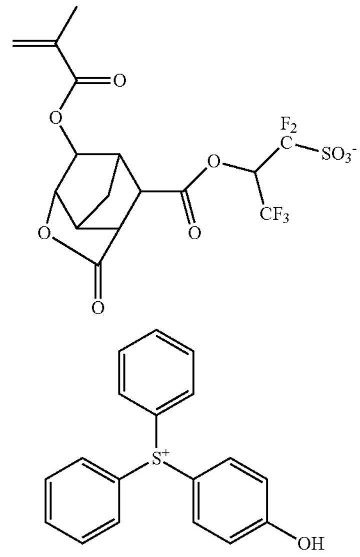

Synthesis Example 2-1

Synthesis of Polymer 1

A 2-L flask was charged with 8.4 g of 1-methylcyclopentyl methacrylate, 2.4 g of 4-hydroxystyrene, 5.9 g of Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 1 as white solid. The polymer was analyzed for composition by $^{13}$C- and $^{1}$H-NMR and for Mw and Mw/Mn by GPC, with the results shown below.

Polymer 1

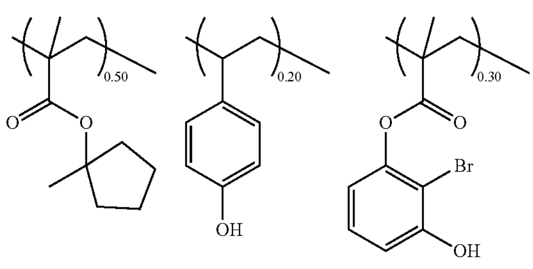

Mw = 8,300
Mw/Mn = 1.77

Synthesis Example 2-2

Synthesis of Polymer 2

A 2-L flask was charged with 5.5 g of 1-methylcyclohexyl methacrylate, 3.1 g of 4-(1-methylcyclopentyloxy)styrene, 4.4 g of 3-oxo-2,7-dioxatricyclo[4.2.1.0$^{4,8}$]nonan-9-yl methacrylate, 6.7 g of Monomer 2, 11.0 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 2 as white solid. The polymer was analyzed for composition by $^{13}$C- and $^{1}$H-NMR and for Mw and Mw/Mn by GPC, with the results shown below.

Polymer 2

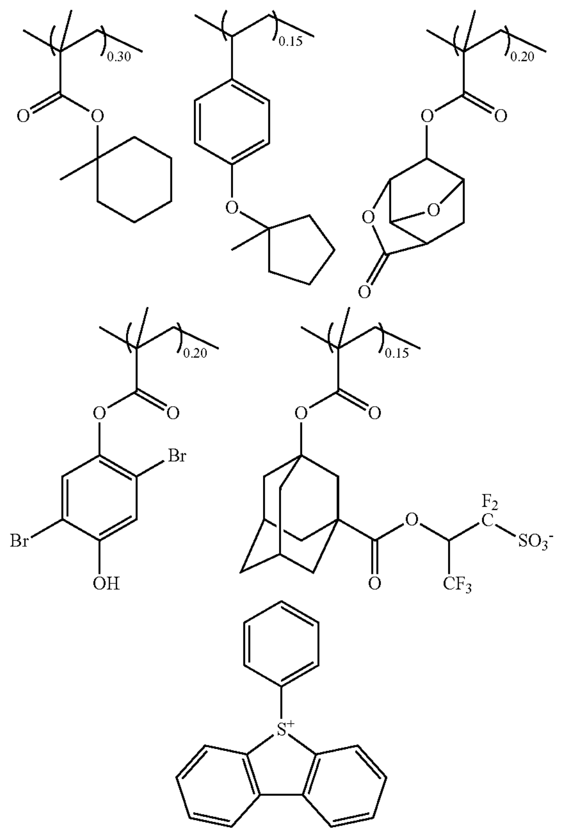

Mw = 9,700
Mw/Mn = 1.83

Synthesis Example 2-3

Synthesis of Polymer 3

A 2-L flask was charged with 7.8 g of tert-pentyl methacrylate, 4.4 g of 3-oxo-2,7-dioxatricyclo[4.2.1.0$^{4,8}$]nonan-9-yl methacrylate, 8.3 g of Monomer 3, 7.4 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 3 as white solid. The polymer was analyzed for composition by $^{13}$C- and $^{1}$H-NMR and for Mw and Mw/Mn by GPC, with the results shown below.

lyzed for composition by $^{13}C$- and $^{1}H$-NMR and for Mw and Mw/Mn by GPC, with the results shown below.

Polymer 3

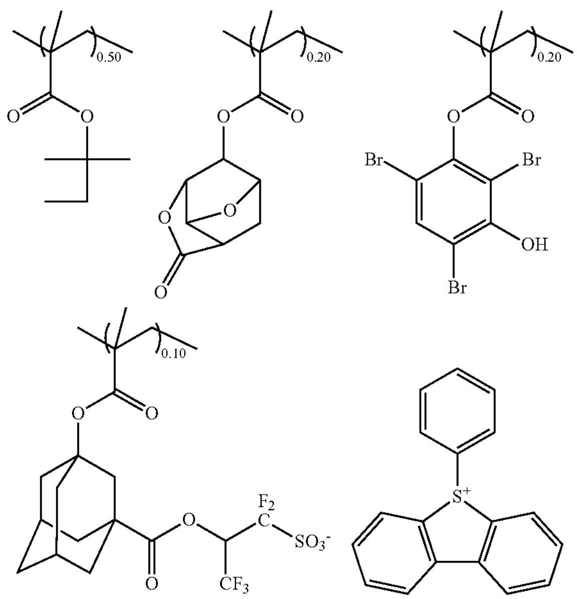

Mw = 9,300
Mw/Mn = 1.89

-continued

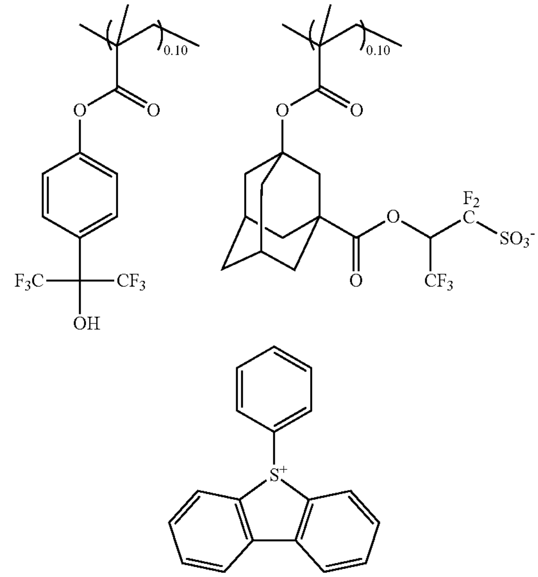

Mw = 9,700
Mw/Mn = 1.81

Synthesis Example 2-4

Synthesis of Polymer 4

A 2-L flask was charged with 8.4 g of 1-methylcyclopentyl methacrylate, 2.2 g of 3-oxo-2,7-dioxatricyclo[4.2.1.0$^{4,8}$]nonan-9-yl methacrylate, 9.9 g of Monomer 4, 3.3 g of Monomer 7, 7.4 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 4 as white solid. The polymer was analyzed for composition by $^{13}C$- and $^{1}H$-NMR and for Mw and Mw/Mn by GPC, with the results shown below.

Polymer 4

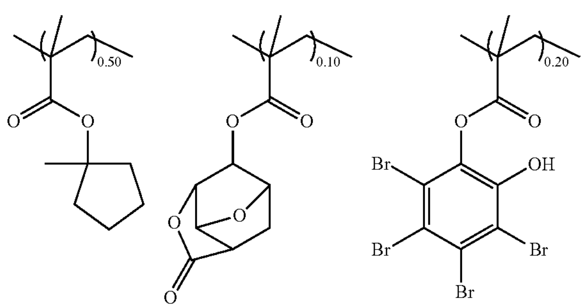

Synthesis Example 2-5

Synthesis of Polymer 5

A 2-L flask was charged with 27.5 g of Monomer 5, 2.2 g of 3-oxo-2,7-dioxatricyclo[4.2.1.0$^{4,8}$]nonan-9-yl methacrylate, 3.6 g of 4-hydroxyphenyl methacrylate, 3.2 g of Monomer 8, 7.4 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 5 as white solid. The polymer was analyzed for composition by $^{13}C$- and $^{1}H$-NMR and for Mw and Mw/Mn by GPC, with the results shown below.

Polymer 5

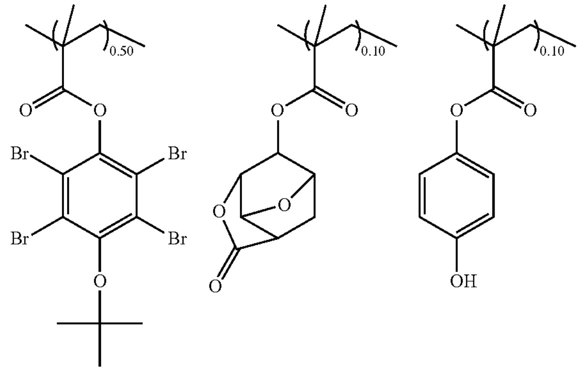

-continued

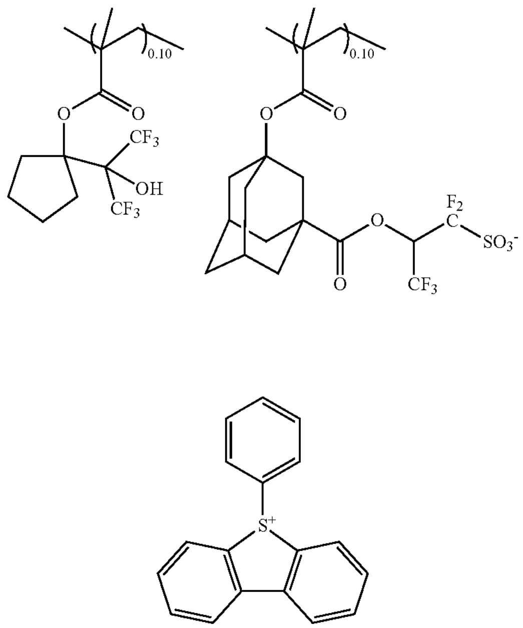

Mw = 9,700
Mw/Mn = 1.81

-continued

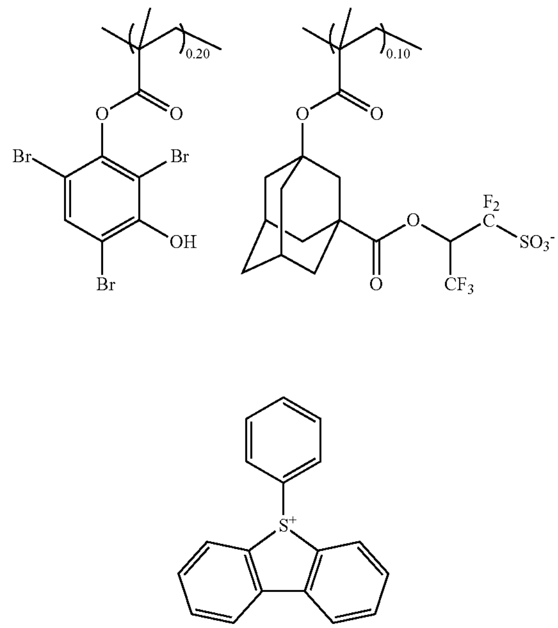

Mw = 9,100
Mw/Mn = 1.67

Synthesis Example 2-6

Synthesis of Polymer 6

A 2-L flask was charged with 27.5 g of Monomer 5, 4.4 g of 3-oxo-2,7-dioxatricyclo[4.2.1.0$^{4,8}$]nonan-9-yl methacrylate, 8.3 g of Monomer 3, 11.0 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 6 as white solid. The polymer was analyzed for composition by $^{13}$C- and $^{1}$H-NMR and for Mw and Mw/Mn by GPC, with the results shown below.

Polymer 6

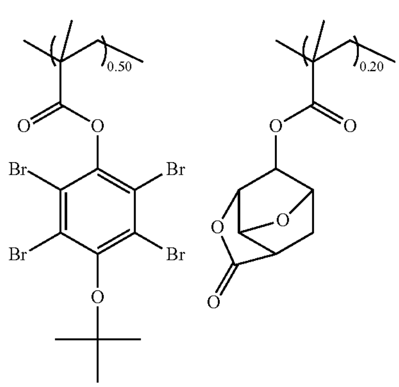

Synthesis Example 2-7

Synthesis of Polymer 7

A 2-L flask was charged with 10.4 g of 4-tert-pentyloxy-3-fluorostyrene, 3.3 g of 3-oxo-2,7-dioxatricyclo[4.2.1.0$^{4,8}$]nonan-9-yl methacrylate, 6.7 g of Monomer 2, 11.0 g of PAG Monomer 1, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 7 as white solid. The polymer was analyzed for composition by $^{13}$C- and $^{1}$H-NMR and for Mw and Mw/Mn by GPC, with the results shown below.

Polymer 7

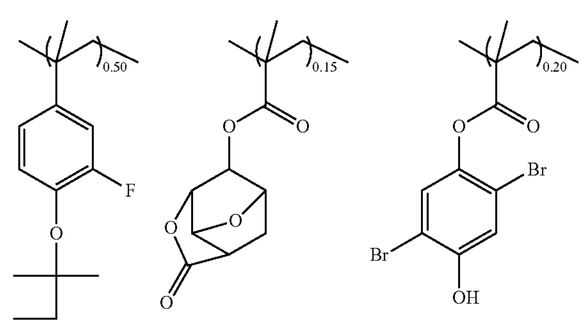

-continued

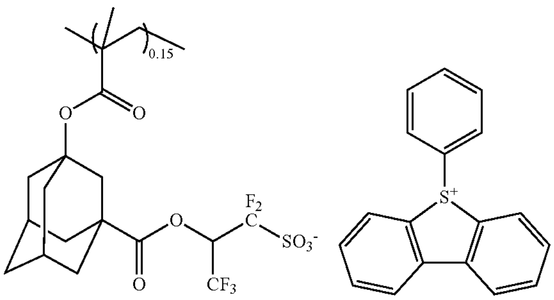

Mw = 9,100
Mw/Mn = 1.81

Synthesis Example 2-8

Synthesis of Polymer 8

A 2-L flask was charged with 5.0 g of Monomer 6, 3.0 g of α-methylene-γ-butyrolactone, 12.4 g of Monomer 3, 7.6 g of PAG Monomer 2, and 40 g of THF as solvent. The reactor was cooled at −70° C. in nitrogen atmosphere, after which vacuum pumping and nitrogen blow were repeated three times. The reactor was warmed up to room temperature, whereupon 1.2 g of AIBN as polymerization initiator was added. The reactor was heated at 60° C., whereupon reaction ran for 15 hours. The reaction solution was poured into 1 L of isopropyl alcohol for precipitation. The resulting white solid was collected by filtration and vacuum dried at 60° C., yielding Polymer 8 as white solid. The polymer was analyzed for composition by $^{13}$C- and $^{1}$H-NMR and for Mw and Mw/Mn by GPC, with the results shown below.

Polymer 8

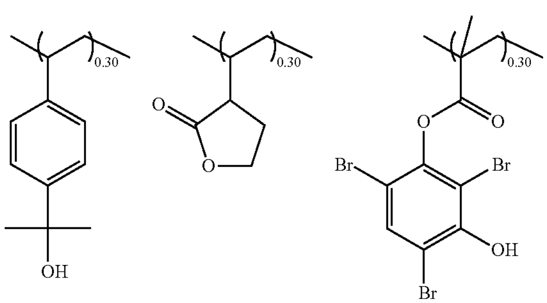

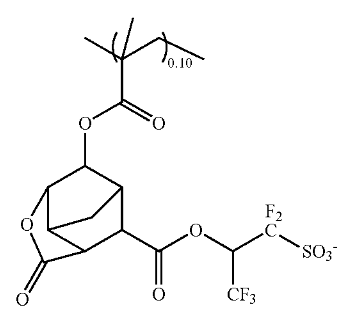

-continued

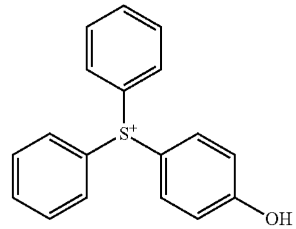

Mw = 7,300
Mw/Mn = 1.68

Comparative Synthesis Example 2-1

Synthesis of Comparative Polymer 1

Comparative Polymer 1 was synthesized by the same procedure as in Synthesis Example 2-1 aside from omitting Monomer 1. The polymer was analyzed for composition by $^{13}$C- and $^{1}$H-NMR and for Mw and Mw/Mn by GPC.

Comparative Polymer 1

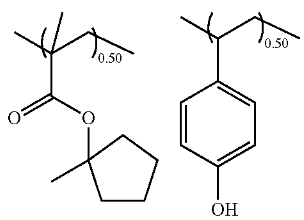

Mw = 9,100
Mw/Mn = 1.65

Comparative Synthesis Example 2-2

Synthesis of Comparative Polymer 2

Comparative Polymer 2 was synthesized by the same procedure as in Synthesis Example 2-3 aside from using 4-hydroxyphenyl methacrylate instead of Monomer 3. The polymer was analyzed for composition by $^{13}$C- and $^{1}$H-NMR and for Mw and Mw/Mn by GPC.

Comparative Polymer 2

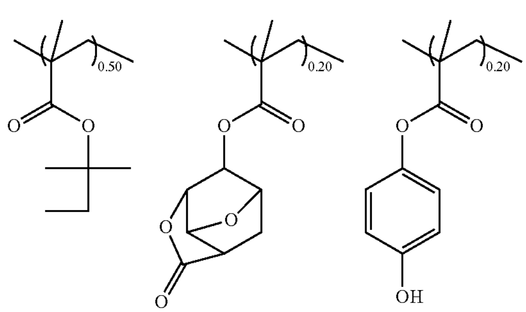

-continued

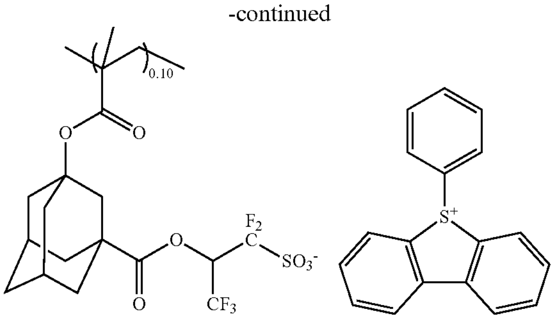

Mw = 9,300
Mw/Mn = 1.89

Comparative Synthesis Example 2-3

Synthesis of Comparative Polymer 3

Comparative Polymer 3 was synthesized by the same procedure as in Synthesis Example 2-7 aside from using 4-hydroxyphenyl methacrylate instead of Monomer 3. The polymer was analyzed for composition by $^{13}C$- and $^{1}H$-NMR and for Mw and Mw/Mn by GPC.

Comparative Polymer 3

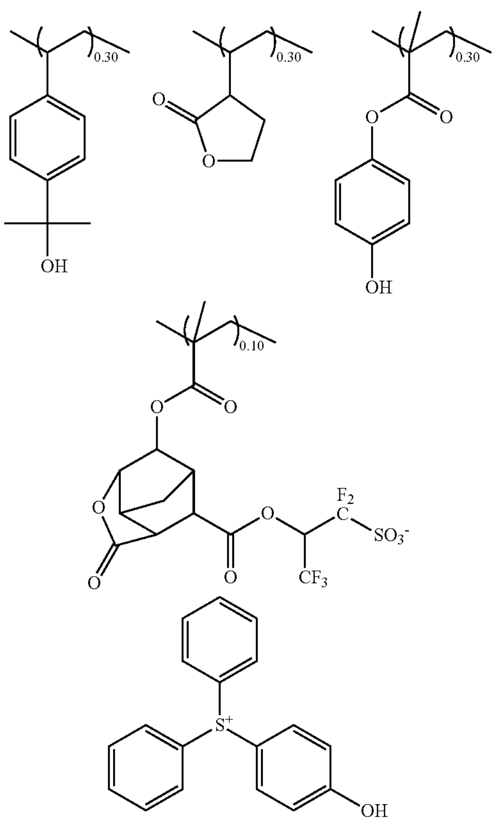

Mw = 7,100
Mw/Mn = 1.73

Examples and Comparative Examples

Resist compositions were prepared by dissolving the polymer and selected components in a solvent in accordance with the recipe shown in Table 1, and filtering through a filter having a pore size of 0.2 μm. The solvent contained 100 ppm of surfactant FC-4430 (3M). The resist compositions of Examples 1 to 10 and Comparative Examples 1 to 2 are of positive tone whereas the resist compositions of Example 11 and Comparative Example 3 are of negative tone. The components in Table 1 are as identified below.

Organic Solvents:

PGMEA (propylene glycol monomethyl ether acetate)

CyH (cyclohexanone)

PGME (propylene glycol monomethyl ether)

Acid generators: PAG 1 to PAG 3 of the following structural formulae

PAG 1

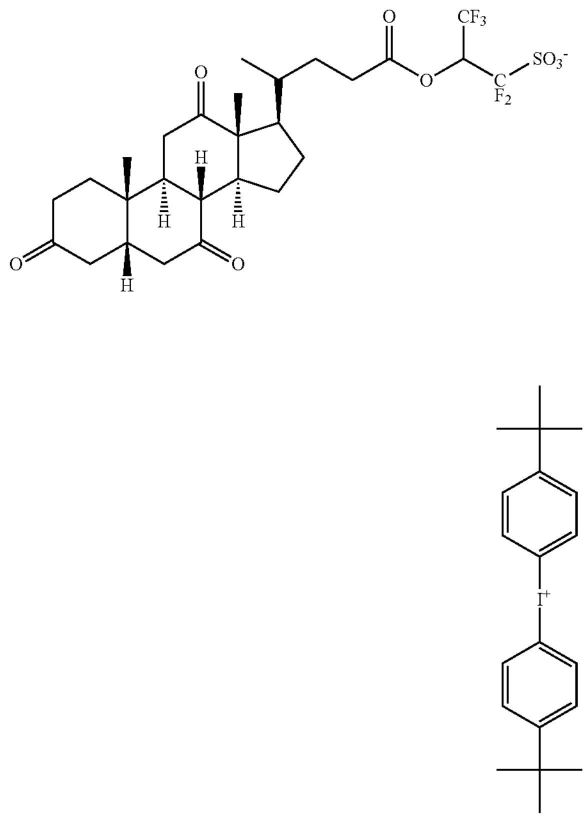

PAG 2

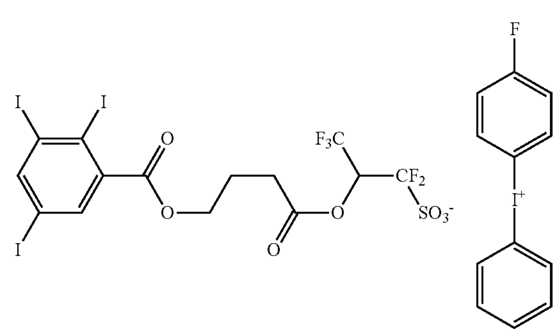

-continued

PAG 3

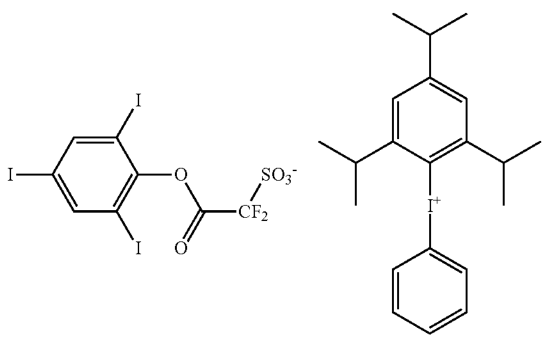

Quenchers: Quenchers 1 to 3 of the following structural formulae

Quencher 1

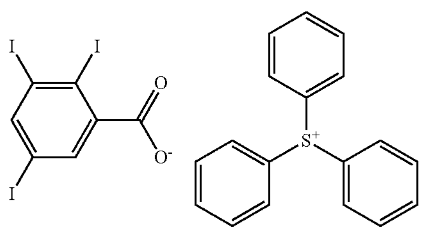

Quencher 2

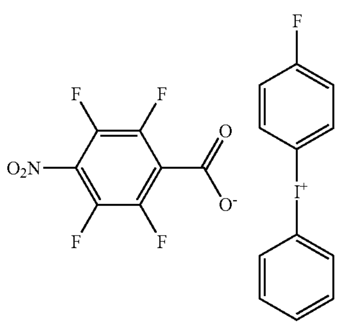

-continued

Quencher 3

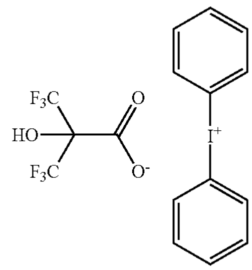

EUV Lithography Test

Examples 1 to 11 and Comparative Examples 1 to 3

Each of the resist compositions in Table 1 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 60 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Table 1 for 60 seconds and developed in a 2.38 wt % TMAH aqueous solution for 30 seconds to form a hole pattern having a size of 23 nm in Examples 1 to 10 and Comparative Examples 1 to 2 or a dot pattern having a size of 23 nm in Example 11 and Comparative Example 3.

The resist pattern was evaluated. The exposure dose that provides a hole or dot pattern having a size of 23 nm is reported as sensitivity. The size of 50 holes or dots was measured under CD-SEM (CG-5000, Hitachi High-Technologies Corp.), from which a size variation (3σ) was computed and reported as CDU.

The resist compositions are shown in Table 1 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 1 | Polymer 1<br>(100) | PAG 1<br>(30) | Quencher 1<br>(4.00) | PGMEA (400)<br>CyH (2,000)<br>PGME (100) | 100 | 26 | 3.5 |
| | 2 | Polymer 2<br>(100) | — | Quencher 2<br>(4.50) | PGMEA (400)<br>CyH (2,000)<br>PGME (100) | 100 | 23 | 2.4 |
| | 3 | Polymer 3<br>(100) | — | Quencher 3<br>(4.50) | PGMEA (400)<br>CyH (2,000)<br>PGME (100) | 105 | 21 | 2.6 |
| | 4 | Polymer 4<br>(100) | — | Quencher 2<br>(4.50) | PGMEA (400)<br>CyH (2,000)<br>PGME (100) | 100 | 18 | 2.4 |
| | 5 | Polymer 5<br>(100) | — | Quencher 2<br>(4.50) | PGMEA (400)<br>CyH (2,000)<br>PGME (100) | 100 | 17 | 2.4 |
| | 6 | Polymer 6<br>(100) | — | Quencher 2<br>(4.50) | PGMEA (400)<br>CyH (2,000)<br>PGME (100) | 100 | 16 | 2.5 |
| | 7 | Polymer 6<br>(100) | PAG 1<br>(10) | Quencher 2<br>(4.50) | PGMEA (400)<br>CyH (2,000)<br>PGME (100) | 100 | 13 | 2.8 |

TABLE 1-continued

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| | 8 | Polymer 6 (100) | PAG 2 (15) | Quencher 2 (4.50) | PGMEA (400) CyH (2,000) PGME (100) | 100 | 12 | 2.6 |
| | 9 | Polymer 6 (100) | PAG 3 (15) | Quencher 2 (4.50) | PGMEA (400) CyH (2,000) PGME (100) | 100 | 11 | 2.7 |
| | 10 | Polymer 7 (100) | — | Quencher 2 (4.50) | PGMEA (400) CyH (2,000) PGME (100) | 85 | 29 | 2.0 |
| | 11 | Polymer 8 (100) | — | Quencher 2 (4.50) | PGMEA (400) CyH (2,000) PGME (100) | 80 | 32 | 3.4 |
| Comparative Example | 1 | Comparative Polymer 1 | PAG 1 (30) | Quencher 1 (4.00) | PGMEA (400) CyH (2,000) PGME (100) | 100 | 33 | 3.8 |
| | 2 | Comparative Polymer 2 | — | Quencher 3 (4.50) | PGMEA (400) CyH (2,000) PGME (100) | 105 | 34 | 2.9 |
| | 3 | Comparative Polymer 3 | — | Quencher 2 (4.50) | PGMEA (400) CyH (2,000) PGME (100) | 80 | 42 | 4.4 |

Japanese Patent Application No. 2017-121532 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base resin containing a polymer comprising recurring units having the formula (a):

(a)

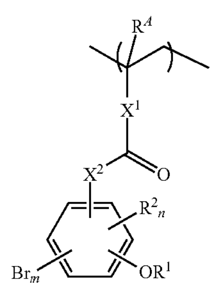

wherein $R^A$ is hydrogen or methyl, $R^1$ is an acid labile group, $R^2$ is a $C_1$-$C_6$ straight, branched or cyclic alkyl group or halogen other than bromine, $X^1$ is a single bond, phenylene group, or a $C_1$-$C_{12}$ straight, branched or cyclic alkylene group which may contain an ester moiety or lactone ring, $X^2$ is —O—, —O—$CH_2$— or —NH—, m is an integer of 1 to 4, and n is an integer of 0 to 3, and recurring units of at least one type selected from the formulae (d1) to (d3):

(d1)

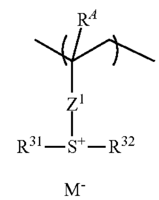

(d2)

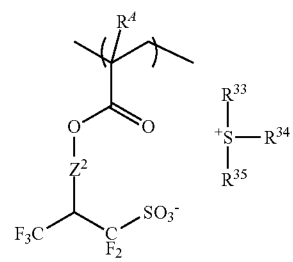

(d3)

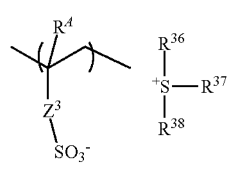

wherein $R^A$ is each independently hydrogen or methyl, $Z^1$ is a single bond, phenylene group, —O—$Z^{12}$—, or —C(═O)—$Z^{11}$-$Z^{12}$—, $Z^{11}$ is —O— or —NH—, $Z^{12}$ is a $C_1$-$C_6$ straight, branched or cyclic alkylene group, $C_2$-$C_6$ straight, branched or cyclic alkenylene group, or phenylene group, which may contain a carbonyl, ester, ether or hydroxyl moiety, $R^{31}$ to $R^{38}$ are each independently a $C_1$-$C_{12}$ straight, branched or cyclic alkyl group which may contain a carbonyl, ester or ether moiety, or a $C_6$-$C_{12}$ aryl group or $C_7$-$C_{20}$ aralkyl group, in which at least one hydrogen may be substituted by a $C_1$-$C_{10}$ straight, branched or cyclic alkyl moiety, halogen, trifluoromethyl, cyano, nitro, hydroxyl, mercapto, $C_1$-$C_{10}$ straight, branched or cyclic alkoxy moiety, $C_2$-$C_{10}$ straight, branched or cyclic alkoxycarbonyl moiety, or $C_2$-$C_{10}$ straight, branched or cyclic acyloxy moiety, $Z^2$ is a single bond, a $C_1$-$C_{12}$ straight, branched or cyclic alkylene group or $C_2$-$C_{12}$ straight, branched or cyclic alkenylene group which may contain an ether moiety, ester moiety or lactone ring, or $C_6$-$C_{10}$ arylene group, $Z^3$ is a single bond, methylene, ethylene, phenylene, fluorinated phenylene, —O—$Z^{32}$—, or —C(═O)—$Z^{31}$-$Z^{32}$—, $Z^{31}$ is —O— or —NH—, $Z^{32}$ is a straight, branched or cyclic $C_1$-$C_{12}$ alkylene or $C_2$-$C_{12}$ alkenylene group which may contain a carbonyl, ester or ether moiety, or phenylene group, in which at least one hydrogen atom may be substituted by fluorine or hydroxyl, and $M^-$ is a non-nucleophilic counter ion.

2. The resist composition of claim 1 wherein m is an integer of 2 to 4.

3. The resist composition of claim 1 wherein the polymer further comprises recurring units having a group capable of polarity switch under the action of acid.

4. The resist composition of claim 3 wherein the polarity switch under the action of acid takes place by elimination reaction.

5. The resist composition of claim 3 wherein the recurring units having a group capable of polarity switch under the action of acid have the formula (b1) or (b2):

(b1)

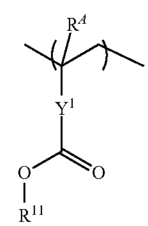

(b2)

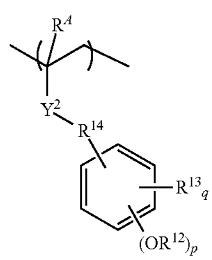

wherein $R^A$ is each independently hydrogen or methyl, $R^{11}$ and $R^{12}$ are each independently an acid labile group, $R^{13}$ is fluorine, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, $R^{14}$ is a single bond or a $C_1$-$C_6$ straight or branched alkylene group in which at least one carbon atom may be substituted by an ether or ester moiety, p is 1 or 2, q is an integer of 0 to 4, $Y^1$ is a single bond, phenylene group, naphthylene group, or a $C_1$-$C_{12}$ linking group which may contain an ester moiety, ether moiety or lactone ring, and $Y^2$ is a single bond, —C(═O)—O— or —C(═O)—NH—.

6. The resist composition of claim 1 wherein the polymer further comprises recurring units having an adhesive group selected from among hydroxyl, carboxyl, lactone ring, carbonate, thiocarbonate, carbonyl, cyclic acetal, ether, ester, sulfonic acid ester, cyano, amide, and —O—C(═O)-G- wherein G is —S— or —NH—.

7. The resist composition of claim 1, further comprising an organic solvent.

8. The resist composition of claim 1, further comprising an acid generator.

9. The resist composition of claim 1, further comprising a basic compound.

10. The resist composition of claim 1, further comprising a surfactant.

11. A process for forming a pattern comprising the steps of applying the resist composition of claim 1 onto a substrate, baking to form a resist film, exposing the resist film to high-energy radiation, and developing the exposed film in a developer.

12. The process of claim 11 wherein the high-energy radiation is i-line, KrF excimer laser, ArF excimer laser, EB or EUV of wavelength 3 to 15 nm.

13. The resist composition of claim 1, further comprising an organic solvent.

14. The resist composition of claim 1, further comprising an acid generator.

15. The resist composition of claim 1, further comprising a surfactant.

16. A resist composition comprising a base resin containing a polymer comprising recurring units having the formula (a), and a quencher which is an onium salt of sulfonic acid which is not fluorinated at α-position as represented by the formula (4) or carboxylic acid as represented by the formula (5):

(a)

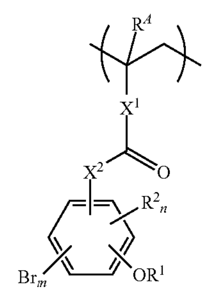

wherein $R^A$ is hydrogen or methyl, $R^1$ is an acid labile group, $R^2$ is a $C_1$-$C_6$ straight, branched or cyclic alkyl group or halogen other than bromine, $X^1$ is a single bond, phenylene group, or a $C_1$-$C_{12}$ straight, branched or cyclic alkylene group which may contain an ester moiety or lactone ring, $X^2$ is —O—, —O—$CH_2$— or —NH—, m is an integer of 1 to 4, and n is an integer of 0 to 3, $$R^{501}-\overset{R^{502}}{\underset{R^{503}}{C}}-SO_3^-\quad M^+ \tag{4}$$

$$R^{504}-CO_2^-\quad M^+ \tag{5}$$

wherein $R^{501}$, $R^{502}$ and $R^{503}$ are each independently hydrogen, halogen exclusive of fluorine, or a $C_1$-$C_{40}$ straight, branched or cyclic monovalent hydrocarbon group which may contain a heteroatom, any two of $R^{501}$, $R^{502}$ and $R^{503}$ may bond together to form a ring with the carbon atom to which they are attached, $R^{504}$ is a $C_1$-$C_{40}$ straight, branched or cyclic monovalent hydrocarbon group which may contain a heteroatom, and $M^+$ is an onium cation.

17. The resist composition of claim 16 wherein the quencher is a sulfonium salt of sulfonic acid having the following formula (4') or sulfonium salt of carboxylic acid having the following formula (5'):

(4')

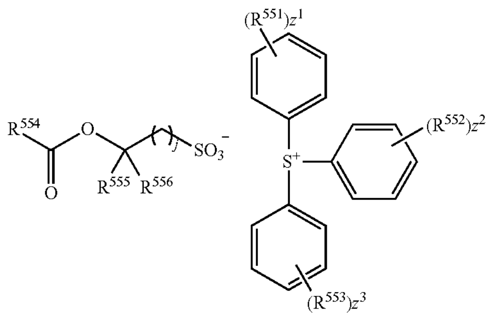

(5')

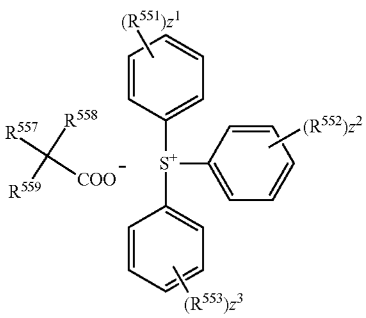

wherein $R^{551}$, $R^{552}$ and $R^{553}$ are each independently a $C_1$-$C_{20}$ straight, branched or cyclic monovalent hydrocarbon group which may contain a heteroatom, any two or more of $R^{551}$, $R^{552}$ and $R^{553}$ may bond together to form a ring with the atom to which they are attached and intervening atoms, $R^{554}$ is a $C_1$-$C_{40}$ straight, branched or cyclic monovalent hydrocarbon group which may contain a heteroatom, $R^{555}$ and $R^{556}$ are each independently hydrogen or trifluoromethyl, $R^{557}$ and $R^{558}$ are each independently hydrogen, fluorine or trifluoromethyl, $R^{559}$ is hydrogen, hydroxyl, a $C_1$-$C_{35}$ straight, branched or cyclic monovalent hydrocarbon group which may contain a heteroatom, or optionally substituted $C_6$-$C_{30}$ aryl group, the subscript j is an integer of 1 to 3, and $z^1$, $z^2$ and $z^3$ are each independently an integer of 0 to 5.

18. The resist composition of claim 16 wherein the recurring units having a group capable of polarity switch under the action of acid have the formula (b1) or (b2):

(b1)

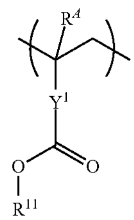

(b2)

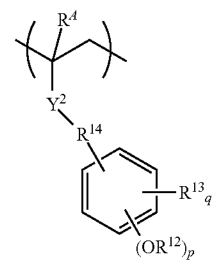

wherein $R^A$ is each independently hydrogen or methyl, $R^{11}$ and $R^{12}$ are each independently an acid labile group, $R^{13}$ is fluorine, trifluoromethyl, cyano, a $C_1$-$C_6$ straight, branched or cyclic alkyl or alkoxy group, or a $C_2$-$C_7$ straight, branched or cyclic acyl, acyloxy or alkoxycarbonyl group, $R^{14}$ is a single bond or a $C_1$-$C_6$ straight or branched alkylene group in which at least one carbon atom may be substituted by an ether or ester moiety, p is 1 or 2, q is an integer of 0 to 4, $Y^1$ is a single bond, phenylene group, naphthylene group, or a $C_1$-$C_{12}$ linking group which may contain an ester moiety, ether moiety or lactone ring, and $Y^2$ is a single bond, —C(═O)—O— or —C(═O)—NH—.

19. The resist composition of claim 16 wherein the polymer further comprises recurring units having an adhesive group selected from among hydroxyl, carboxyl, lactone ring, carbonate, thiocarbonate, carbonyl, cyclic acetal, ether, ester, sulfonic acid ester, cyano, amide, and —O—C(═O)-G- wherein G is —S— or —NH—.

* * * * *